United States Patent
Kurihara et al.

(10) Patent No.: US 12,058,455 B2
(45) Date of Patent: Aug. 6, 2024

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventors: Takuya Kurihara, Kanagawa (JP); Yuji Torige, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 206 days.

(21) Appl. No.: 17/596,749

(22) PCT Filed: Jun. 24, 2020

(86) PCT No.: PCT/JP2020/024837
§ 371 (c)(1),
(2) Date: Dec. 17, 2021

(87) PCT Pub. No.: WO2020/262461
PCT Pub. Date: Dec. 30, 2020

(65) Prior Publication Data
US 2022/0239853 A1    Jul. 28, 2022

(30) Foreign Application Priority Data
Jun. 26, 2019  (JP) ................ 2019-118936

(51) Int. Cl.
*H04N 25/59*   (2023.01)
*H01L 27/146*   (2006.01)
(Continued)

(52) U.S. Cl.
CPC ....... *H04N 25/59* (2023.01); *H01L 27/14612* (2013.01); *H01L 27/14636* (2013.01);
(Continued)

(58) Field of Classification Search
CPC ........ H04N 25/59; H04N 25/75; H04N 25/77; H04N 25/79; H01L 27/14612;
(Continued)

(56) References Cited

U.S. PATENT DOCUMENTS

2013/0092820 A1    4/2013  Takemoto
2014/0042298 A1*   2/2014  Wan .................... H01L 27/1469
                                                    257/E31.127
(Continued)

FOREIGN PATENT DOCUMENTS

CN    103067674 A    4/2013
CN    107210311 A    9/2017
(Continued)

OTHER PUBLICATIONS

English translation of WIPO publication WO 2016121521 A1 (Year: 2016).*
(Continued)

*Primary Examiner* — Shahbaz Nazrul
(74) *Attorney, Agent, or Firm* — CHIP LAW GROUP

(57) ABSTRACT

Provided is a technology capable of acquiring a saturation charge amount and improving low-light characteristics while suppressing an enlargement of a device and deterioration in pixel density. A solid-state imaging device according to an embodiment includes: a first substrate (100) including a plurality of photoelectric converters (PD) arranged in a matrix; a second substrate (200) that is bonded to a first surface of the first substrate and includes a pixel circuit (120) that generates a pixel signal based on a charge generated in each of the photoelectric converters; and a third substrate (300) bonded to a third surface of the second substrate opposite to a second surface to which the first substrate is bonded, the third substrate including a peripheral circuit that executes predetermined processing on the pixel
(Continued)

signal generated by the pixel circuit, in which the pixel circuit includes: a charge accumulation unit (FD) that accumulates a charge generated in the photoelectric converter; an amplification transistor (AMP) that generates the pixel signal having a voltage value corresponding to a charge amount regarding the charge accumulated in the charge accumulation unit; and a switching transistor (FDG) that switches capacitance of the charge accumulation unit.

19 Claims, 77 Drawing Sheets

(51) Int. Cl.
    *H04N 25/75*     (2023.01)
    *H04N 25/77*     (2023.01)
(52) U.S. Cl.
    CPC ....... *H01L 27/14643* (2013.01); *H04N 25/75* (2023.01); *H04N 25/77* (2023.01)
(58) Field of Classification Search
    CPC ......... H01L 27/14636; H01L 27/14643; H01L 21/768; H01L 23/522; H01L 27/146
    See application file for complete search history.

(56) References Cited

U.S. PATENT DOCUMENTS

| | | | |
|---|---|---|---|
| 2017/0373107 A1 | 12/2017 | Koga | |
| 2018/0054583 A1* | 2/2018 | Iwabuchi | H01L 27/1464 |
| 2020/0168652 A1* | 5/2020 | Kato | H01L 24/08 |
| 2020/0195863 A1* | 6/2020 | Shim | H04N 25/53 |
| 2021/0152771 A1* | 5/2021 | Parks | H01L 27/1464 |

FOREIGN PATENT DOCUMENTS

| | | | |
|---|---|---|---|
| EP | 3252818 A1 | 12/2017 | |
| JP | 2010-245506 A | 10/2010 | |
| JP | 2013-090127 A | 5/2013 | |
| JP | 2014-146894 A | 8/2014 | |
| KR | 10-2017-0106309 A | 9/2017 | |
| WO | 2016/121521 A1 | 8/2016 | |

OTHER PUBLICATIONS

International Search Report and Written Opinion of PCT Application No. PCT/JP2020/024837, issued on Sep. 24, 2020, 10 pages of ISRWO.

\* cited by examiner

SOLID-STATE IMAGING DEVICE AND ELECTRONIC DEVICE

CROSS REFERENCE TO RELATED APPLICATIONS

This application is a U.S. National Phase of International Patent Application No. PCT/JP2020/024837 filed on Jun. 24, 2020, which claims priority benefit of Japanese Patent Application No. JP 2019-118936 filed in the Japan Patent Office on Jun. 26, 2019. Each of the above-referenced applications is hereby incorporated herein by reference in its entirety.

FIELD

The present disclosure relates to a solid-state imaging device and an electronic device.

BACKGROUND

In known technologies, miniaturization of an area per pixel of a solid-state imaging device having a two-dimensional structure has been achieved by introduction of a microfabrication process and improvement of mounting density. In recent years, in order to achieve further miniaturization of a solid-state imaging device and densification of pixels, a solid-state imaging device having a three-dimensional structure has been developed. The solid-state imaging device having a three-dimensional structure has a configuration, for example, in which a semiconductor substrate including a plurality of sensor pixels and a semiconductor substrate including a signal processing circuit that processes a signal obtained by each of sensor pixels are stacked on each other.

CITATION LIST

Patent Literature

Patent Literature 1: JP 2010-245506 A

SUMMARY

Technical Problem

Here, this solid-state imaging device is desired to improve low-light characteristics while acquiring the saturation charge amount of each pixel. One conceivable method of achieving both the acquisition of the saturation charge amount and the improvement of the low-light characteristics is a method of adding a configuration of connecting or disconnecting additional capacitance as appropriate, to the floating diffusion (FD) as a charge-voltage converter.

However, simply adding a configuration for FD capacitance switching as described above to the solid-state imaging device having the three-dimensional structure leads to the possibility of hindrance of downsizing and densification, resulting in an enlargement of the device, deterioration in pixel density, and the like.

In view of these, the present disclosure proposes a solid-state imaging device and an electronic device capable of acquiring a saturation charge amount and improving low-light characteristics while suppressing an enlargement of the device and deterioration in pixel density.

Solution to Problem

To solve the above-described problem, a solid-state imaging device according to one aspect of the present disclosure comprises: a first substrate including a plurality of photoelectric converters arranged in a matrix; a second substrate that is bonded to a first surface of the first substrate and includes a pixel circuit that generates a pixel signal based on a charge generated in each of the photoelectric converters; and a third substrate bonded to a third surface of the second substrate opposite to a second surface to which the first substrate is bonded, the third substrate including a peripheral circuit that executes predetermined processing on the pixel signal generated by the pixel circuit, wherein the pixel circuit includes: a charge accumulation unit that accumulates a charge generated in the photoelectric converter; an amplification transistor that generates the pixel signal having a voltage value corresponding to a charge amount regarding the charge accumulated in the charge accumulation unit; and a switching transistor that switches capacitance of the charge accumulation unit.

BRIEF DESCRIPTION OF DRAWINGS

FIG. 37 is a schematic plan view illustrating another example of a pixel isolation portion illustrated in FIG. 7A and the like.

DESCRIPTION OF EMBODIMENTS

An embodiment of the present disclosure will be described below in detail with reference to the drawings. In each of the following embodiments, the same parts are denoted by the same reference symbols, and a repetitive description thereof will be omitted.

The present disclosure will be described in the following order.

1. Embodiment (imaging device having stacked structure of three substrates)
2. First modification (planar configuration example 1)
3. Second modification (planar configuration example 2)
4. Third modification (planar configuration example 3)
5. Fourth modification (example in which inter-substrate contact portion is provided at central portion of pixel array unit)
6. Fifth modification (example of including planar transfer transistor)
7. Sixth modification (example in which one pixel is connected to one pixel circuit)
8. Seventh modification (configuration example of pixel isolation portion)
9. Second Embodiment
  9.1 First example
    9.1.1 Circuit configuration example
    9.1.2 Planar layout example
      9.1.2.1 Semiconductor layer of first substrate
      9.1.2.2 Semiconductor layer of second substrate
      9.1.2.3 Wiring layer of second substrate
    9.1.3 Effects
  9.2 Second example
  9.3 Third example
  9.4 Fourth example
  9.5 Fifth example
    9.5.1 Modification of fifth example 9.6 Sixth example
9.7 Seventh example
9.8 Eighth example
   9.8.1 First modification
   9.8.2 Second modification
   9.8.3 Third modification
   9.8.4 Fourth modification
   9.8.5 Fifth modification
9.9 Ninth example
   9.9.1 Circuit configuration example
   9.9.2 Example of planar layout of each layer
   9.9.3 Effects
10. Third Embodiment
10.1 First example
10.2 Second example
10.3 Third example
10.4 Fourth example
10.5 Fifth example
10.6 Sixth example
11. Modifications
12. Application example (imaging system)
13. Examples of application to products 1. Embodiment

[Functional Configuration of Imaging Device 1]

Figure 1:
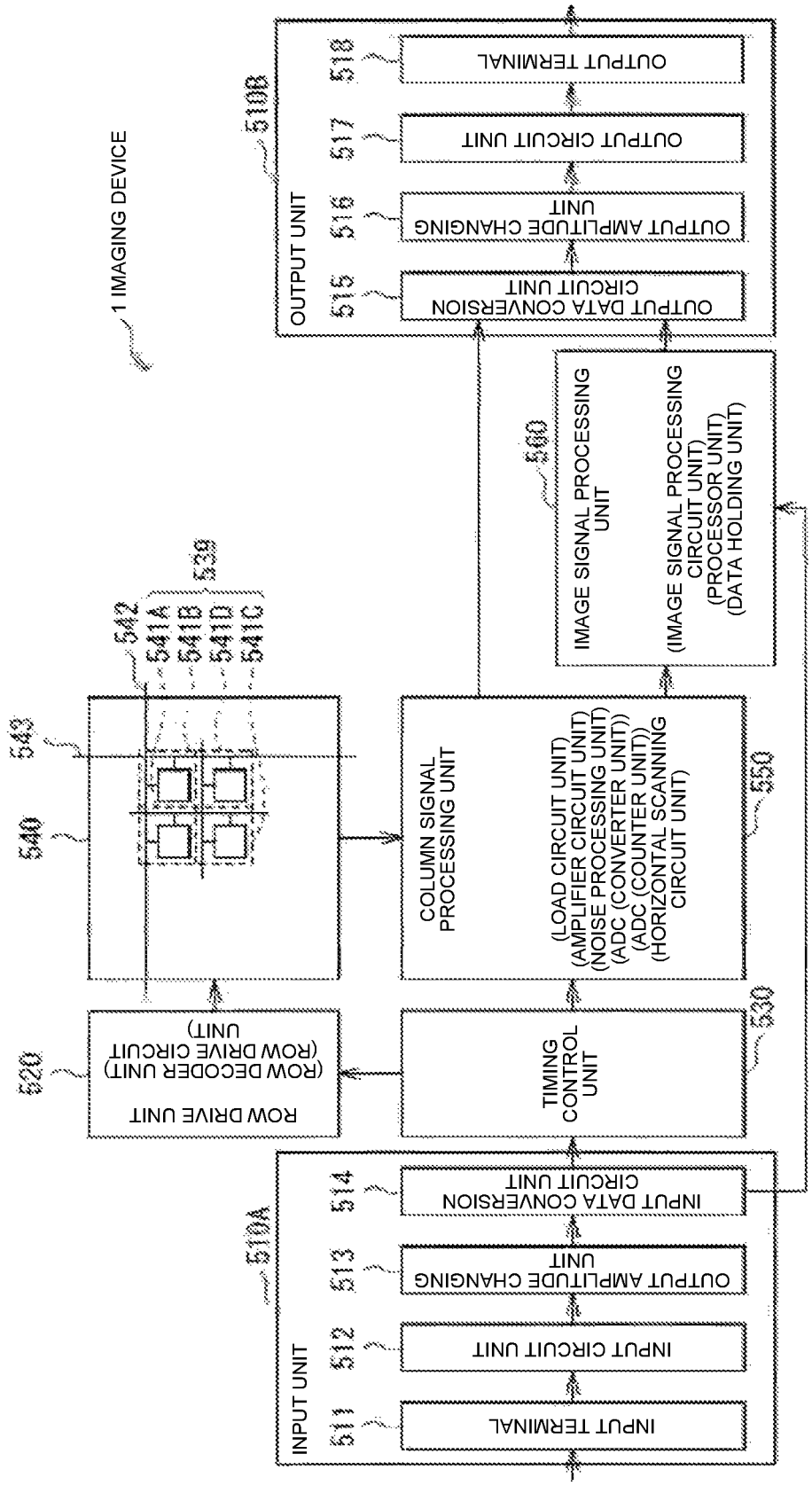
FIG. 1 is a block diagram illustrating an example of a functional configuration of an imaging device according to an embodiment of the present disclosure.

FIG. 1 is a block diagram illustrating an example of a functional configuration of an imaging device (imaging device 1) according to an embodiment of the present disclosure.

The imaging device 1 of FIG. 1 includes, for example, an input unit 510A, a row drive unit 520, a timing control unit 530, a pixel array unit 540, a column signal processing unit 550, an image signal processing unit 560, and an output unit 510B.

In the pixel array unit 540, pixels 541 are repeatedly arranged in an array. More specifically, a pixel sharing unit 539 including a plurality of pixels is a repeating unit, and is repeatedly arranged in an array including a row direction and a column direction. In the present specification, for convenience, the row direction may be referred to as an H direction, and the column direction orthogonal to the row direction may be referred to as a V direction. In the example of FIG. 1, one pixel sharing unit 539 includes four pixels (pixels 541A, 541B, 541C, and 541D). Each of the pixels 541A, 541B, 541C, and 541D includes a photodiode PD (illustrated in FIG. 6 and the like described below). The pixel sharing unit 539 is a unit of sharing one pixel circuit (a pixel circuit 210 in FIG. 3 described below). In other words, one pixel circuit (the pixel circuit 210 to be described below) is provided for every four pixels (pixels 541A, 541B, 541C, and 541D). By allowing the pixel circuit to operate in time division, a pixel signal of each of the pixels 541A, 541B, 541C, and 541D is sequentially read out. The pixels 541A, 541B, 541C, and 541D are each arranged in 2 rows×2 columns, for example. The pixel array unit 540 includes a plurality of row drive signal lines 542 and a plurality of vertical signal lines (column readout lines) 543 together with the pixels 541A, 541B, 541C, and 541D. The row drive signal line 542 drives the pixels 541 included in each of the plurality of pixel sharing units 539 arranged side by side in the row direction in the pixel array unit 540. In the pixel sharing unit 539, individual pixels arranged side by side in the row direction are driven. As will be described in detail below with reference to FIG. 4, the pixel sharing unit 539 is provided with a plurality of transistors. In order to drive each of the plurality of transistors, the plurality of row drive signal lines 542 is connected to one pixel sharing unit 539.

The pixel sharing unit 539 is connected to the vertical signal line (column readout line) 543. A pixel signal is read out from each of the pixels 541A, 541B, 541C, and 541D included in the pixel sharing unit 539 via the vertical signal line (column readout line) 543.

The row drive unit 520 includes, for example, a row address control unit that determines a position of a row for pixel drive, in other words, a row decoder unit, and a row drive circuit unit that generates a signal for driving the pixels 541A, 541B, 541C, and 541D.

The column signal processing unit 550 includes, for example, a load circuit unit connected to the vertical signal line 543 and configured to form a source follower circuit with the pixels 541A, 541B, 541C, and 541D (pixel sharing unit 539). The column signal processing unit 550 may include an amplifier circuit unit that amplifies a signal read out from the pixel sharing unit 539 via the vertical signal line 543. The column signal processing unit 550 may include a noise processing unit. The noise processing unit removes system noise levels from the signal read out from the pixel sharing unit 539 as a result of photoelectric conversion, for example.

The column signal processing unit 550 includes an analog-to-digital converter (ADC), for example. The analog-to-digital converter converts the signal read out from the pixel sharing unit 539 or the noise-processed analog signal into a digital signal. The ADC includes, for example, a comparator unit and a counter unit. The comparator unit compares an analog signal to be converted with a reference signal for comparison. The counter unit is supposed to count the time until the comparison result in the comparator unit is inverted. The column signal processing unit 550 may include a horizontal scanning circuit unit that performs control to scan the readout column.

The timing control unit 530 supplies a signal controlling timing to the row drive unit 520 and the column signal processing unit 550 based on the reference clock signal and the timing control signal input to the device.

The image signal processing unit 560 is a circuit that applies various types of signal processing on data obtained as a result of photoelectric conversion, in other words, data obtained as a result of an imaging operation in the imaging device 1. The image signal processing unit 560 includes, for example, an image signal processing circuit unit and a data holding unit. The image signal processing unit 560 may include a processor unit.

An example of signal processing executed in the image signal processing unit 560 is a tone curve correction process of increasing levels of gradations in a case where the AD converted imaging data is data obtained by imaging a dark subject and reducing the levels of gradations in a case where the AD converted imaging data is data obtained by imaging a bright subject. In this case, it is desirable to preliminarily store, in the data holding unit of the image signal processing unit 560, the characteristic data of the tone curve, that is, which tone curve is to be used as a bases of the correction of gradation of the imaging data.

The input unit 510A is, for example, a unit provided for inputting the above-described reference clock signal, the timing control signal, the characteristic data, and the like from the outside of the device to the imaging device 1. The timing control signal is, for example, a vertical synchronization signal, a horizontal synchronization signal, or the like. The characteristic data is data to be stored in the data holding unit of the image signal processing unit 560, for example. The input unit 510A includes an input terminal 511, an input circuit unit 512, an input amplitude changing unit 513, an input data conversion circuit unit 514, and a power supply unit (not illustrated), for example.

The input terminal 511 is an external terminal for inputting data. The input circuit unit 512 is a unit provided for capturing a signal input to the input terminal 511 into the imaging device 1. The input amplitude changing unit 513 changes the amplitude of the signal captured by the input circuit unit 512 to an amplitude highly usable inside the imaging device 1. The input data conversion circuit unit 514 changes the arrangement of data strings of the input data. The input data conversion circuit unit 514 is constituted with a serial-to-parallel conversion circuit, for example. The serial-to-parallel conversion circuit converts a serial signal received as input data into a parallel signal. The input unit 510A can omit the input amplitude changing unit 513 and the input data conversion circuit unit 514. The power supply unit supplies power set to various voltages required inside the imaging device 1 based on power supplied from the outside to the imaging device 1.

When the imaging device 1 is connected to an external memory device, the input unit 510A may be provided with a memory interface circuit that receives data from the external memory device. Examples of the external memory device include a flash drive, SRAM, and DRAM.

The output unit 510B outputs image data to the outside of the device. Examples of the image data include image data captured by the imaging device 1, image data that has undergone signal processing performed by the image signal processing unit 560, and the like. The output unit 510B includes, for example, an output data conversion circuit unit 515, an output amplitude changing unit 516, an output circuit unit 517, and an output terminal 518.

The output data conversion circuit unit 515 is, for example, constituted with a parallel-to-serial conversion circuit, and thus, the output data conversion circuit unit 515 converts a parallel signal used inside the imaging device 1 into a serial signal. The output amplitude changing unit 516 changes the amplitude of a signal used inside the imaging device 1. The signal having amplitude changed will have high usability in an external device connected to the outside of the imaging device 1. The output circuit unit 517 is a circuit that outputs data from the inside of the imaging device 1 to the outside of the device. The output circuit unit 517 also drives wiring outside the imaging device 1 connected to the output terminal 518. Data is output from the imaging device 1 to the outside of the device via the output terminal 518. The output unit 510B can omit the output data conversion circuit unit 515 and the output amplitude changing unit 516.

When the imaging device 1 is connected to an external memory device, the output unit 510B may be provided with a memory interface circuit that outputs data to the external memory device. Examples of the external memory device include a flash drive, SRAM, and DRAM.

[Schematic Configuration of Imaging Device 1]

Figure 2:
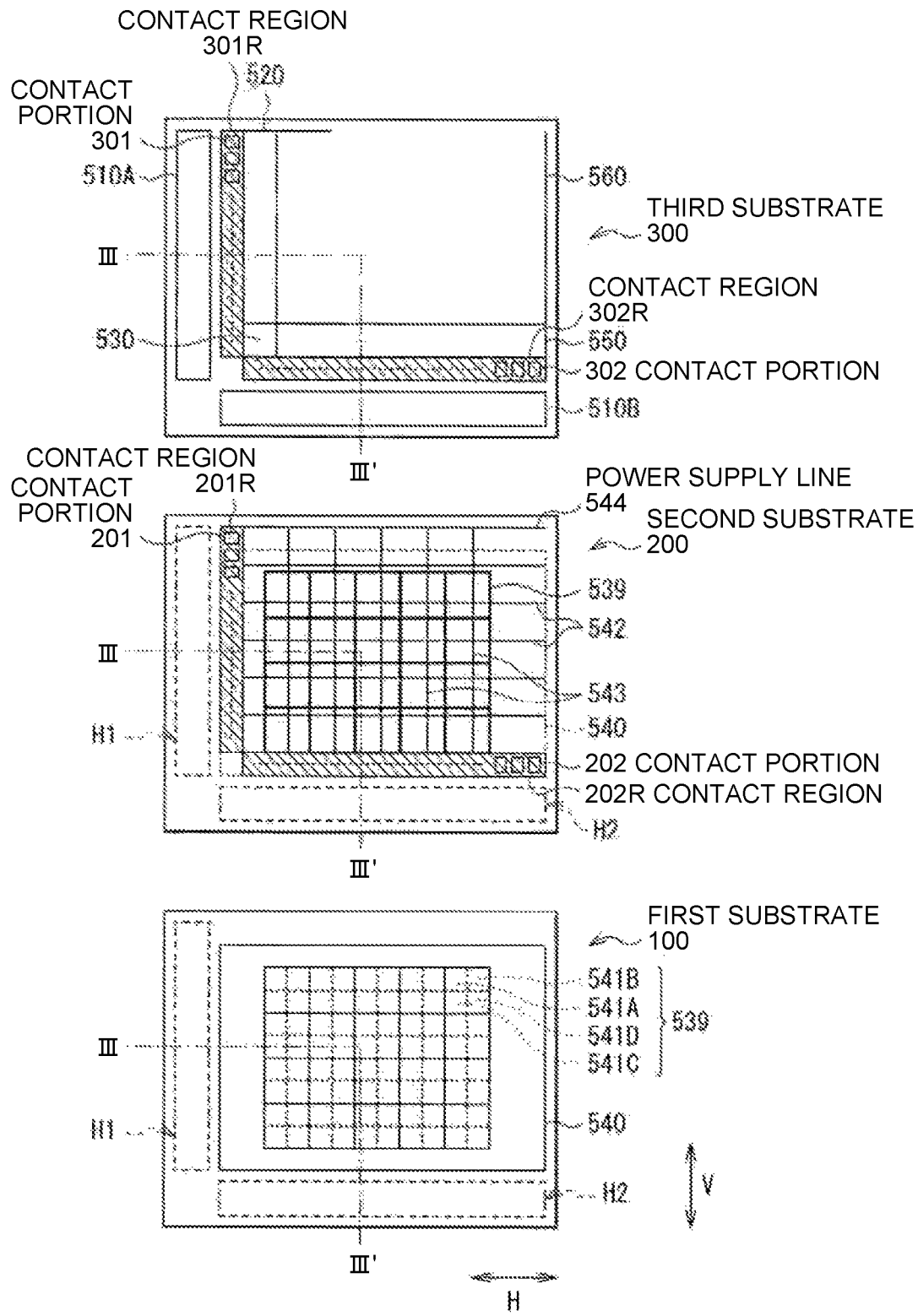
FIG. 2 is a schematic plan view illustrating a schematic configuration of the imaging device illustrated in FIG. 1.
Figure 3:
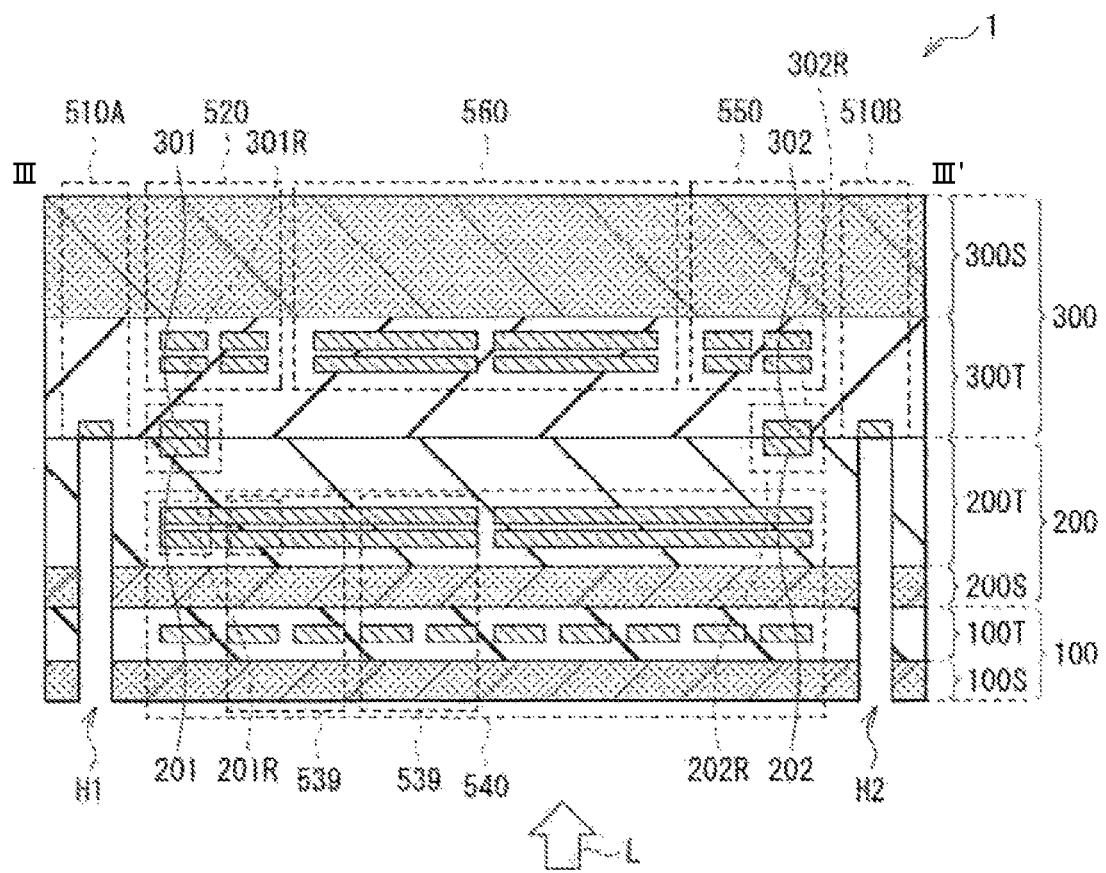
FIG. 3 is a schematic diagram illustrating a cross-sectional configuration taken along line III-III' in FIG. 2.

FIGS. 2 and 3 illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300. FIG. 3 schematically illustrates a cross-sectional configuration of the first substrate 100, the second substrate 200, and the third substrate 300 stacked on each other. FIG. 3 corresponds to the cross-sectional configuration taken along line III-III' illustrated in FIG. 2. The imaging device 1 is an imaging device having a three-dimensional structure formed by bonding three substrates (the first substrate 100, the second substrate 200, and the third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a combination of the wiring included in each substrate of the first substrate 100, the second substrate 200, and the third substrate 300 together with an interlayer insulating film around the wiring is referred to as wiring layers (100T, 200T, and 300T) provided on each of the substrates (the first substrate 100, the second substrate 200, and the third substrate 300) for convenience. The first substrate 100, the second substrate 200, and the third substrate 300 are stacked in this order, and specifically, the layers are stacked in order of the semiconductor layer 100S, the wiring layer 100T, the semiconductor layer 200S, the wiring layer 200T, the wiring layer 300T, and the semiconductor layer 300S in a stacking direction. Specific configurations of the first substrate 100, the second substrate 200, and the third substrate 300 will be described below. The arrow illustrated in FIG. 3 indicates the incident direction of light L on the imaging device 1. In the following cross-sectional views in the present specification, the light incident side in the imaging device 1 may be referred to as "lower", "lower side", or "below", and the side opposite to the light incident side may be referred to as "upper", "upper side", or "above" for convenience. In addition, in the present specification, for convenience, in a substrate including a semiconductor layer and a wiring layer, a side of the wiring layer may be referred to as a front surface, and a side of the semiconductor layer may be referred to as a back surface. The description of the specification is not limited to the above terms. The imaging device 1 is, for example, a back-illuminated imaging device in which light enters from the back surface side of the first substrate 100 having a photodiode.

Both the pixel array unit 540 and the pixel sharing unit 539 included in the pixel array unit 540 are constituted by using both the first substrate 100 and the second substrate 200. The first substrate 100 is provided with the plurality of pixels 541A, 541B, 541C, and 541D included in the pixel sharing unit 539. Each of these pixels 541 includes a photodiode (photodiode PD described below) and a transfer transistor (transfer transistor TR described below). The second substrate 200 is provided with a pixel circuit (a pixel circuit 210 to be described below) included in the pixel sharing unit 539. The pixel circuit reads out the pixel signal transferred from the photodiode of each of the pixels 541A, 541B, 541C, and 541D via the transfer transistor, or resets the photodiode. In addition to such a pixel circuit, the second substrate 200 includes a plurality of row drive signal lines 542 extending in the row direction and a plurality of vertical signal lines 543 extending in the column direction. The second substrate 200 further includes a power supply line 544 extending in the row direction. The third substrate 300 includes, for example, an input unit 510A, a row drive unit 520, a timing control unit 530, a column signal processing unit 550, an image signal processing unit 560, and an output unit 510B. The region in which the row drive unit 520 is located partially overlaps the pixel array unit 540 in the stacking direction of the first substrate 100, the second substrate 200, and the third substrate 300 (hereinafter, simply referred to as the stacking direction), for example. More specifically, the row drive unit 520 is provided in a region overlapping the vicinity of an end of the pixel array unit 540 in the H direction in the stacking direction (FIG. 2). The column signal processing unit 550 is provided, for example, in a region partially overlapping the pixel array unit 540 in the stacking direction. More specifically, the column signal processing unit 550 is provided in a region overlapping the vicinity of the end of the pixel array unit 540 in the V direction, in the stacking direction (FIG. 2). Although not illustrated, the input unit 510A and the output unit 510B may be disposed in a portion other than the third substrate 300, and may be disposed on the second substrate 200, for example. Alternatively, the input unit 510A and the output unit 510B may be provided on the back surface (light incident surface) side of the first substrate 100. The pixel circuit provided on the second substrate 200 may also be referred to as a pixel transistor circuit, a pixel transistor group, a pixel transistor, a pixel readout circuit, or a readout circuit as an alternative term. In the present specification, the term "pixel circuit" is used.

The first substrate 100 and the second substrate 200 are electrically connected by a through-substrate electrode (through-substrate electrodes 120E and 121E of FIG. 6 to be described below), for example. The second substrate 200 and the third substrate 300 are electrically connected via contact portions 201, 202, 301, and 302, for example. The contact portions 201 and 202 are provided on the second substrate 200, while the contact portions 301 and 302 are provided on the third substrate 300. The contact portion 201 of the second substrate 200 is in contact with the contact portion 301 of the third substrate 300, while the contact portion 202 of the second substrate 200 is in contact with the contact portion 302 of the third substrate 300. The second substrate 200 has a contact region 201R including a plurality of the contact portions 201 and a contact region 202R including a plurality of the contact portions 202. The third substrate 300 has a contact region 301R including a plurality of the contact portions 301 and a contact region 302R including a plurality of the contact portions 302. The contact regions 201R and 301R are provided between the pixel array unit 540 and the row drive unit 520 in the stacking direction (FIG. 3). In other words, the contact regions 201R and 301R are provided, for example, in a region where the row drive unit 520 (on the third substrate 300) and the pixel array unit 540 (on the second substrate 200) overlap each other in the stacking direction or in a region in their vicinity. The contact regions 201R and 301R are disposed at ends in the H direction in such regions, for example (FIG. 2). In the third substrate 300, for example, the contact region 301R is provided at a position overlapping a part of the row drive unit 520, specifically the end of the row drive unit 520 in the H direction (FIGS. 2 and 3). The contact portions 201 and 301 connect, for example, the row drive unit 520 provided on the third substrate 300 and the row drive signal line 542 provided on the second substrate 200 to each other. For example, the contact portions 201 and 301 may connect the input unit 510A provided on the third substrate 300, the power supply line 544, and a reference potential line (a reference potential line VSS described below) to each other. The contact regions 202R and 302R are provided between the pixel array unit 540 and the column signal processing unit 550 in the stacking direction (FIG. 3). In other words, the contact regions 202R and 302R are provided, for example, in a region where the column signal processing unit 550 (on the third substrate 300) and the pixel array unit 540 (on the second substrate 200) overlap each other in the stacking direction or in a region in their vicinity. The contact regions 202R and 302R are disposed at ends in the V direction in such regions, for example (FIG. 2). In the third substrate 300, for example, the contact region 301R is provided at a position overlapping a part of the column signal processing unit 550, specifically, the end of the column signal processing unit 550 in the V direction (FIGS. 2 and 3). The contact portions 202 and 302 are provided for connecting a pixel signal (a signal corresponding to the amount of charge generated as a result of photoelectric conversion in a photodiode) output from each of the plurality of pixel sharing units 539 included in the pixel array unit 540 to the column signal processing unit 550 provided on the third substrate 300. The pixel signal is to be transmitted from the second substrate 200 to the third substrate 300.

FIG. 3 is an example of a cross-sectional view of the imaging device 1 as described above. The first substrate 100, the second substrate 200, and the third substrate 300 are electrically connected to each other via the wiring layers 100T, 200T, and 300T. For example, the imaging device 1 includes an electrical connection portion that electrically connects the second substrate 200 and the third substrate 300 to each other. Specifically, the contact portions 201, 202, 301, and 302 are formed with electrodes formed of a conductive material. The conductive material is formed of, for example, a metal material such as copper (Cu), aluminum (Al), or gold (Au). By directly bonding wiring portions formed as electrodes, for example, the contact regions 201R, 202R, 301R, and 302R electrically connect the second substrate and the third substrate to each other, enabling signal input and/or output between the second substrate 200 and the third substrate 300.

An electrical connection portion that electrically connects the second substrate 200 and the third substrate 300 can be provided at a desired location. For example, as described as the contact regions 201R, 202R, 301R, and 302R in FIG. 3, the contact regions may be provided in a region overlapping the pixel array unit 540 in the stacking direction. The electrical connection portion may be provided in a region not overlapping the pixel array unit 540 in the stacking direction. Specifically, it may be provided in a region overlapping a peripheral portion disposed outside the pixel array unit 540 in the stacking direction.

The first substrate 100 and the second substrate 200 are provided with connection holes H1 and H2, for example. The connection holes H1 and H2 penetrate the first substrate 100 and the second substrate 200 (FIG. 3). The connection holes H1 and H2 are provided outside the pixel array unit 540 (or a portion overlapping the pixel array unit 540) (FIG. 2). For example, the connection hole H1 is arranged outside the pixel array unit 540 in the H direction, while the connection hole H2 is arranged outside the pixel array unit 540 in the V direction. For example, the connection hole H1 reaches the input unit 510A provided in the third substrate 300, while the connection hole H2 reaches the output unit 510B provided in the third substrate 300. The connection holes H1 and H2 may be hollow, and may at least a partially contain a conductive material. For example, there is a configuration in which a bonding wire is connected to an electrode formed as the input unit 510A and/or the output unit 510B. Alternatively, there is a configuration in which the electrode formed as the input unit 510A and/or the output unit 510B is connected to the conductive material provided in the connection holes H1 and H2. The conductive material provided in the connection holes H1 and H2 may be embedded in a part or all of the connection holes H1 and H2, and the conductive material may be formed on side walls of the connection holes H1 and H2.

FIG. 3 is a case of a structure in which the input unit 510A and the output unit 510B are provided on the third substrate 300, but the present disclosure is not limited thereto. For example, by sending a signal of the third substrate 300 to the second substrate 200 via the wiring layers 200T and 300T, the input unit 510A and/or the output unit 510B can be provided on the second substrate 200. Similarly, by sending a signal of the second substrate 200 to the first substrate 1000 via the wiring layers 100T and 200T, the input unit 510A and/or the output unit 510B can be provided on the first substrate 100.

Figure 4:
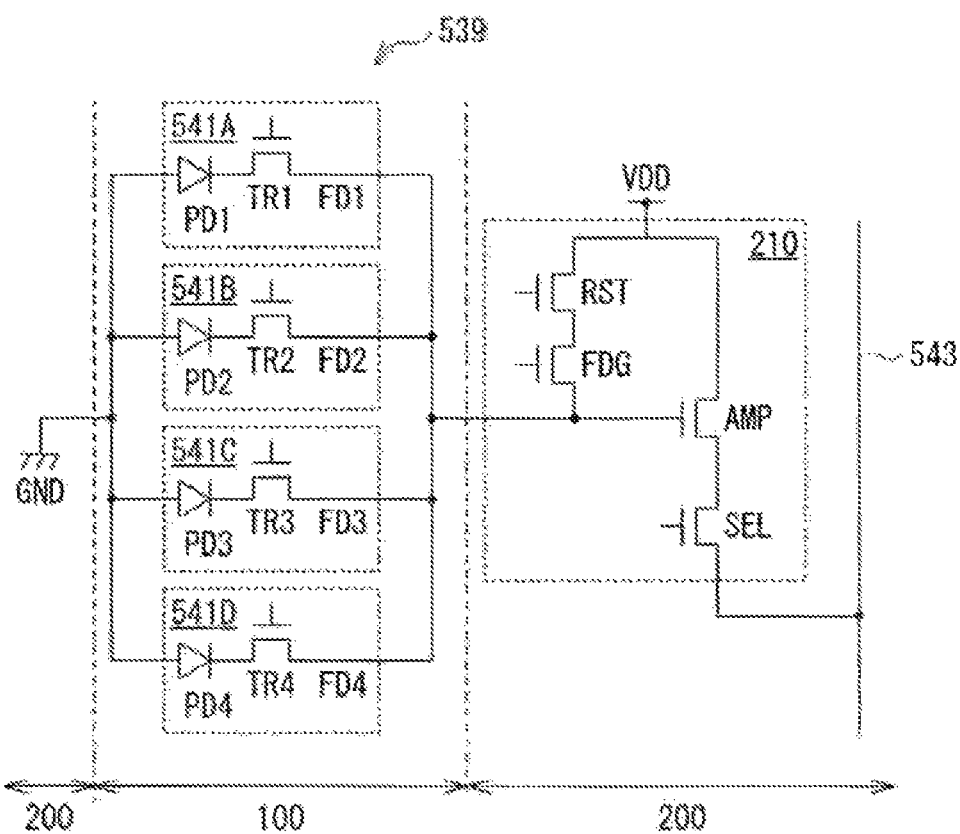
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes the plurality of pixels 541 (FIG. 4 illustrates four pixels 541, namely, the pixels 541A, 541B, 541C, and 541D), one pixel circuit 210 connected to the plurality of pixels 541, and a vertical signal line 5433 connected to the pixel circuit 210. The pixel circuit 210 includes four transistors, specifically, an amplification transistor AMP, a selection transistor SEL, a reset transistor RST, and an FD conversion gain switching transistor FD, for example. As described above, by operating one pixel circuit 210 in time division, the pixel sharing unit 539 is configured to sequentially output the pixel signals of the four pixels 541 (pixels 541A, 541B, 541C, and 541D) included in the pixel sharing unit 539 to the vertical signal line 543. The mode in which one pixel circuit 210 is connected to the plurality of pixels 541 and pixel signals of the plurality of pixels 541 are output by the one pixel circuit 210 in time division is referred to as a mode in which "the plurality of pixels 541 shares one pixel circuit 210".

The pixels 541A, 541B, 541C, and 541D have components common to each other. Hereinafter, in order to distinguish the components of the pixels 541A, 541B, 541C, and 541D from each other, an identification number 1 is assigned to the end of the sign of the component of the pixel 541A, an identification number 2 is assigned to the end of the sign of the component of the pixel 541B, an identification number 3 is assigned to the end of the sign of the component of the pixel 541C, and an identification number 4 is assigned to the end of the sign of the component of the pixel 541D. When there is no need to distinguish the components of the pixels 541A, 541B, 541C, and 541D from each other, the identification numbers at the ends of the signs of the components of the pixels 541A, 541B, 541C, and 541D are omitted.

The pixels 541A, 541B, 541C, and 541D each include, for example, a photodiode PD, a transfer transistor TR electrically connected to the photodiode PD, and a node of floating diffusion FD electrically connected to the transfer transistor TR. The photodiode PD (PD1, PD2, PD3, and PD4) has a cathode electrically connected to the source of the transfer transistor TR and has an anode electrically connected to a reference potential line (for example, ground). The photodiode PD photoelectrically converts incident light and generates a charge corresponding to the amount of received light. The transfer transistor TR (transfer transistors TR1, TR2, TR3, or TR4) is, for example, an n type complementary metal oxide semiconductor (CMOS) transistor. The transfer transistor TR has its drain electrically connected to the floating diffusion FD, and has its gate electrically connected to the drive signal line. This drive signal line is a part of the plurality of row drive signal lines 542 (refer to FIG. 1) connected to one pixel sharing unit 539. The transfer transistor TR transfers the charge generated in the photodiode PD to the floating diffusion FD. The floating diffusion FD (specifically, the floating diffusion FD1, FD2, FD3, or FD4) is an n type diffusion layer region formed in the p type semiconductor layer. The floating diffusion FD is a charge holding means of temporarily holding the charge transferred from the photodiode PD, and is a charge-voltage conversion means of generating a voltage corresponding to the charge amount.

The four nodes of floating diffusion FD (specifically, floating diffusion FD1, FD2, FD3, and FD4) included in one pixel sharing unit 539 are electrically connected to each other, and are electrically connected to the gate of the amplification transistor AMP and the source of an FD conversion gain switching transistor FDG. The drain of the FD conversion gain switching transistor FDG is connected to the source of the reset transistor RST, and the gate of the FD conversion gain switching transistor FDG is connected to a drive signal line. This drive signal line is a part of the plurality of row drive signal lines 542 connected to one pixel sharing unit 539. The drain of the reset transistor RST is connected to a power supply line VDD, and the gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. The source of the selection transistor SEL is connected to the vertical signal line 543, while the gate of the selection transistor SEL is connected to the drive signal line. This drive signal line is a part of the plurality of row drive signal lines 542 connected to one pixel sharing unit 539.

Figure 6:
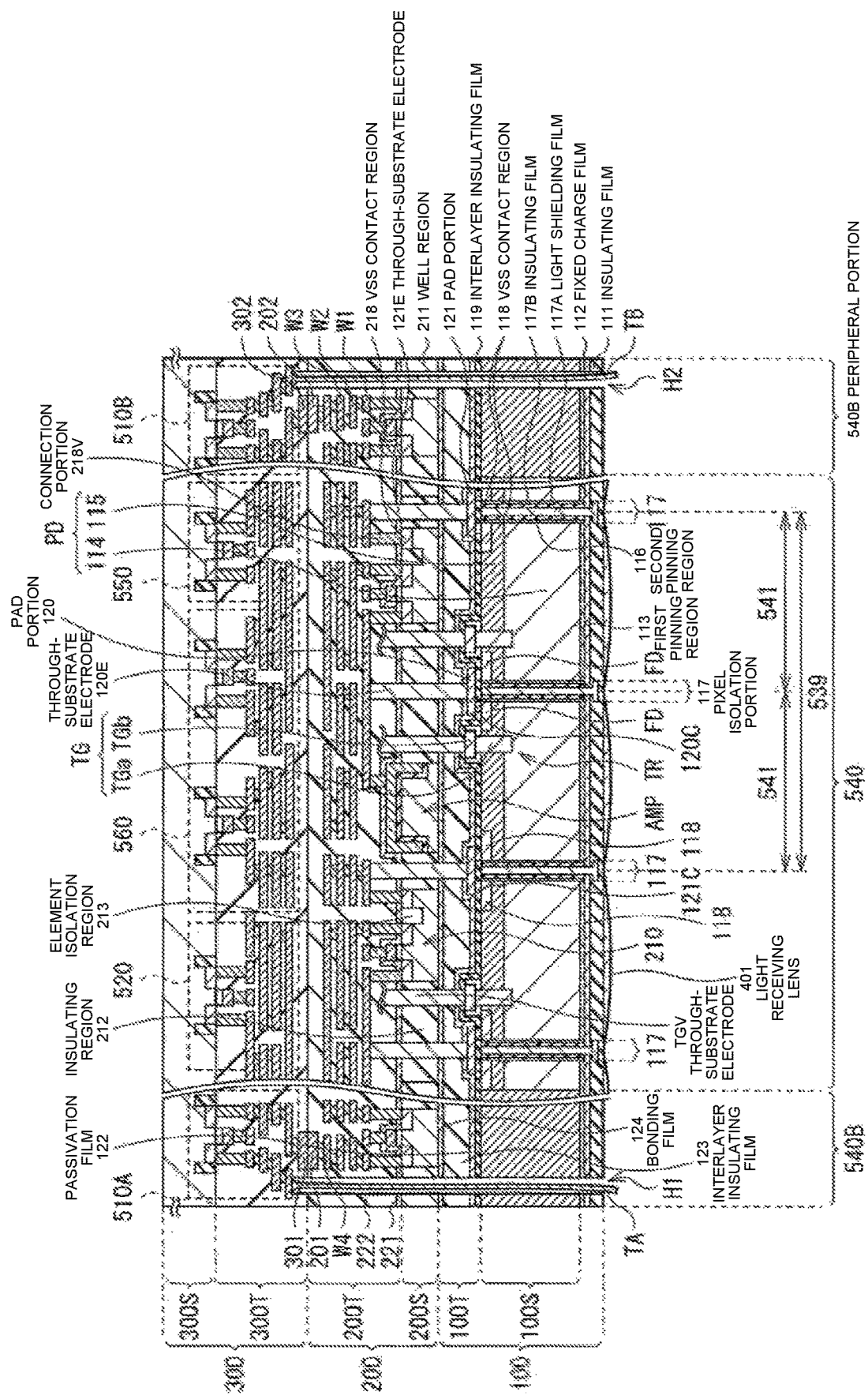
FIG. 6 is a schematic cross-sectional view illustrating an example of a specific configuration of the imaging device illustrated in FIG. 3.

When the transfer transistor TR is turned on, the transfer transistor TR transfers the charge of the photodiode PD to the floating diffusion FD. A gate (transfer gate TG) of the transfer transistor TR includes, for example, an electrode referred to as a vertical electrode, and is provided to extend from a front surface of a semiconductor layer (a semiconductor layer 100S in FIG. 6 to be described below) to a depth reaching the PD as illustrated in FIG. 6 to be described below. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal from the pixel circuit 210. The amplification transistor AMP generates a signal at a voltage corresponding to the level of the charge held in the floating diffusion FD as a pixel signal. The amplification transistor AMP is connected to the vertical signal line 543 via the selection transistor SEL. The amplification transistor AMP constitutes a source follower together with a load circuit unit (refer to FIG. 1) connected to the vertical signal line 543 in the column signal processing unit 550. When the selection transistor SEL is turned on, the amplification transistor AMP outputs the voltage of the floating diffusion FD to the column signal processing unit 550 via the vertical signal line 543. The reset transistor RST, the amplification transistor AMP, and the selection transistor SEL are N type CMOS transistors, for example.

The FD conversion gain switching transistor FDG is used to change the gain of charge-voltage conversion in the floating diffusion FD. In general, a pixel signal is weak at the time of shooting in a dark place. Based on Q=CV, when the capacitance (FD capacitance C) of the floating diffusion FD is large at the time of performing charge-voltage conversion, this results in a small V at the time of conversion into a voltage by the amplification transistor AMP. In contrast, the pixel signal has a great strength in a bright place, making it difficult to hold the charge of the photodiode PD at the floating diffusion FD unless the FD capacitance C is large enough. Furthermore, the FD capacitance C needs to be large so that V when converted into a voltage by the amplification transistor AMP does not become too high (in other words, so as to be low). In view of these, when the FD conversion gain switching transistor FDG is turned on, the gate capacitance of the FD conversion gain switching transistor FDG increases, leading to an increase in the entire FD capacitance C. In contrast, when the FD conversion gain switching transistor FDG is turned off, the entire FD capacitance C decreases. In this manner, switching on/off of the FD conversion gain switching transistor FDG can achieve variable FD capacitance C, making it possible to switch the conversion efficiency. The FD conversion gain switching transistor FDG is an N type CMOS transistor, for example.

Note that there may be a configuration without the FD conversion gain switching transistor FDG. At this time, for example, the pixel circuit 210 includes three transistors, for example, an amplification transistor AMP, a selection transistor SEL, and a reset transistor RST. The pixel circuit 210 includes, for example, at least one of pixel transistors such as an amplification transistor AMP, a selection transistor SEL, a reset transistor RST, and an FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, while the gate of the selection transistor SEL is electrically connected to the row drive signal line 542 (refer to FIG. 1). The source of the amplification transistor AMP (an output end of the pixel circuit 210) is electrically connected to the vertical signal line 543, while the gate of the amplification transistor AMP is electrically connected to the source of the reset transistor RST. Note that, although not illustrated, the number of pixels 541 sharing one pixel circuit 210 may be other than four. For example, two or eight pixels 541 may share one pixel circuit 210.

Figure 5:
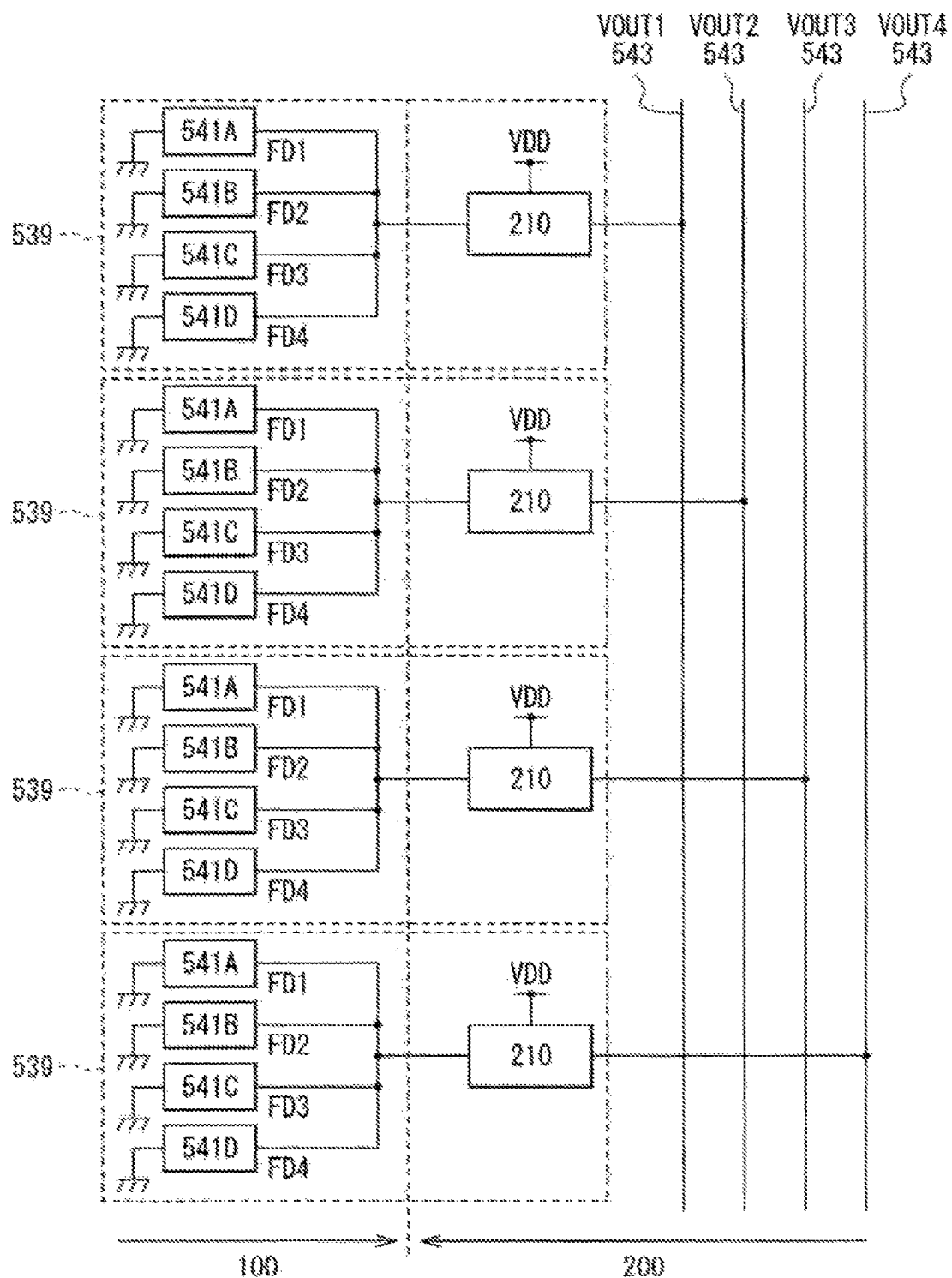
FIG. 5 is a diagram illustrating an example of a connection mode between a plurality of pixel sharing units and a plurality of vertical signal lines.

FIG. 5 illustrates an example of a connection mode between the plurality of pixel sharing units 539 and the vertical signal line 543. For example, the four pixel sharing units 539 aligned in the column direction are divided into four groups, and the vertical signal line 543 is connected to each of the four groups. For simplification, FIG. 5 illustrates an example in which each of the four groups has one pixel sharing unit 539, but the four groups may each include a plurality of pixel sharing units 539. In this manner, in the imaging device 1, the plurality of pixel sharing units 539 aligned in the column direction may be divided into groups including one or a plurality of pixel sharing units 539. For example, the vertical signal line 543 and the column signal processing unit 550 are connected to each of the groups, and pixel signals can be simultaneously read out from each of the groups. Alternatively, in the imaging device 1, one vertical signal line 543 may be connected to the plurality of pixel sharing units 539 aligned in the column direction. At this time, pixel signals are sequentially read out from the plurality of pixel sharing units 539 connected to the one vertical signal line 543 in time division.

[Specific Configuration of Imaging Device 1]

FIG. 6 illustrates an example of a cross-sectional configuration in a direction perpendicular to main surfaces of the first substrate 100, the first substrate 100, and the third substrate 300 of the imaging device 1. FIG. 6 schematically illustrates the positional relationship of the components to facilitate understanding, and may be different from the actual cross section. In the imaging device 1, a first substrate 100, a second substrate 200, and a third substrate 300 are stacked in this order. The imaging device 1 further includes a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging device 1 is, for example, a back-illuminated imaging device. The imaging device 1 includes a pixel array unit 540 disposed in a central portion and a peripheral portion 540B disposed at an outer side of the pixel array unit 540.

The first substrate 100 includes an insulating film 111, a fixed charge film 112, a semiconductor layer 100S, and a wiring layer 100T in this order from the light receiving lens 401 side. The semiconductor layer 100S is formed of a silicon substrate, for example. The semiconductor layer 100S includes, for example, a p well layer 115 in a part of the front surface (surface on the wiring layer 100T side) and in the vicinity thereof, and an n type semiconductor region 114 in the other region (region deeper than the p well layer 115). For example, the n type semiconductor region 114 and the p well layer 115 constitute a pn junction type photodiode PD. The p well layer 115 is a p type semiconductor region.

Figure 7A:
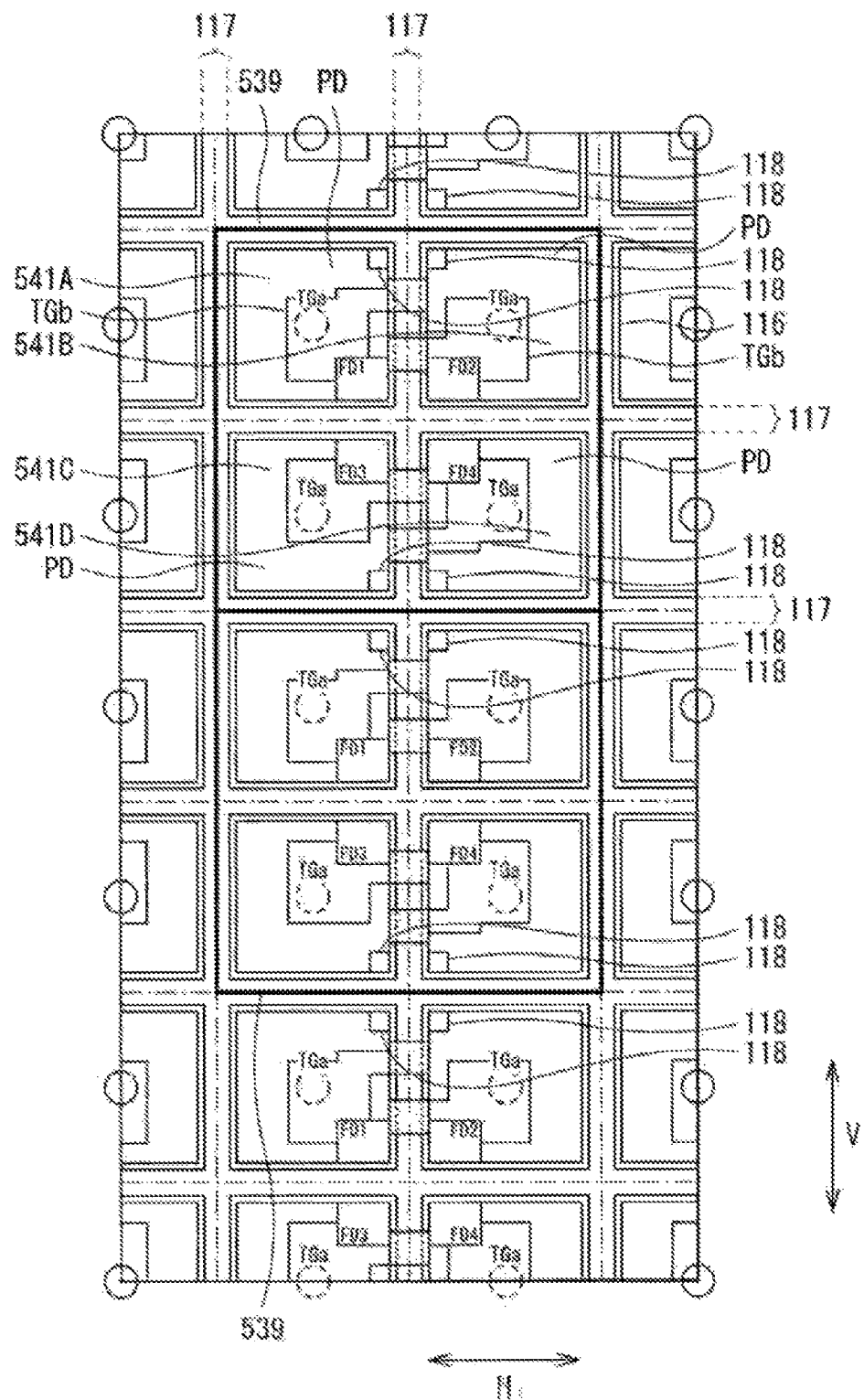
FIG. 7A is a schematic diagram illustrating an example of a planar configuration of a main part of a first substrate illustrated in FIG. 6.

FIG. 7A illustrates an example of a planar configuration of the first substrate 100. FIG. 7A mainly illustrates a planar configuration of a pixel isolation portion 117, a photodiode PD, floating diffusion FD, a VSS contact region 118, and a transfer transistor TR of the first substrate 100. The configuration of the first substrate 100 will be described with reference to FIG. 7A together with FIG. 6.

The floating diffusion FD and the VSS contact region 118 are provided in the vicinity of the front surface of the semiconductor layer 100S. The floating diffusion FD includes an n type semiconductor region provided in the p well layer 115. The nodes of floating diffusion FD (floating diffusion FD1, FD2, FD3, and FD4) of each of the pixels 541A, 541B, 541C, and 541D are provided close to each other in the central portion of the pixel sharing unit 539, for example (FIG. 7A). Although details will be described below, the four nodes of floating diffusion (floating diffusion FD1, FD2, FD3, and FD4) included in the pixel sharing unit 539 are electrically connected to each other via an electrical connection means (a pad portion 120 described below) in the first substrate 100 (more specifically, in the wiring layer 100T). Furthermore, the floating diffusion FD is connected from the first substrate 100 to the second substrate 200 (more specifically, from the wiring layer 100T to the wiring layer 200T) via an electrical means (a through-substrate electrode 120E described below). In the second substrate 200 (more specifically, inside the wiring layer 200T), the floating diffusion FD is electrically connected, via this electrical means, to the gate of the amplification transistor AMP and the source of the FD conversion gain switching transistor FDG.

The VSS contact region 118 is a region electrically connected to the reference potential line VSS, and is separated away from the floating diffusion FD. For example, in the pixels 541A, 541B, 541C, and 541D, the floating diffusion FD is disposed at one end and the VSS contact region 118 is disposed at the other end of each of pixels in the V direction (FIG. 7A). The VSS contact region 118 includes, for example, a p type semiconductor region. The VSS contact region 118 is connected to a ground potential or a fixed potential, for example. This allows the reference potential to be supplied to the semiconductor layer 100S.

Together with the photodiode PD, the floating diffusion FD, and the VSS contact region 118, the transfer transistor TR is provided on the first substrate 100. The photodiode PD, the floating diffusion FD, the VSS contact region 118, and the transfer transistor TR are provided in each of the pixels 541A, 541B, 541C, and 541D. The transfer transistor TR is provided on the front surface side (side opposite to the light incident surface side, being the second substrate 200 side) of the semiconductor layer 100S. The transfer transistor TR has a transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. The vertical portion TGa has one end being in contact with the horizontal portion TGb and the other end being provided in the n type semiconductor region 114. With a configuration of the transfer transistor TR using a vertical transistor like this, it is possible to suppress an occurrence of a transfer failure of the pixel signal and improve readout efficiency of the pixel signal.

The horizontal portion TGb of the transfer gate TG extends from a position facing the vertical portion TGa toward the central portion of the pixel sharing unit 539 in the H direction, for example (FIG. 7A). With this configuration, the position, in the H direction, of the through-substrate electrode (through-substrate electrode TGV to be described below) reaching the transfer gate TG can be brought close to the position, in the H direction, of the through-substrate electrodes (through-substrate electrodes 120E and 121E to be described below) connected to the floating diffusion FD and the VSS contact region 118. For example, the plurality of pixel sharing units 539 provided on the first substrate 100 has the same configuration (FIG. 7A).

Figure 7B:
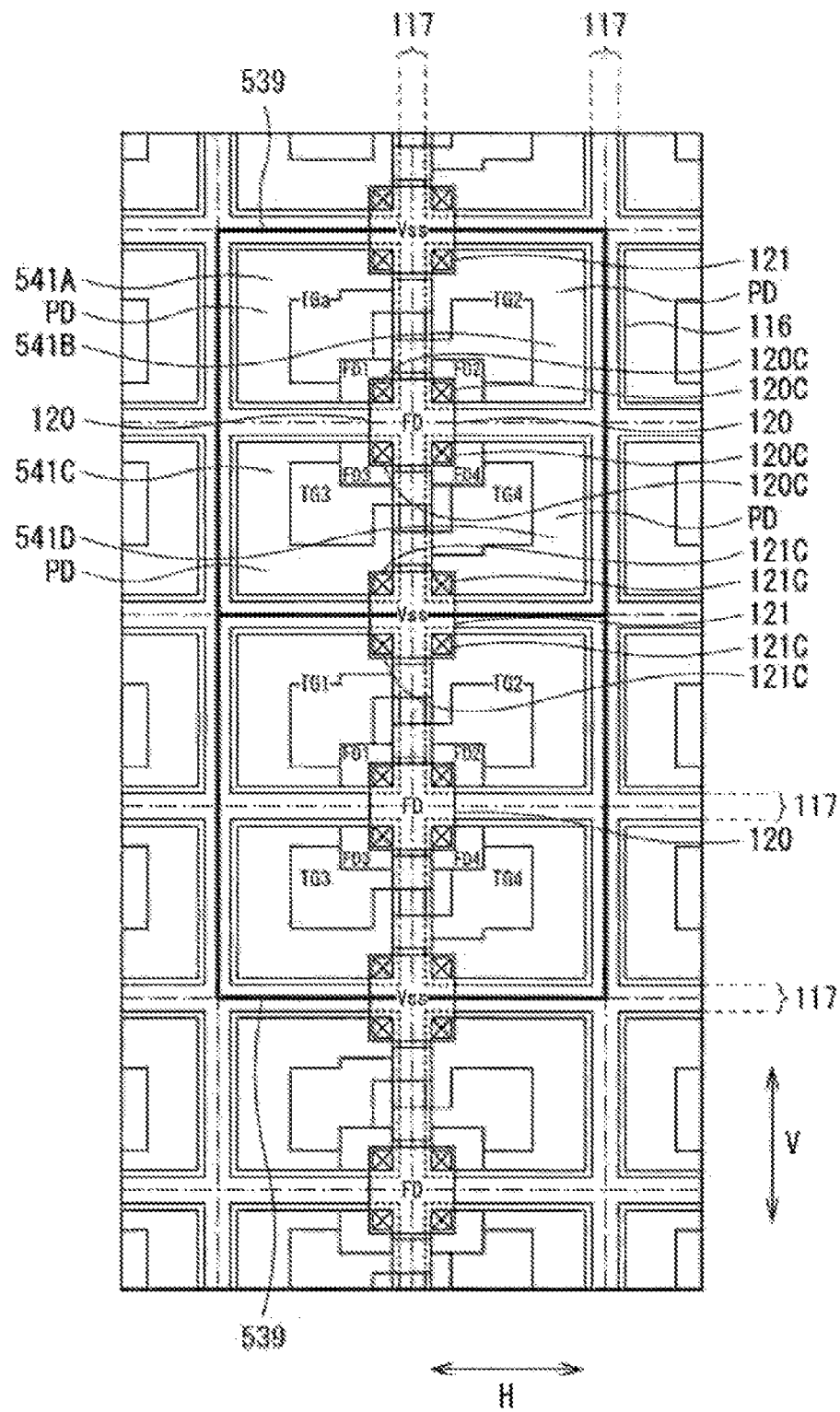
FIG. 7B is a schematic diagram illustrating a planar configuration of a pad portion together with the main part of the first substrate illustrated in FIG. 7A.

The semiconductor layer 100S is provided with the pixel isolation portion 117 that isolates the pixels 541A, 541B, 541C, and 541D from each other. The pixel isolation portion 117 is formed to extend in the normal direction of the semiconductor layer 100S (direction perpendicular to the front surface of the semiconductor layer 100S). The pixel isolation portion 117 is provided so as to partition the pixels 541A, 541B, 541C, and 541D from each other, and has a grid-like planar shape, for example (FIGS. 7A and 7B). For example, the pixel isolation portion 117 electrically and optically isolates the pixels 541A, 541B, 541C, and 541D from each other. The pixel isolation portion 117 includes a light shielding film 117A and an insulating film 117B, for example. For example, the light shielding film 117A is formed of tungsten (W) or the like. The insulating film 117B is provided between the light shielding film 117A and the p well layer 115 or the n type semiconductor region 114. The insulating film 117B is formed of silicon oxide (SiO), for example. The pixel isolation portion 117 has a full trench isolation (FTI) structure, for example, and penetrates the semiconductor layer 100S. Although not illustrated, the pixel isolation portion 117 is not limited to the FTI structure penetrating the semiconductor layer 100S. For example, it is allowable to use a deep trench isolation (DTI) structure not penetrating the semiconductor layer 100S. The pixel isolation portion 117 extends in the normal direction of the semiconductor layer 100S and is formed in a partial region of the semiconductor layer 100S.

The semiconductor layer 100S includes a first pinning region 113 and a second pinning region 116, for example. The first pinning region 113 is provided in the vicinity of the back surface of the semiconductor layer 100S so as to be arranged between the n type semiconductor region 114 and the fixed charge film 112. The second pinning region 116 is provided on a side surface of the pixel isolation portion 117, specifically, between the pixel isolation portion 117 and the p well layer 115 or the n type semiconductor region 114. The first pinning region 113 and the second pinning region 116 are formed with a p type semiconductor region, for example.

There is provided a fixed charge film 112 having a negative fixed charge between the semiconductor layer 100S and the insulating film 111. With the electric field induced by the fixed charge film 112, the first pinning region 113 of a hole accumulation layer is formed at an interface on the light-receiving surface (back surface) side of the semiconductor layer 100S. This can suppress the generation of dark current due to the interface state on the light-receiving surface side of the semiconductor layer 100S. The fixed charge film 112 is formed of an insulating film having a negative fixed charge, for example. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided at a position facing the pixel isolation portion 117 in the semiconductor layer 100S, for example. The insulating film 111 is provided so as to cover the light shielding film 117A. The insulating film 111 is formed of silicon oxide, for example.

The wiring layer 100T, provided between the semiconductor layer 100S and the second substrate 200, includes an interlayer insulating film 119, pad portions 120 and 121, a passivation film 122, an interlayer insulating film 123, and a bonding film 124 in this order from the semiconductor layer 100S side. The horizontal portion TGb of the transfer gate TG is provided in the wiring layer 100T, for example. The interlayer insulating film 119 is provided over the entire front surface of the semiconductor layer 100S and is in contact with the semiconductor layer 100S. The interlayer insulating film 119 is formed of a silicon oxide film, for example. Note that the configuration of the wiring layer 100T is not limited to the above, and any configuration including wiring and an insulating film may be used.

FIG. 7B illustrates the configuration of the pad portions 120 and 121 together with the planar configuration illustrated in FIG. 7A. The pad portions 120 and 121 are provided in a selected region on the interlayer insulating film 119. The pad portion 120 is provided for connecting the nodes of the floating diffusion FD (floating diffusion FD1, FD2, FD3, and FD4) of the pixels 541A, 541B, 541C, and 541D to each other. For example, the pad portion 120 is disposed at the central portion of the pixel sharing unit 539 in plan view for each of the pixel sharing units 539 (FIG. 7B). The pad portion 120 is provided across the pixel isolation portion 117, and is arranged so as to overlap at least a part of each of nodes of the floating diffusion FD1, FD2, FD3, and FD4 (FIGS. 6 and 7B). Specifically, the pad portion 120 is formed in a region overlapping at least a part of each of the plurality of nodes of floating diffusion FD (floating diffusion FD1, FD2, FD3, and FD4) sharing the pixel circuit 210 and at least a part of the pixel isolation portion 117 formed between the plurality of photodiodes PD (photodiodes PD1, PD2, PD3, and PD4) sharing the pixel circuit 210, in a direction perpendicular to the front surface of the semiconductor layer 100S. The interlayer insulating film 119 is provided with a connection via 120C for electrically connecting the pad portion 120 and nodes of the floating diffusion FD1, FD2, FD3, and FD4. The connection via 120C is provided in each of the pixels 541A, 541B, 541C, and 541D. For example, by embedding a part of the pad portion 120 in the connection via 120C, the pad portion 120 is electrically connected to each of nodes of the floating diffusion FD1, FD2, FD3, and FD4.

The pad portion 121 is provided for connecting the plurality of VSS contact regions 118 to each other. For example, the VSS contact region 118 provided in the pixels 541C and 541D of one pixel sharing unit 539 adjacent in the V direction is electrically connected with the VSS contact region 118 provided in the pixels 541A and 541B of the other pixel sharing unit 539 by the pad portion 121. The pad portion 121 is provided across the pixel isolation portion 117, for example, and is disposed to overlap at least a part of each of the four VSS contact regions 118. Specifically, the pad portion 121 is formed in a region overlapping at least a part of each of the plurality of VSS contact regions 118 and at least a part of the pixel isolation portion 117 formed between the plurality of VSS contact regions 118 in a direction perpendicular to the front surface of the semiconductor layer 100S. The interlayer insulating film 119 is provided with a connection via 121C for electrically connecting the pad portion 121 and the VSS contact region 118 to each other. The connection via 121C is provided in each of the pixels 541A, 541B, 541C, and 541D. For example, by embedding a part of the pad portion 121 in the connection via 121C, the pad portion 121 and the VSS contact region 118 are electrically connected to each other. For example, the pad portion 120 and the pad portion 121 of each of the plurality of pixel sharing units 539 aligned in the V direction are arranged at substantially the same position in the H direction (FIG. 7B).

By providing the pad portion 120, it is possible to reduce the number of wiring lines for connecting from each floating diffusion FD to the pixel circuit 210 (for example, a gate electrode of the amplification transistor AMP) in the entire chip. Similarly, by providing the pad portion 121, wiring for supplying a potential to each VSS contact region 118 can be reduced in the entire chip. This configuration makes it possible to reduce the area of the entire chip, suppress the electrical interference between the wiring lines in the miniaturized pixel, and/or reduce the cost by decreased number of components.

The pad portions 120 and 121 can be provided at desired positions on the first substrate 100 and the second substrate 200. Specifically, the pad portions 120 and 121 can be provided in either the wiring layer 100T or an insulating region 212 of the semiconductor layer 200S. When provided in the wiring layer 100T, the pad portions 120 and 121 may be brought into direct contact with the semiconductor layer 100S. Specifically, the pad portions 120 and 121 may be directly connected to at least a part of each of the floating diffusion FD and/or the VSS contact region 118. Alternatively, it is allowable to use a configuration in which the connection vias 120C and 121C are provided from the floating diffusion FD and/or the VSS contact region 118 connected to the pad portions 120 and 121, respectively, and the pad portions 120 and 121 may be provided at desired positions of the insulating region 2112 of the wiring layer 100T and the semiconductor layer 200S.

In particular, in a case where the pad portions 120 and 121 are provided in the wiring layer 100T, it is possible to reduce the number of wiring lines connected to the floating diffusion FD and/or the VSS contact region 118 in the insulating region 212 of the semiconductor layer 200S. With this configuration, in the second substrate 200 forming the pixel circuit 210, it is possible to reduce the area of the insulating region 212 for forming the through-substrate wiring for connecting the floating diffusion FD to the pixel circuit 210. This makes it possible to ensure a large area of the second substrate 200 forming the pixel circuit 210. By ensuring the area of the pixel circuit 210, it is possible to form pixel transistors in large areas and contribute to image quality improvement by noise reduction and the like.

In particular, in a case where the FTI structure is used for the pixel isolation portion 117, it is preferable to provide the floating diffusion FD and/or the VSS contact region 118 in each of the pixels 541. Therefore, by using the configurations of the pad portions 120 and 121, it is possible to greatly decrease the wiring lines connecting the first substrate 100 and the second substrate 200 to each other.

Furthermore, as illustrated in FIG. 7B, for example, the pad portion 120 connected to the plurality of floating diffusions FD and the pad portion 121 connected to the plurality of VSS contact regions 118 are alternately arranged linearly in the V direction. Furthermore, the pad portions 120 and 121 are formed at positions surrounded by the plurality of photodiodes PD, the plurality of transfer gates TG, and the plurality of nodes of floating diffusion FD. This makes it possible to achieve flexible arrangement of elements other than the floating diffusion FD and the VSS contact region 118 on the first substrate 100 forming a plurality of elements, leading to higher efficiency of the layout of the entire chip. Furthermore, it is possible to achieve symmetry in the layout of the elements formed in each pixel sharing unit 539 and to suppress variations in characteristics of each pixel 541.

The pad portions 120 and 121 are each formed of polysilicon (Poly Si), for example, and more specifically, doped polysilicon doped with impurities. The pad portions 120 and 121 are preferably formed of a conductive material having high heat resistance, such as polysilicon, tungsten (W), titanium (Ti), or titanium nitride (TiN). This makes it possible to form the pixel circuit 210 after bonding the semiconductor layer 200S of the second substrate 200 to the first substrate 100. Hereinafter, the reason will be described. Note that, in the following description, a method of forming the pixel circuit 210 after bonding the first substrate 100 and the semiconductor layer 200S of the second substrate 200 is referred to as a first manufacturing method.

Here, there is another conceivable method of forming the pixel circuit 210 on the second substrate 200 and thereafter bonding the second substrate 200 to the first substrate 100 (hereinafter referred to as a second manufacturing method). In the second manufacturing method, an electrode for electrical connection is formed in advance on the front surface of the first substrate 100 (front surface of the wiring layer 100T) and the front surface of the second substrate 200 (front surface of the wiring layer 200T) individually. Simultaneously to the bonding of the first substrate 100 and the second substrate 200 to each other, the electrodes for electrical connection formed on the front surface of the first substrate 100 and the front surface of the second substrate 200 come into contact with each other. This leads to formation of an electrical connection between the wiring included in the first substrate 100 and the wiring included in the second substrate 200. Therefore, by adopting the configuration of the imaging device 1 using the second manufacturing method, for example, manufacturing can be performed using an appropriate process for the configuration of each of the first substrate 100 and the second substrate 200, leading to achievement of manufacture of a high-quality and high-performance imaging device.

When the first substrate 100 and the second substrate 200 are bonded to each other with such a second manufacturing method, an alignment error can occur due to a manufacturing device for bonding. In addition, when the first substrate 100 and the second substrate 200 are bonded to each other, with the first substrate 100 and the second substrate 200 each having the size about several tens of centimeters in diameter, for example, there is a possibility that expansion and contraction of the substrates occur in microscopic regions of the first substrate 100 and the second substrate 200. This expansion and contraction of the substrates is caused by a slight shift in the timing of contact between the substrates. Due to such expansion and contraction of the first substrate 100 and the second substrate 200, an error might occur in the positions of the electrodes for electrical connection formed on the front surface of the first substrate 100 and the front surface of the second substrate 200. In the second manufacturing method, it is preferable to take measures so that the electrodes of the first substrate 100 and the second substrate 200 come into contact with each other even with occurrence of such an error. Specifically, at least one, preferably both, of the electrodes of the first substrate 100 and the second substrate 200 can be formed to have a large size in consideration of the above error. Therefore, with the use of the second manufacturing method, for example, the size of the electrode formed on the front surface of the first substrate 100 or the second substrate 200 (the size in the substrate planar direction) is larger than the size of an internal electrode extending from the inside of the first substrate 100 or the second substrate 200 to the front surface in the thickness direction.

On the other hand, by forming the pad portions 120 and 121 using a heat-resistant conductive material, the first manufacturing method can be applied. In the first manufacturing method, the first substrate 100 including the photodiode PD, the transfer transistor TR, and the like is formed, and thereafter the first substrate 100 and the second substrate 200 (semiconductor layer 2000S) are bonded to each other. At this time, the second substrate 200 is in a state in which patterns such as active elements and wiring layers constituting the pixel circuit 210 are not yet formed. Since the second substrate 200 is in a state before pattern formation, even if an error occurs in the bonding position when the first substrate 100 and the second substrate 200 are bonded together, this bonding error would not cause an error in alignment between the pattern of the first substrate 100 and the pattern of the second substrate 200. This is because the pattern of the second substrate 200 is to be formed after bonding of the first substrate 100 and the second substrate 200 to each other. At pattern formation on the second substrate, the pattern is to be formed, for example, on an exposure device for pattern formation, by using pattern formed on the first substrate as an alignment basis. For the above reason, the error in the bonding position between the first substrate 100 and the second substrate 200 does not cause a problem in manufacturing the imaging device 1 using the first manufacturing method. For similar reasons, an error caused by expansion and contraction of the substrate caused by the second manufacturing method would not cause a problem in manufacturing the imaging device 1 by the first manufacturing method.

In the first manufacturing method, after the first substrate 100 and the second substrate 200 (semiconductor layer 200S) are bonded to each other in this manner, active elements are formed on the second substrate 200. Thereafter, the through-substrate electrodes 120E and 121E and the through-substrate electrode TGV (FIG. 6) are formed. In the formation of the through-substrate electrodes 120E, 121E, and TGV, for example, patterns of the through-substrate electrodes are formed from above the second substrate 200 by reduction projection exposure using an exposure device. Since the reduction exposure projection is used, even if an error occurs in the alignment between the second substrate 200 and the exposure device, the magnitude of the error would be as small as a fraction of the error of the second manufacturing method (inverse of the reduction exposure projection magnification) in the second substrate 200. Therefore, by adopting the configuration of the imaging device 1 using the first manufacturing method, it is possible to facilitate alignment of elements formed on the first substrate 100 and the second substrate 200 with each other, leading to achievement of manufacturing a high-quality and high-performance imaging device.

The imaging device 1 manufactured using such a first manufacturing method has features different from the case of the imaging device manufactured by the second manufacturing method. Specifically, in the imaging device 1 manufactured by the first manufacturing method, the through-substrate electrodes 120E, 121E, and TGV have substantially constant thicknesses (sizes in the substrate planar direction) from the second substrate 200 to the first substrate 100, for example. Alternatively, when the through-substrate electrodes 120E, 121E, and TGV have tapered shapes, they have tapered shapes with a constant inclination. The imaging device 1 including such through-substrate electrodes 120E, 121E, and TGV has high applicability in miniaturization of the pixel 541.

Here, when the imaging device 1 is manufactured by the first manufacturing method, since active elements are formed on the second substrate 200 after the first substrate 100 and the second substrate 200 (semiconductor layer 200S) are bonded together, the first substrate 100 would be also affected by the heating process necessary for forming the active elements. Therefore, as described above, it is preferable to use a conductive material having high heat resistance for the pad portions 120 and 121 provided on the first substrate 100. For example, the pad portions 120 and 121 are preferably formed of a material having a higher melting point (that is, higher heat resistance) than at least a part of the wiring material included in the wiring layer 200T of the second substrate 200. For example, the pad portions 120 and 121 are formed by using a conductive material having high heat resistance, such as doped polysilicon, tungsten, titanium, and titanium nitride. With this configuration, the imaging device 1 can be manufactured using the first manufacturing method described above.

The passivation film 122 is provided over the entire front surface of the semiconductor layer 100S so as to cover the pad portions 120 and 121, for example (FIG. 6). The passivation film 122 is formed of a silicon nitride (SiN) film, for example. The interlayer insulating film 123 covers the pad portions 120 and 121 with the passivation film 122 interposed therebetween. The interlayer insulating film 123 is provided over the entire front surface of the semiconductor layer 100S, for example. The interlayer insulating film 123 is formed of a silicon oxide (SiO) film, for example. The bonding film 124 is provided on a bonding surface between the first substrate 100 (specifically, the wiring layer 100T) and the second substrate 200. That is, the bonding film 124 is in contact with the second substrate 200. The bonding film 124 is provided over the entire main surface of the first substrate 100. The bonding film 124 is formed of a silicon nitride film, for example.

The light receiving lens 401 faces the semiconductor layer 100S with the fixed charge film 112 and the insulating film 111 interposed therebetween, for example (FIG. 6). The light receiving lens 401 is provided, for example, at a position facing the photodiode PD of each of the pixels 541A, 541B, 541C, and 541D.

The second substrate 200 includes a semiconductor layer 200S and a wiring layer 200T in this order from the first substrate 100 side. The semiconductor layer 200S is formed of a silicon substrate. In the semiconductor layer 200S, a well region 211 is provided over the thickness direction. The well region 211 is, for example, a p type semiconductor region. The second substrate 200 is provided with the pixel circuit 210 disposed for each of the pixel sharing units 539. The pixel circuit 210 is provided on the front surface side (wiring layer 200T side) of the semiconductor layer 200S, for example. In the imaging device 1, the second substrate 200 is bonded to the first substrate 100 such that the back surface side (semiconductor layer 200S side) of the second substrate 200 faces the front surface side (wiring layer 100T side) of the first substrate 100. That is, the second substrate 200 is bonded to the first substrate 100 in a face-to-back bonding.

Figure 8:
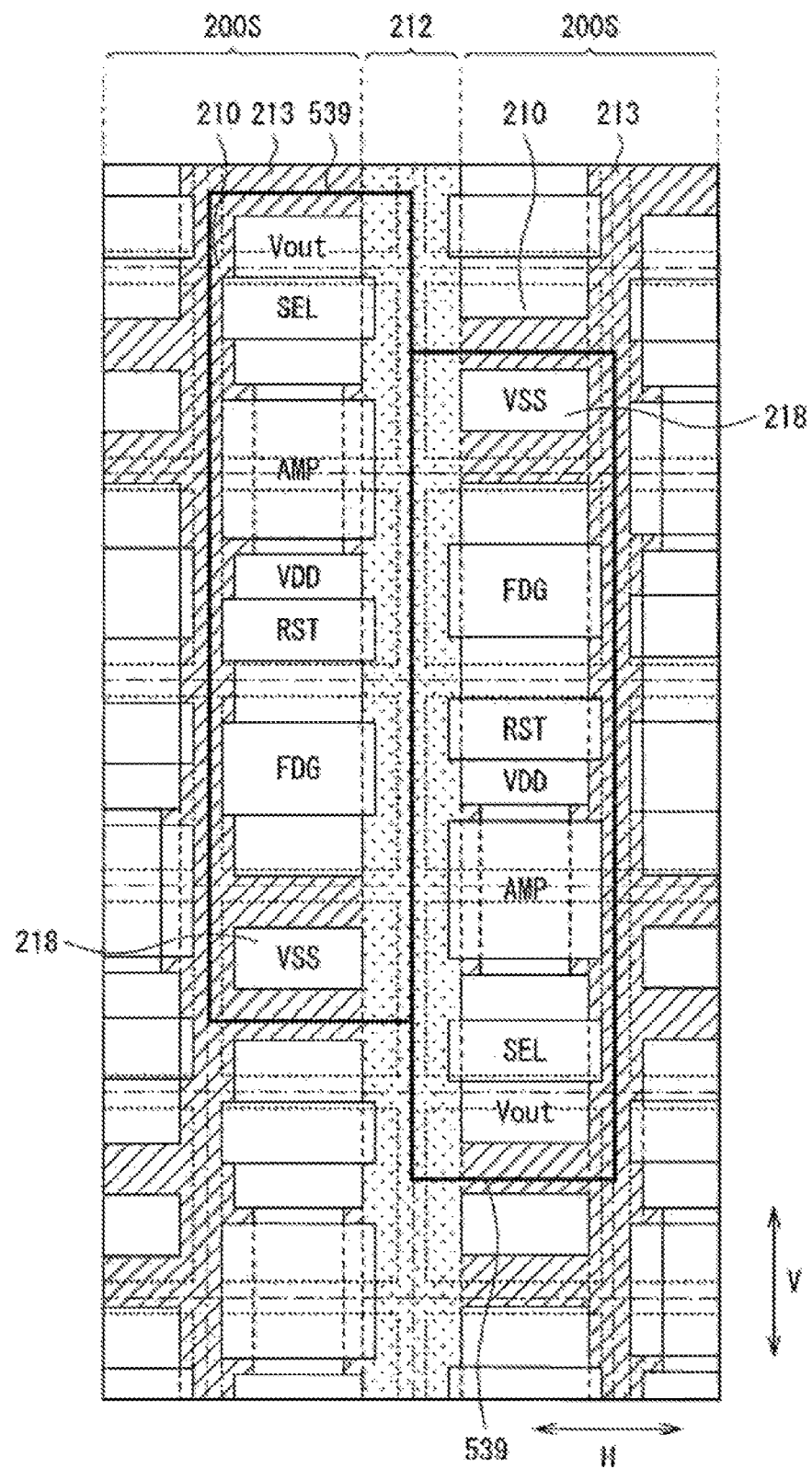
FIG. 8 is a schematic diagram illustrating an example of a planar configuration of a second substrate (semiconductor layer) illustrated in FIG. 6.
Figure 9:
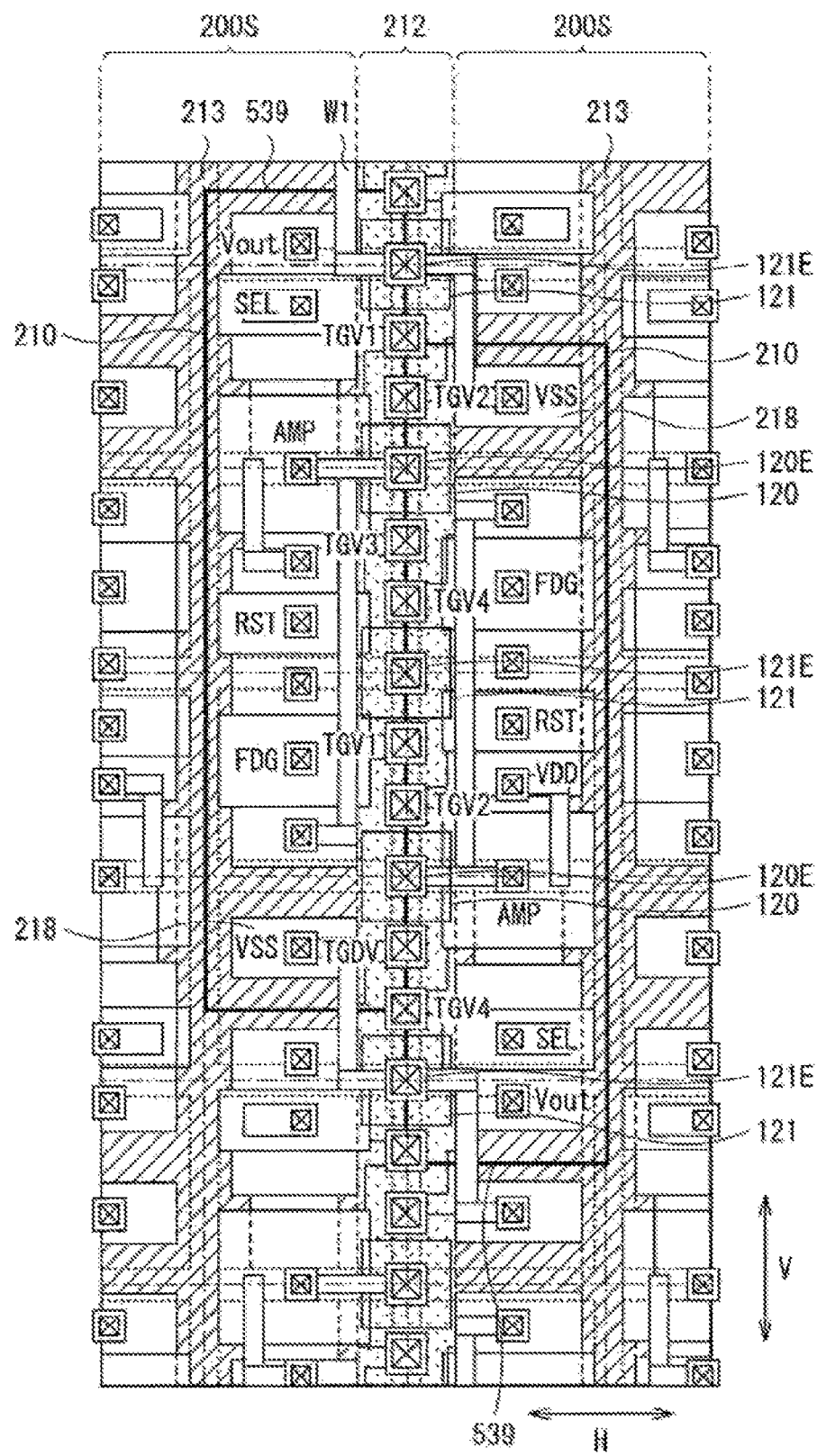
FIG. 9 is a schematic diagram illustrating an example of a planar configuration of a main part of a pixel circuit and the first substrate together with a first wiring layer illustrated in FIG. 6.
Figure 10:
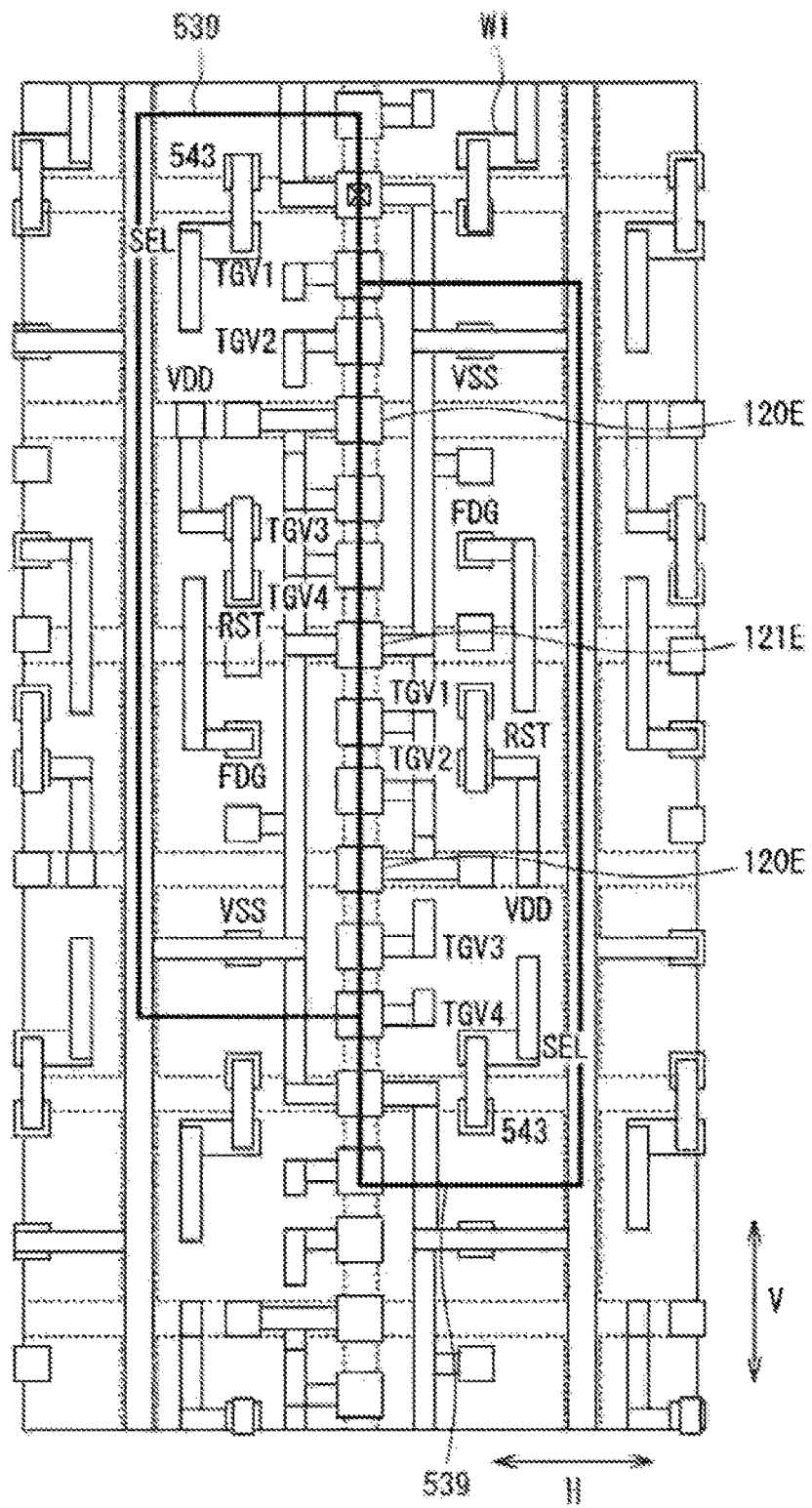
FIG. 10 is a schematic diagram illustrating an example of a planar configuration of the first wiring layer and a second wiring layer illustrated in FIG. 6.
Figure 11:
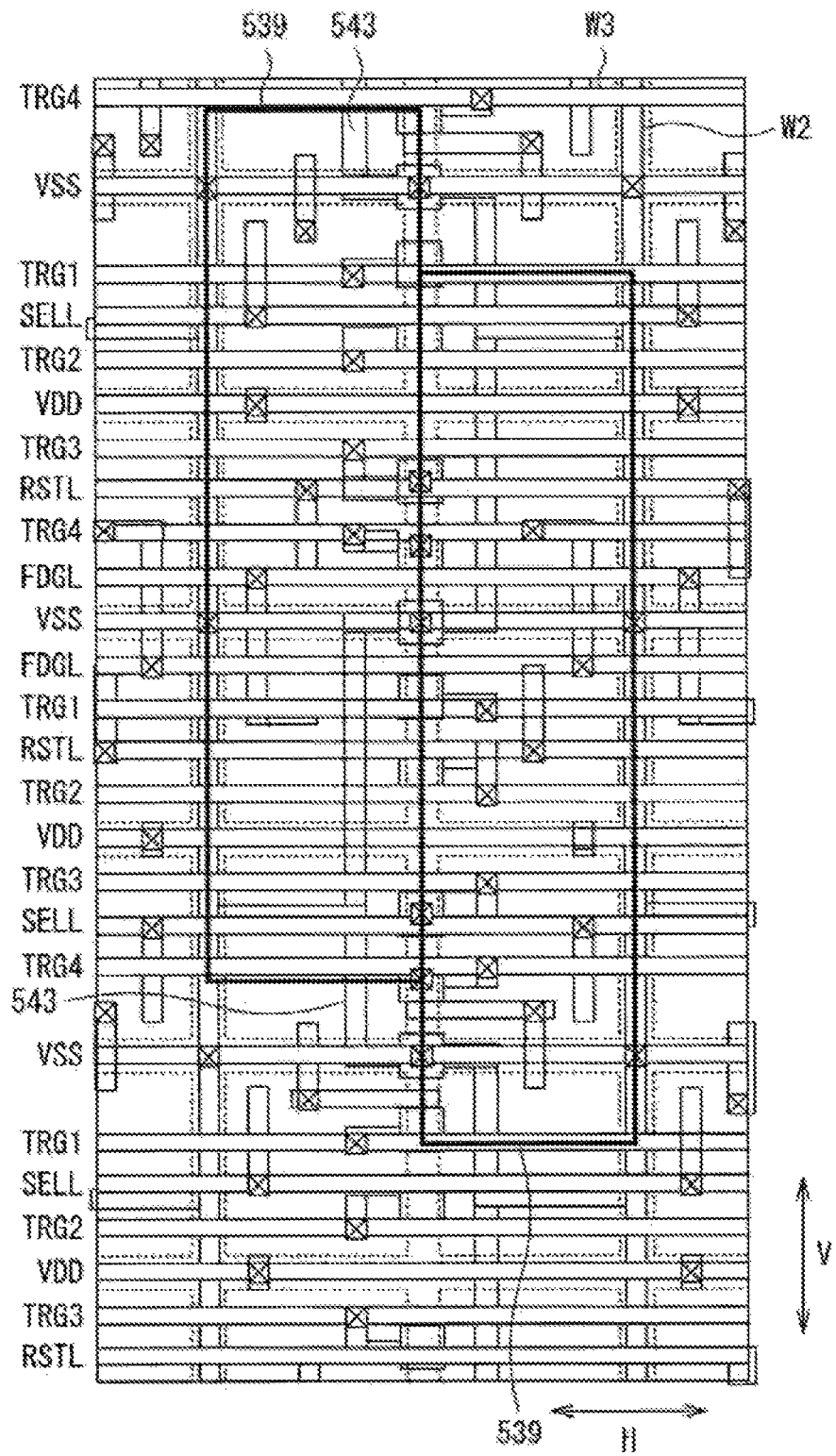
FIG. 11 is a schematic diagram illustrating an example of a planar configuration of the second wiring layer and a third wiring layer illustrated in FIG. 6.
Figure 12:
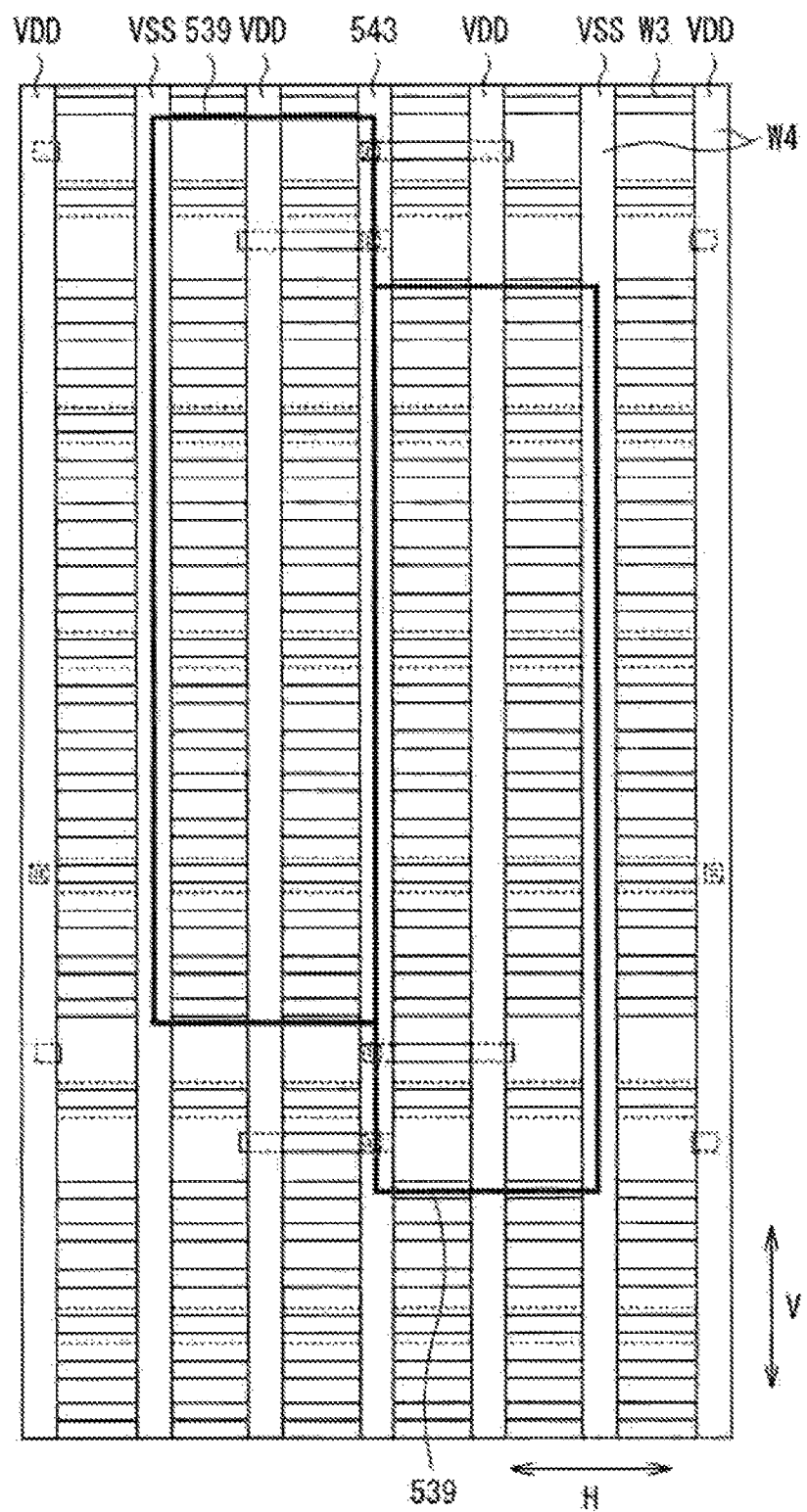
FIG. 12 is a schematic diagram illustrating an example of a planar configuration of the third wiring layer and a fourth wiring layer illustrated in FIG. 6.

FIGS. 8 to 12 schematically illustrate an example of a planar configuration of the second substrate 200. FIG. 8 illustrates a configuration of the pixel circuit 210 provided in the vicinity of the front surface of the semiconductor layer 200S. FIG. 9 schematically illustrates a configuration of individual parts of the wiring layer 200T (specifically, a first wiring layer W1 to be described below), the semiconductor layer 200S connected to the wiring layer 200T, and the first substrate 100. FIGS. 10 to 12 illustrate an example of a planar configuration of the wiring layer 200T. Hereinafter, the configuration of the second substrate 200 will be described with reference to FIGS. 8 to 12 together with FIG. 6. In FIGS. 8 and 9, the outer shape of the photodiode PD (boundary between the pixel isolation portion 117 and the photodiode PD) is indicated by a broken line, and a boundary between the semiconductor layer 200S and an element isolation region 213 or an insulating region 214 in a portion overlapping the gate electrode of each of transistors constituting the pixel circuit 210 is indicated by a dotted line. A portion overlapping the gate electrode of the amplification transistor AMP has a boundary between the semiconductor layer 200S and the element isolation region 213 and a boundary between the element isolation region 213 and the insulating region 212 on one side in a channel width direction.

The second substrate 200 includes: the insulating region 212 that divides the semiconductor layer 200S; and the element isolation region 213 provided in a part of the semiconductor layer 200S in the thickness direction (FIG. 6). For example, the through-substrate electrodes 120E and 121E and the through-substrate electrodes TGV (through-substrate electrodes TGV1, TGV2, TGV3, and TGV4) of the two pixel sharing units 539 connected to two pixel circuits 210 adjacent in the H direction are arranged in the insulating region 212 provided between the two pixel circuits 210 (FIG. 9).

The insulating region 212 has substantially the same thickness as the thickness of the semiconductor layer 200S (FIG. 6). The semiconductor layer 200S is divided by the insulating region 212. The through-substrate electrodes 120E and 121E and the through-substrate electrode TGV are disposed in the insulating region 212. The insulating region 212 is formed of silicon oxide, for example.

The through-substrate electrodes 120E and 121E are provided to penetrate the insulating region 212 in the thickness direction. The upper ends of the through-substrate electrodes 120E and 121E are connected to wiring (first wiring layer W1, second wiring layer W2, third wiring layer W3, and fourth wiring layer W4 to be described below) of the wiring layer 200T. The through-substrate electrodes 120E and 121E are provided to penetrate the insulating region 212, the bonding film 124, the interlayer insulating film 123, and the passivation film 122, and the lower ends of the electrodes are connected to the pad portions 120 and 121, respectively (FIG. 6). The through-substrate electrode 120E is provided to electrically connect the pad portion 120 and the pixel circuit 210 to each other. That is, the floating diffusion FD of the first substrate 100 is electrically connected to the pixel circuit 210 of the second substrate 200 by the through-substrate electrode 120E. The through-substrate electrode 121E is provided for electrically connecting the pad portion 121 and the reference potential line VSS of the wiring layer 200T to each other. That is, the VSS contact region 118 of the first substrate 100 is electrically connected to the reference potential line VSS of the second substrate 200 by the through-substrate electrode 121E.

The through-substrate electrode TGV is provided to penetrate the insulating region 212 in the thickness direction. The upper end of the through-substrate electrode TGV is connected to the wiring of the wiring layer 200T. The through-substrate electrode TGV is provided to penetrate the insulating region 212, the bonding film 124, the interlayer insulating film 123, the passivation film 122, and the interlayer insulating film 119, and the lower end thereof is connected to the transfer gate TG (FIG. 6). Such a through-substrate electrode TGV is provided for electrically connecting the transfer gate TG (transfer gates TG1, TG2, TG3, and TG4) of each of the corresponding pixels 541A, 541B, 541C, and 541D to the wiring of the wiring layer 200T (part of the row drive signal line 542, specifically, wiring lines TRG1, TRG2, TRG3, and TRG4 in FIG. 11 to be described below). That is, by the through-substrate electrode TGV, the transfer gate TG of the first substrate 100 is electrically connected to the wiring TRG of the second substrate 200 and a drive signal is sent to each of the transfer transistors TR (transfer transistors TR1, TR2, TR3, and TR4).

The insulating region 212 is a region for insulating, from the semiconductor layer 200S, the through-substrate electrodes 120E and 121E and the through-substrate electrode TGV for electrically connecting the first substrate 100 and the second substrate 200 to each other. For example, the through-substrate electrodes 120E and 121E and the through-substrate electrodes TGV (through-substrate electrodes TGV1, TGV2, TGV3, and TGV4) connected to two pixel circuits 210 (pixel sharing unit 539) adjacent in the H direction are disposed in the insulating region 212 provided between the two pixel circuits 210. The insulating region 212 is provided to extend in the V direction, for example (FIGS. 8 and 9). Here, by appropriately arranging the horizontal portion TGb of the transfer gate TG, the through-substrate electrode TGV is disposed such that the position of the through-substrate electrode TGV in the H direction approaches the positions of the through-substrate electrodes 120E and 121E in the H direction as compared with the position of the vertical portion TGa (FIGS. 7A and 9). For example, the through-substrate electrode TGV is disposed at substantially the same position as the through-substrate electrodes 120E and 120E in the H direction. With this configuration, the through-substrate electrodes 120E and 121E and the through-substrate electrode TGV can be collectively arranged in the insulating region 212 extending in the V direction. As another arrangement example, it is also conceivable to provide the horizontal portion TGb only in a region overlapping the vertical portion TGa. In this case, the through-substrate electrode TGV would be formed substantially immediately above the vertical portion TGa, and for example, the through-substrate electrode TGV is disposed substantially at the central portion in the H direction and the V direction of each of the pixels 541. At this time, the position of the through-substrate electrode TGV in the H direction greatly deviates from the positions of the through-substrate electrodes 120E and 121E in the H direction. For example, the insulating region 212 is provided around the through-substrate electrode TGV and the through-substrate electrodes 120E and 121E in order to electrically insulate these through-substrate electrodes from the semiconductor layer 200S close to the electrodes. When the position of the through-substrate electrode TGV in the H direction and the positions of the through-substrate electrodes 120E and 121E in the H direction are greatly separated from each other, it would be necessary to provide the insulating region 212 independently around each of the through-substrate electrodes 120E, 121E, and TGV. This configuration would divide the semiconductor layer 200S into a number of pieces. In comparison, the layout in which the through-substrate electrodes 120E and 121E and the through-substrate electrode TGV are collectively arranged in the insulating region 212 extending in the V direction can obtain a sufficiently large size of the semiconductor layer 200S in the H direction. This makes it possible to ensure a large area of the semiconductor element formation region in the semiconductor layer 200S. This configuration makes it possible to increase the size of the amplification transistor AMP and suppress noise, for example.

As described with reference to FIG. 4, the pixel sharing unit 539 has a structure in which the floating diffusion FD provided in each of the plurality of pixels 541 is electrically connected, and the plurality of pixels 541 shares one pixel circuit 210. The floating diffusion FD is electrically connected to each other by the pad portion 120 provided on the first substrate 100 (FIGS. 6 and 7B). The electrical connection portion (pad portion 120) provided on the first substrate 100 and the pixel circuit 210 provided on the second substrate 200 are electrically connected via one through-substrate electrode 120E. In another conceivable structure example, an electrical connection portion between the floating diffusions FD can be provided on the second substrate 200. In this case, the pixel sharing unit 539 is provided with four through-substrate electrodes connected to the floating diffusions FD1, FD2, FD3, and FD4, respectively. This would result in, in the second substrate 200, the increased number of through-substrate electrodes penetrating the semiconductor layer 200S and enlargement of the insulating region 212 that insulates the surroundings of these through-substrate electrodes. In comparison, in the structure in which the pad portion 120 is provided on the first substrate 100 (FIGS. 6 and 7B), it is possible to achieve reduction in the number of through-substrate electrodes and downsizing of the insulating region 212. This makes it possible to ensure a large area of the semiconductor element formation region in the semiconductor layer 200S. This configuration makes it possible to increase the size of the amplification transistor AMP and suppress noise, for example.

The element isolation region 213 is provided on the front surface side of the semiconductor layer 200S. The element isolation region 213 has a shallow trench isolation (STI) structure. In the element isolation region 213, the semiconductor layer 200S is dug in the thickness direction (direction perpendicular to the main surface of the second substrate 200), and an insulating film is buried in the dug portion. This insulating film is formed of silicon oxide, for example. The element isolation region 213 isolates the plurality of elements, namely, transistors constituting the pixel circuit 210 from each other in accordance with the layout of the pixel circuit 210. The semiconductor layer 200S (specifically, well region 211) extends below the element isolation region 213 (deep portion of the semiconductor layer 200S).

Here, with reference to FIGS. 7A, 7B, and 8, a difference between the outer shape (outer shape in the substrate planar direction) of the pixel sharing unit 539 on the first substrate 100 and the outer shape of the pixel sharing unit 539 on the second substrate 200 will be described.

In the imaging device 1, the pixel sharing unit 539 is provided over both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 7A and 7B, the outline of the pixels 541A, 541B, 541C, and 541D is represented by a one-dot chain line, and the outer shape of the pixel sharing unit 539 is represented by a thick line. For example, the pixel sharing unit 539 of the first substrate 100 is formed with two pixels 541 (pixels 541A and 541B) disposed adjacent to each other in the H direction and two pixels 541 (pixels 541C and 541D) disposed adjacent to each other in the V direction. That is, the pixel sharing unit 539 of the first substrate 100 includes four pixels 541 in adjacent 2 rows×2 columns, giving the pixel sharing unit 539 of the first substrate 100 a substantially square outer shape. In the pixel array unit 540, such pixel sharing units 539 are arranged adjacent to each other at a pitch of two pixels (pitch corresponding to two pixels 541) in the H direction and a pitch of two pixels (pitch corresponding to two pixels 541) in the V direction.

In FIGS. 8 and 9, the outline of the pixels 541A, 541B, 541C, and 541D is represented by a one-dot chain line, and the outer shape of the pixel sharing unit 539 is represented by a thick line. For example, the outer shape of the pixel sharing unit 539 of the second substrate 200 is smaller than the pixel sharing unit 539 of the first substrate 100 in the H direction and larger than the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent 1 row×4 columns, giving the pixel sharing unit 539 of the second substrate 200 a substantially rectangular outer shape.

For example, in each of the pixel circuits 210, the selection transistor SEL, the amplification transistor AMP, the reset transistor RST, and the FD conversion gain switching transistor FDG are arranged in this order in the V direction (FIG. 8). By providing the outer shape of each pixel circuit 210 in a substantially rectangular shape as described above, it is possible to arrange four transistors (selection transistor SEL, amplification transistor AMP, reset transistor RST, and FD conversion gain switching transistor FDG) side by side in one direction (V direction in FIG. 8). With this configuration, the drain of the amplification transistor AMP and the drain of the reset transistor RST can be shared by one diffusion region (diffusion region connected to the power supply line VDD). For example, the formation region of each of the pixel circuits 210 can be provided in a substantially square shape (refer to FIG. 21 described below). In this case, two transistors are arranged in one direction, making it difficult to share the drain of the amplification transistor AMP and the drain of the reset transistor RST in one diffusion region. Therefore, the formation region of the pixel circuit 210 provided in a substantially rectangular shape can facilitate arrangement of the four transistors so as to be close to each other, making it possible to downsize the formation region of the pixel circuit 210. This achieves miniaturization of the pixels. Furthermore, when there is no need to reduce the formation region of the pixel circuit 210, the formation region of the amplification transistor AMP can be increased to suppress noise.

For example, in the vicinity of the front surface of the semiconductor layer 200S, a VSS contact region 218 connected to the reference potential line VSS is provided in addition to the selection transistor SEL, the amplification transistor AMP, the reset transistor RST, and the FD conversion gain switching transistor FDG. The VSS contact region 218 is formed with a p type semiconductor region, for example. The VSS contact region 218 is electrically connected to the VSS contact region 118 of the first substrate 100 (semiconductor layer 100S) via the wiring of the wiring layer 200T and the through-substrate electrode 121E. The VSS contact region 218 is provided at a position adjacent to the source of the FD conversion gain switching transistor FDG with the element isolation region 213 interposed therebetween, for example (FIG. 8).

Next, a positional relationship between the pixel sharing unit 539 provided on the first substrate 100 and the pixel sharing unit 539 provided on the second substrate 200 will be described with reference to FIGS. 7B and 8. For example, one pixel sharing unit 539 (for example, one on the upper side of FIG. 7B) out of the two pixel sharing units 539 aligned in the V direction on the first substrate 100 is connected to one pixel sharing unit 539 (for example, one on the left side of FIG. 8) out of the two pixel sharing units 539 arranged in the H direction on the second substrate 200. For example, the other pixel sharing unit 539 (for example, one on the lower side of FIG. 7B) out of the two pixel sharing units 539 aligned in the V direction on the first substrate 100 is connected to the other pixel sharing unit 539 (for example, one on the right side of FIG. 8) out of the two pixel sharing units 539 aligned in the H direction on the second substrate 200.

For example, in the two pixel sharing units 539 aligned in the H direction of the second substrate 200, the internal layout (arrangement of transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 aligned in the V direction of the first substrate 100, each of the pad portions 120 is disposed at the central portion of the outer shape of the pixel sharing unit 539, that is, at the central portion in the V direction and the H direction of the pixel sharing unit 539 (FIG. 7B). On the other hand, the pixel sharing unit 539 of the second substrate 200 has a substantially rectangular outer shape long in the V direction as described above, and therefore, the amplification transistor AMP connected to the pad portion 120 is disposed at a position shifted upward in the drawing from the center of the pixel sharing unit 539 in the V direction, for example. For example, when the two pixel sharing units 539 aligned in the H direction of the second substrate 200 have the same internal layout, the distance between the amplification transistor AMP of one pixel sharing unit 539 and the pad portion 120 (for example, the pad portion 120 of the pixel sharing unit 539 on the upper side of FIGS. 7A and 7B) becomes relatively short. However, the distance between the amplification transistor AMP of the other pixel sharing unit 539 and the pad portion 120 (for example, the pad portion 120 of the pixel sharing unit 539 on the lower side of FIGS. 7A and 7B) becomes long. This increases the area of the wiring required for connecting the amplification transistor AMP and the pad portion 120, leading to a concern of a complicated wiring layout of the pixel sharing unit 539. This might affect miniaturization of the imaging device 1.

In contrast, by inverting the internal layout of the two pixel sharing units 539 aligned in the H direction of the second substrate 200 at least in the V direction, it is possible to shorten the distance between the amplification transistor AMP and the pad portion 120 of both of the two pixel sharing units 539. This facilitates miniaturization of the imaging device 1 as compared with the configuration in which the two pixel sharing units 539 aligned in the H direction of the second substrate 200 have the same internal layout. Although the planar layout of each of the plurality of pixel sharing units 539 of the second substrate 200 is bilaterally symmetrical in the range illustrated in FIG. 8, the layout is bilaterally asymmetrical when including the layout of the first wiring layer W1 illustrated in FIG. 9 described below.

Furthermore, it is preferable that the internal layouts of the two pixel sharing units 539 aligned in the H direction of the second substrate 200 are also inverted in the H direction. Hereinafter, the reason will be described. As illustrated in FIG. 9, each of the two pixel sharing units 539 aligned in the H direction on the second substrate 200 is connected to each of the pad portions 120 and 121 of the first substrate 100. For example, the pad portions 120 and 121 are disposed at the central portion in the H direction (between the two pixel sharing units 539 aligned in the H direction) of the two pixel sharing units 539 aligned in the H direction on the second substrate 200. Therefore, by inverting the internal layouts of the two pixel sharing units 539 aligned in the H direction of the second substrate 200 also in the H direction, it is possible to reduce the distance between each of the plurality of pixel sharing units 539 of the second substrate 200 and each of the pad portions 120 and 121. This makes it further easier to miniaturize the imaging device 1.

Furthermore, the position of the outline of the pixel sharing unit 539 of the second substrate 200 does not have to be aligned with the position of any of the outlines of the pixel sharing units 539 of the first substrate 100. For example, in one pixel sharing unit 539 (for example, the one on the left side of FIG. 9) out of the two pixel sharing units 539 aligned in the H direction on the second substrate 200, one outline (for example, one on the upper side of FIG. 9) in the V direction is arranged outside of one outline in the V direction of the pixel sharing unit 539 (for example, one on the upper side of FIG. 7B) of the corresponding first substrate 100. Furthermore, in the other pixel sharing unit 539 (for example, the one on the right side of FIG. 9) out of the two pixel sharing units 539 aligned in the H direction on the second substrate 200, the other outline (for example, one on the lower side of FIG. 9) in the V direction is arranged outside of the other outline in the V direction of the pixel sharing unit 539 (for example, one on the lower side of FIG. 7B) of the corresponding first substrate 100. In this manner, by arranging the pixel sharing unit 539 of the second substrate 200 and the pixel sharing unit 539 of the first substrate 100 to correspond to each other, it is possible to shorten the distance between the amplification transistor AMP and the pad portion 120. This facilitates miniaturization of the imaging device 1.

Furthermore, the positions of the outlines of the plurality of pixel sharing units 539 of the second substrate 200 do not need to be aligned. For example, the two pixel sharing units 539 aligned in the H direction of the second substrate 200 are arranged such that their outline positions in the V direction are shifted from each other. This configuration makes it possible to shorten the distance between the amplification transistor AMP and the pad portion 120. This facilitates miniaturization of the imaging device 1.

The repeated arrangement of the pixel sharing units 539 in the pixel array unit 540 will be described with reference to FIGS. 7B and 9. The pixel sharing unit 539 of the first substrate 100 has the size of two pixels 541 in the H direction and the size of two pixels 541 in the V direction (FIG. 7B). For example, in the pixel array unit 540 of the first substrate 100, the pixel sharing unit 539 having the size corresponding to the four pixels 541 is repeatedly arranged adjacent to each other at a pitch of two pixels in the H direction (a pitch corresponding to two pixels 541) and at a pitch of two pixels in the V direction (a pitch corresponding to two pixels 541). Alternatively, the pixel array unit 540 of the first substrate 100 may include a pair of pixel sharing units 539 in which two pixel sharing units 539 are arranged adjacent to each other in the V direction. In the pixel array unit 540 of the first substrate 100, for example, the pair of pixel sharing units 539 adjacent to each other is repeatedly arranged at a pitch of two pixels in the H direction (a pitch corresponding to two pixels 541) and at a pitch of four pixels in the V direction (a pitch corresponding to four pixels 541). The pixel sharing unit 539 of the second substrate 200 has the size of one pixel 541 in the H direction and the size of four pixels 541 in the V direction (FIG. 9). For example, the pixel array unit 540 of the second substrate 200 includes a pair of pixel sharing units 539 including two pixel sharing units 539 having a size corresponding to the four pixels 541. The pixel sharing units 539 are arranged adjacent to each other in the H direction and are arranged to be shifted from each other in the V direction. In the pixel array unit 540 of the second substrate 200, for example, the pair of pixel sharing units 539 adjacent to each other is repeatedly arranged without a gap at a pitch of two pixels in the H direction (a pitch corresponding to two pixels 541) and at a pitch of four pixels in the V direction (a pitch corresponding to four pixels 541). Such repetitive arrangement of the pixel sharing units 539 enables the pixel sharing units 539 to be arranged without any gap. This facilitates miniaturization of the imaging device 1.

The amplification transistor AMP preferably has a three-dimensional structure such as a Fin-shaped transistor, for example (FIG. 6). This can increase the effective gate width, making it possible to suppress noise. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wiring layer 200T includes, for example, a passivation film 221, an interlayer insulating film 222, and a plurality of wiring layers (a first wiring layer W1, a second wiring layer W2, a third wiring layer W3, and a fourth wiring layer W4). The passivation film 221 is in contact with the front surface of the semiconductor layer 200S and covers the entire front surface of the semiconductor layer 200S, for example. The passivation film 221 covers the gate electrodes of the selection transistor SEL, the amplification transistor AMP, the reset transistor RST, and the FD conversion gain switching transistor FDG. The interlayer insulating film 222 is provided between the passivation film 221 and the third substrate 300. The interlayer insulating film 222 isolates the plurality of wiring layers (first wiring layer W1, second wiring layer W2, third wiring layer W3, and fourth wiring layer W4) from each other. The interlayer insulating film 222 is formed of silicon oxide, for example.

The wiring layer 200T includes, for example, from the semiconductor layer 200S side, a first wiring layer W1, a second wiring layer W2, a third wiring layer W3, a fourth wiring layer W4, and the contact portions 201 and 202 in this order, and these portions are insulated from each other by the interlayer insulating film 222. The interlayer insulating film 222 includes a plurality of connection portions that connect the first wiring layer W1, the second wiring layer W2, the third wiring layer W3 or the fourth wiring layer W4 with their lower layers. The connection portion is a portion formed by embedding a conductive material in a connection hole provided in the interlayer insulating film 222. For example, the interlayer insulating film 222 includes a connection portion 218V that connects the first wiring layer W1 and the VSS contact region 218 of the semiconductor layer 200S. For example, the hole diameter of the connection portion connecting the elements of the second substrate 200 is different from the hole diameters of the through-substrate electrodes 120E and 121E and the through-substrate electrode TGV. Specifically, the hole diameter of the connection hole connecting the elements of the second substrate 200 is preferably smaller than the hole diameters of the through-substrate electrodes 120E and 121E and the through-substrate electrode TGV. Hereinafter, the reason will be described. The depth of the connection portion provided in the wiring layer 200T (the connection portion 218V or the like) is smaller than the depths of the through-substrate electrodes 120E and 121E and the through-substrate electrode TGV. Therefore, the connection portion can easily fill the conductive material in the connection hole as compared with the through-substrate electrodes 120E and 121E and the through-substrate electrode TGV. By forming the hole diameter of the connection portion smaller than the hole diameters of the through-substrate electrodes 120E and 121E and the through-substrate electrode TGV, it is possible to facilitate miniaturization of the imaging device 1.

For example, the through-substrate electrode 120E is connected to the gate of the amplification transistor AMP and the source of the FD conversion gain switching transistor FDG (specifically, a connection hole reaching the source of the FD conversion gain switching transistor FDG) by the first wiring layer W1. The first wiring layer W1 connects the through-substrate electrode 121E and the connection portion 218V to each other, for example, enabling electrical connection between the VSS contact region 218 of the semiconductor layer 200S and the VSS contact region 118 of the semiconductor layer 100S.

Next, a planar configuration of the wiring layer 200T will be described with reference to FIGS. 10 to 12. FIG. 10 illustrates an example of a planar configuration of the first wiring layer W1 and the second wiring layer W2. FIG. 11 illustrates an example of a planar configuration of the second wiring layer W2 and the third wiring layer W3. FIG. 12 illustrates an example of a planar configuration of the third wiring layer W3 and the fourth wiring layer W4.

For example, the third wiring layer W3 includes wiring lines TRG1, TRG2, TRG3, TRG4, SELL, RSTL, and FDGL extending in the H direction (row direction) (FIG. 11). These wiring lines correspond to the plurality of row drive signal lines 542 described with reference to FIG. 4. The wiring lines TRG1, TRG2, TRG3, and TRG4 are provided for sending drive signals to the transfer gates TG1, TG2, TG3, and TG4, respectively. The wiring lines TRG1, TRG2, TRG3, and TRG4 are respectively connected to the transfer gates TG1, TG2, TG3, and TG4 via the second wiring layer W2, the first wiring layer W1, and the through-substrate electrode 120E. The wiring line SELL is provided for sending a drive signal to the gate of the selection transistor SEL, the wiring line RSTL is provided for sending a drive signal to the gate of the reset transistor RST, and the wiring line FDGL is provided for sending a drive signal to the gate of the FD conversion gain switching transistor FDG. The wiring lines SELL, RSTL, and FDGL are connected to the gates of the selection transistor SEL, the reset transistor RST, and the FD conversion gain switching transistor FDG via the second wiring layer W2, the first wiring layer W1, and the connection portion, respectively.

For example, the fourth wiring layer W4 includes a power supply line VDD, a reference potential line VSS, and a vertical signal line 543 extending in the V direction (column direction) (FIG. 12). The power supply line VDD is connected to the drain of the amplification transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. In addition, the reference potential line VSS is connected to the VSS contact region 118 of the first substrate 100 via the third wiring layer W3, the second wiring layer W2, the first wiring layer W1, the through-substrate electrode 121E, and the pad portion 121. The vertical signal line 543 is connected to the source (Vout) of the selection transistor SEL via the third wiring layer W3, the second wiring layer W2, the first wiring layer W1, and the connection portion.

The contact portions 201 and 202 may be provided at a position overlapping the pixel array unit 540 in plan view (for example, FIG. 3), or may be provided in the peripheral portion 540B outside the pixel array unit 540 (for example, FIG. 6). The contact portions 201 and 202 are provided on the front surface (surface on the wiring layer 200T side) of the second substrate 200. The contact portions 201 and 202 are formed of metal such as copper (Cu) and aluminum (Al), for example. The contact portions 201 and 202 are exposed on the front surface (surface on the third substrate 300 side) of the wiring layer 200T. The contact portions 201 and 202 are used for electrical connection between the second substrate 200 and the third substrate 300 and bonding between the second substrate 200 and the third substrate 300.

FIG. 6 illustrates an example in which a peripheral circuit is provided in the peripheral portion 540B of the second substrate 200. This peripheral circuit may include a part of the row drive unit 520, a part of the column signal processing unit 550, and the like. Furthermore, as illustrated in FIG. 3, the connection holes H1 and H2 may be arranged in the vicinity of the pixel array unit 540, instead of disposing the peripheral circuit in the peripheral portion 540B of the second substrate 200.

The third substrate 300 includes the wiring layer 300T and the semiconductor layer 300S in this order from the second substrate 200 side, for example. For example, the front surface of the semiconductor layer 300S is provided on the second substrate 200 side. The semiconductor layer 300S is formed with a silicon substrate. The semiconductor layer 300S includes a circuit provided at its portion on the front surface side. Specifically, for example, the portion on the front surface side of the semiconductor layer 300S includes at least a part of the input unit 510A, the row drive unit 520, the timing control unit 530, the column signal processing unit 550, the image signal processing unit 560, and the output unit 510B. The wiring layer 300T provided between the semiconductor layer 300S and the second substrate 200 includes, for example, an interlayer insulating film, a plurality of wiring layers isolated by the interlayer insulating film, and the contact portions 301 and 302. The contact portions 301 and 302 are exposed on the front surface (the surface on the second substrate 200 side) of the wiring layer 300T. In addition, the contact portion 301 is in contact with the contact portion 201 of the second substrate 200 and the contact portion 302 is in contact with the contact portion 202 of the second substrate 200, individually. The contact portions 301 and 302 are electrically connected to a circuit (for example, at least one of the input unit 510A, the row drive unit 520, the timing control unit 530, the column signal processing unit 550, the image signal processing unit 560, or the output unit 510B) formed in the semiconductor layer 300S. The contact portions 301 and 302 are formed of metal such as copper (Cu) and aluminum (Al), for example. For example, an external terminal TA is connected to the input unit 510A via the connection hole H1 while an external terminal TB is connected to the output unit 510B via the connection hole H2.

Here, features of the imaging device 1 will be described.

Typically, an imaging device includes a photodiode and a pixel circuit, as main components. Here, increasing the area of the photodiode will increase the charge generated as a result of photoelectric conversion. As a result, the signal/noise ratio (S/N ratio) of the pixel signal is improved, and the imaging device can output better image data (image information). In contrast, increasing the size of the transistor (particularly, the size of the amplification transistor) included in the pixel circuit will decrease the noise generated in the pixel circuit. As a result, the S/N ratio of the imaging signal is improved, enabling the imaging device to output better image data (image information).

However, in an imaging device in which a photodiode and a pixel circuit are provided on the same semiconductor substrate, increasing the area of the photodiode in a limited area of the semiconductor substrate might decrease the size of a transistor included in the pixel circuit. Furthermore, increasing the size of the transistor included in the pixel circuit might decrease the area of the photodiode.

In order to solve these problems, for example, the imaging device 1 of the present embodiment uses a structure in which a plurality of pixels 541 shares one pixel circuit 210 and the shared pixel circuit 210 is arranged to overlap the photodiode PD. This configuration makes it possible to achieve maximization of the area of the photodiode PD and maximization of the size of the transistor included in the pixel circuit 210 within the limited area of the semiconductor substrate. This makes it possible to improve the S/N ratio of the pixel signal, enabling the imaging device 1 to output better image data (image information).

In implementation of a structure in which the plurality of pixels 541 shares one pixel circuit 210 and the shared pixel circuit 210 is arranged to overlap the photodiode PD, a plurality of wiring lines connected to one pixel circuit 210 extends from the floating diffusion FD of each of the plurality of pixels 541. In order to ensure a large area of the second substrate 200 forming the pixel circuit 210, a plurality of extending wiring lines can be mutually connected to form integrated connected wiring, for example. Similarly, for the plurality of wiring lines extending from the VSS contact region 118, it is possible to mutually connect the plurality of extending wiring lines to form the integrated connected wiring.

For example, forming a connected wiring that mutually connects a plurality of wiring lines extending from the floating diffusion FD of each of the plurality of pixels 541 in the second substrate 200 on which the pixel circuit 210 is to be formed, however, would lead to a conceivable concern of decreasing an area for forming transistors included in the pixel circuit 210. Similarly, forming an integrated connected wiring of mutually connecting a plurality of wiring lines extending from the VSS contact region 118 of each of the plurality of pixels 541 in the second substrate 200 on which the pixel circuit 210 is to be formed would lead to a conceivable concern of decreasing the area for forming the transistors included in the pixel circuit 210.

In order to solve these problems, for example, the imaging device 1 of the present embodiment can use a structure in which a plurality of pixels 541 shares one pixel circuit 210, and the shared pixel circuit 210 is arranged to overlap the photodiode PD, the structure being a structure in which an integrated connected wiring of mutually connecting the floating diffusion FD of each of the plurality of pixels 541, and an integrated connected wiring of mutually connecting the VSS contact regions 118 included in each of the plurality of pixels 541, are provided on the first substrate 100.

Here, by using the second manufacturing method described above as the manufacturing method for providing, on the first substrate 100, the integrated connected wiring of mutually connecting the floating diffusion FD of each of the plurality of pixels 541 and the integrated connected wiring of mutually connecting the VSS contact regions 118 of each of the plurality of pixels 541, for example, it is possible to achieve manufacturing using an appropriate process according to the configuration of each of the first substrate 100 and the second substrate 200, leading to the manufacture of a high-quality and high-performance imaging device. In addition, the connected wiring of the first substrate 100 and the second substrate 200 can be formed by a facilitated process. Specifically, in the case of using the second manufacturing method, an electrode connected to the floating diffusion FD and an electrode connected to the VSS contact region 118 are each provided on the front surface of the first substrate 100 and the front surface of the second substrate 200, which are the bonding boundary surfaces between the first substrate 100 and the second substrate 200. Furthermore, it is preferable to enlarge the electrodes formed on the front surfaces of the two substrates, namely, the first substrate 100 and the second substrate 200 so that the electrodes formed on the front surfaces of the two substrates come into contact with each other even when misalignment occurs between the electrodes provided on the front surfaces of the two substrates when the two substrates are bonded together. In this case, however, there is a conceivable concern of difficulty in disposing the electrodes in a limited area of individual pixels included in the imaging device 1.

In order to solve the problem of requirement for a large electrode at the bonding boundary surface between the first substrate 100 and the second substrate 200, the imaging device 1 of the present embodiment can use, for example, the first manufacturing method described above as the manufacturing method in which the plurality of pixels 541 shares one pixel circuit 210, and the shared pixel circuit 210 is arranged to overlap the photodiode PD. This makes it possible to facilitate alignment of elements formed on the first substrate 100 and the second substrate 200 with each other, leading to achievement of manufacturing a high-quality and high-performance imaging device. Furthermore, it is possible to provide a unique structure generated by using this manufacturing method. That is, the imaging device includes a structure in which the semiconductor layer 100S and the wiring layer 100T of the first substrate 100, and the semiconductor layer 200S and the wiring layer 200T of the second substrate 200, are stacked in this order, in other words, a structure in which the first substrate 100 and the second substrate 200 are stacked in a face-to-back bonding, and the device is provided with the through-substrate electrodes 120E and 121E penetrating from the front surface of the semiconductor layer 200S of the second substrate 200 through the semiconductor layer 200S and the wiring layer 100T of the first substrate 100 to reach the front surface of the semiconductor layer 100S of the first substrate 100.

In this structure, however, having the integrated connected wiring of mutually connecting the floating diffusion FD of each of the plurality of pixels 541, and the integrated connected wiring of mutually connecting the VSS contact regions 118 of each of the plurality of pixels 541, being provided on the first substrate 100, stacking this structure and the second substrate 200 using the first manufacturing method and then forming the pixel circuit 210 on the second substrate 200 might lead to a possibility that the heating process necessary at formation of the active elements included in the pixel circuit 210 affects the connected wiring that has been formed on the first substrate 100.

Therefore, in order to solve the problem that the connected wiring is affected by the heating process at formation of active elements, it is desirable that the imaging device 1 of the present embodiment use a conductive material having high heat resistance for the integrated connected wiring of mutually connecting the floating diffusion FD of each of the plurality of pixels 541 and the integrated connected wiring of mutually connecting the VSS contact regions 118 of each of the plurality of pixels 541. Specifically, as the conductive material having high heat resistance, it is possible to use a material having a melting point higher than that of at least a part of the wiring material included in the wiring layer 200T of the second substrate 200.

In this manner, for example, the imaging device 1 of the present embodiment includes: (1) the structure in which the first substrate 100 and the second substrate 200 are stacked in a face-to-back bonding (specifically, a structure in which the semiconductor layer 100S and the wiring layer 100T of the first substrate 100, and the semiconductor layer 200S and the wiring layer 200T of the second substrate 200 are stacked in this order); (2) the structure in which the through-substrate electrodes 120E and 121E are provided from the front surface of the semiconductor layer 200S of the second substrate 200, penetrating through the semiconductor layer 200S and the wiring layer 100T of the first substrate 100 to reach the front surface of the semiconductor layer 100S of the first substrate 100; and (3) the structure in which the integrated connected wiring of mutually connecting the floating diffusion FD included in each of the plurality of pixels 541, and the integrated connected wiring of mutually connecting the VSS contact regions 118 included in each of the plurality of pixels 541, are formed of a conductive material having high heat resistance. With this configuration, it is possible to provide the integrated connected wiring of mutually connecting the floating diffusion FD included in each of the plurality of pixels 541 and the integrated connected wiring of mutually connecting the VSS contact regions 118 included in each of the plurality of pixels 541, on the first substrate 100, with no large electrodes at the boundary surface between the first substrate 100 and the second substrate 200.

[Operation of Imaging Device 1]

Figure 13:
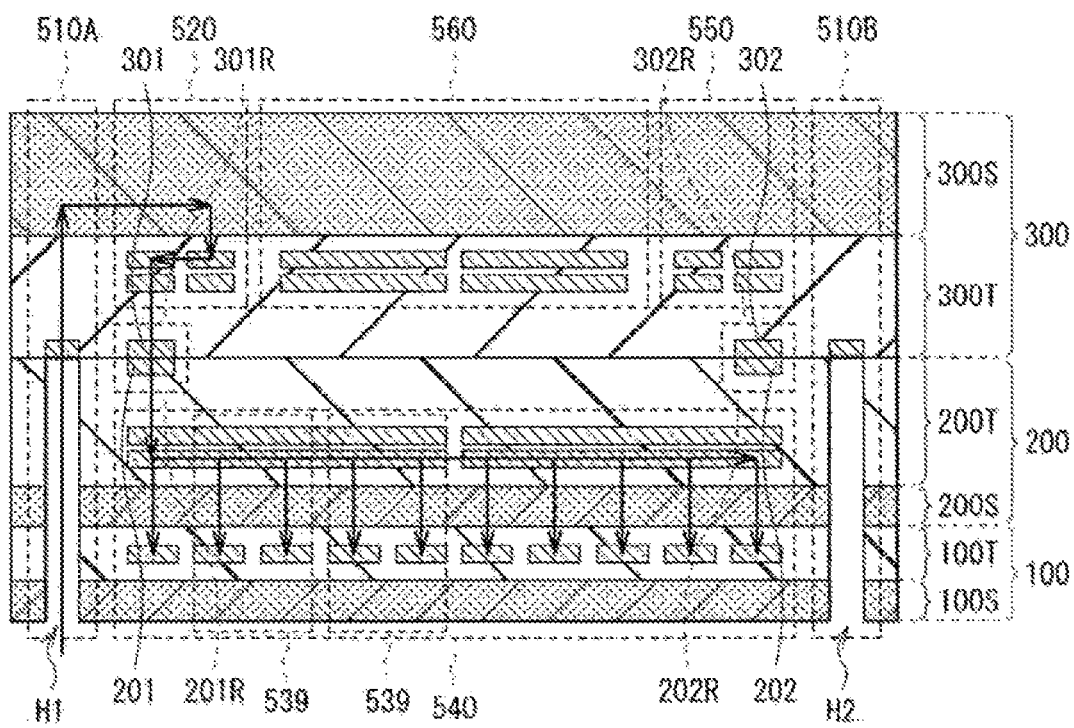
FIG. 13 is a schematic diagram illustrating a route of an input signal to the imaging device illustrated in FIG. 3.
Figure 14:
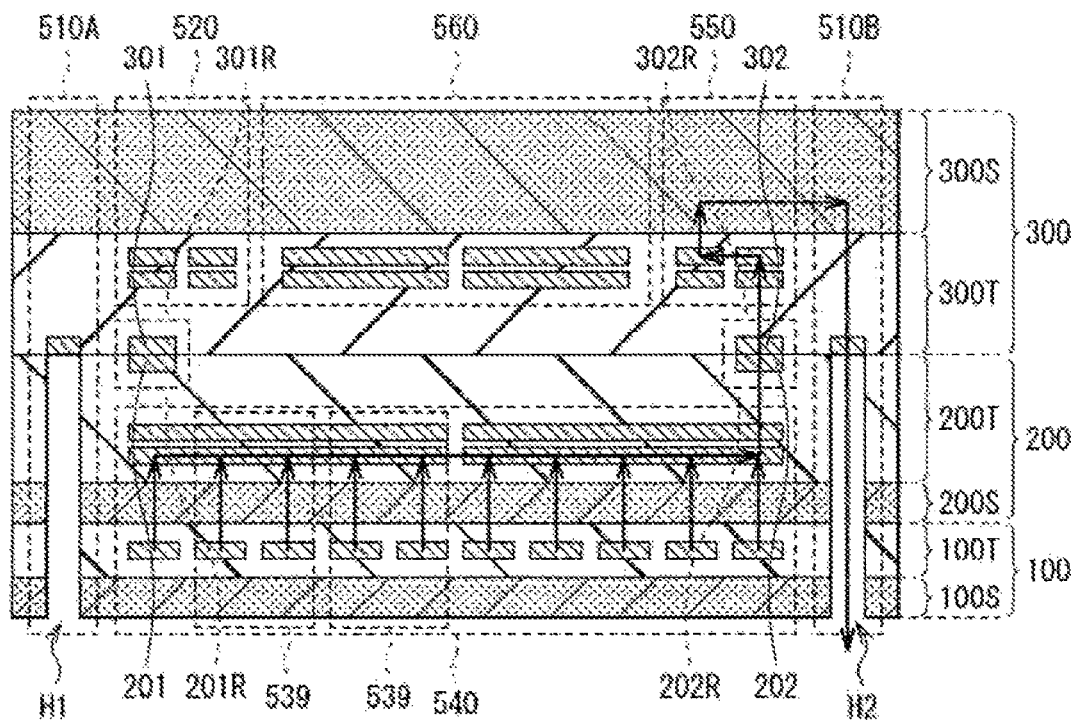
FIG. 14 is a schematic diagram illustrating a signal route of a pixel signal of the imaging device illustrated in FIG. 3.

Next, operation of the imaging device 1 will be described with reference to FIGS. 13 and 14. FIGS. 13 and 14 are diagrams having arrows representing routes of individual signals added to FIG. 3. In FIG. 13, routes of an input signal input to the imaging device 1 from the outside and routes of a power supply potential and a reference potential are indicated by arrows. In FIG. 14, a signal route regarding a pixel signal output from the imaging device 1 to the outside is indicated by arrows. For example, an input signal (for example, a pixel clock and a synchronization signal) input to the imaging device 1 via the input unit 510A is transmitted to the row drive unit 520 of the third substrate 300 to allow the row drive unit 520 to generate a row drive signal. The row drive signal is sent to the second substrate 200 via the contact portions 301 and 201. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D (FIG. 13). Furthermore, the power supply potential and the reference potential supplied from the outside of the imaging device 1 to the input unit 510A (input terminal 511) of the third substrate 300 are sent to the second substrate 200 via the contact portions 301 and 201, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539 via the through-substrate electrode 120E. The pixel signal based on this pixel signal is sent from the pixel circuit 210 to the third substrate 300 via the vertical signal line 543 and the contact portions 202 and 302. This pixel signal is processed by the column signal processing unit 550 and the image signal processing unit 560 of the third substrate 300, and then output to the outside via the output unit 510B.

[Effects]

In the present embodiment, the pixels 541A, 541B, 541C, and 541D (pixel sharing unit 539) and the pixel circuit 210 are provided on different substrates (first substrate 100 and second substrate 200). With this configuration, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, it is possible to increase the amount of pixel signals obtained by photoelectric conversion, and possible to decrease the transistor noise of the pixel circuit 210. This makes it possible to improve the signal/noise ratio of the pixel signal, enabling the imaging device 1 to output better pixel data (image information). In addition, it is possible to achieve miniaturization of the imaging device 1 (in other words, reduction of the pixel size and downsizing of the imaging device 1). With the reduced pixel size, the imaging device 1 can increase the number of pixels per unit area and can output a high-quality image.

Furthermore, in the imaging device 1, the first substrate 100 and the second substrate 200 are electrically connected to each other by the through-substrate electrodes 120E and 121E provided in the insulating region 212. For example, there is a conceivable method of connecting the first substrate 100 and the second substrate 200 to each other by bonding pad electrodes to each other, or a method of connecting these to each other by through-substrate wiring (for example, Thorough Si Via (TSV)) penetrating the semiconductor layer. As compared with such a method, by providing the through-substrate electrodes 120E and 121E in the insulating region 212, it is possible to decrease the area required for connecting the first substrate 100 and the second substrate 200 to each other. This makes it possible to reduce the pixel size and further downsize the imaging device 1. Furthermore, further miniaturization of the area per pixel leads to achievement of higher resolution. When there is no need to reduce the chip size, the formation region of the pixels 541A, 541B, 541C, and 541D and the pixel circuit 210 can be enlarged. As a result, it is possible to increase the amount of pixel signals obtained by photoelectric conversion and reduce the noise of the transistor included in the pixel circuit 210. This makes it possible to improve the signal/noise ratio of the pixel signal, enabling the imaging device 1 to output better pixel data (image information).

Furthermore, in the imaging device 1, the pixel circuit 210 is provided on a substrate (the second substrate 200) different from the substrate (the third substrate 300) on which the column signal processing unit 550 and the image signal processing unit 560 are provided. This configuration can enlarge the area of the pixel circuit 210 and the areas of the column signal processing unit 550 and the image signal processing unit 560 as compared with the case where the pixel circuit 210, the column signal processing unit 550, and the image signal processing unit 560 are formed on the same substrate. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel array unit 540 is provided on the first substrate 100 and the second substrate 200, and the column signal processing unit 550 and the image signal processing unit 560 are provided on the third substrate 300. In addition, the contact portions 201, 202, 301, and 302 connecting the second substrate 200 and the third substrate 300 are formed above the pixel array unit 540. This enables flexible layout of the contact portions 201, 202, 301, and 302 without receiving layout interference from various wiring lines provided in the pixel array. For this reason, the contact portions 201, 202, 301, and 302 can be applied to electrical connection between the second substrate 200 and the third substrate 300. With the use of the contact portions 201, 202, 301, and 302, for example, the column signal processing unit 550 and the image signal processing unit 560 have a higher degree of freedom in layout. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel isolation portion 117 penetrates the semiconductor layer 100S. With this configuration, even when the distance between adjacent pixels (pixels 541A, 541B, 541C, and 541D) is shortened due to miniaturization of the area per pixel, it is possible to suppress color mixing among the pixels 541A, 541B, 541C, and 541D. This makes it possible to improve the signal/noise ratio of the pixel signal, enabling the imaging device 1 to output better pixel data (image information).

Furthermore, in the imaging device 1, a pixel circuit 210 is provided for each pixel sharing unit 539. With this configuration, as compared with a case where the pixel circuit 210 is provided in each of the pixels 541A, 541B, 541C, and 541D, it is possible to increase the formation region of the transistors (amplification transistor AMP, reset transistor RST, selection transistor SEL, and FD conversion gain switching transistor FDG) constituting the pixel circuit 210. For example, noise can be suppressed by increasing the formation region of the amplification transistor AMP. This makes it possible to improve the signal/noise ratio of the pixel signal, enabling the imaging device 1 to output better pixel data (image information).

Furthermore, in the imaging device 1, the pad portion 120 that electrically connects the floating diffusion FD (floating diffusion FD1, FD2, FD3, and FD4) of the four pixels (pixels 541A, 541B, 541C, and 541D) is provided on the first substrate 100. With this configuration, it is possible to decrease the number of through-substrate electrodes (through-substrate electrodes 120E) connecting the first substrate 100 and the second substrate 200 to each other as compared with the case where the pad portion 120 is provided on the second substrate 200. This makes it possible to reduce the size of the insulating region 212 and ensure a sufficient size of the transistor formation region (semiconductor layer 200S) constituting the pixel circuit 210. This makes it possible to reduce the noise of the transistor included in the pixel circuit 210, leading to improvement in the signal/noise ratio of the pixel signal, enabling the imaging device 1 to output better pixel data (image information).

Hereinafter, modifications of the imaging device 1 according to the above embodiment will be described. In the following modifications, the same reference symbols are assigned to the same configurations as those of the above embodiment.

2. First Modification

Figure 15:
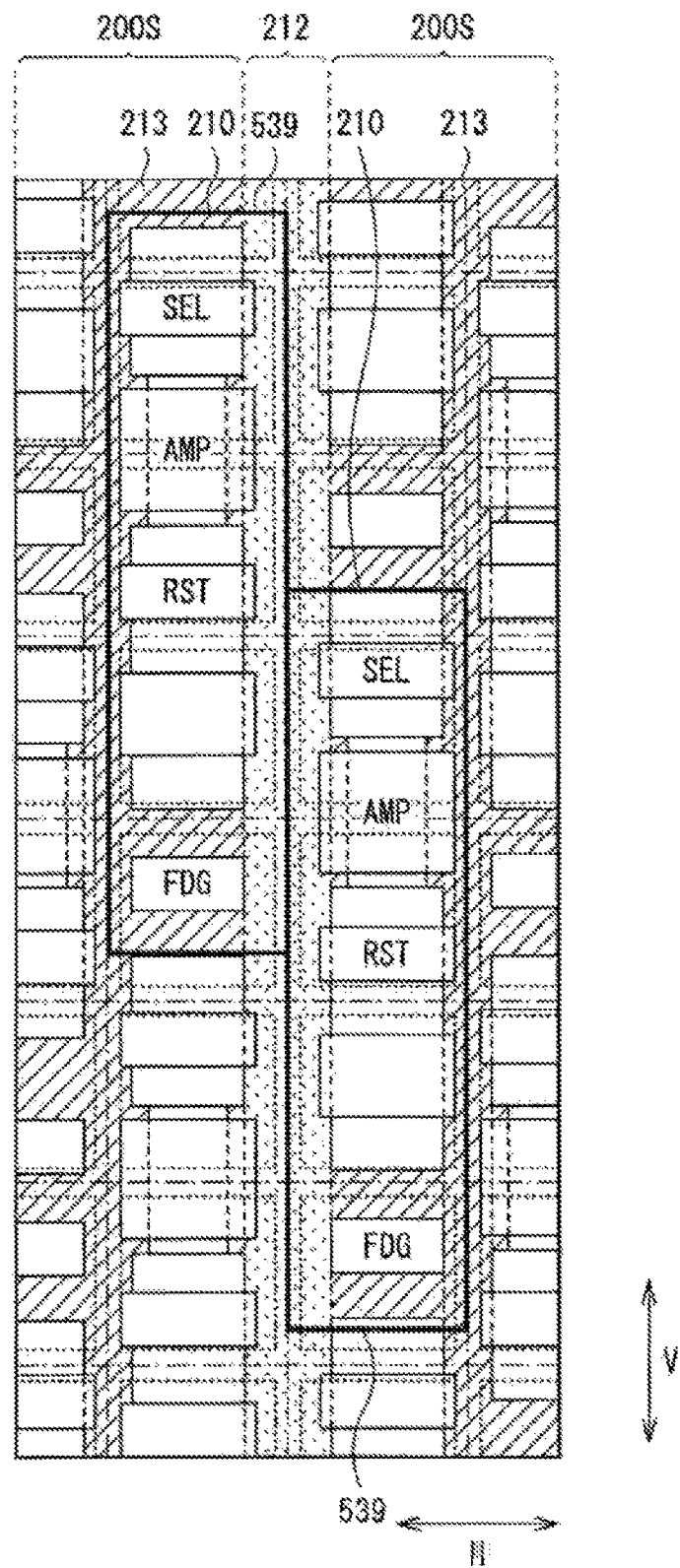
FIG. 15 is a schematic diagram illustrating a modification of the planar configuration of the second substrate (semiconductor layer) illustrated in FIG. 8.
Figure 16:
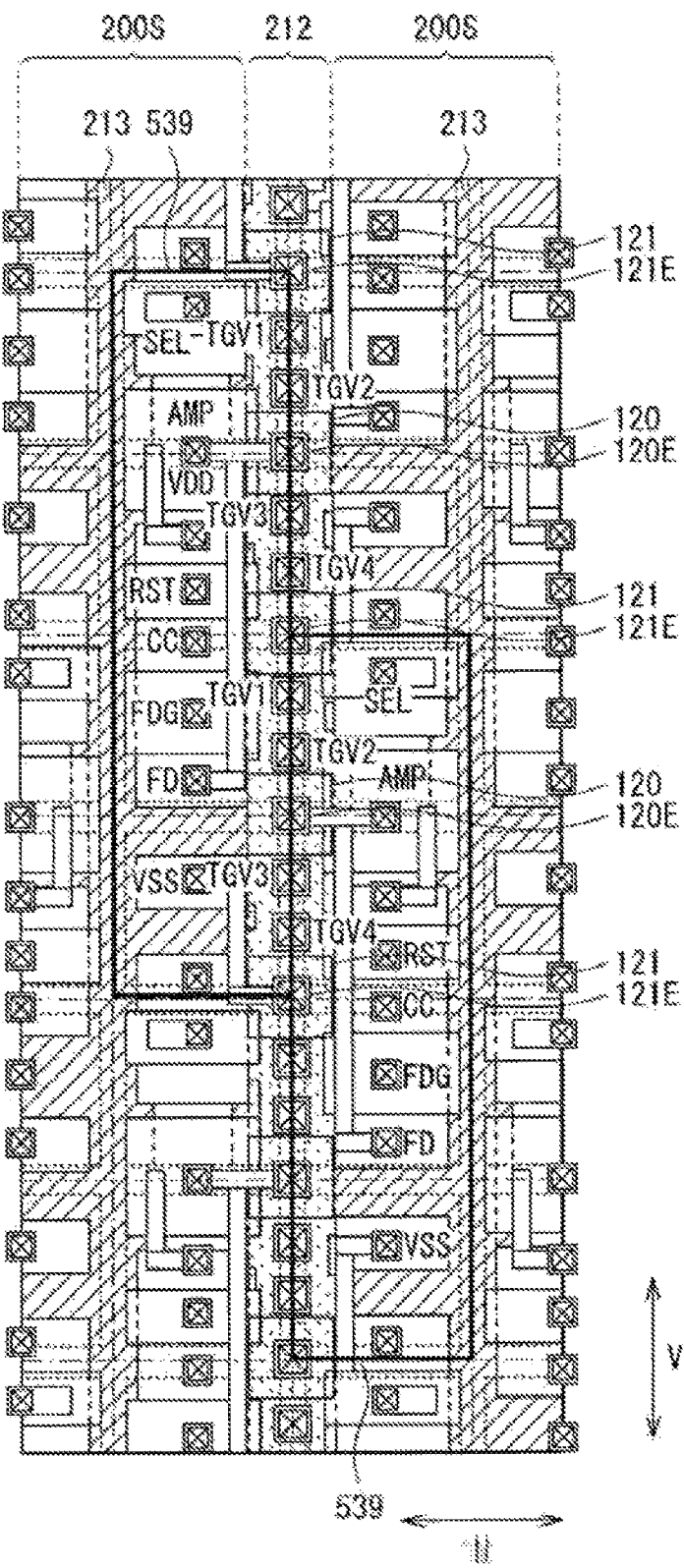
FIG. 16 is a schematic diagram illustrating a planar configuration of a main part of the first wiring layer and the first substrate together with a pixel circuit illustrated in FIG. 15.
Figure 17:
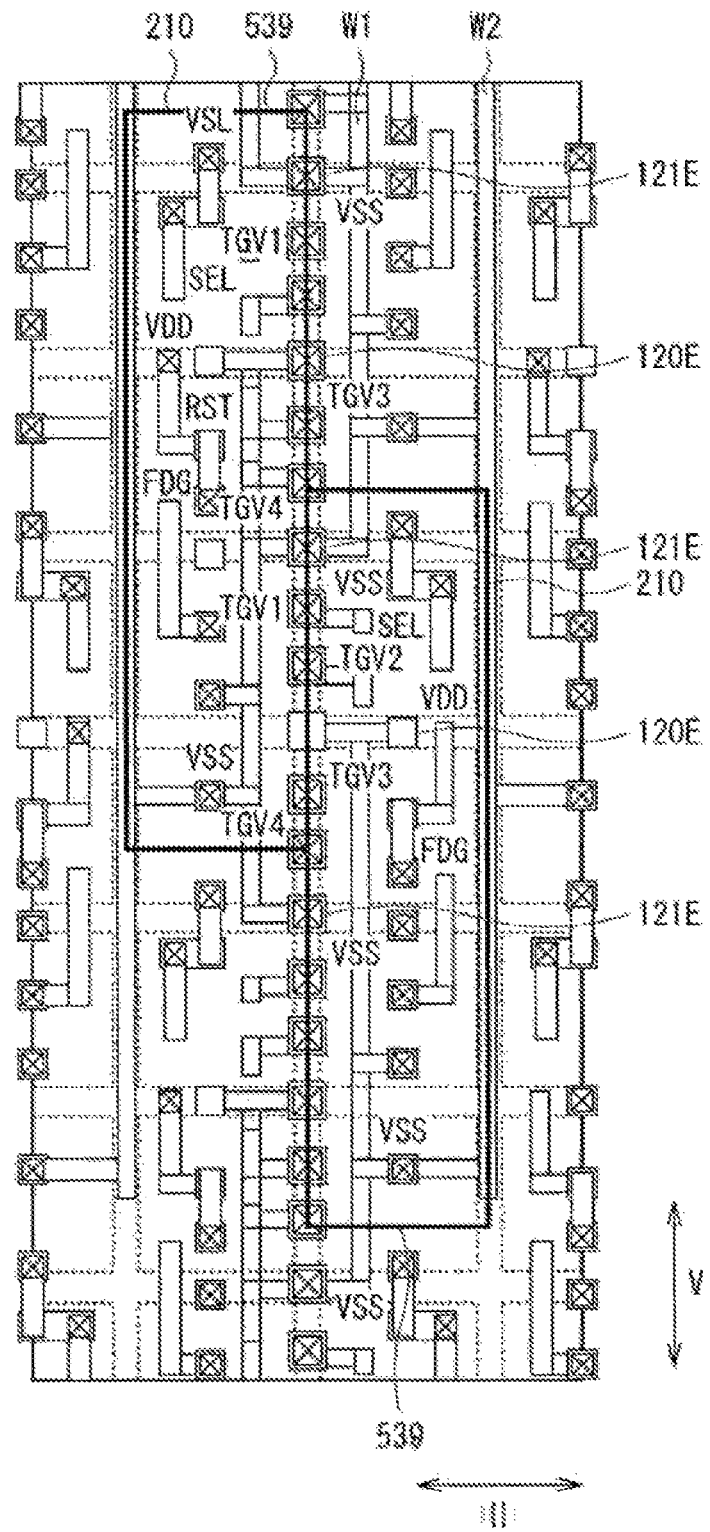
FIG. 17 is a schematic diagram illustrating an example of a planar configuration of the second wiring layer together with the first wiring layer illustrated in FIG. 16.
Figure 18:
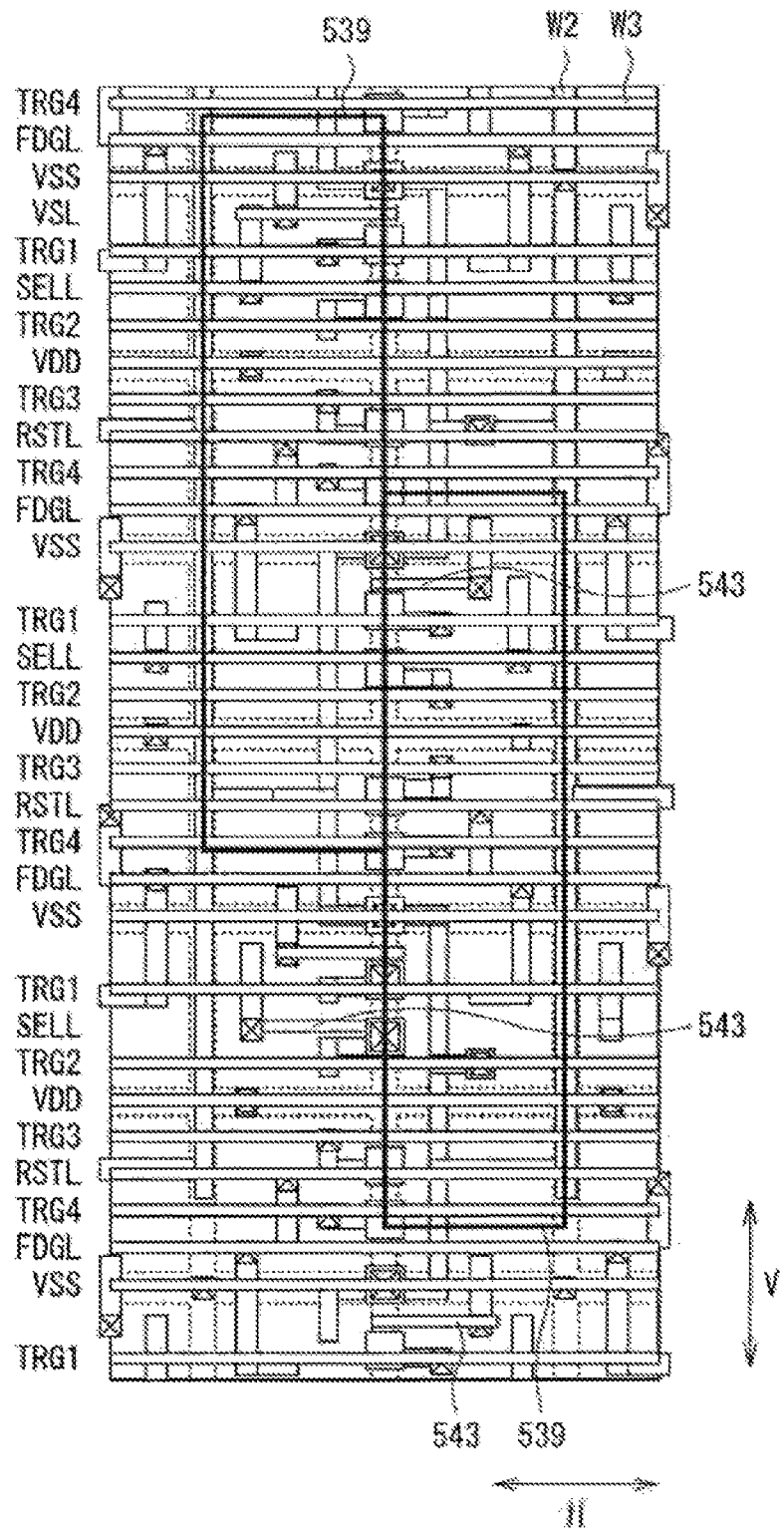
FIG. 18 is a schematic diagram illustrating an example of a planar configuration of the third wiring layer together with the second wiring layer illustrated in FIG. 17.
Figure 19:
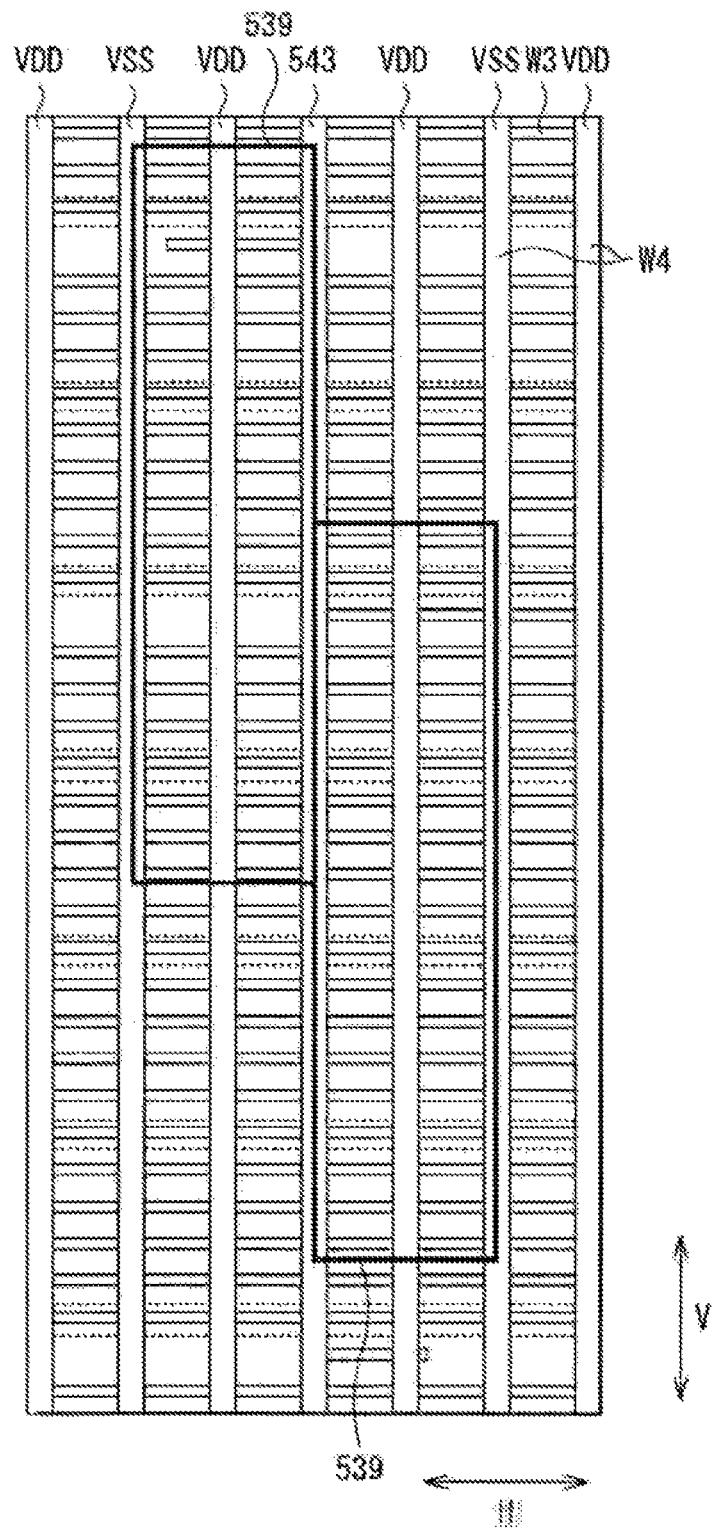
FIG. 19 is a schematic diagram illustrating an example of a planar configuration of the fourth wiring layer together with the third wiring layer illustrated in FIG. 18.

FIGS. 15 to 19 illustrate a modification of the planar configuration of the imaging device 1 according to the above embodiment. FIG. 15 schematically illustrates a planar configuration in the vicinity of the front surface of the semiconductor layer 200S of the second substrate 200, and corresponds to FIG. 8 described in the above embodiment. FIG. 16 schematically illustrates a configuration of each of portions of the first wiring layer W1, the semiconductor layer 200S connected to the first wiring layer W1, and the first substrate 100, and corresponds to FIG. 9 described in the above embodiment. FIG. 17 illustrates an example of a planar configuration of the first wiring layer W1 and the second wiring layer W2, and corresponds to FIG. 10 described in the above embodiment. FIG. 18 illustrates an example of a planar configuration of the second wiring layer W2 and the third wiring layer W3, and corresponds to FIG. 11 described in the above embodiment. FIG. 19 illustrates an example of a planar configuration of the third wiring layer W3 and the fourth wiring layer W4, and corresponds to FIG. 12 described in the above embodiment.

As illustrated in FIG. 16, the present modification has a configuration in which the internal layout of one pixel sharing unit 539 (for example, one on the right side in the drawing) among the two pixel sharing units 539 arranged in the H direction on the second substrate 200 is obtained by inverting the internal layout of the other pixel sharing unit 539 (for example, one on the left side in the drawing) only in the H direction. In addition, the shift in the V direction between the outline of one pixel sharing unit 539 and the outline of the other pixel sharing unit 539 is larger than the shift described in the above embodiment (FIG. 9). In this manner, providing a larger shift in the V direction will make it possible to shorten the distance between the amplification transistor AMP of the other pixel sharing unit 539 and the connected pad portion 120 (the pad portion 120 of the other pixel sharing unit 539 (one on lower side of the drawing) of the two pixel sharing units 539 aligned in the V direction illustrated in FIGS. 7A and 7B). With such a layout, the first modification of the imaging device 1 illustrated in FIGS. 15 to 19 can make an achievement of the area of the planar layout of the two pixel sharing units 539 aligned in the H direction the same as the area of the pixel sharing unit 539 of the second substrate 200 described in the above embodiment without mutually inverting the planar layout of the two pixel sharing units 539 in the V direction. Note that the planar layout of the pixel sharing unit 539 of the first substrate 100 is the same as the planar layout described in the above embodiment (FIGS. 7A and 7B). Therefore, the imaging device 1 of the present modification can obtain the effects similar to those of the imaging device 1 described in the above embodiment. The arrangement of the pixel sharing unit 539 of the second substrate 200 is not limited to the arrangement described in the above embodiment and the present modification.

3. Second Modification

Figure 20:
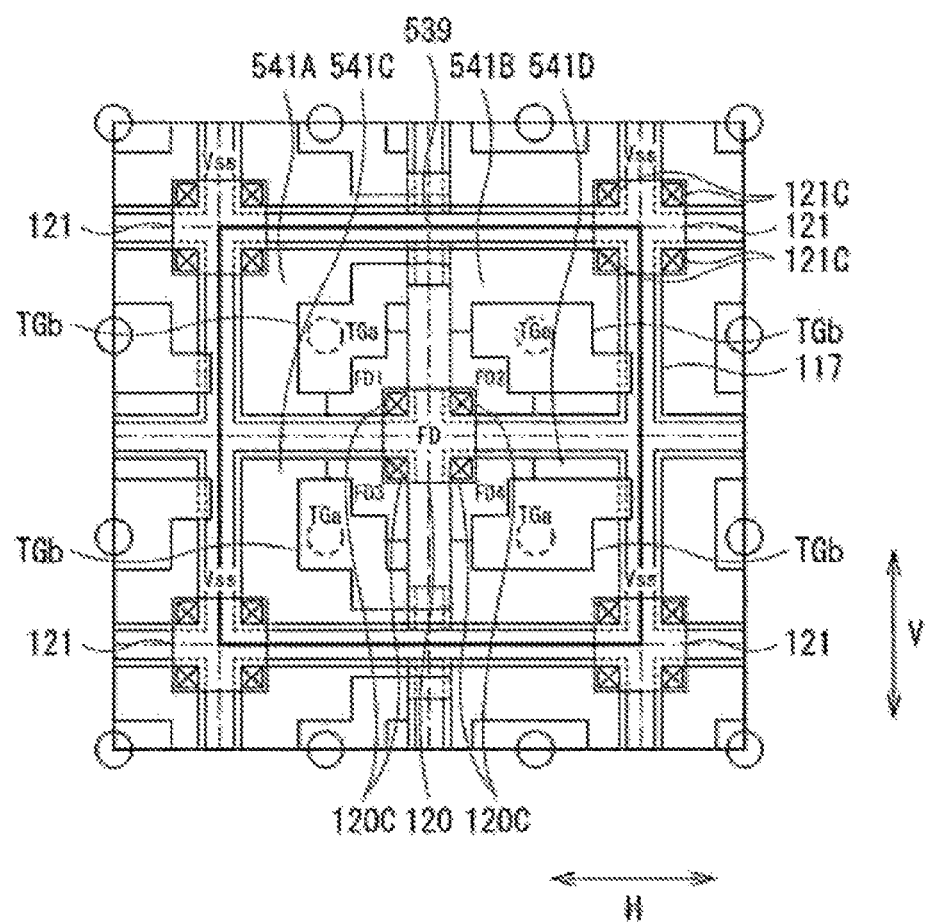
FIG. 20 is a schematic diagram illustrating a modification of the planar configuration of the first substrate illustrated in FIG. 7A.
Figure 21:
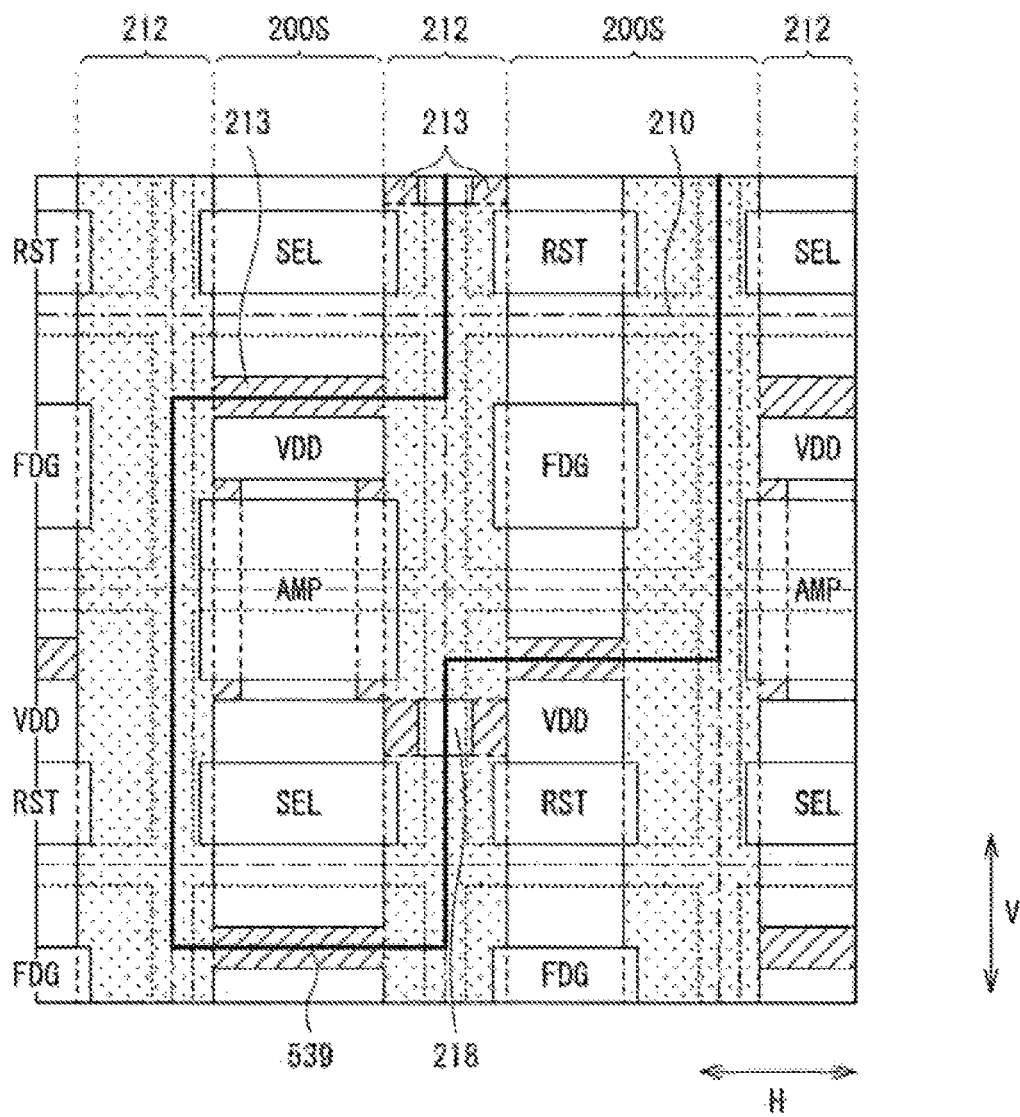
FIG. 21 is a schematic diagram illustrating an example of a planar configuration of the second substrate (semiconductor layer) stacked on the first substrate illustrated in FIG. 20.
Figure 22:
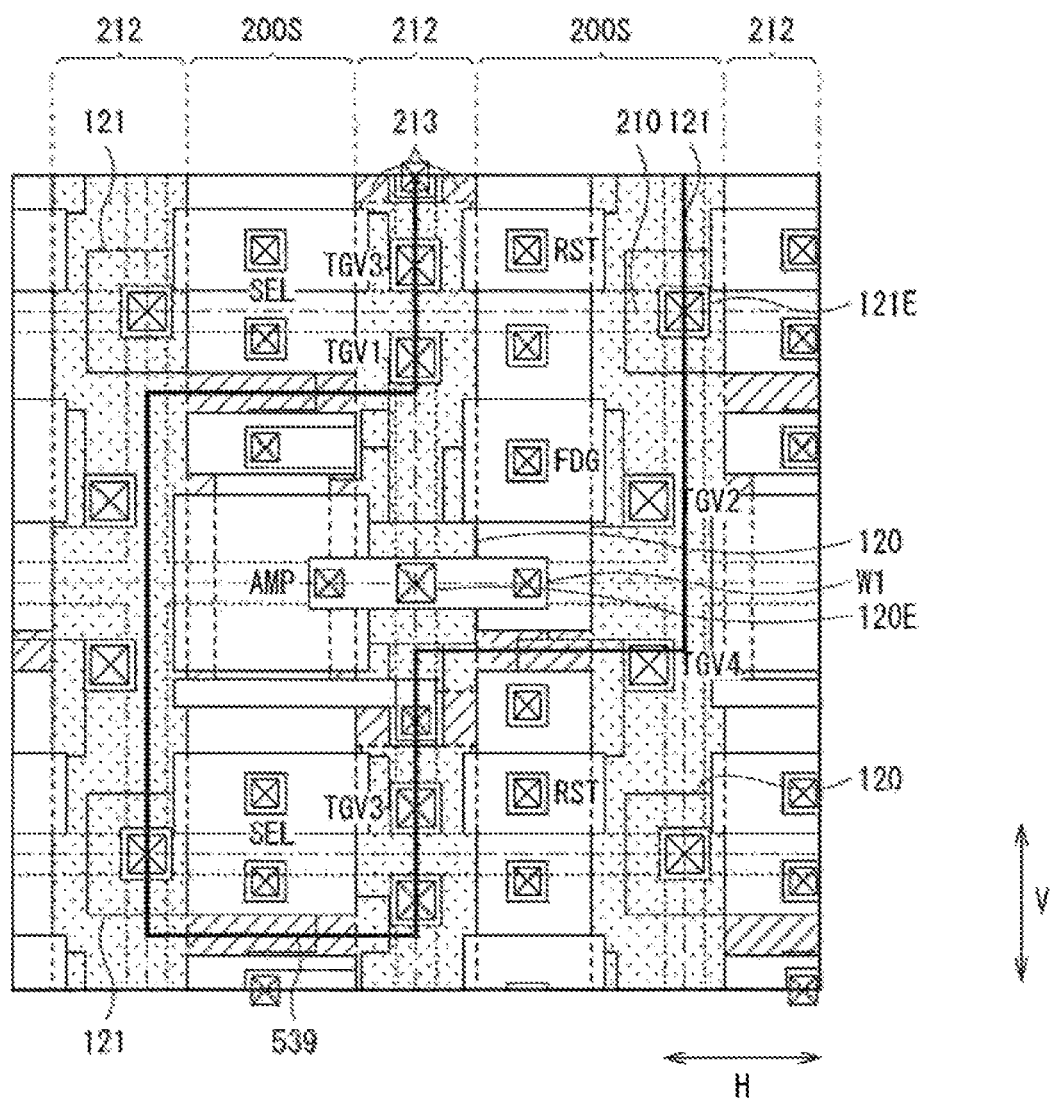
FIG. 22 is a schematic diagram illustrating an example of a planar configuration of the first wiring layer together with the pixel circuit illustrated in FIG. 21.
Figure 23:
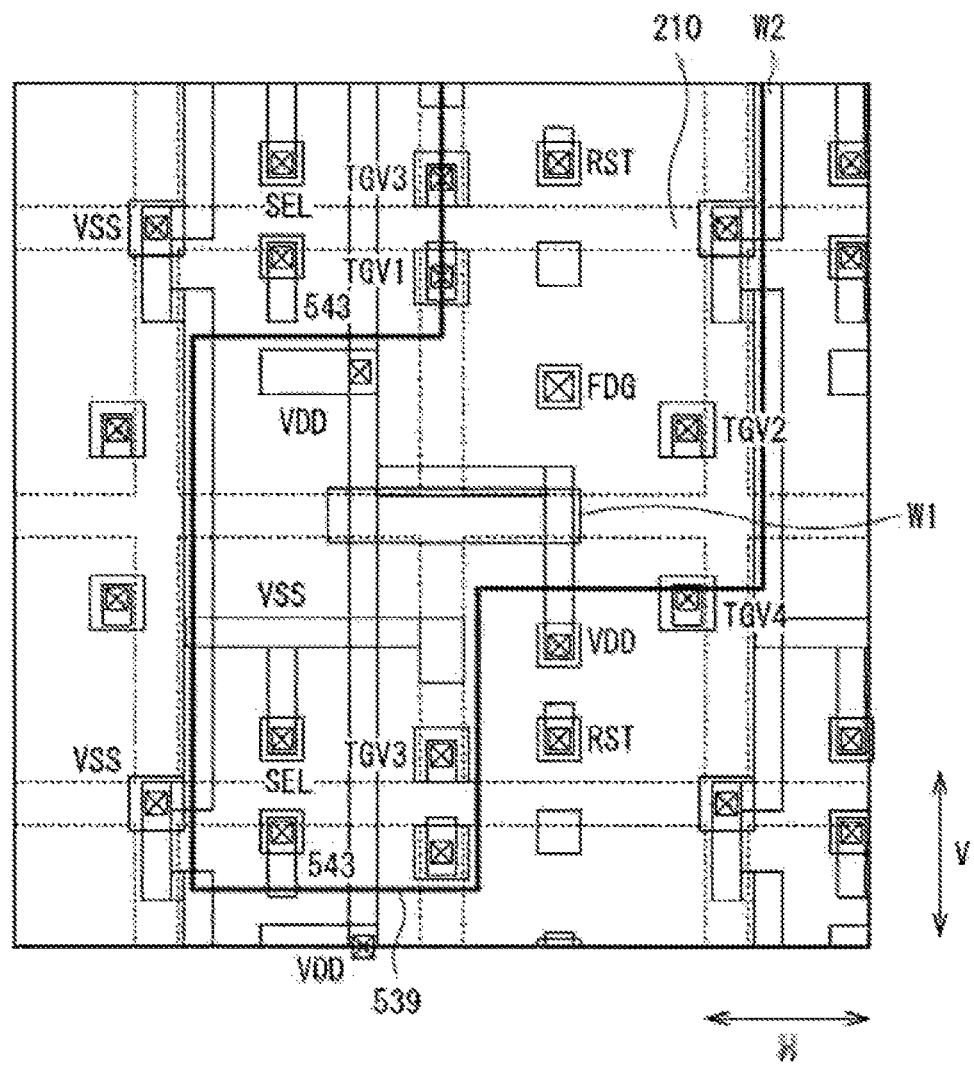
FIG. 23 is a schematic diagram illustrating an example of a planar configuration of the second wiring layer together with the first wiring layer illustrated in FIG. 22.
Figure 24:
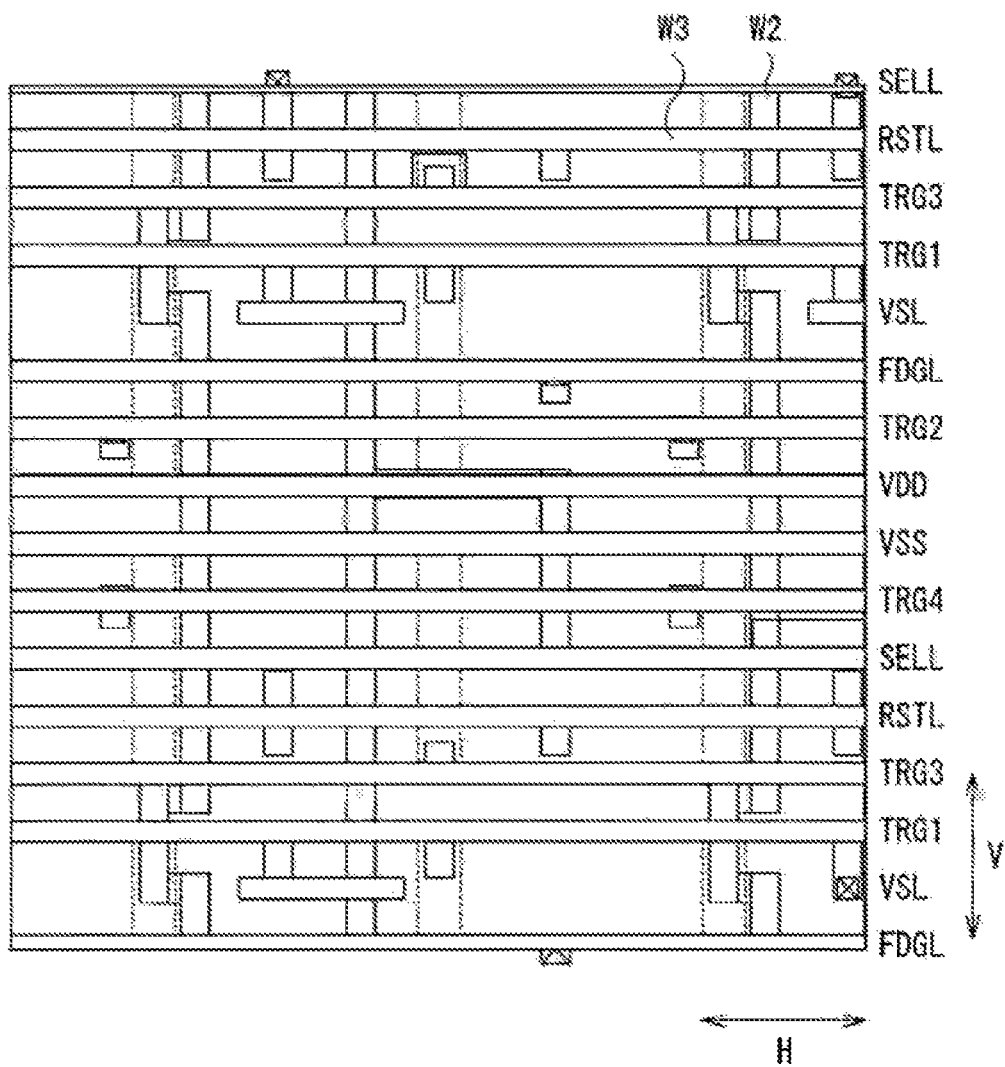
FIG. 24 is a schematic diagram illustrating an example of a planar configuration of the third wiring layer together with the second wiring layer illustrated in FIG. 23.
Figure 25:
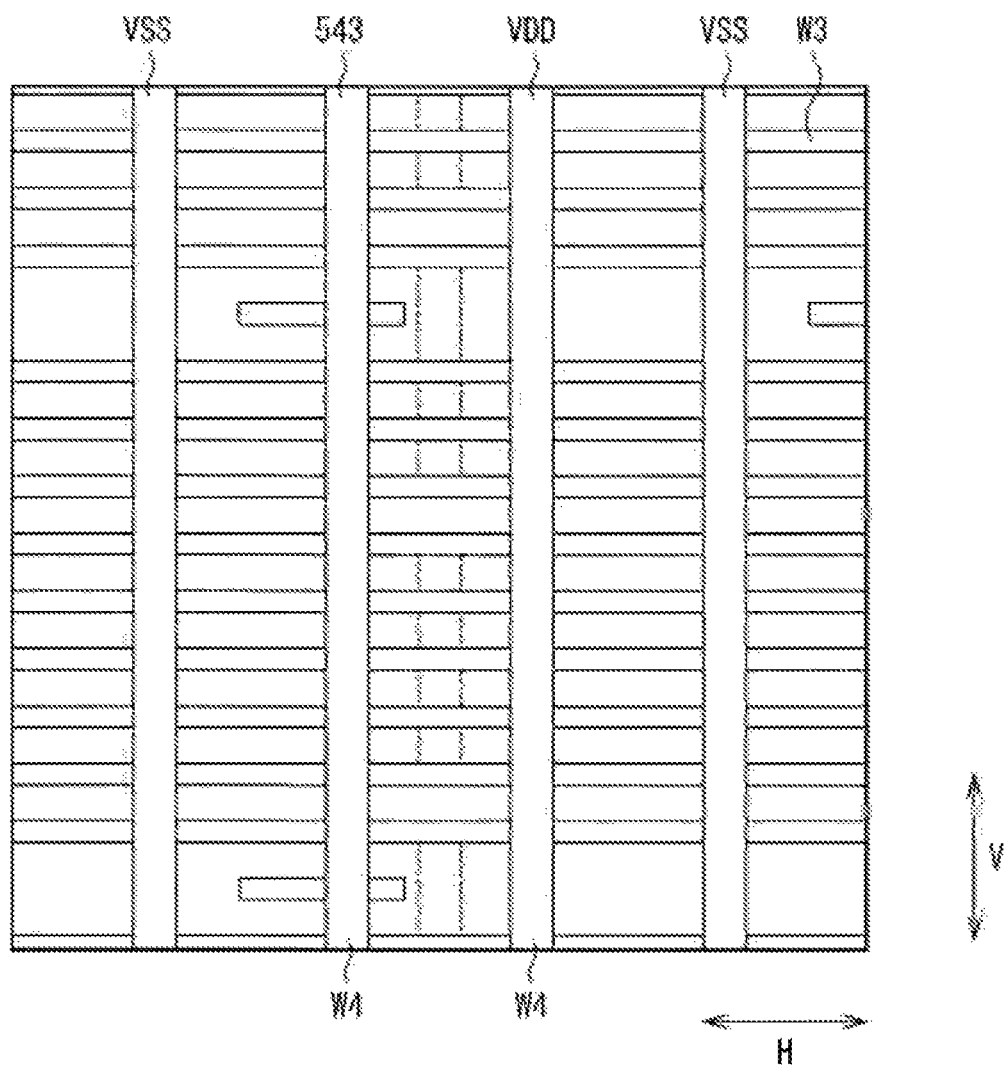
FIG. 25 is a schematic diagram illustrating an example of a planar configuration of the fourth wiring layer together with the third wiring layer illustrated in FIG. 24.

FIGS. 20 to 25 illustrate a modification of the planar configuration of the imaging device 1 according to the above embodiment. FIG. 20 schematically illustrates a planar configuration of the first substrate 100, and corresponds to FIG. 7A described in the above embodiment. FIG. 21 schematically illustrates a planar configuration in the vicinity of the front surface of the semiconductor layer 200S of the second substrate 200, and corresponds to FIG. 8 described in the above embodiment. FIG. 22 schematically illustrates a configuration of each of portions of the first wiring layer W1, the semiconductor layer 200S connected to the first wiring layer W1, and the first substrate 100, and corresponds to FIG. 9 described in the above embodiment. FIG. 23 illustrates an example of a planar configuration of the first wiring layer W1 and the second wiring layer W2, and corresponds to FIG. 10 described in the above embodiment. FIG. 24 illustrates an example of a planar configuration of the second wiring layer W2 and the third wiring layer W3, and corresponds to FIG. 11 described in the above embodiment. FIG. 25 illustrates an example of a planar configuration of the third wiring layer W3 and the fourth wiring layer W4, and corresponds to FIG. 12 described in the above embodiment.

In the present modification, the outer shape of each of the pixel circuits 210 has a substantially square planar shape (FIG. 21 and the like). In this respect, the planar configuration of the imaging device 1 of the present modification is different from the planar configuration of the imaging device 1 described in the above embodiment.

For example, the pixel sharing unit 539 of the first substrate 100 is formed over a pixel region of 2 rows×2 columns, and has a substantially square planar shape (FIG. 20), similarly to the description in the embodiment described above. For example, in each of the pixel sharing units 539, the horizontal portions TGb of the transfer gates TG1 and TG3 of the respective pixel 541A and the pixel 541C of one pixel column extend in the direction from a position overlapping the vertical portion TGa toward the central portion of the pixel sharing unit 539 in the H direction (more specifically, a direction toward the outer edges of the pixels 541A and 541C and a direction toward the central portion of the pixel sharing unit 539), while the horizontal portions TGb of the transfer gates TG2 and TG4 of the respective pixel 541B and the pixel 541D of the other pixel column extend in the direction from a position overlapping the vertical portion TGa toward the outer side of the pixel sharing unit 539 in the H direction (more specifically, a direction toward the outer edges of the pixels 541B and 541D and a direction toward the outer side of the pixel sharing unit 539). The pad portion 120 connected to the floating diffusion FD is provided at a central portion of the pixel sharing unit 539 (central portion of the pixel sharing unit 539 in the H direction and the V direction), while the pad portion 121 connected to the VSS contact region 118 is provided at an end of the pixel sharing unit 539 at least in the H direction (in the H direction and the V direction in FIG. 20).

As another arrangement example, it is also conceivable to provide the horizontal portions TGb of the transfer gates TG1, TG2, TG3, and TG4 only in a region facing the vertical portion TGa. At this time, the semiconductor layer 200S is likely to be divided into a number of pieces similarly to the description in the above embodiment. This makes it difficult to enlarge the transistors of the pixel circuit 210. On the other hand, when the horizontal portions TGb of the transfer gates TG1, TG2, TG3, and TG4 are extended in the H direction from the position overlapping the vertical portion TGa as in the above modification, the width of the semiconductor layer 200S can be increased as described similarly to the description in the above embodiment. Specifically, the positions in the H direction of the through-substrate electrodes TGV1 and TGV3 respectively connected to the transfer gates TG1 and TG3 can be arranged close to the position in the H direction of the through-substrate electrode 120E, while the positions in the H direction of the through-substrate electrodes TGV2 and TGV4 respectively connected to the transfer gates TG2 and TG4 can be arranged close to the position in the H direction of the through-substrate electrode 121E (FIG. 22). This configuration can increase the width (size in the H direction) of the semiconductor layer 200S extending in the V direction similarly to the description in the above embodiment. This makes it possible to increase the size of the transistors of the pixel circuit 210, particularly, the size of the amplification transistor AMP. As a result, it is possible to improve the signal/noise ratio of the pixel signal, enabling the imaging device 1 to output better pixel data (image information).

The pixel sharing unit 539 of the second substrate 200 has substantially the same size as that of the pixel sharing unit 539 of the first substrate 100 in the H direction and the V direction, for example, and is provided over a region corresponding to a pixel region of approximately 2 rows×2 columns, for example. For example, in each of the pixel circuits 210, the selection transistor SEL and the amplification transistor AMP are arranged side by side in the V direction in one semiconductor layer 200S extending in the V direction, while the FD conversion gain switching transistor FDG and the reset transistor RST are arranged side by side in the V direction in one semiconductor layer 200S extending in the V direction. The one semiconductor layer 200S including the selection transistor SEL and the amplification transistor AMP and the one semiconductor layer 200S including the FD conversion gain switching transistor FDG and the reset transistor RST are arranged in the H direction via the insulating region 212. The insulating region 212 extends in the V direction (FIG. 21).

Here, the outer shape of the pixel sharing unit 539 of the second substrate 200 will be described with reference to FIGS. 21 and 22. For example, the pixel sharing unit 539 of the first substrate 100 illustrated in FIG. 20 is connected to the amplification transistor AMP and the selection transistor SEL provided on one side of the pad portion 120 in the H direction (the left side of FIG. 22), and connected to the FD conversion gain switching transistor FDG and the reset transistor RST provided on the other side of the pad portion 120 in the H direction (the right side of FIG. 22). The outer shape of the pixel sharing unit 539 of the second substrate 200, including the amplification transistor AMP, the selection transistor SEL, the FD conversion gain switching transistor FDG, and the reset transistor RST, is determined by the following four outer edges.

The first outer edge is an outer edge of one end in the V direction of the semiconductor layer 200S including the selection transistor SEL and the amplification transistor AMP (end on the upper side of FIG. 22). The first outer edge is provided between the amplification transistor AMP included in the pixel sharing unit 539 and the selection transistor SEL included in the pixel sharing unit 539 adjacent to one side in the V direction of the pixel sharing unit 539 (upper side of FIG. 22). More specifically, the first outer edge is provided at the central portion in the V direction of the element isolation region 213 between the amplification transistor AMP and the selection transistor SEL. The second outer edge is an outer edge of the other end in the V direction of the semiconductor layer 200S including the selection transistor SEL and the amplification transistor AMP (lower end of FIG. 22). The second outer edge is provided between the selection transistor SEL included in the pixel sharing unit 539 and the amplification transistor AMP included in the pixel sharing unit 539 adjacent to the other side in the V direction of the pixel sharing unit 539 (the lower side of FIG. 22). More specifically, the second outer edge is provided at the central portion in the V direction of the element isolation region 213 between the selection transistor SEL and the amplification transistor AMP. The third outer edge is an outer edge of the other end in the V direction (lower end of FIG. 22) of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side in the V direction of the pixel sharing unit 539 (the lower side of FIG. 22). More specifically, the third outer edge is provided at the central portion in the V direction of the element isolation region 213 between the FD conversion gain switching transistor FDG and the reset transistor RST. The fourth outer edge is an outer edge of one end in the V direction of the semiconductor layer 200S including the reset transistor RST and the FD conversion gain switching transistor FDG (end on upper side of FIG. 22). The fourth outer edge is provided between the reset transistor RST included in the pixel sharing unit 539 and the FD conversion gain switching transistor FDG (not illustrated) included in the pixel sharing unit 539 adjacent to one side in the V direction of the pixel sharing unit 539 (on upper side of FIG. 22). More specifically, the fourth outer edge is provided at the central portion in the V direction of the element isolation region 213 (not illustrated) between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be disposed as close as possible to the pad portion 120. This makes it possible to reduce the area of the wiring connecting these, facilitating miniaturization of the imaging device 1. Note that the VSS contact region 218 is provided between the semiconductor layer 200S including the selection transistor SEL and the amplification transistor AMP and the semiconductor layer 200S including the reset transistor RST and the FD conversion gain switching transistor FDG. For example, the plurality of pixel circuits 210 has the same arrangement.

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification.

4. Third Modification

Figure 26:
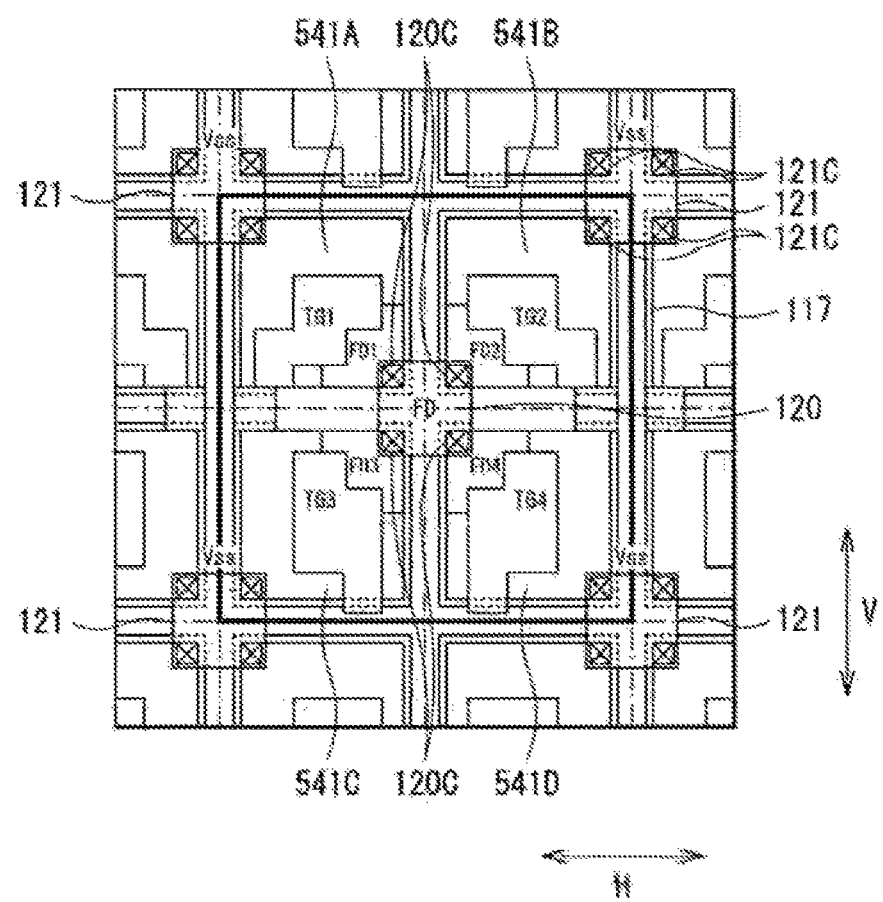
FIG. 26 is a schematic diagram illustrating another example of the planar configuration of the first substrate illustrated in FIG. 20.
Figure 27:
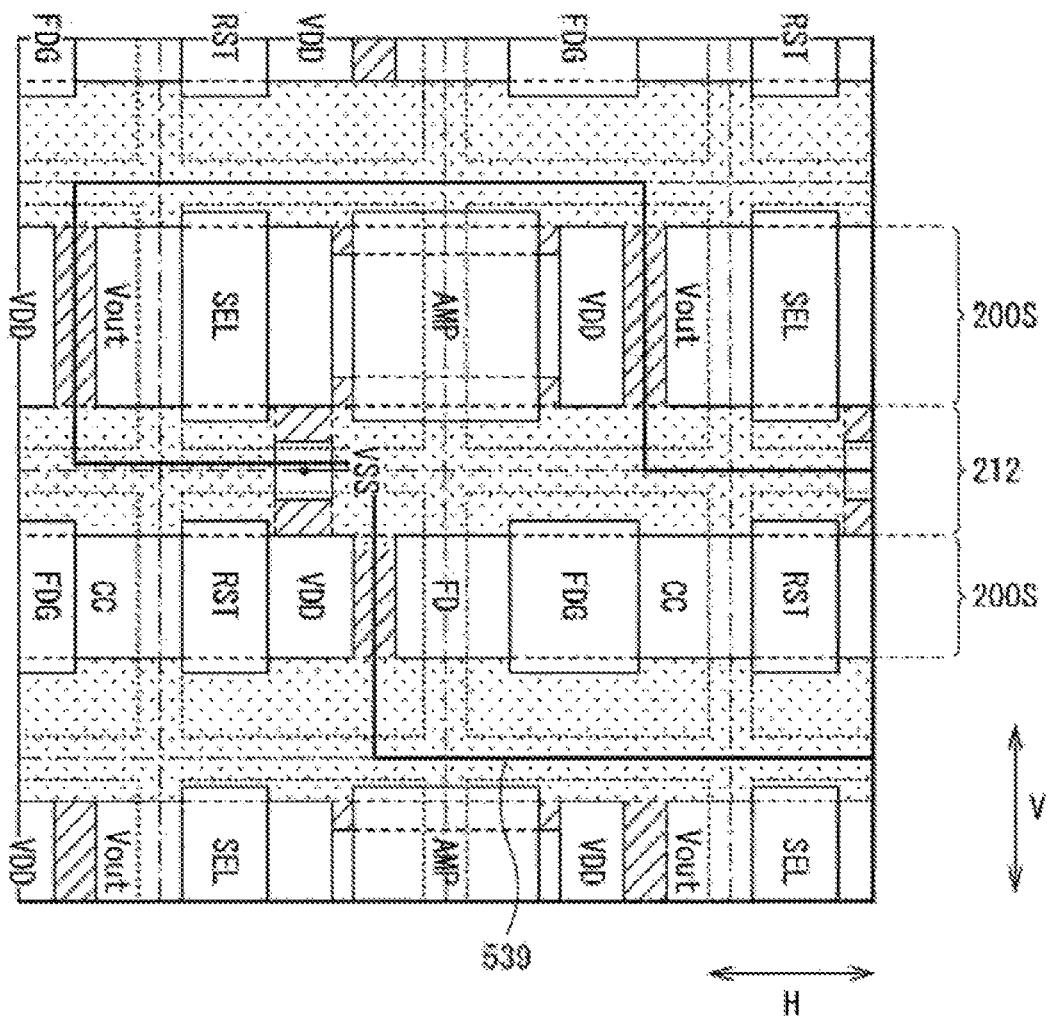
FIG. 27 is a schematic diagram illustrating an example of a planar configuration of the second substrate (semiconductor layer) stacked on the first substrate illustrated in FIG. 26.
Figure 28:
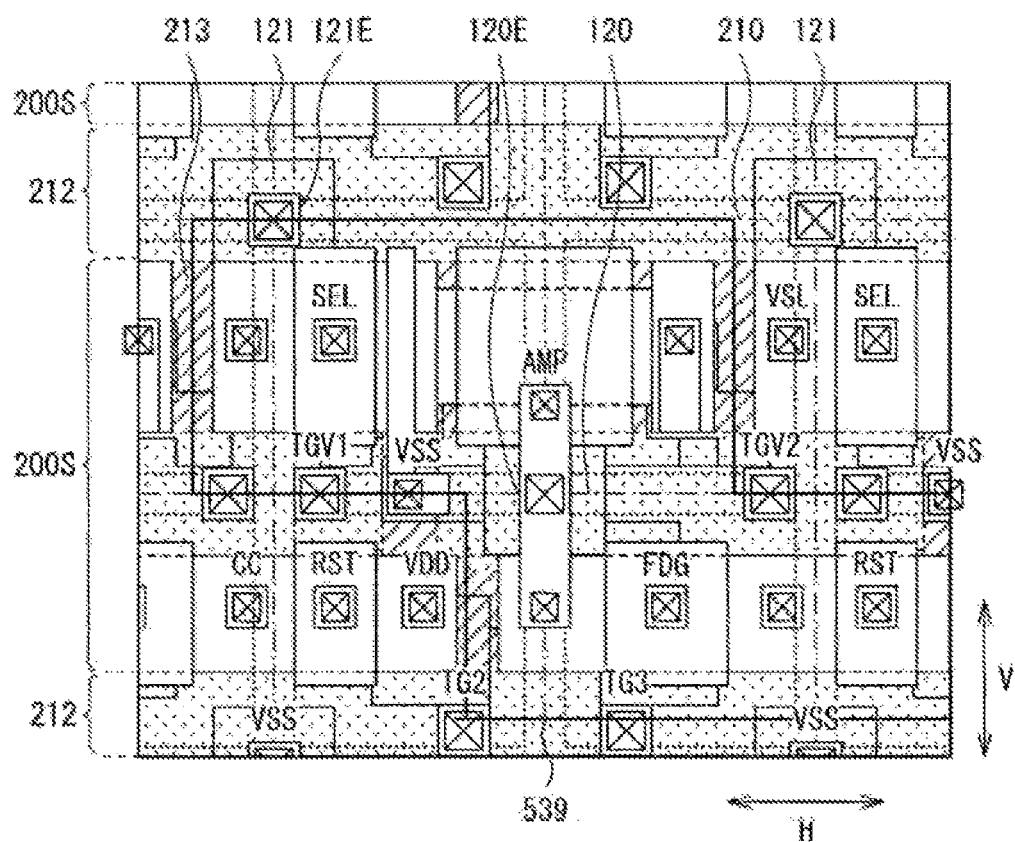
FIG. 28 is a schematic diagram illustrating an example of a planar configuration of the first wiring layer together with the pixel circuit illustrated in FIG. 27.
Figure 29:
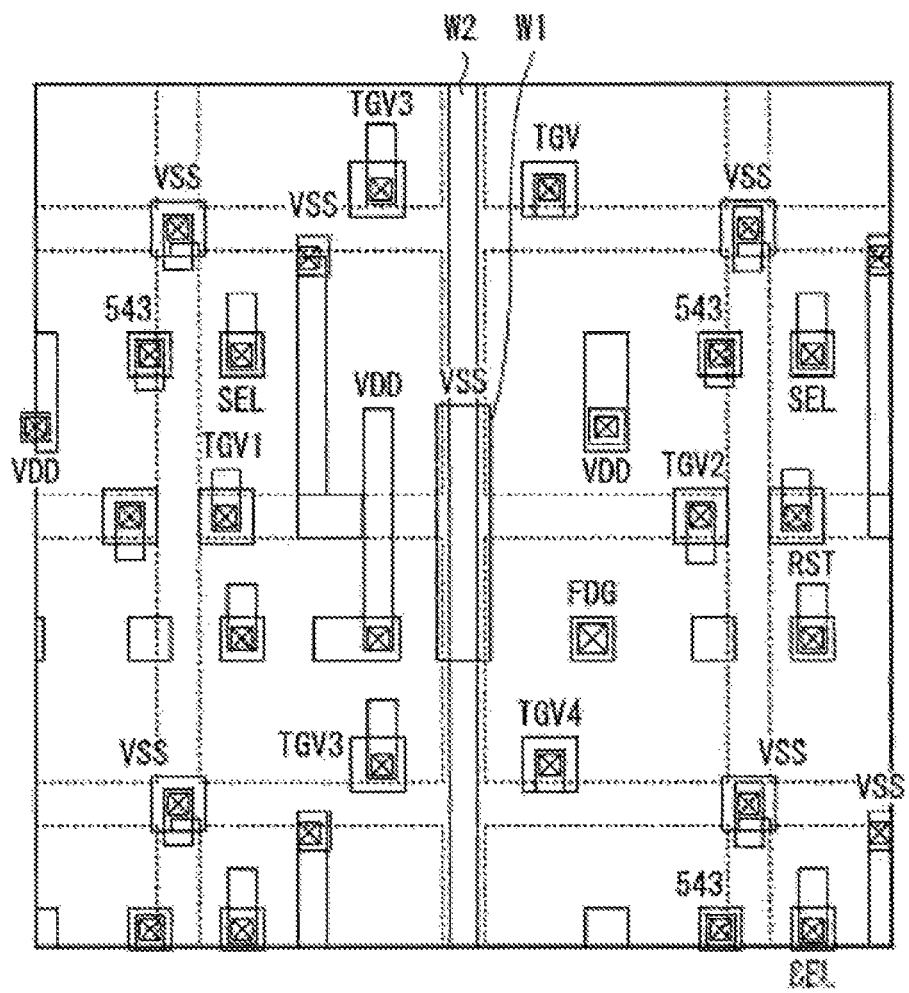
FIG. 29 is a schematic diagram illustrating an example of a planar configuration of the second wiring layer together with the first wiring layer illustrated in FIG. 28.
Figure 30:
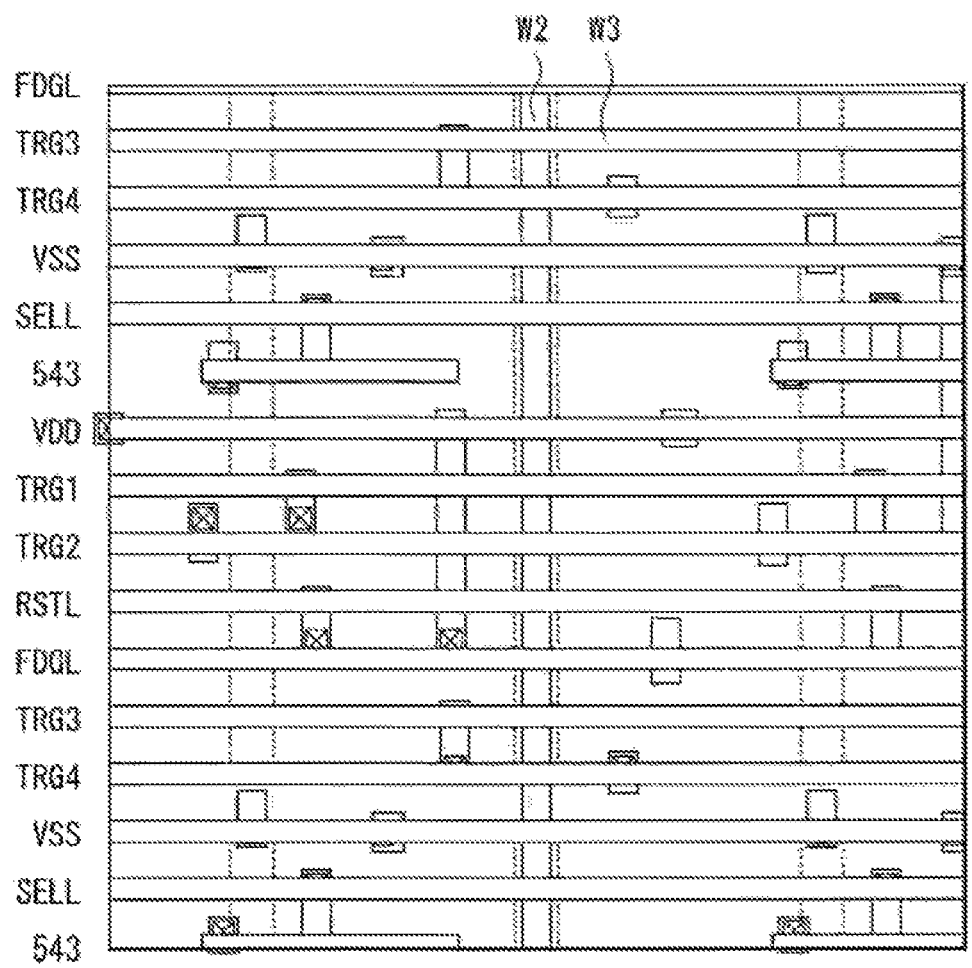
FIG. 30 is a schematic diagram illustrating an example of a planar configuration of the third wiring layer together with the second wiring layer illustrated in FIG. 29.
Figure 31:
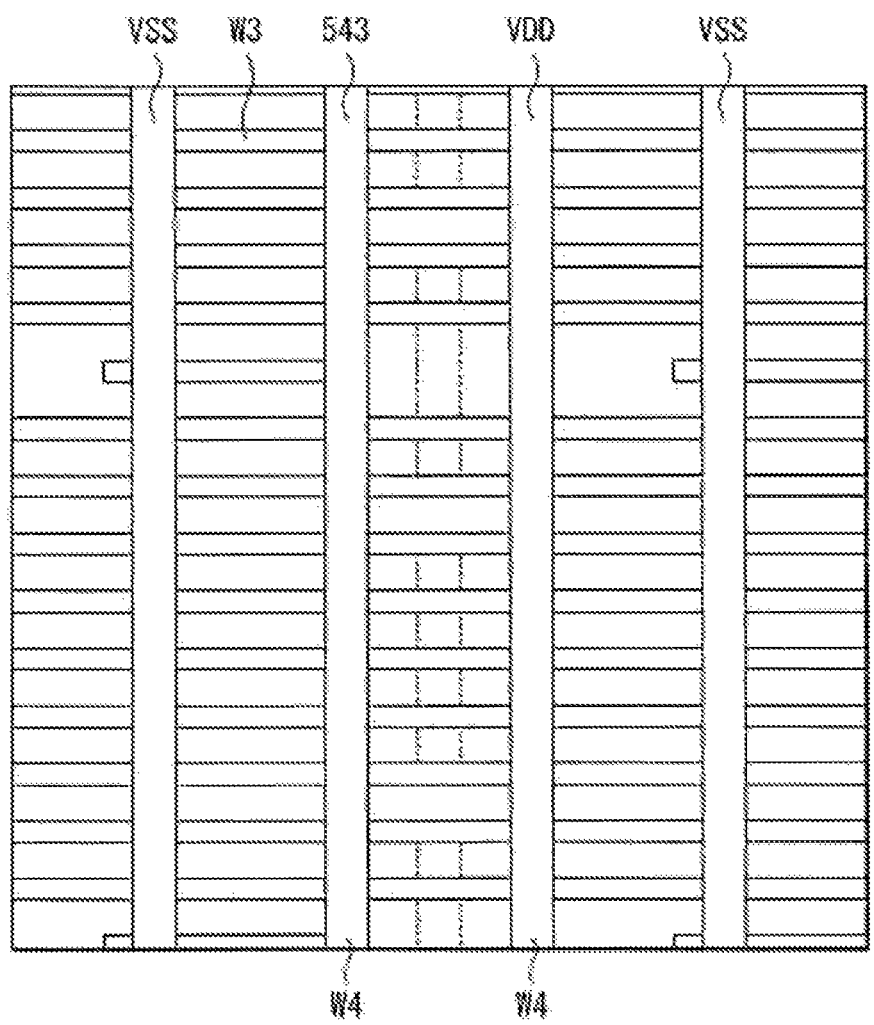
FIG. 31 is a schematic diagram illustrating an example of a planar configuration of the fourth wiring layer together with the third wiring layer illustrated in FIG. 30.

FIGS. 26 to 31 illustrate a modification of the planar configuration of the imaging device 1 according to the above embodiment. FIG. 26 schematically illustrates a planar configuration of the first substrate 100, and corresponds to FIG. 7B described in the above embodiment. FIG. 27 schematically illustrates a planar configuration in the vicinity of the front surface of the semiconductor layer 200S of the second substrate 200, and corresponds to FIG. 8 described in the above embodiment. FIG. 28 schematically illustrates a configuration of each of portions of the first wiring layer W1, the semiconductor layer 200S connected to the first wiring layer W1, and the first substrate 100, and corresponds to FIG. 9 described in the above embodiment. FIG. 29 illustrates an example of a planar configuration of the first wiring layer W1 and the second wiring layer W2, and corresponds to FIG. 10 described in the above embodiment. FIG. 30 illustrates an example of a planar configuration of the second wiring layer W2 and the third wiring layer W3, and corresponds to FIG. 11 described in the above embodiment. FIG. 31 illustrates an example of a planar configuration of the third wiring layer W3 and the fourth wiring layer W4, and corresponds to FIG. 12 described in the above embodiment.

In the present modification, the semiconductor layer 200S of the second substrate 200 extends in the H direction (FIG. 28). That is, this configuration substantially corresponds to the configuration in which the planar configuration of the imaging device 1 illustrated in FIG. 21 and the like is rotated by 90 degrees.

For example, similarly to the description in the above embodiment, the pixel sharing unit 539 of the first substrate 100 is formed over a pixel region of 2 rows×2 columns, and has a substantially square planar shape (FIG. 26). For example, in each of the pixel sharing units 539, the transfer gates TG1 and TG2 of the respective pixel 541A and the pixel 541B of one pixel row extend toward the central portion of the pixel sharing unit 539 in the V direction, while the transfer gates TG3 and TG4 of the respective pixel 541C and the pixel 541D of the other pixel row extend in the outer direction of the pixel sharing unit 539 in the V direction. The pad portion 120 connected to the floating diffusion FD is provided at a central portion of the pixel sharing unit 539, while the pad portion 121 connected to the VSS contact region 118 is provided at an end of the pixel sharing unit 539 at least in the V direction (in the V direction and the H direction in FIG. 26). At this time, the positions in the V direction of the through-substrate electrodes TGV1 and TGV2 of the transfer gates TG1 and TG2 are closer to the positions in the V direction of the through-substrate electrode 120E, and the positions in the V direction of the through-substrate electrodes TGV3 and TGV4 of the transfer gates TG3 and TG4 are closer to the positions in the V direction of the through-substrate electrode 121E (FIG. 28). Therefore, the width (the size in the V direction) of the semiconductor layer 200S extending in the H direction can be increased for the reason similar to the description in the above embodiment. This makes it possible to increase the size of the amplification transistor AMP and suppress noise.

In each of the pixel circuits 210, the selection transistor SEL and the amplification transistor AMP are arranged side by side in the H direction, while the reset transistor RST is arranged at a position adjacent in the V direction with and interposed between the selection transistor SEL and the insulating region 212 (FIG. 27). The FD conversion gain switching transistor FDG is arranged side by side with the reset transistor RST in the H direction. The VSS contact region 218 is provided in an island shape in the insulating region 212. For example, the third wiring layer W3 extends in the H direction (FIG. 30), and the fourth wiring layer W4 extends in the V direction (FIG. 31).

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification. For example, the semiconductor layer 200S described in the above embodiment and first modification may extend in the H direction.

5. Fourth Modification

Figure 32:
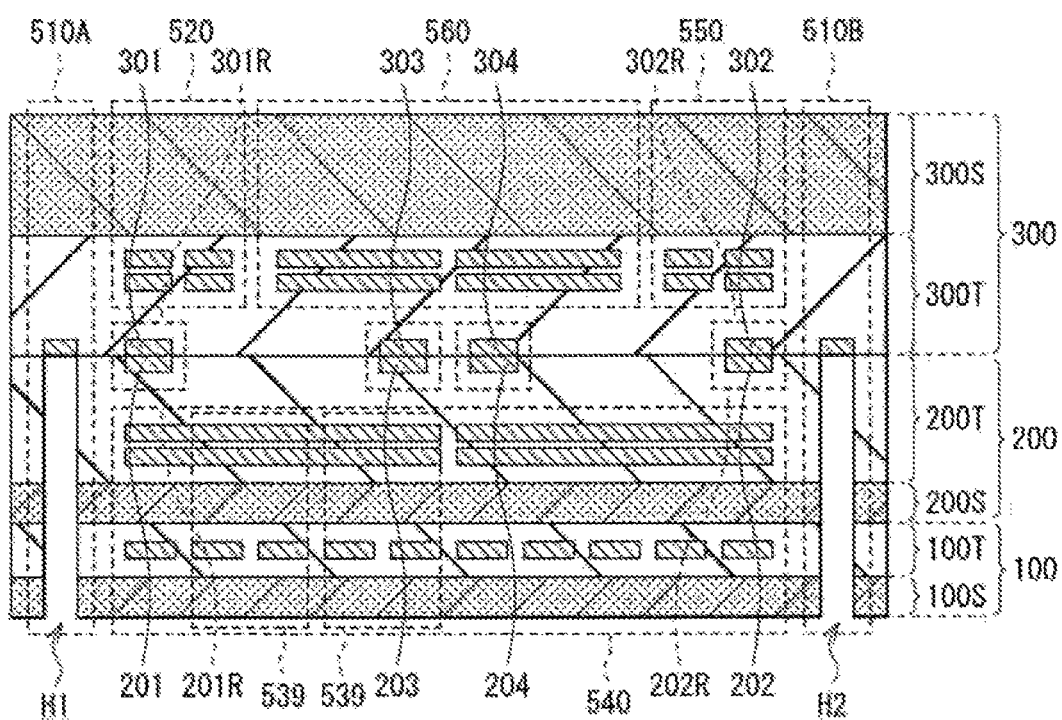
FIG. 32 is a schematic cross-sectional view illustrating another example of the imaging device illustrated in FIG. 3.

FIG. 32 schematically illustrates a modification of the cross-sectional configuration of the imaging device 1 according to the above embodiment. FIG. 32 corresponds to FIG. 3 described in the above embodiment. In the present modification, in addition to the contact portions 201, 202, 301, and 302, the imaging device 1 includes contact portions 203, 204, 303, and 304 at positions facing the central portion of the pixel array unit 540. In this respect, the imaging device 1 of the present modification is different from the imaging device 1 described in the above embodiment.

The contact portions 203 and 204 are provided on the second substrate 200, and are exposed on a bonding surface with the third substrate 300. The contact portions 303 and 304 are provided on the third substrate 300 and are exposed on a bonding surface with the second substrate 200. The contact portion 203 is in contact with the contact portion 303, while the contact portion 204 is in contact with the contact portion 304. That is, in the imaging device 1, the second substrate 200 and the third substrate 300 are connected by the contact portions 203, 204, 303, and 304 in addition to the contact portions 201, 202, 301, and 302.

Figure 33:
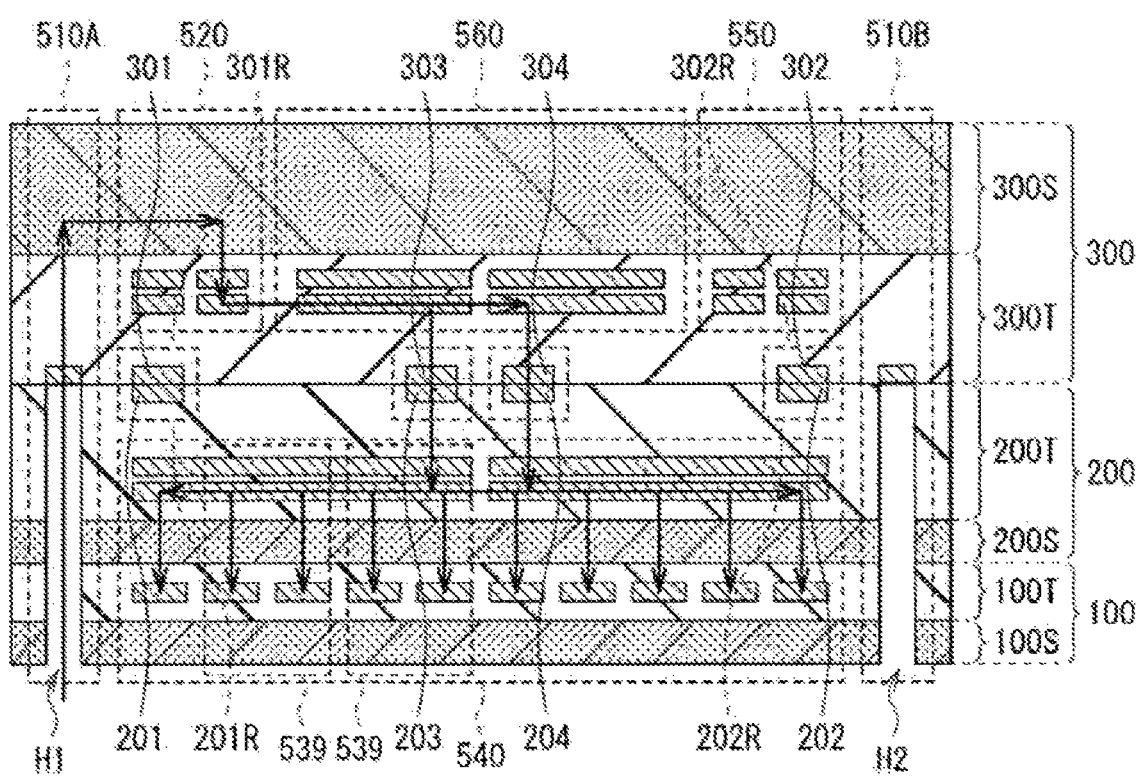
FIG. 33 is a schematic diagram illustrating a route of an input signal to the imaging device illustrated in FIG. 32.
Figure 34:
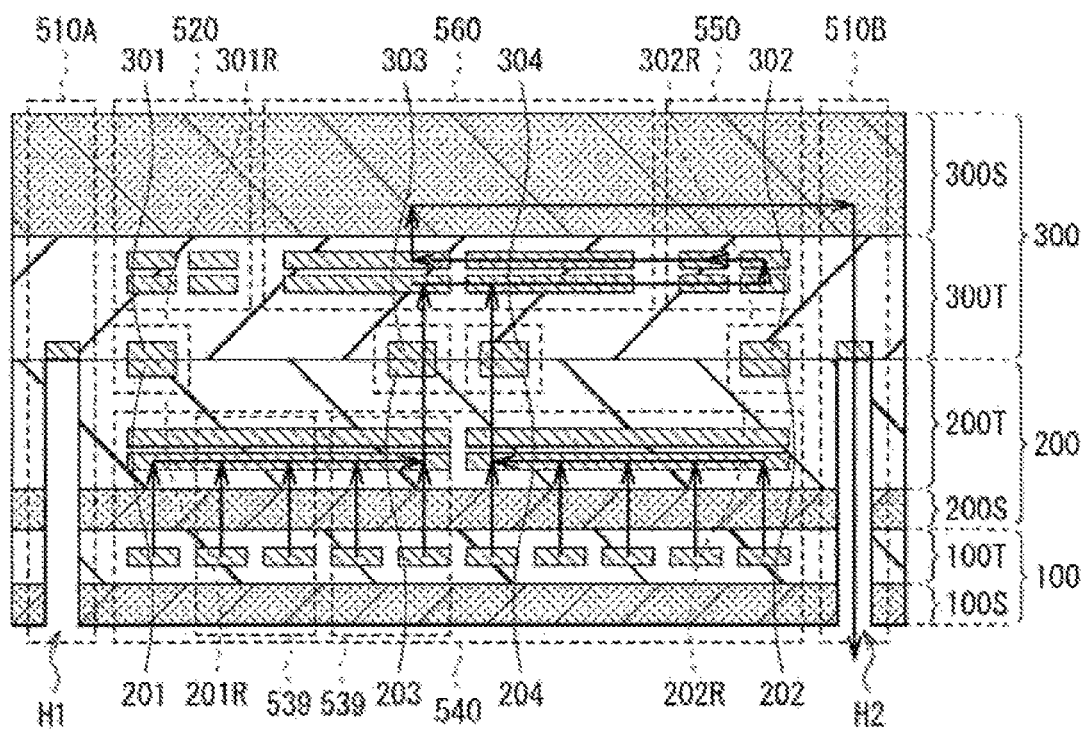
FIG. 34 is a schematic diagram illustrating a signal route of a pixel signal of the imaging device illustrated in FIG. 32.

Next, operation of the imaging device 1 will be described with reference to FIGS. 33 and 34. In FIG. 33, routes of an input signal input to the imaging device 1 from the outside and routes of a power supply potential and a reference potential are indicated by arrows. In FIG. 34, a signal route regarding a pixel signal output from the imaging device 1 to the outside is indicated by arrows. For example, an input signal input to the imaging device 1 via the input unit 510A is transmitted to the row drive unit 520 of the third substrate 300 to allow the row drive unit 520 to generate a row drive signal. The row drive signal is sent to the second substrate 200 via the contact portions 303 and 203. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D. Furthermore, the power supply potential and the reference potential supplied from the outside of the imaging device 1 to the input unit 510A (input terminal 511) of the third substrate 300 are sent to the second substrate 200 via the contact portions 303 and 203, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539. The pixel signal based on this pixel signal is sent from the pixel circuit 210 to the third substrate 300 via the vertical signal line 543 and the contact portions 204 and 304. This pixel signal is processed by the column signal processing unit 550 and the image signal processing unit 560 of the third substrate 300, and then output to the outside via the output unit 510B.

The imaging device 1 including such contact portions 203, 204, 303, and 304 can also obtain effects similar to those described in the above embodiment. The position, the number, and the like of the contact portions can be changed according to the design of the circuit and the like of the third substrate 300 to which the wiring lines are to be connected via the contact portions 303 and 304.

6. Fifth Modification

Figure 35:
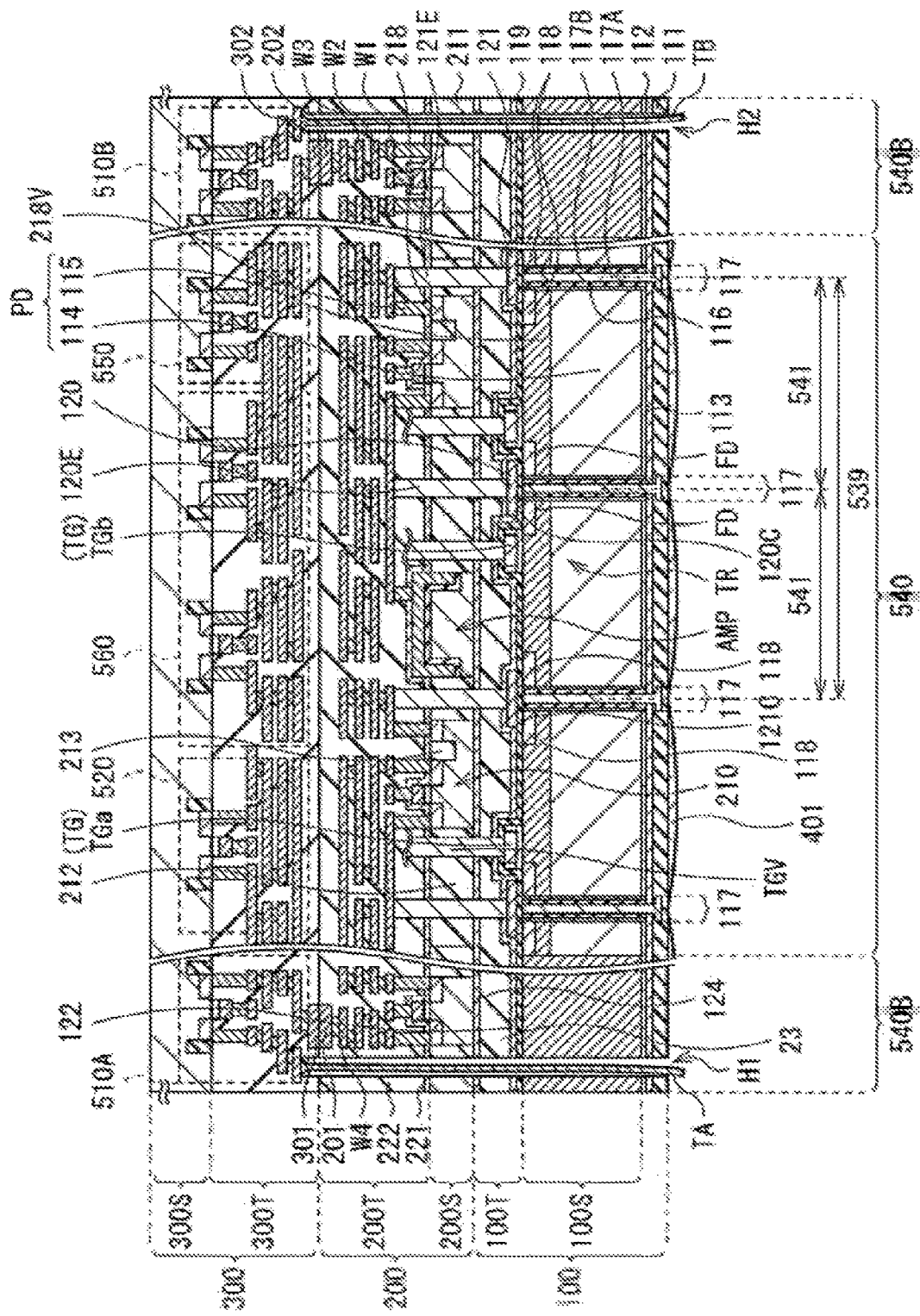
FIG. 35 is a schematic cross-sectional view illustrating another example of the imaging device illustrated in FIG. 6.

FIG. 35 illustrates a modification of the cross-sectional configuration of the imaging device 1 according to the above embodiment. FIG. 35 corresponds to FIG. 6 described in the above embodiment. In the present modification, the transfer transistor TR having a planar structure is provided on the first substrate 100. In this respect, the imaging device 1 of the present modification is different from the imaging device 1 described in the above embodiment.

In the transfer transistor TR, a transfer gate TG is configured only by the horizontal portion TGb. In other words, the transfer gate TG has no vertical portion TGa, and is provided to face the semiconductor layer 100S.

The imaging device 1 including the transfer transistor TR having such a planar structure can also obtain effects similar to those described in the above embodiment. Furthermore, it is also conceivable to form the photodiode PD closer to the front surface of the semiconductor layer 100S by providing the planar transfer gate TG on the first substrate 100 as compared with the case where the vertical transfer gate TG is provided on the first substrate 100, thereby increasing a saturation signal amount (Qs). In addition, the method of forming the planar transfer gate TG on the first substrate 100 can be considered to have a smaller number of manufacturing processes than the method of forming the vertical transfer gate TG on the first substrate 100 and have a less likelihood of occurrence of adverse effects due to the manufacturing processes, on the photodiode PD.

7. Sixth Modification

Figure 36:
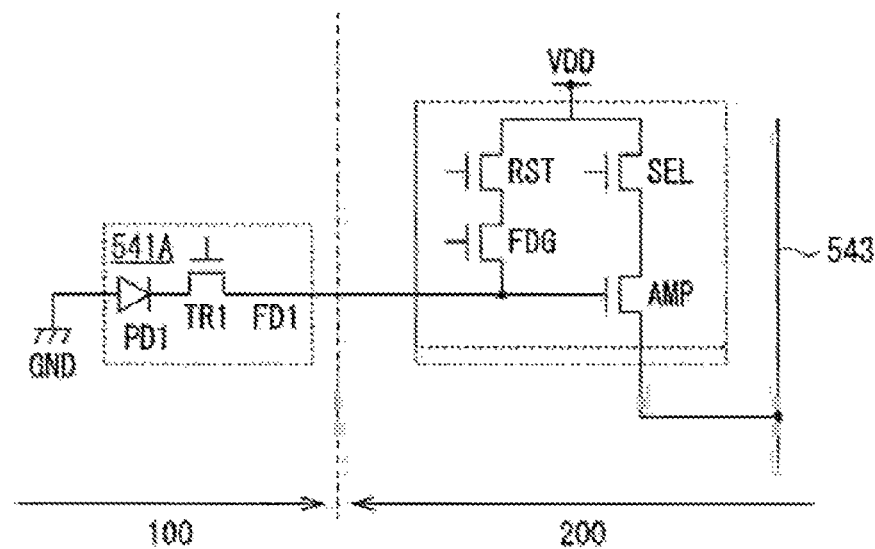
FIG. 36 is a diagram illustrating another example of the equivalent circuit illustrated in FIG. 4.

FIG. 36 illustrates a modification of the pixel circuit of the imaging device 1 according to the above embodiment. FIG. 36 corresponds to FIG. 4 described in the above embodiment. In the present modification, the pixel circuit 210 is provided for each pixel (pixel 541A). That is, the pixel circuit 210 is not shared by a plurality of pixels. In this respect, the imaging device 1 of the present modification is different from the imaging device 1 described in the above embodiment.

The imaging device 1 of the present modification is the same as the imaging device 1 described in the above embodiment in that the pixel 541A and the pixel circuit 210 are provided on different substrates (the first substrate 100 and the second substrate 200). Therefore, the imaging device 1 according to the present modification can also obtain effects similar to those described in the above embodiment.

8. Seventh Modification

Figure 37:
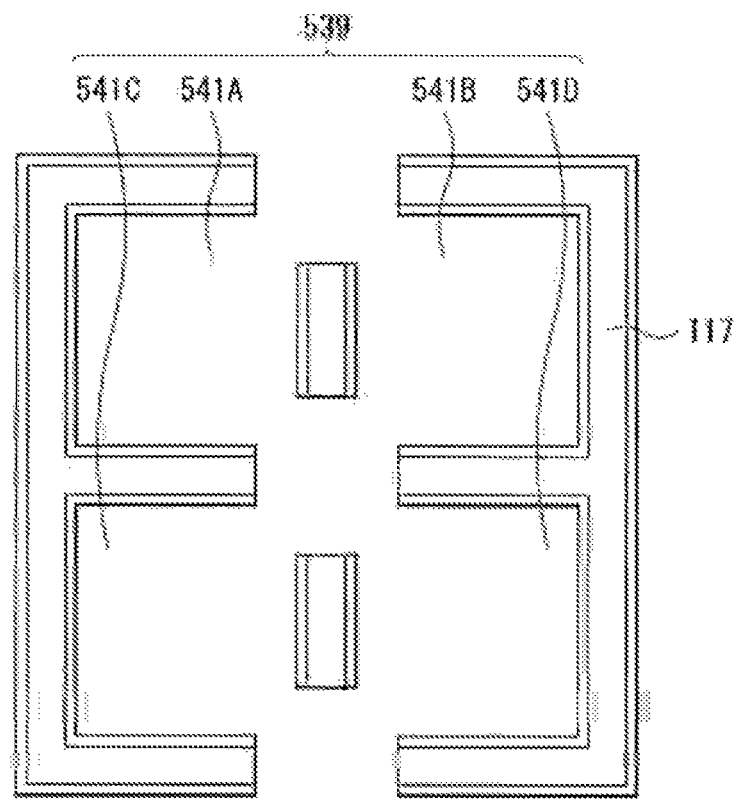

FIG. 37 illustrates a modification of the planar configuration of the pixel isolation portion 117 described in the above embodiment. The pixel isolation portion 117 surrounding each of the pixels 541A, 541B, 541C, and 541D may have gaps. That is, the entire circumference of the pixels 541A, 541B, 541C, and 541D does not have to be surrounded by the pixel isolation portion 117. For example, the gaps of the pixel isolation portion 117 are provided in the vicinity of the pad portions 120 and 121 (refer to FIG. 7B).

The above embodiment is an example in which the pixel isolation portion 117 has the FTI structure penetrating the semiconductor layer 100S (refer to FIG. 6). Alternatively, the pixel isolation portion 117 may have a configuration other than the FTI structure. For example, the pixel isolation portion 117 does not have to completely penetrate the semiconductor layer 100S, and may have a structure referred to as a deep trench isolation (DTI) structure.

9. Second Embodiment

The first embodiment described above is an exemplary case of switching conversion efficiency Qs according to the situation by switching the entire FD capacitance C using the gate capacitance of the FD conversion gain switching transistor FDG and obtaining good image data. The capacitance available for switching the FD capacitance C, however, is not limited to the gate capacitance of the FD conversion gain switching transistor FDG. In the present description, the FD conversion gain switching transistor FDG is also referred to as a switching transistor.

Therefore, in the present embodiment, variations of the capacitance used for switching the FD capacitance C will be described with some examples. In the following description, the capacitance used for switching the FD capacitance C, that is, the capacitance connected/disconnected to/from the floating diffusion FD is referred to as subFD capacitance. Furthermore, for the sake of simplicity, the following will describe an exemplary case where there is no pixel sharing structure in which one pixel circuit 210 is shared by a plurality of pixels (for example, the pixels 541A to 541D), that is, a case where one pixel circuit 210 is provided for one pixel. However, the present technology is not limited thereto, and each example described below can be similarly applied to a case having a pixel sharing structure.

Furthermore, in the following description, the configuration and operation similar to those of the first embodiment described above will be cited, thereby omitting redundant description. Furthermore, in the following description, a configuration including the pixel 541 and the pixel circuit 210 is referred to as a unit pixel. In that case, in the configuration having the pixel sharing structure, a plurality of unit pixels constituting the pixel sharing unit 539 includes the common pixel circuit 210.

9.1 First Example

Figure 38:
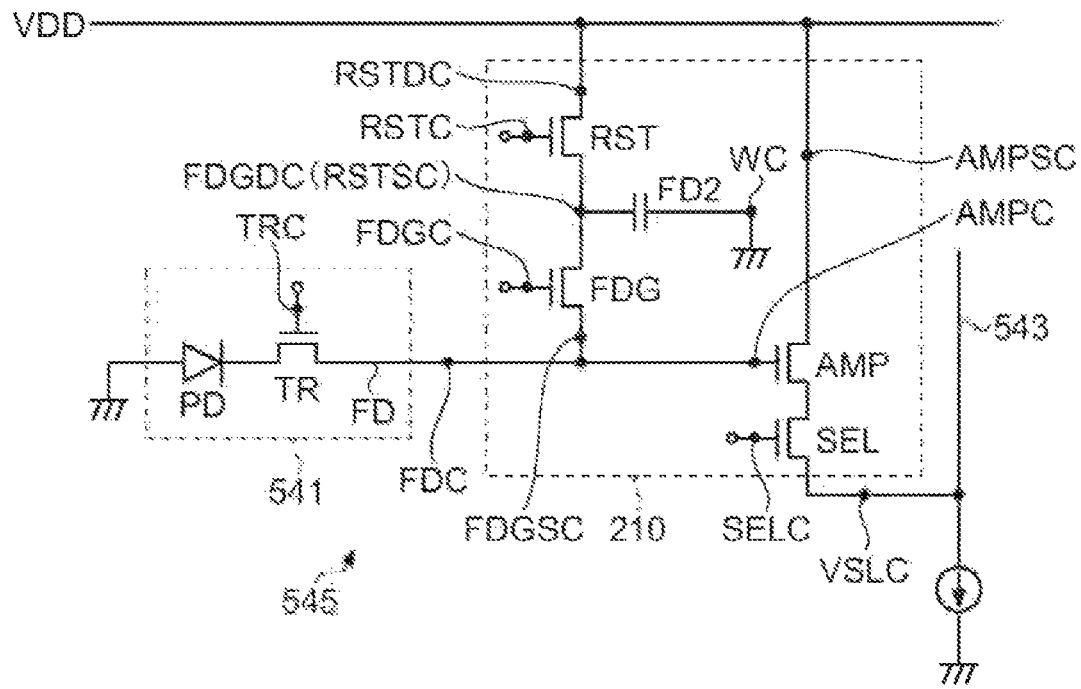
FIG. 38 is a circuit diagram illustrating a schematic configuration example of a unit pixel according to a first example of a second embodiment.
Figure 39:
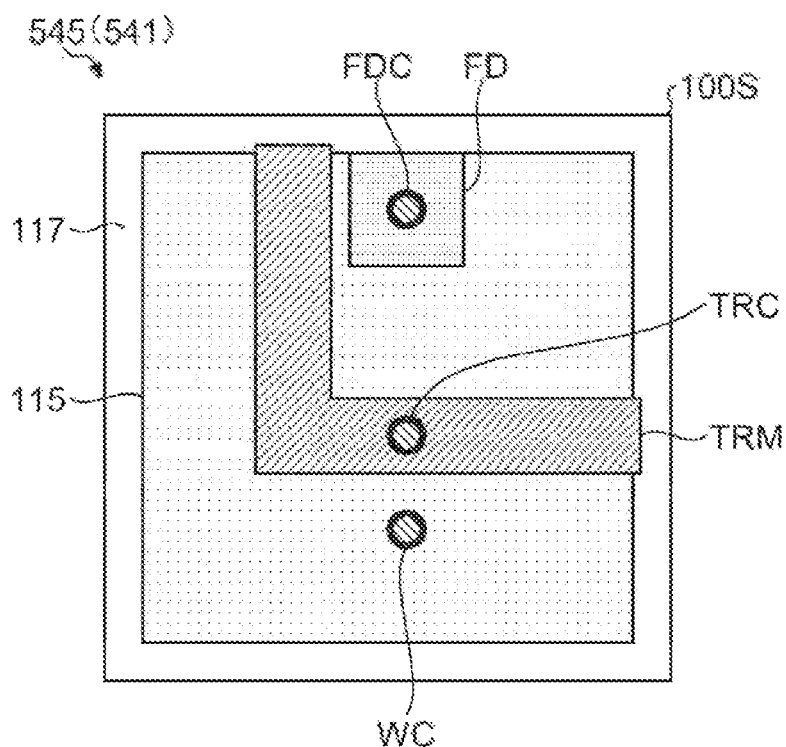
FIG. 39 is a schematic diagram illustrating a planar layout example of a main surface of a semiconductor layer in a first substrate according to the first example of the second embodiment.
Figure 40:
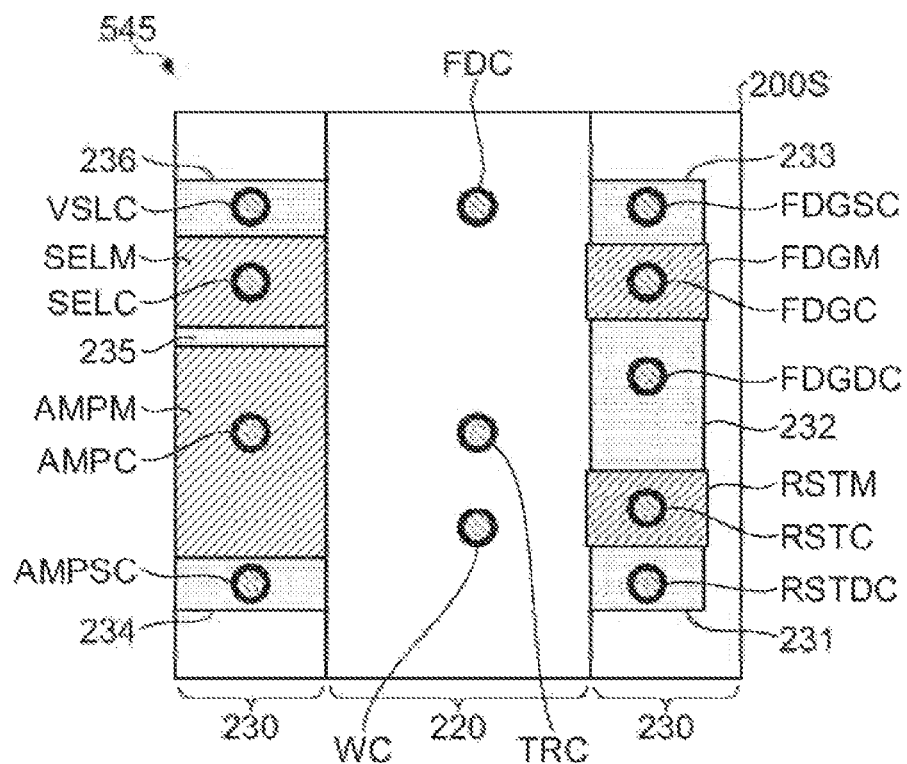
FIG. 40 is a schematic diagram illustrating a planar layout example of a main surface of a semiconductor layer in a second substrate according to the first example of the second embodiment.
Figure 41:
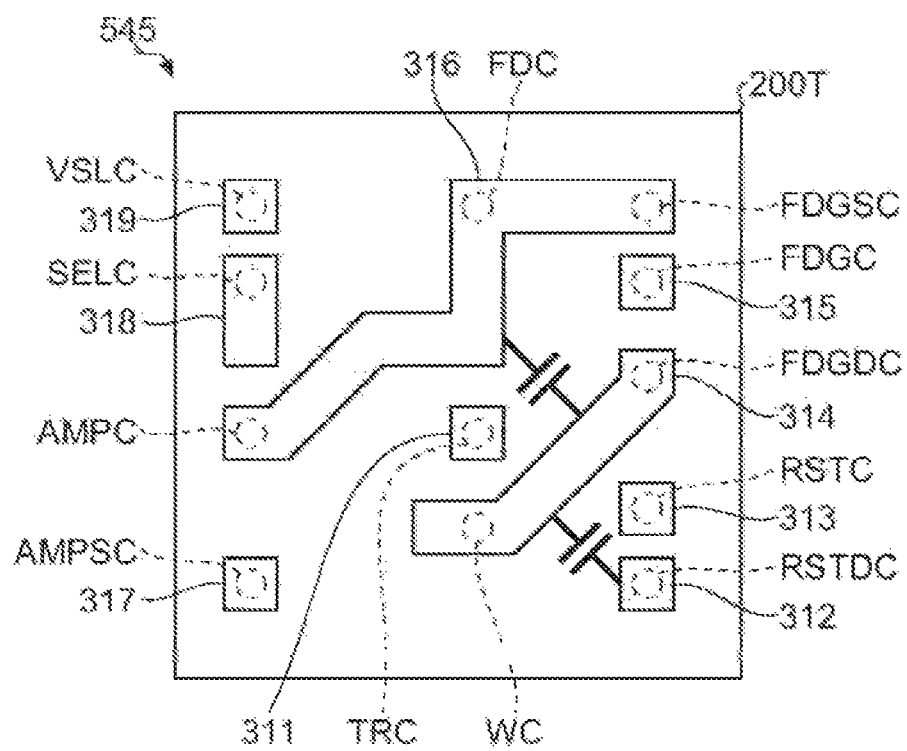
FIG. 41 is a schematic diagram illustrating a planar layout example of wiring provided in a wiring layer in the second substrate according to the first example of the second embodiment.

A first example is an exemplary case where wiring capacitance is used as a capacitive element forming the subFD capacitance. FIG. 38 is a circuit diagram illustrating a schematic configuration example of a unit pixel according to the first example. FIG. 39 is a schematic diagram illustrating a planar layout example of the main surface of the semiconductor layer in the first substrate according to the first example; FIG. 40 is a schematic diagram illustrating a planar layout example of the main surface of the semiconductor layer in the second substrate according to the first example; and FIG. 41 is a schematic diagram illustrating a planar layout example of the wiring provided in the wiring layer in the second substrate according to the first example. Note that the wiring lines illustrated in FIG. 41 do not necessarily have to be provided in the same wiring layer among the plurality of wiring lines (the first wiring layer W1 to the fourth wiring layer W4), and may be distributed in different wiring layers.

9.1.1 Circuit Configuration Example

First, a circuit configuration example of a unit pixel 545 according to the first example will be described. As illustrated in FIG. 38, in addition to the configuration similar to the configuration described with reference to FIG. 4 in the first embodiment, the unit pixel 545 according to the first example further includes a configuration, for example, in which subFD capacitance SFD is connected between the drain of the FD conversion gain switching transistor FDG and the source of the reset transistor RST. In the first example, the subFD capacitance SFD is constituted with the wiring capacitance of the wiring (referred to as subFD wiring) provided in the wiring layer 200T of the second substrate 200.

9.1.2 Planar Layout Example

Next, a layout example of individual layers of an imaging device according to the first example will be described. In the first example, the pixel 541 out of the unit pixel 545 is disposed on the first substrate 100, while the pixel circuit 210 of the unit pixel 545 is disposed on the second substrate 200. In addition, the subFD wiring for forming the subFD capacitance SFD is provided in the wiring layer 200T of the second substrate 200.

9.1.2.1 Semiconductor Layer of First Substrate

As illustrated in FIG. 39, the semiconductor layer 100S of the first substrate 100 is partitioned by the lattice-shaped pixel isolation portions 117 into pixel regions where the individual unit pixels 545 are provided. Note that the pixel region may be a region on each of substrates where circuit elements and the like constituting each of the unit pixels 545 are to be disposed.

The pixel isolation portion 117 defining individual pixel regions can be formed by applying various structures such as: a structure referred to as Deep Trench Isolation (DTI) formed by embedding an insulating material and/or a light shielding material in a trench formed from the back surface or front surface of the semiconductor layer 100S to the middle of the semiconductor layer; and a structure referred to as Full Trench Isolation (FTI) formed by embedding an insulating material and/or a light shielding material in a trench formed so as to penetrate the semiconductor layer 100S.

The p well layer 115 of each pixel region is connected to a well contact WC penetrating the wiring layer 100T and the semiconductor layer 200S of the second substrate 200 and being connected to subFD wiring 314 (refer to FIG. 41) of the wiring layer 200T.

In addition, the floating diffusion FD formed in a part of the p well layer 115 is connected to an FD contact FDC penetrating the wiring layer 100T and the semiconductor layer 200S of the second substrate 200 and being connected to wiring 316 (refer to FIG. 41) of the wiring layer 200T.

Furthermore, a gate electrode TRM of the transfer transistor TR is provided on a part of the p well layer 115 via an insulating film. The gate electrode TRM is connected to a transfer gate contact TRC penetrating the wiring layer 100T and the second substrate 200 and being connected to the row drive signal line 542 of the third substrate 300.

9.1.2.2 Semiconductor Layer of Second Substrate

As illustrated in FIG. 40, each of pixel regions in the semiconductor layer 200S of the second substrate 200 has a structure in which an element isolation region 220 is provided at the center and an element formation region 230 is provided on each side of the element isolation region 220. The element isolation region 220 may be, for example, a region formed of an insulating film such as silicon oxide or silicon nitride. Furthermore, each of pixel regions in the second substrate 200 may correspond, in the substrate stacking direction, to each of pixel regions in the first substrate 100 electrically connected to the second substrate 200, or may be shifted in a direction parallel to the main surface with respect to each of the pixel regions in the first substrate 100 (pupil correction).

The element isolation region 220 is provided with the well contact WC, the FD contact FDC, and the transfer gate contact TRC, each of which penetrating from the first substrate 100.

The element formation region 230, which is one region out of the regions sandwiching the element isolation region 220 (for example, the right side in the drawing) is provided with the reset transistor RST and the FD conversion gain switching transistor FDG. Specifically, the region includes a gate electrode RSTM of the reset transistor RST, a gate electrode FDGM of the FD conversion gain switching transistor FDG, and diffusion regions 231 to 233 functioning as the source/drain of these transistors.

For example, the gate electrode RSTM of the reset transistor RST is connected to a reset gate contact RSTC penetrating the wiring layer 200T and being connected to the row drive signal line 542 of the third substrate 300. Similarly, the gate electrode FDGM of the FD conversion gain switching transistor FDG is connected to an FD transfer gate contact FDGC penetrating the wiring layer 200T and being connected to the row drive signal line 542 of the third substrate 300, for example.

The diffusion region 231 functioning as the drain of the reset transistor RST is connected to a reset drain contact RSTDC penetrating the wiring layer 200T and being connected to the power supply line VDD of the third substrate 300.

The diffusion region 232 functioning as the source of the reset transistor RST and the drain of the FD conversion gain switching transistor FDG is connected to a subFD contact FDGDC connected to the subFD wiring 314 (refer to FIG. 41) provided in the wiring layer 200T.

The diffusion region 233 functioning as the source of the FD conversion gain switching transistor FDG is connected to an FD transfer source contact FDGSC connected to the wiring 316 (refer to FIG. 41) provided in the wiring layer 200T.

The other element formation region 230, that is, the other region out of the regions sandwiching the element isolation region 220 (for example, the left side in the drawing) is provided with an amplification transistor AMP and a selection transistor SEL. Specifically, there is provided a gate electrode AMPM of the amplification transistor AMP, a gate electrode SELM of the selection transistor SEL, and diffusion regions 234 to 236 functioning as the source/drain of these transistors.

The gate electrode AMPM of the amplification transistor AMP is connected to an amplification gate contact AMPM connected to the wiring 316 (refer to FIG. 41) provided in the wiring layer 200T. Furthermore, the gate electrode SELM of the transfer transistor SEL is connected to a selection gate contact SELC penetrating the wiring layer 200T and being connected to the row drive signal line 542 of the third substrate 300.

The diffusion region 234 functioning as the source of the amplification transistor AMP is connected to an amplification source contact AMPSC penetrating the wiring layer 200T and being connected to the power supply line VDD of the third substrate 300.

The diffusion region 236 functioning as the drain of the selection transistor SEL is connected to a vertical signal line contact VSLC penetrating the wiring layer 200T and being connected to the vertical signal line 543 of the third substrate 300.

Note that the diffusion region 235 between the gate electrode AMPM of the amplification transistor AMP and the gate electrode SELM of the selection transistor SEL is also used as the drain of the amplification transistor AMP and the source of the selection transistor SEL.

9.1.2.3 Wiring Layer of Second Substrate

As illustrated in FIG. 41, the wiring layer 200T of the second substrate 200 is provided with a plurality of pads 311 to 313, 315, and 317 to 319 mediating the connection to the third substrate 300, the wiring 316, and the subFD wiring 314.

The pad 311 mediates the connection of the transfer gate contact TRC to the third substrate 300. The pad 312 mediates the connection of the reset drain contact RSTDC transfer gate contact TRC to the third substrate 300. The pad 313 mediates the connection of the reset gate contact RSTC to the third substrate 300. The pad 315 mediates the connection of the FD transfer gate contact FDGC to the third substrate 300. The pad 317 mediates the connection of the amplification source contact AMPSC to the third substrate 300. The pad 318 mediates the connection of the selection gate contact SELC to the third substrate 300. The pad 319 mediates the connection of the vertical signal line contact VSLC to the third substrate 300.

The wiring 316 forms a connection from the FD transfer source contact FDGSC to the amplification gate contact AMPC. The FD contact FDC is connected in the middle of the wiring 316, thereby connecting the floating diffusion FD to the gate electrode AMPM of the amplification transistor AMP.

The subFD wiring 314 connects the subFD contact FDGDC and the well contact WC to each other, and forms the subFD capacitance SFD as the wiring capacitance between surrounding wiring and pads, for example, between the wiring 316 and the pad 312.

The subFD wiring 314 can be formed by using a metal material such as tungsten (W). However, the material is not limited thereto, and various conductive materials may be used.

That is, in the first example, by turning on the FD conversion gain switching transistor FDG, the subFD wiring 314 and the wiring 316 are connected to each other via the FD transistor FDG. This allows the subFD capacitance SFD to be connected to the gate of the amplification transistor AMP, whereby the entire FD capacitance C is switched to the capacitance obtained by adding the capacitance of the floating diffusion FD and the capacitance of the subFD capacitance SFD.

9.1.3 Effects

As described above, in the first example, the subFD capacitance SFD for switching the conversion efficiency Qs is constituted by using the wiring capacitance of the subFD wiring 314 disposed in the wiring layer 200T of the second substrate 200.

With such a configuration, for example, it is possible to add the subFD capacitance SFD having a capacitance larger than the gate capacitance of the FD conversion gain switching transistor FDG while suppressing the influence on the area to be specifically used by the photodiode PD and the floating diffusion FD in the first substrate 100, the various transistors constituting the pixel circuit 210 in the second substrate 200, (hereinafter, referred to as a pixel transistor) and the like.

This makes it possible to achieve a wide dynamic range and a high S/N ratio while suppressing the influence on the light receiving area of the photodiode PD, the characteristics of the pixel transistor, and the like, enabling generation of image data with better image quality appropriate for the situation.

Although the first example is an exemplary case of having no pixel sharing structure as described above, the present disclosure is not limited thereto, and the above configuration can be applied to a case of including a pixel sharing structure.

Since other configurations, operations, and effects may be similar to those in the above-described embodiment, detailed description thereof will be omitted here.

9.2 Second Example

Figure 42:
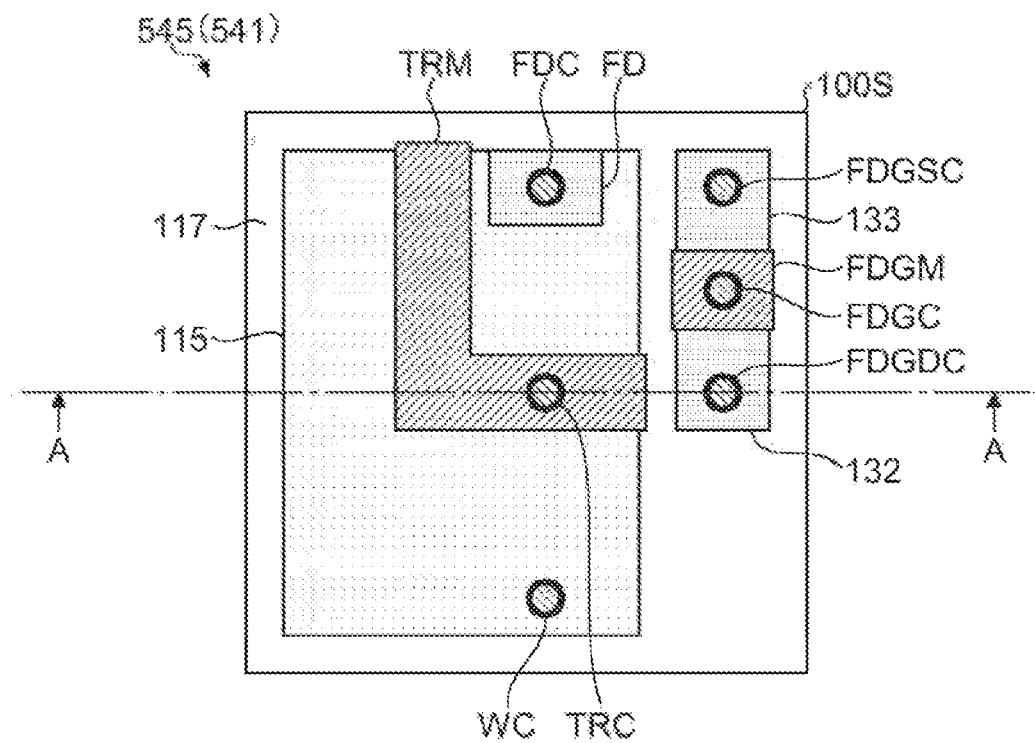
FIG. 42 is a schematic diagram illustrating a planar layout example of a main surface of a semiconductor layer in a first substrate according to a second example of the second embodiment.
Figure 43:
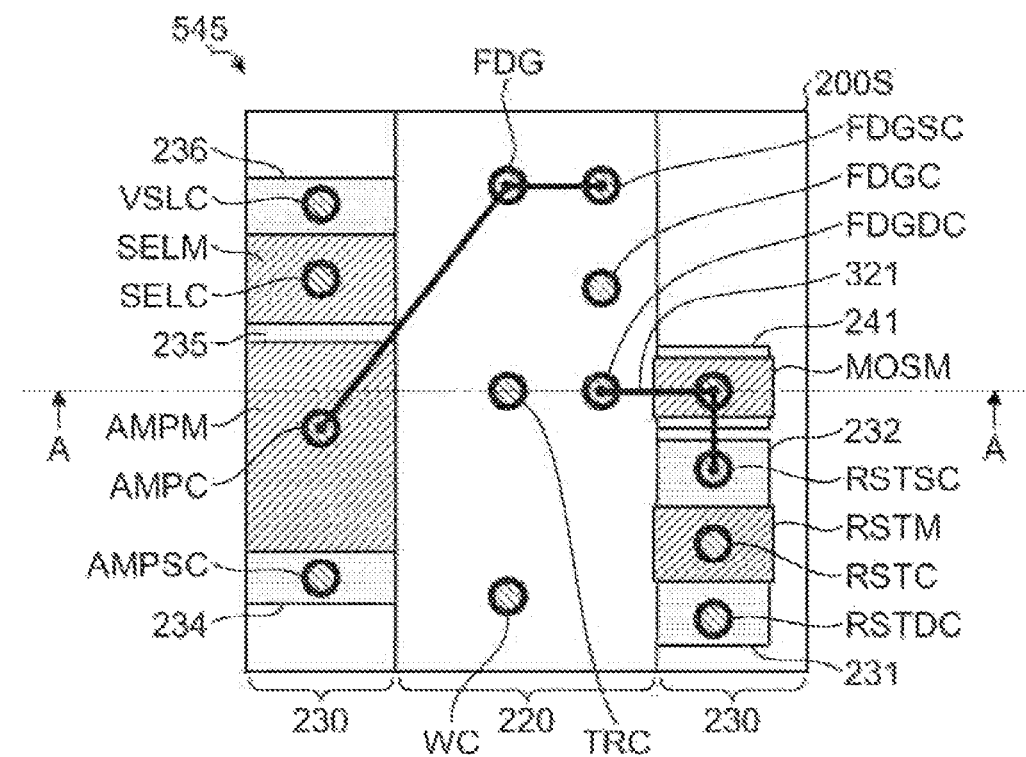
FIG. 43 is a schematic diagram illustrating a planar layout example of a main surface of a semiconductor layer in a second substrate according to the second example of the second embodiment.

A second example is a case where a MOS capacitor is used as a capacitive element forming the subFD capacitance SFD. FIG. 42 is a schematic diagram illustrating a planar layout example of the main surface of the semiconductor layer in the first substrate according to the second example; FIG. 43 is a schematic diagram illustrating a planar layout example of the main surface of the semiconductor layer in the second substrate according to the second example; and FIG. 44 is a cross-sectional view illustrating a structural example of an A-A plane in FIGS. 42 and 43.

Note that the pixel circuit according to the second example may be similar to, for example, the pixel circuit 210 described with reference to FIG. 38 in the first example, and thus a detailed description thereof will be omitted here.

Figure 44:
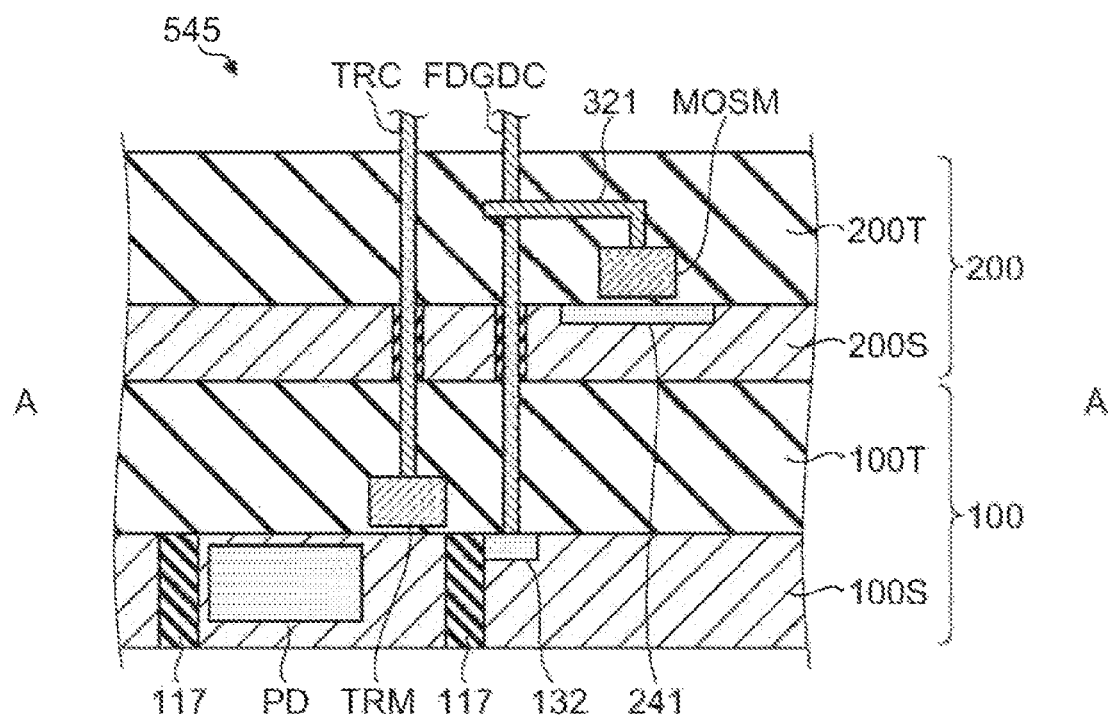
FIG. 44 is a cross-sectional view illustrating a structural example of an A-A plane in FIGS. 42 and 43.

As illustrated in FIGS. 42 to 44, in the second example, in addition to the photodiode PD and the floating diffusion FD, the FD conversion gain switching transistor FDG is disposed in the semiconductor layer 100S of the first substrate 100. a diffusion regions 132 and 133 are the source/drain of the FD conversion gain switching transistor FDG.

In addition, in the second example, a MOS capacitor being the subFD capacitance SFD is disposed on the semiconductor layer 200S of the second substrate 200. This MOS capacitor includes a diffusion region 241 formed in the semiconductor layer 200S, and a gate electrode MOSM provided on an element formation surface of the semiconductor layer 200S so as to face the diffusion region 241 via a gate insulating film, for example.

The subFD contact FDGDC connected to the diffusion region 132 being the drain of the FD conversion gain switching transistor FDG is connected to the gate electrode MOSM of the MOS transistor and to a reset source contact RSTSC connected to the diffusion region 232 being the source of the reset transistor RST via wiring 321 formed in the wiring layer 200T of the second substrate 200.

In this manner, the subFD capacitance SFD for switching the FD capacitance C can also be constituted by using a capacitive element such as a MOS capacitor, for example.

This enables addition of the subFD capacitance SFD having a larger capacitance to the floating diffusion FD, leading to achievement of a wider dynamic range and a high S/N ratio. As a result, it is possible to generate image data with better image quality appropriate for the situation.

At that time, by disposing a capacitive element such as a MOS capacitor on the second substrate 200, it is also possible to suppress the influence on the light receiving area of the photodiode PD in the first substrate 100, or the like.

Although the second example is an exemplary case of having no pixel sharing structure similarly to the first example, the present technology is not limited thereto, and the above configuration can be applied to a case of including a pixel sharing structure.

Since other configurations, operations, and effects may be similar to those in the above-described first example or the first embodiment, detailed description thereof will be omitted here.

9.3 Third Example

Figure 45:
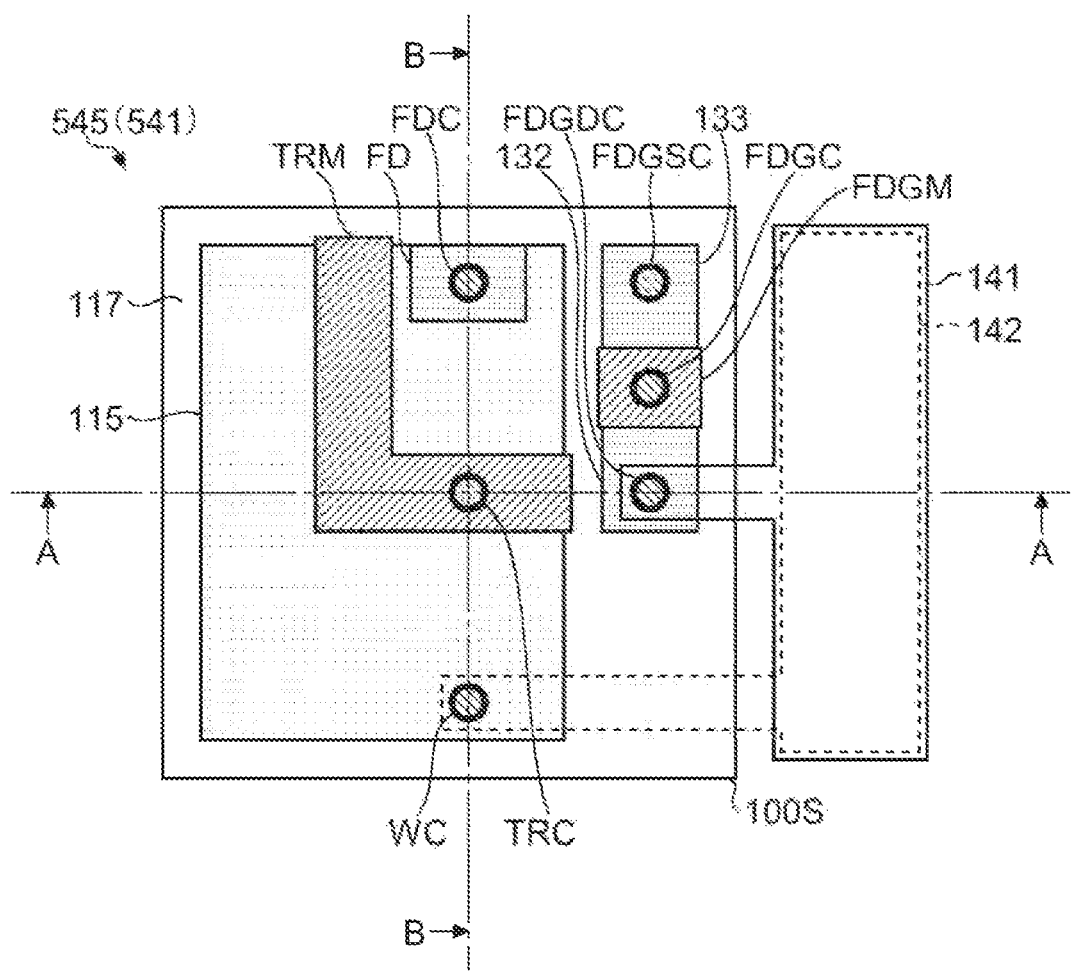
FIG. 45 is a schematic diagram illustrating a planar layout example of a main surface of a semiconductor layer in a first substrate according to a third example of the second embodiment.
Figure 46:
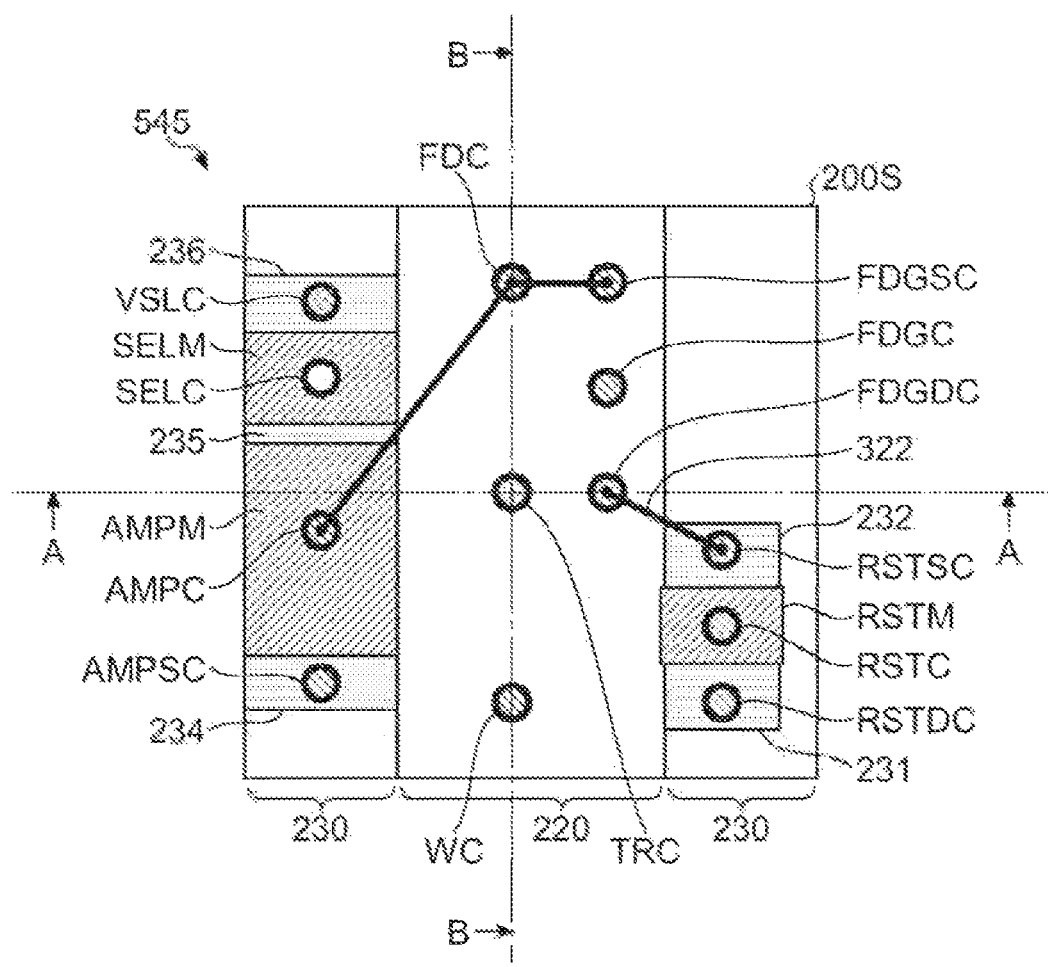
FIG. 46 is a schematic diagram illustrating a planar layout example of a main surface of a semiconductor layer in a second substrate according to the third example of the second embodiment.
Figure 47:
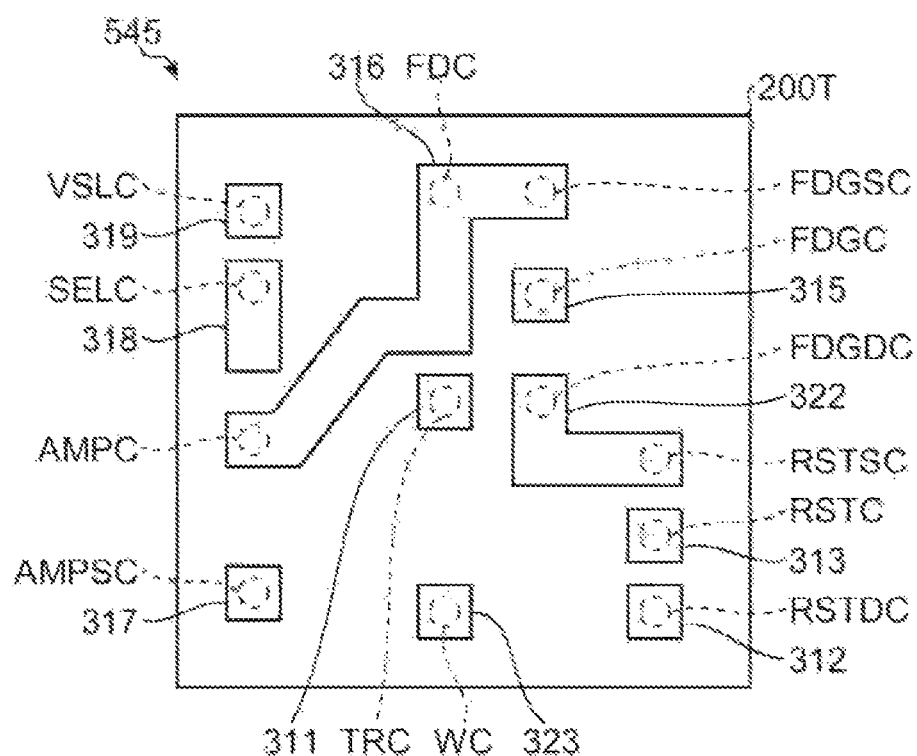
FIG. 47 is a schematic diagram illustrating a planar layout example of a wiring layer in the second substrate according to the third example of the second embodiment.

A third example is a case where a parallel plate capacitor is used as the capacitive element forming the subFD capacitance SFD. FIG. 45 is a schematic diagram illustrating a planar layout example of the main surface of the semiconductor layer in the first substrate according to the third example; FIG. 46 is a schematic diagram illustrating a planar layout example of the main surface of the semiconductor layer in the second substrate according to the third example; and FIG. 47 is a schematic diagram illustrating a planar layout example of the wiring layer in the second substrate according to the third example. Note that the wiring lines illustrated in FIG. 47 do not necessarily have to be provided in the same wiring layer among the plurality of wiring lines (the first wiring layer W1 to the fourth wiring layer W4), and may be distributed in different wiring layers.

Figure 48:
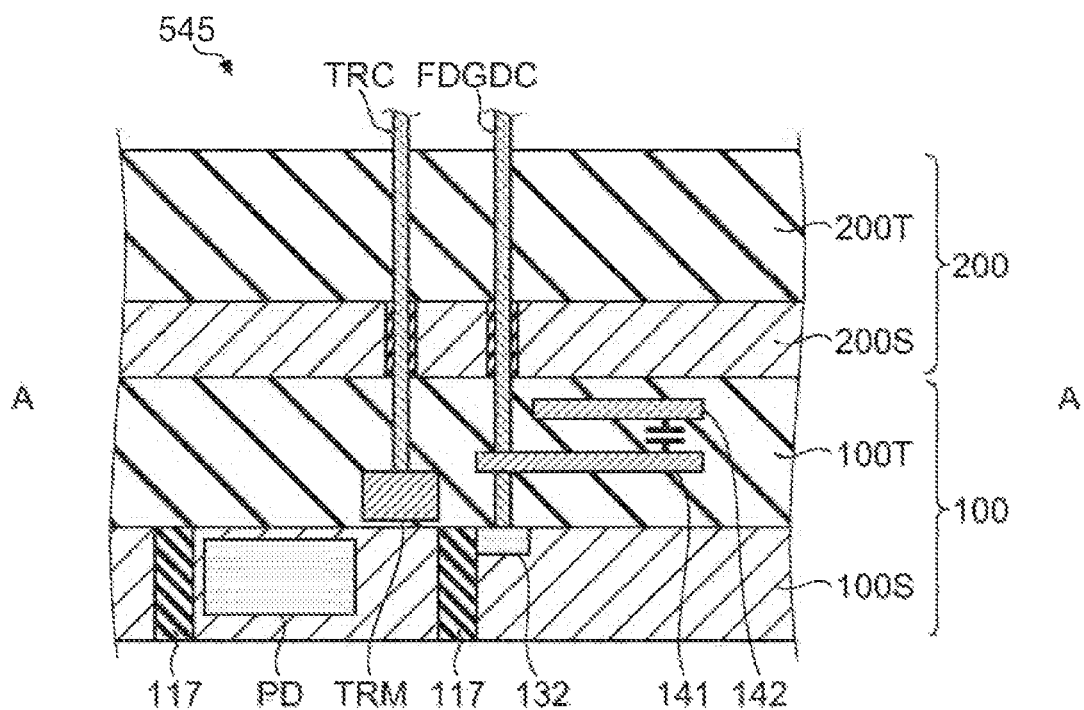
FIG. 48 is a cross-sectional view illustrating a structural example of an A-A plane in FIGS. 45 and 46.
Figure 49:
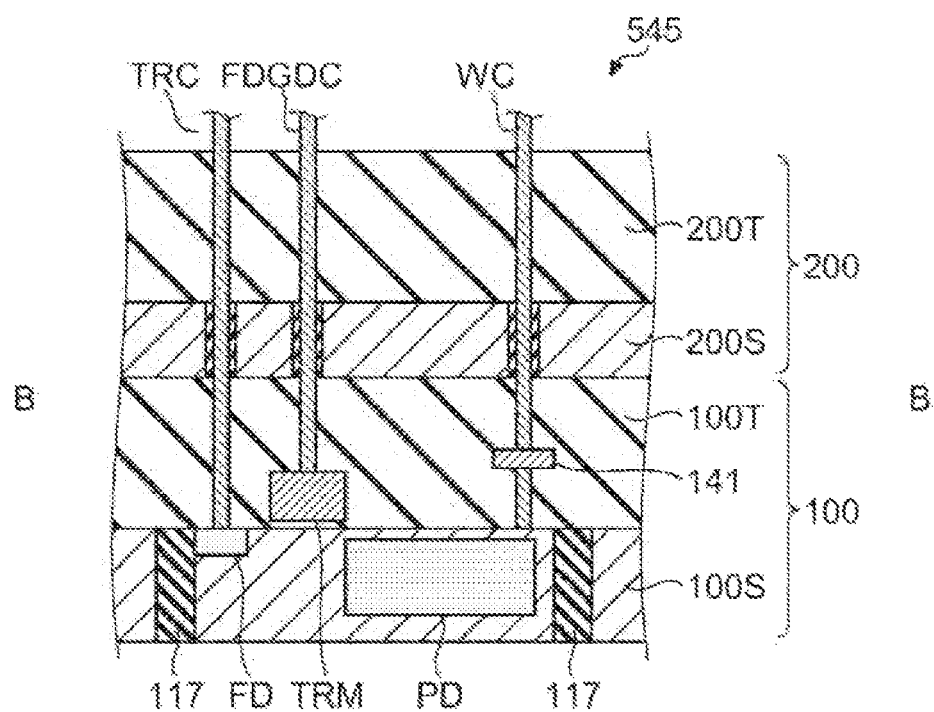
FIG. 49 is a cross-sectional view illustrating a structural example of a B-B plane in FIGS. 45 and 46.

FIG. 48 is a cross-sectional view illustrating a structural example of an A-A plane in FIGS. 45 and 46; and FIG. 49 is a cross-sectional view illustrating a structural example of a B-B plane in FIGS. 45 and 46.

Note that the pixel circuit according to the third example may be similar to, for example, the pixel circuit 210 described with reference to FIG. 38 in the first example, and thus a detailed description thereof will be omitted here.

As illustrated in FIGS. 45 to 49, in the third example, the photodiode PD, the floating diffusion FD, and the FD conversion gain switching transistor FDG are disposed in the semiconductor layer 100S of the first substrate 100 similarly to the second example.

In the third example, two parallel plate electrodes 141 and 142 constituting the subFD capacitance SFD are provided in the wiring layer 100T of the first substrate 100.

Of the two parallel plate electrodes 141 and 142, the parallel plate electrode 141 closer to the semiconductor layer 100S is connected to the drain of the FD conversion gain switching transistor FDG via the subFD contact FDGDC, for example. On the other hand, the parallel plate electrode 142 closer to the semiconductor layer 200S is connected to the p well layer 115 of the semiconductor layer 100S via the well contact WC, for example.

The two parallel plate electrodes 141 and 142 can be formed with, for example, polysilicon doped with predetermined impurities to impart conductivity. However, the material is not limited thereto, and various conductive materials may be used for the parallel plate electrodes 141 and 142.

Furthermore, as illustrated in FIGS. 45 and 48, the parallel plate capacitor of each unit pixel 545 may be disposed in the pixel region of the unit pixel 545 adjacent to each unit pixel 545. However, the capacitor arrangement is not limited to such an example, and various changes may be made in consideration of the arrangement of contacts penetrating the wiring layer 100T and the influence of capacitive coupling with these contacts.

In this manner, by disposing the parallel plate capacitor as the subFD capacitance SFD in the wiring layer 100T of the first substrate 100 having a relatively low wiring density, it is possible to realize a subFD capacitance SFD having a larger capacitance. This makes it possible to achieve a wider dynamic range and a high S/N ratio, enabling generation of image data with better image quality appropriate for the situation.

In addition, by disposing the parallel plate capacitor constituting the subFD capacitance SFD on the first substrate 100, it is possible to reduce capacitive coupling between the subFD capacitance SFD and the power supply line VDD, leading to improvement of power supply rejection ratio (PSRR) characteristics.

Although the third example is an exemplary case of having no pixel sharing structure similarly to the first example and the second example, the present technology is not limited thereto, and the above configuration can be applied to a case of including a pixel sharing structure.

Since other configurations, operations, and effects may be similar to those in the above-described first example, second example or the first embodiment, detailed description thereof will be omitted here.

9.4 Fourth Example

The third example described above is a case where the subFD capacitance SFD including the two parallel plate electrodes 141 and 142 is provided in the wiring layer 100T of the first substrate 100. In contrast, a fourth example will describe a case where one (for example, parallel plate electrode 142) of the two parallel plate electrodes 141 and 142 is substituted with the semiconductor layer 200S of the second substrate 200.

Figure 50:
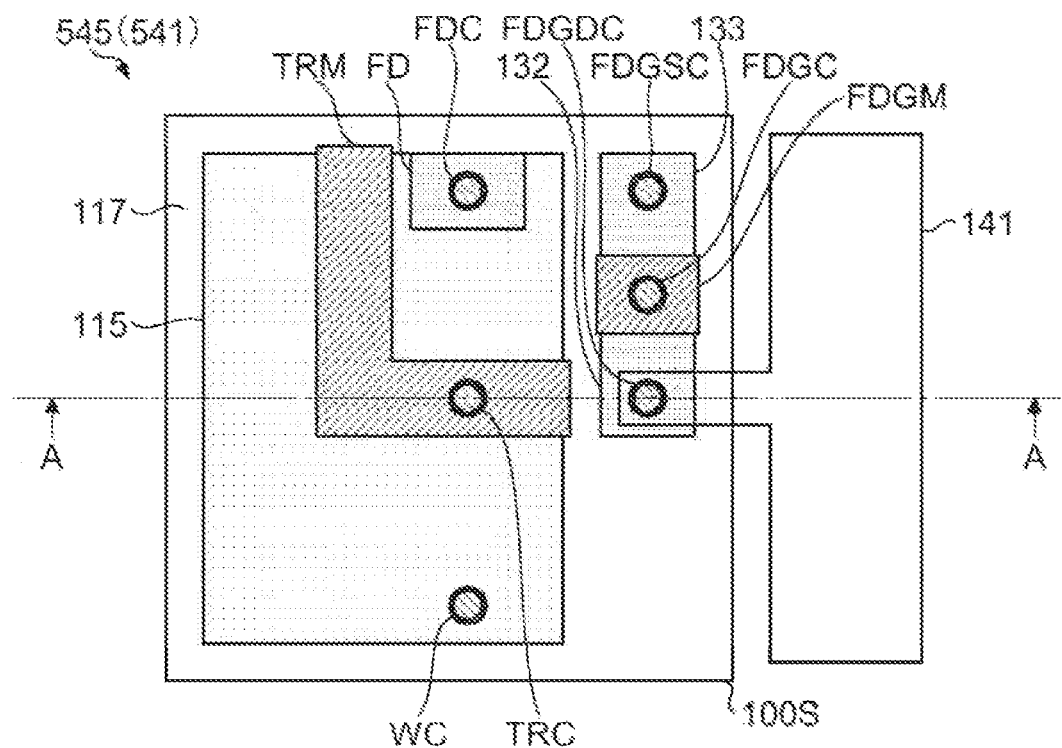
FIG. 50 is a schematic diagram illustrating a planar layout example of a main surface of a semiconductor layer in a first substrate according to a fourth example of the second embodiment.
Figure 51:
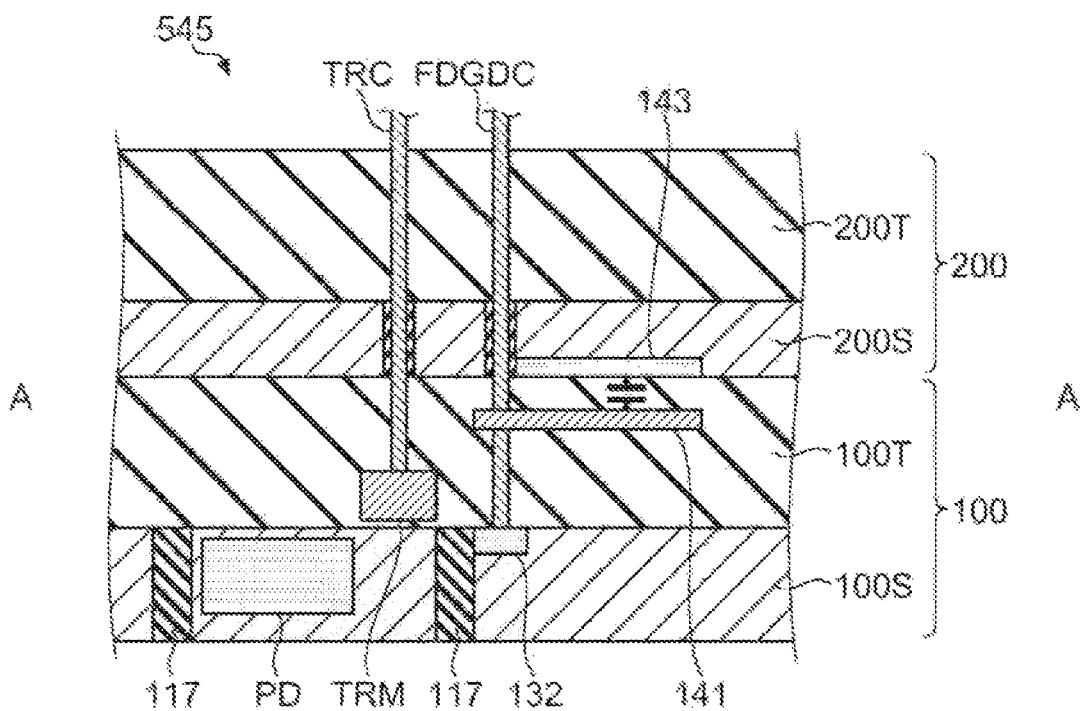
FIG. 51 is a cross-sectional view illustrating a structural example of an A-A plane in FIG. 50.

FIG. 50 is a schematic diagram illustrating a planar layout example of the main surface of the semiconductor layer in the first substrate according to the fourth example. FIG. 51 is a cross-sectional view illustrating a structural example of the A-A plane in FIG. 50.

Note that the pixel circuit according to the fourth example may be similar to, for example, the pixel circuit 210 described with reference to FIG. 38 in the first example, and thus a detailed description thereof will be omitted here. Furthermore, the planar layout example of the main surface of the semiconductor layer in the second substrate according to the fourth example may be similar to, for example, the planar layout example described with reference to FIG. 46 in the third example, and thus a detailed description thereof will be omitted here.

As illustrated in FIGS. 50, 51 and 46, in the fourth example, the photodiode PD, the floating diffusion FD, and the FD conversion gain switching transistor FDG are disposed in the semiconductor layer 100S of the first substrate 100 similarly to the second example. In the fourth example, similarly to the third example, the parallel plate electrode 141 constituting the subFD capacitance SFD is provided in the wiring layer 100T of the first substrate 100.

In addition, in the fourth example, a diffusion region 143 functioning as the other electrode of the parallel plate capacitor is provided in a region in the semiconductor layer 200S of the second substrate 200 facing the parallel plate electrode 141.

In this manner, by using the diffusion region 143 formed in the semiconductor layer 200S of the second substrate 200 for one parallel plate electrode of the parallel plate capacitor being the subFD capacitance SFD, it is possible to realize, for example, a subFD capacitance SFD having a larger capacitance, similarly to the third example. This makes it possible to achieve a wider dynamic range and a high S/N ratio, enabling generation of image data with better image quality appropriate for the situation.

In addition, by disposing the subFD capacitance SFD on the first substrate 100, it is possible to reduce capacitive coupling between the subFD capacitance SFD and the power supply line VDD, leading to improvement of power supply rejection ratio (PSRR) characteristics.

Furthermore, it is possible, in the fourth example, to omit the process of forming one parallel plate electrode (for example, parallel plate electrode 142) forming the parallel plate capacitor being the subFD capacitance SFD, leading to achievement of simplified manufacturing process and reduced manufacturing cost.

Although the fourth example is an exemplary case of having no pixel sharing structure similarly to the first example to the third example, the present disclosure is not limited thereto, and the above configuration can be applied to a case of including a pixel sharing structure.

Since other configurations, operations, and effects may be similar to those in the above-described first example to the third example or the first embodiment, detailed description thereof will be omitted here.

9.5 Fifth Example

A fifth example will describe a case where, in addition to the parallel plate capacitor (first capacitive element) connected to the subFD contact FDGDC illustrated in the third example or the fourth example, a parallel plate capacitor connected to the well contact WC is added as a capacitive element (second capacitive element) forming the subFD capacitance SFD.

Note that, although the present description is a case where the structure described in the fourth example, that is, the structure in which one parallel plate electrode (for example, parallel plate electrode 142) of the parallel plate capacitor is substituted by the diffusion region 143 formed in the semiconductor layer 200S of the second substrate 200 is used as a base, the present technology is not limited thereto, and the structure described in other examples such as the structure described in the third example can be used as a base.

Figure 52:
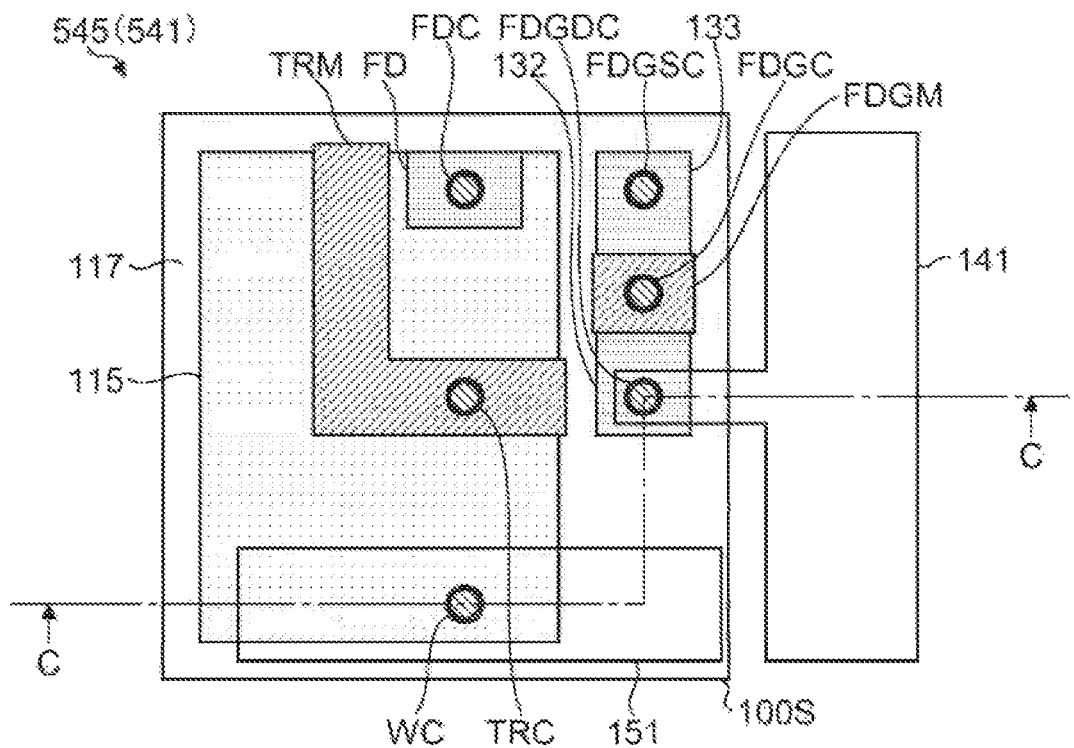
FIG. 52 is a schematic diagram illustrating a planar layout example of a main surface of a semiconductor layer in a first substrate according to a fifth example of the second embodiment.
Figure 53:
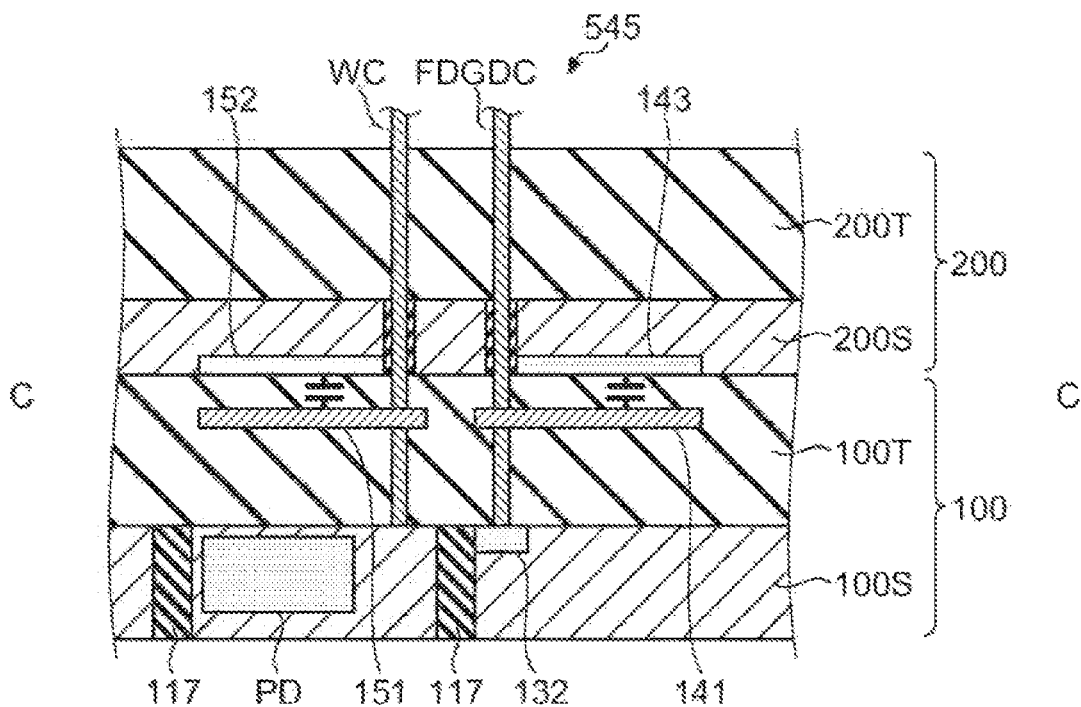
FIG. 53 is a cross-sectional view illustrating a structural example of a C-C plane in FIG. 52.

FIG. 52 is a schematic diagram illustrating a planar layout example of the main surface of the semiconductor layer in the first substrate according to the fifth example. FIG. 53 is a cross-sectional view illustrating a structural example of a C-C plane in FIG. 52.

Note that the pixel circuit according to the fifth example may be similar to, for example, the pixel circuit 210 described with reference to FIG. 38 in the first example, and thus a detailed description thereof will be omitted here. Furthermore, similarly to the fourth example, the planar layout example of the main surface of the semiconductor layer in the second substrate according to the fifth example may be similar to, for example, the planar layout example described with reference to FIG. 46 in the third example, and thus a detailed description thereof will be omitted here.

As illustrated in FIGS. 52, 53, and 46, in the fifth example, the photodiode PD, the floating diffusion FD, and the FD conversion gain switching transistor FDG are disposed in the semiconductor layer 100S of the first substrate 100 similarly to the second example. Furthermore, similarly to the fourth example, the configuration of the fifth example is such that the parallel plate electrode 141 constituting the subFD capacitance SFD is provided in the wiring layer 100T of the first substrate 100, and the diffusion region 143 functioning as the other electrode of the parallel plate capacitor is provided in a region in the semiconductor layer 200S of the second substrate 200 facing the parallel plate electrode 141.

In addition, in the fifth example, the parallel plate electrode 151 connected to the well contact WC is provided in the wiring layer 100T of the first substrate 100. Furthermore, in the fifth example, a diffusion region 152 functioning as the other electrode of the parallel plate capacitor is provided in a region in the semiconductor layer 200S of the second substrate 200 facing the parallel plate electrode 151.

Similarly to the parallel plate electrode 141 and the like, the parallel plate electrode 151 can be formed by using, for example, polysilicon doped with a predetermined impurity to impart conductivity. However, the material is not limited thereto, and various conductive materials may be used for the parallel plate electrode 151.

In this manner, with the subFD capacitance SFD constituted with the two capacitive elements of the parallel plate capacitor connected to the subFD contact FDGDC and the parallel plate capacitor connected to the well contact WC, it is possible to realize the subFD capacitance SFD with a larger capacitance. This makes it possible to achieve a wider dynamic range and a high S/N ratio, enabling generation of image data with better image quality appropriate for the situation.

In addition, by disposing the subFD capacitance SFD including the two parallel plate capacitors on the first substrate 100, it is possible to reduce capacitive coupling between the subFD capacitance SFD and the power supply line VDD, leading to improvement of power supply rejection ratio (PSRR) characteristics.

Furthermore, it is possible, in the fifth example, to omit the process of forming one parallel plate electrode (for example, parallel plate electrode 142) forming the parallel plate capacitor, leading to achievement of the simplified manufacturing process and reduced manufacturing cost.

Although the fifth example is an exemplary case of having no pixel sharing structure similarly to the first example to the fourth example, the present technology is not limited thereto, and the above configuration can be applied to a case of including a pixel sharing structure.

Since other configurations, operations, and effects may be similar to those in the above-described first example to the fourth example or the first embodiment, detailed description thereof will be omitted here.

9.5.1 Modification of Fifth Example

Figure 54:
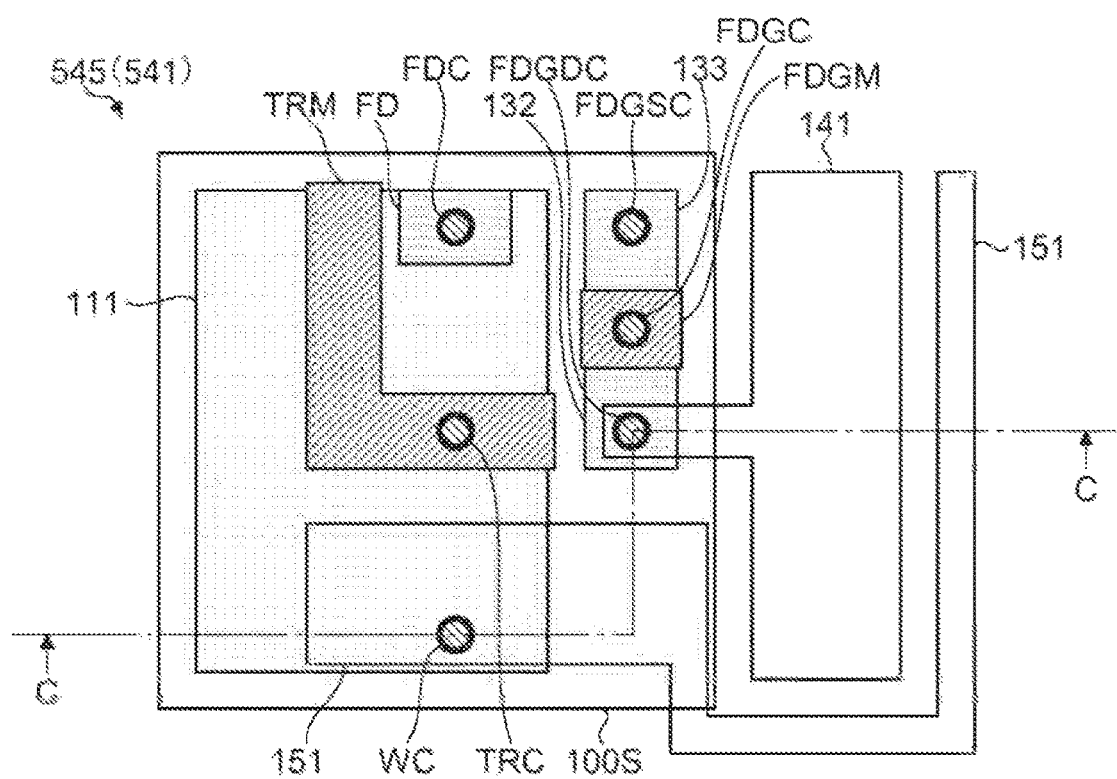
FIG. 54 is a schematic diagram illustrating a planar layout example of a main surface of a semiconductor layer in a first substrate according to a modification of the fifth example of the second embodiment.
Figure 55:
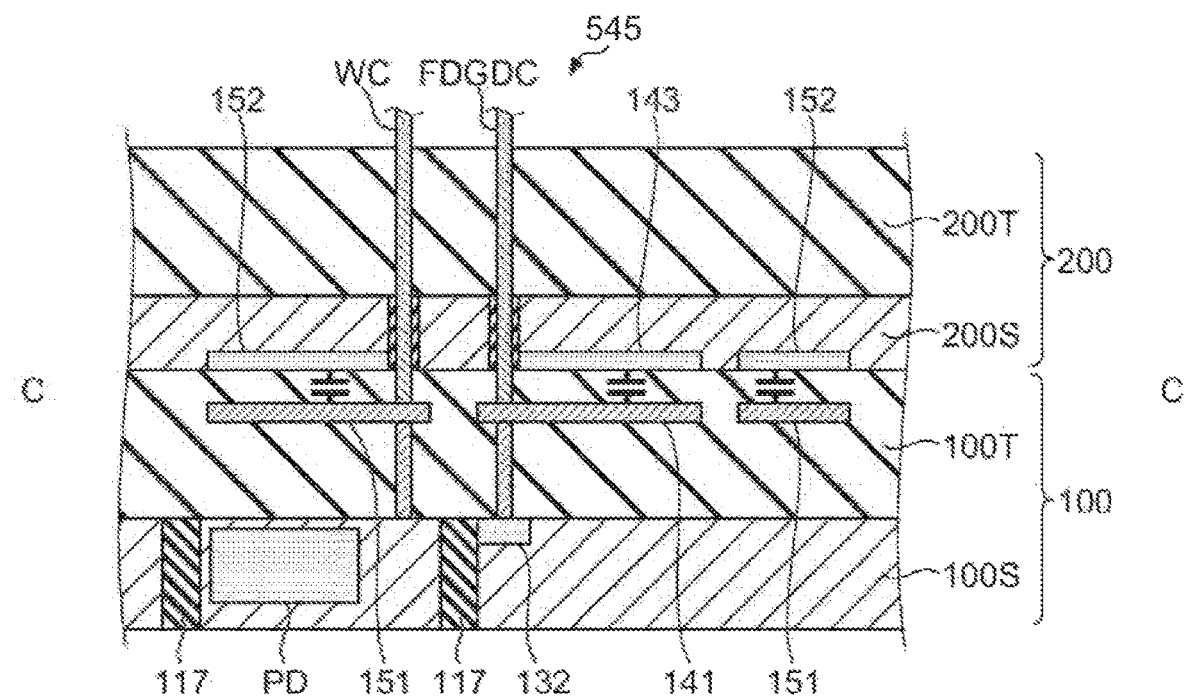
FIG. 55 is a cross-sectional view illustrating a structural example of a C-C plane in FIG. 54.

FIG. 54 is a schematic diagram illustrating a planar layout example of a main surface of a semiconductor layer in a first substrate according to a modification of the fifth example. FIG. 55 is a cross-sectional view illustrating a structural example of a C-C plane in FIG. 54.

As illustrated in FIGS. 54 and 55, the parallel plate capacitor connected to the well contact WC illustrated in the fifth example may be routed to a boundary portion of the adjacent unit pixel 545, for example. That is, the parallel plate electrode 151 and the diffusion region 152 constituting the parallel plate capacitor may be continuously formed up to the boundary portion of the adjacent unit pixel 545.

In this manner, by routing the parallel plate capacitor connected to the p well layer 115 to the boundary portion between the adjacent pixels, it is possible to allow the capacitor to function as a shield to reduce electrical interference between the adjacent pixels. This makes it possible to reduce the settling time of the vertical signal line 543, enabling stable and high speed readout of the image data.

Since other configurations, operations, and effects may be similar to those in the above-described fifth example, detailed description thereof will be omitted here.

9.6 Sixth Example

The sixth example will describe a case where the FD conversion gain switching transistor FDG is disposed on the second substrate 200 based on the second example to the fifth example, for example.

Note that, although the present description is a case where the structure described in the fourth example, that is, the structure in which one parallel plate electrode (for example, parallel plate electrode 142) of the parallel plate capacitor is substituted by the diffusion region 143 formed in the semiconductor layer 200S of the second substrate 200 is used as a base, the present technology is not limited thereto, and the structure described in other examples such as the structure described above or below can be used as a base.

Figure 56:
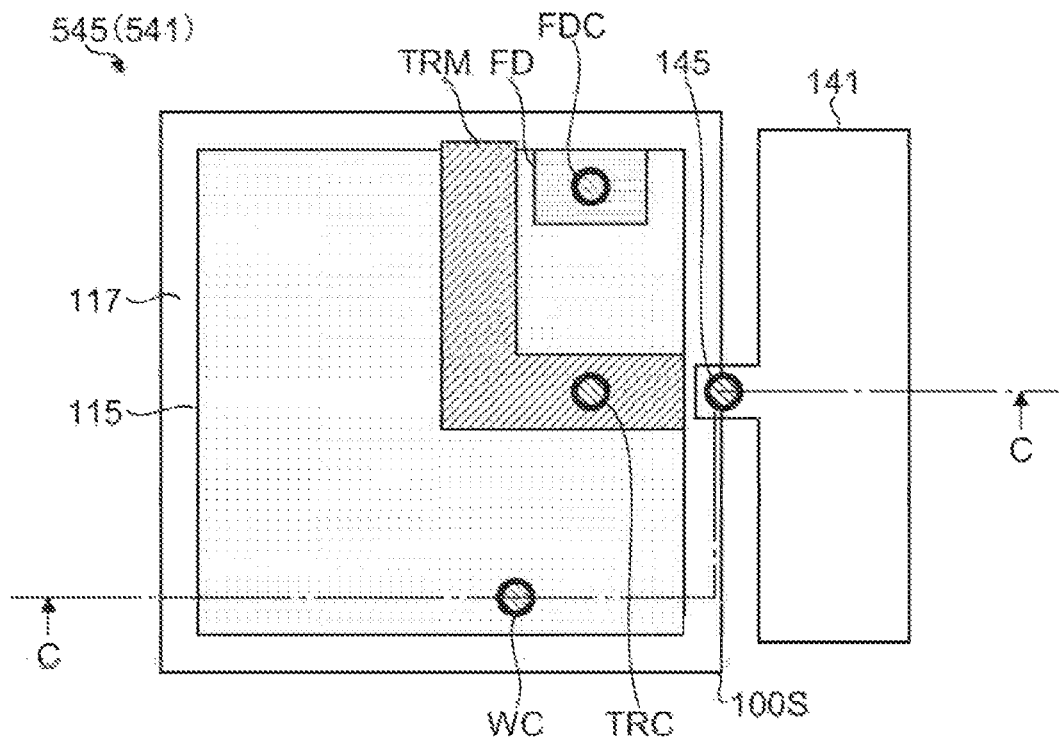
FIG. 56 is a schematic diagram illustrating a planar layout example of a main surface of a semiconductor layer in a first substrate according to a sixth example of the second embodiment.
Figure 57:
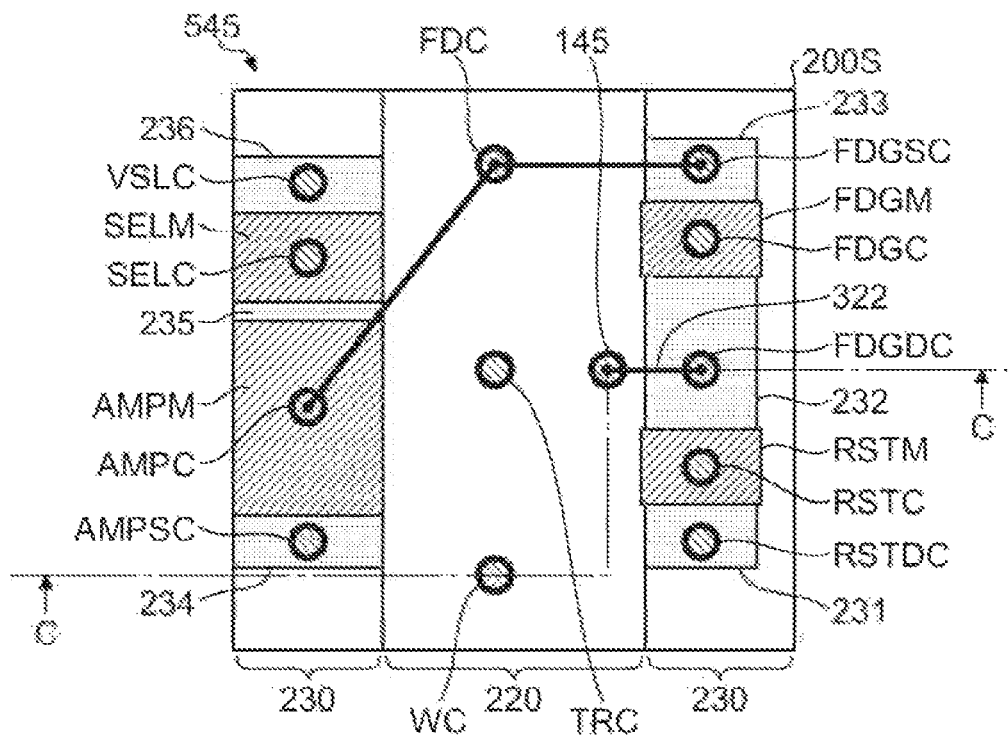
FIG. 57 is a schematic diagram illustrating a planar layout example of a main surface of a semiconductor layer in a second substrate according to the sixth example of the second embodiment.
Figure 58:
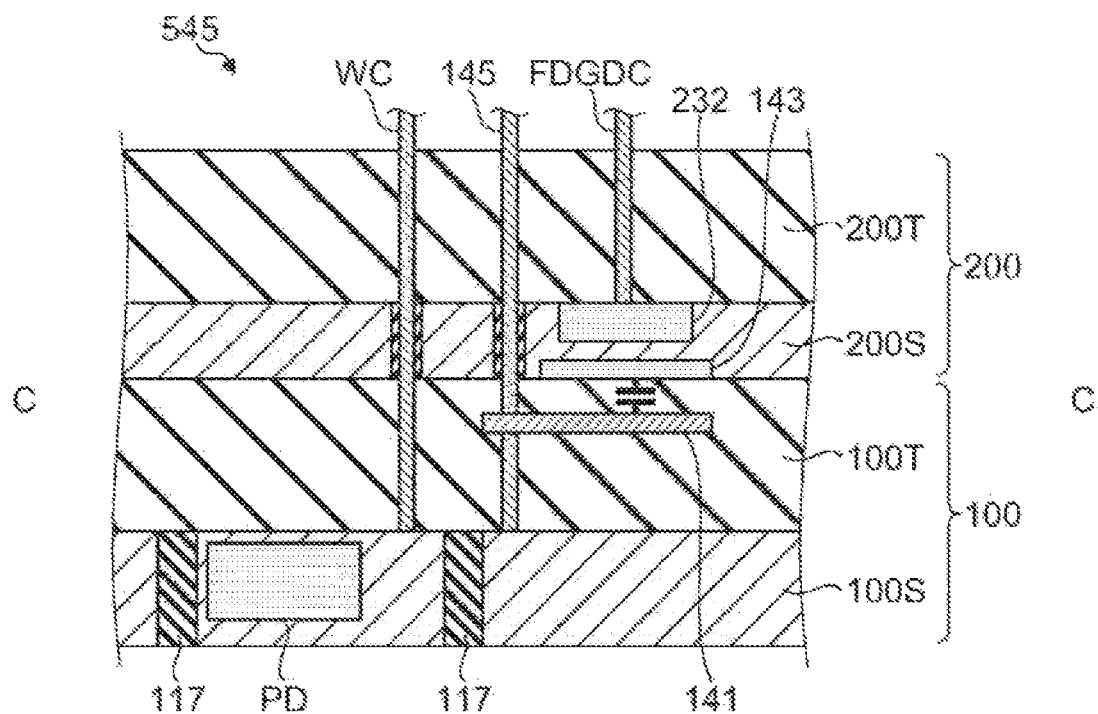
FIG. 58 is a cross-sectional view illustrating a structural example of a C-C plane in FIGS. 56 and 57.

FIG. 56 is a schematic diagram illustrating a planar layout example of the main surface of the semiconductor layer in the first substrate according to the sixth example; and FIG. 57 is a schematic diagram illustrating a planar layout example of the main surface of the semiconductor layer in the second substrate according to the sixth example. FIG. 58 is a cross-sectional view illustrating a structural example of a C-C plane in FIGS. 56 and 57.

Note that the pixel circuit according to the sixth example may be similar to, for example, the pixel circuit 210 described with reference to FIG. 38 in the first example, and thus a detailed description thereof will be omitted here.

As illustrated in FIGS. 56 to 58, in the sixth example, the FD conversion gain switching transistor FDG is disposed on the second substrate 200, similarly to the first example. Furthermore, similarly to the fourth example, the configuration of the sixth example is such that the parallel plate electrode 141 constituting the subFD capacitance SFD is provided in the wiring layer 100T of the first substrate 100, and the diffusion region 143 functioning as the other electrode of the parallel plate capacitor is provided in a region in the semiconductor layer 200S of the second substrate 200 facing the parallel plate electrode 141.

In addition, in the sixth example, the diffusion region 232 functioning as the drain of the FD conversion gain switching transistor FDG provided in the second substrate 200 is connected to the parallel plate electrode 141 formed in the wiring layer 100T via the subFD contact FDGDC, wiring 322 formed in the wiring layer 200T, and via-wiring 145 penetrating from the wiring layer 200T to the wiring layer 100T across the semiconductor layer 200S.

By disposing the subFD capacitance SFD on the second substrate 200 in this manner, it is possible to increase the light receiving area of the photodiode PD in the first substrate 100. This leads to improvement of the conversion efficiency Qs.

Although the sixth example is an exemplary case of having no pixel sharing structure similarly to the first example to the fifth example, the present disclosure is not limited thereto, and the above configuration can be applied to a case of including a pixel sharing structure.

Since other configurations, operations, and effects may be similar to those in the above-described first example to the fifth example or the first embodiment, detailed description thereof will be omitted here.

9.7 Seventh Example

As described with reference to FIG. 38 in the first example, the first to sixth examples described above are cases where the FD conversion gain switching transistor FDG and the reset transistor RST are connected in series to the gate of the amplification transistor AMP, and the subFD capacitance SFD is connected to the connection node between the drain of the FD conversion gain switching transistor FDG and the source of the reset transistor RST, which is the connected portion. In contrast, the seventh example will describe a case where the FD conversion gain switching transistor FDG and the reset transistor RST are connected in parallel to the gate of the amplification transistor AMP.

Note that, although the present description is a case where the structure described in the fourth example, that is, the structure in which one parallel plate electrode (for example, parallel plate electrode 142) of the parallel plate capacitor is substituted by the diffusion region 143 formed in the semiconductor layer 200S of the second substrate 200 is used as a base, the present technology is not limited thereto, and the structure described in other examples such as the structure described above or below can be used as a base.

Figure 59:
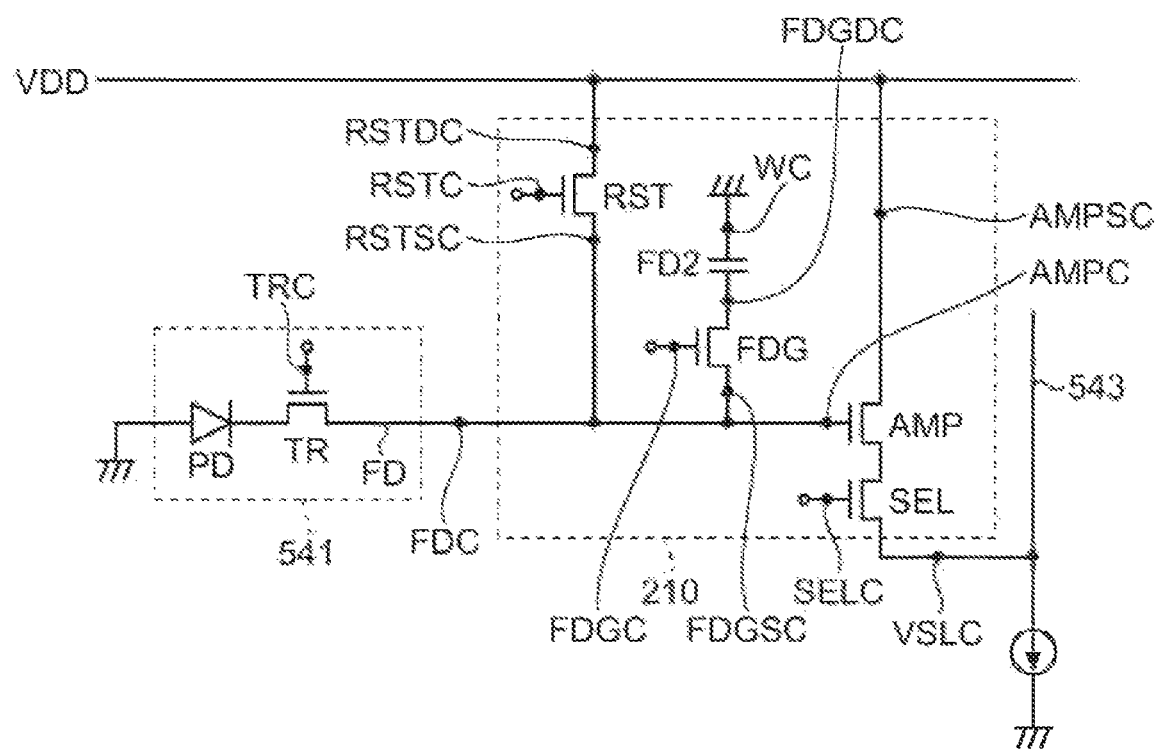
FIG. 59 is a circuit diagram illustrating a schematic configuration example of a pixel circuit according to a seventh example of the second embodiment.
Figure 60:
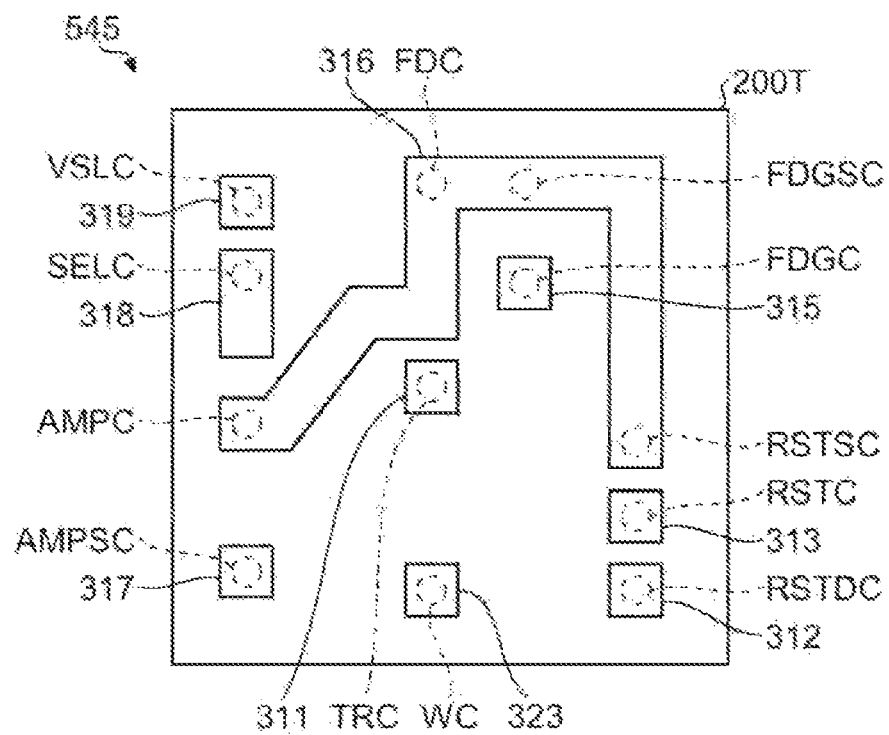
FIG. 60 is a schematic diagram illustrating a planar layout example of wiring provided in a wiring layer in a second substrate according to the seventh example of the second embodiment.
Figure 61:
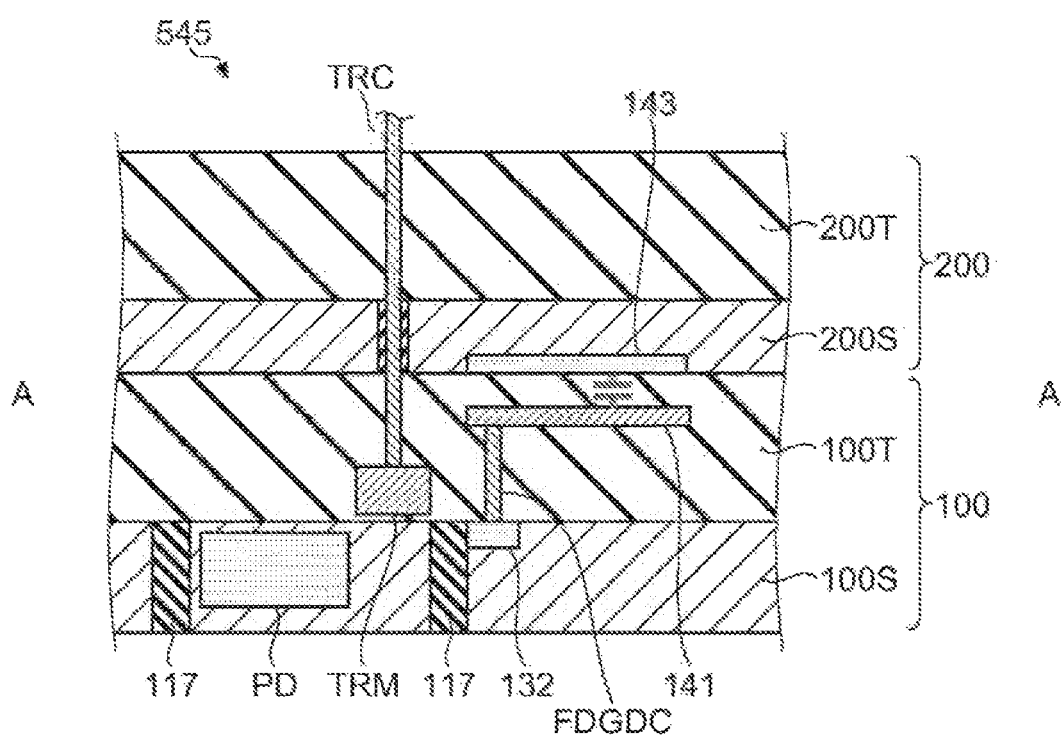
FIG. 61 is a cross-sectional view illustrating a structural example of an A-A plane in FIGS. 50 and 51 according to the seventh example of the second embodiment.

FIG. 59 is a circuit diagram illustrating a schematic configuration example of a pixel circuit according to a seventh example; and FIG. 60 is a schematic diagram illustrating a planar layout example of wiring provided in a wiring layer in a second substrate according to the seventh example. Note that the planar layout of the main surface of the semiconductor layer 100S in the first substrate 100 and the planar layout of the main surface of the semiconductor layer 200S in the second substrate 200 may be similar to, for example, the planar layout example described with reference to FIGS. 50 and 51 in the fourth example, and thus, similar portions are cited in the present description. Note that the wiring lines illustrated in FIG. 59 do not necessarily have to be provided in the same wiring layer among the plurality of wiring lines (the first wiring layer W1 to the fourth wiring layer W4), and may be distributed in different wiring layers. FIG. 61 is a cross-sectional view illustrating a structural example of the A-A plane in FIGS. 50 and 51 according to the seventh example.

As illustrated in FIG. 59, the pixel circuit 210 according to the seventh example has a configuration similar to the pixel circuit 210 described with reference to FIG. 38 in the first example, in which the reset transistor RST and the FD conversion gain switching transistor FDG are connected in parallel to the gate of the amplification transistor AMP. More specifically, the source of the reset transistor RST and the source of the FD conversion gain switching transistor FDG are connected to the wiring linking the floating diffusion FD to the gate of the amplification transistor AMP. In addition, the subFD capacitance SFD is connected to the drain of the FD conversion gain switching transistor FDG.

As illustrated in FIG. 60, the seventh example uses a configuration in which the source of the reset transistor RST is connected to the floating diffusion FD via the wiring 316 of the wiring layer 200T and the FD contact FDC and is connected to the gate of the amplification transistor AMP via the wiring 316 and the amplification gate contact AMPC.

Furthermore, as illustrated in FIG. 61, in the seventh example, the subFD contact FDGDC connected to the drain of the FD conversion gain switching transistor FDG is connected to the parallel plate electrode 141 provided in the wiring layer 100T without penetrating the wiring layer 100T.

In this manner, with a configuration in which the reset transistor RST and the FD conversion gain switching transistor FDG are connected in parallel to the gate of the amplification transistor AMP (and the floating diffusion FD), and the subFD capacitance SFD is connected to the drain of the FD conversion gain switching transistor FDG, it is possible to separately control the release (reset) of the charge accumulated in the floating diffusion FD and the release (reset) of the charge accumulated in the subFD capacitance SFD. In that case, the subFD capacitance SFD can also be used as memory that holds the charge generated in the photodiode PD by the preceding light reception.

Although the seventh example is an exemplary case of having no pixel sharing structure similarly to the first example to the sixth example, the present disclosure is not limited thereto, and the above configuration can be applied to a case of including a pixel sharing structure.

Since other configurations, operations, and effects may be similar to those in the above-described first example to the sixth example or the first embodiment, detailed description thereof will be omitted here.

9.8 Eighth Example

Here, cases where the pixel sharing structure is applied to the above-described first example to the seventh example will be described as modifications with some examples.

Note that, although the present description is a case where the structure described in the fourth example, that is, the structure in which one parallel plate electrode (for example, parallel plate electrode 142) of the parallel plate capacitor is substituted by the diffusion region 143 formed in the semiconductor layer 200S of the second substrate 200 is used as a base, the present technology is not limited thereto, and the structure described in other examples such as the structure described above or below can be used as a base.

Furthermore, in the following description, the first to third modifications will describe a case where one pixel circuit 210 is shared by the pixel sharing unit 539 including the four pixels 541A to 541D in total of 2 rows×2 columns, and the fourth and fifth modifications will describe a case where one pixel circuit 210 is shared by the pixel sharing unit 539 including the two pixels 541A and 541B in total of 1 row×2 columns.

9.8.1 First Modification

Figure 62:
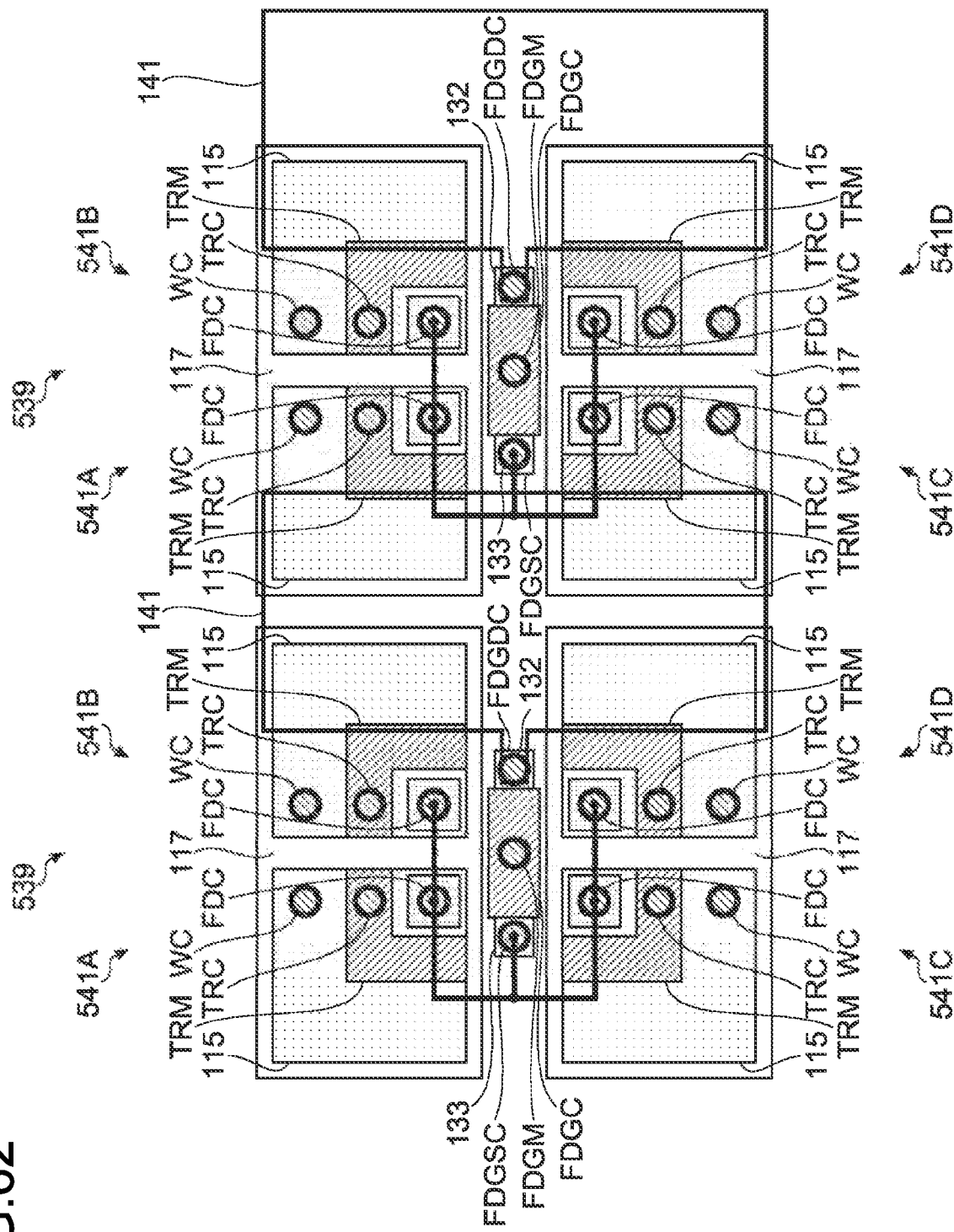
FIG. 62 is a schematic diagram illustrating a planar layout example of a main surface of a semiconductor layer in a first substrate according to a first modification of an eighth example of the second embodiment.

FIG. 62 is a schematic diagram illustrating a planar layout example of the main surface of the semiconductor layer in the first substrate according to a first modification. As illustrated in FIG. 62, the first modification has a structure in which the FD conversion gain switching transistor FDG is disposed at the center of a rectangular region formed by the pixels 541A to 541D arranged in 2 rows×2 columns for each pixel sharing unit 539. The pixels 541A to 541D are isolated from each other by the pixel isolation portion 117, for example.

Nodes of the floating diffusion FD of each of the pixels 541A to 541D arranged in 2 rows×2 columns are connected to each other via the wiring formed in the wiring layer 200T of the second substrate 200 (refer to FIG. 4).

Similarly to the pixel circuit 210, the parallel plate electrode 141 forming the subFD capacitance SFD is shared by the four pixels 541A to 541D constituting one pixel sharing unit 539. The parallel plate electrode 141 is disposed in a region where various contacts of the pixels 541A to 541D are not arranged in the wiring layer 100T of the first substrate 100, for example, arranged in a boundary portion of the adjacent pixel sharing unit 539.

9.8.2 Second Modification

Figure 63:
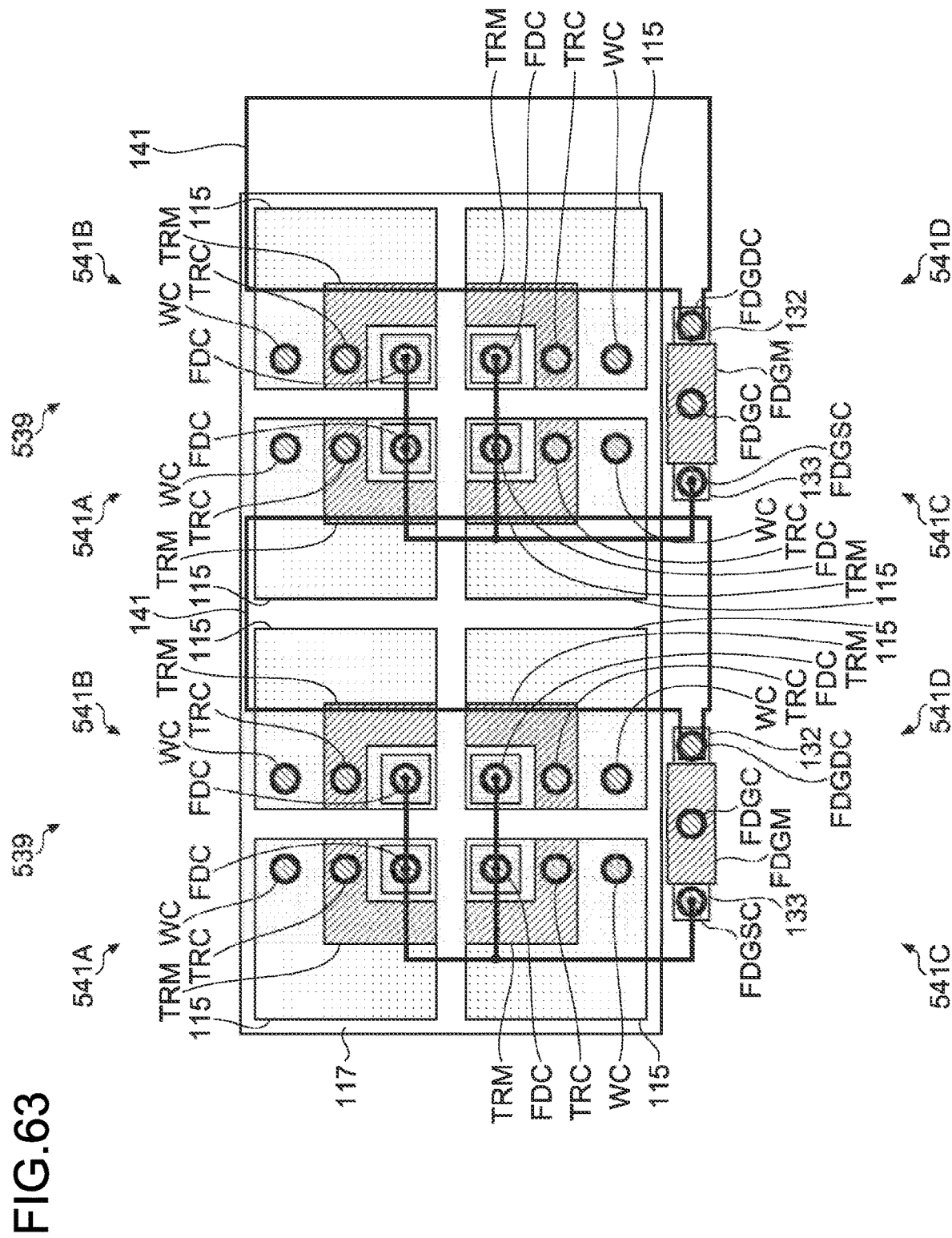
FIG. 63 is a schematic diagram illustrating a planar layout example of a main surface of a semiconductor layer in a first substrate according to a second modification of the eighth example of the second embodiment.

FIG. 63 is a schematic diagram illustrating a planar layout example of the main surface of the semiconductor layer in the first substrate according to a second modification. As illustrated in FIG. 63, the second modification has a structure in which the FD conversion gain switching transistor FDG is disposed in a region adjacent to the outer side of the rectangular region formed by the pixels 541A to 541D arranged in 2 rows×2 columns for each pixel sharing unit 539 (for example, an adjacent region on the lower side in the drawing). The pixels 541A to 541D are isolated from each other by the pixel isolation portion 117, for example.

Nodes of the floating diffusion FD of each of the pixels 541A to 541D arranged in 2 rows×2 columns are connected to each other via wiring formed in the wiring layer 200T of the second substrate 200, similarly to the first modification (refer to FIG. 4).

Similarly to the first modification, the parallel plate electrode 141 forming the subFD capacitance SFD is shared by the four pixels 541A to 541D constituting one pixel sharing unit 539. Similarly to the first modification, the parallel plate electrode 141 is arranged in a region where various contacts of the pixels 541A to 541D are not arranged in the wiring layer 100T of the first substrate 100, for example, arranged in a boundary portion of the adjacent pixel sharing unit 539.

9.8.3 Third Modification

Figure 64:
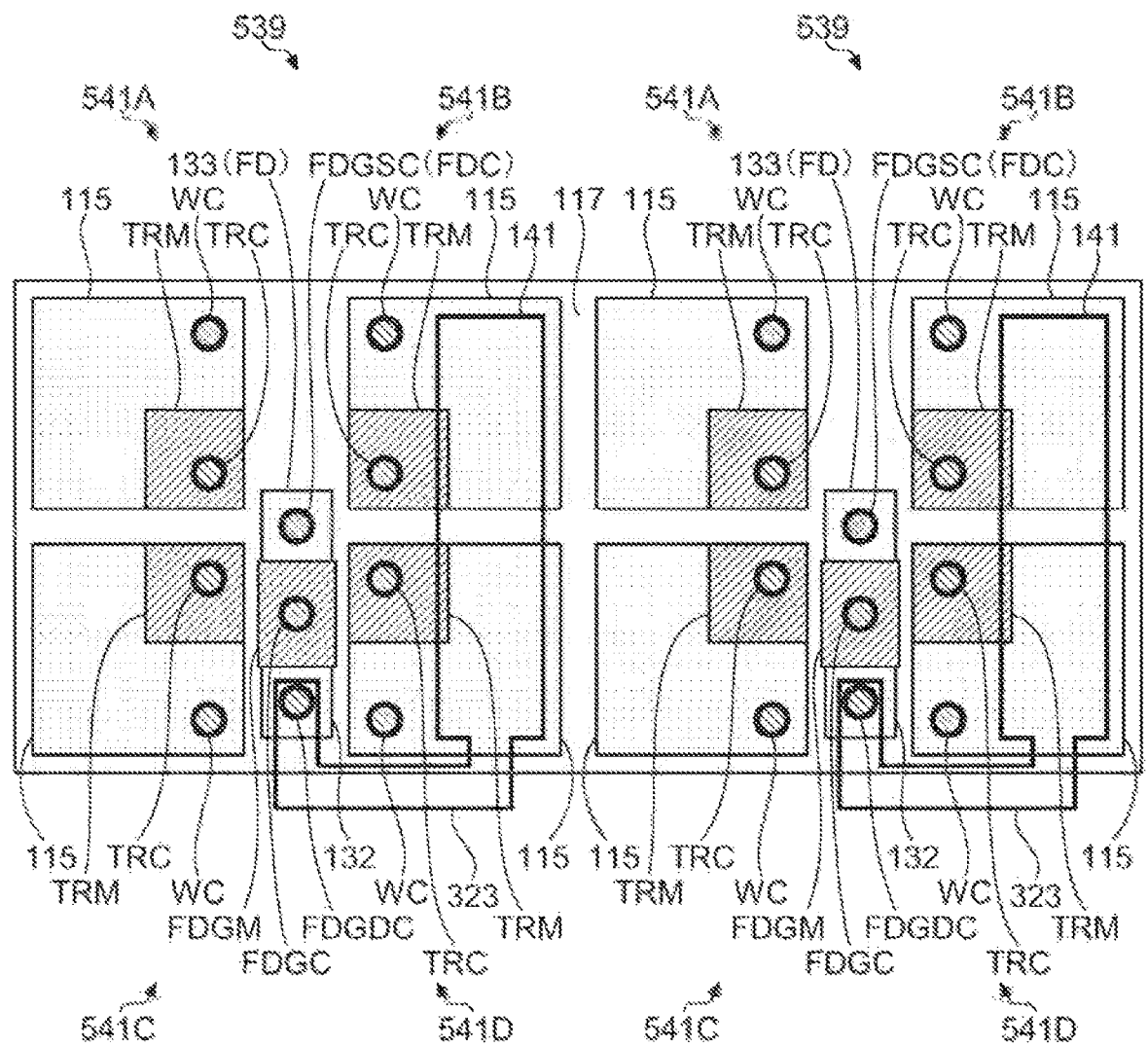
FIG. 64 is a schematic diagram illustrating a planar layout example of a main surface of a semiconductor layer in a first substrate according to a third modification of the eighth example of the second embodiment.

FIG. 64 is a schematic diagram illustrating a planar layout example of the main surface of the semiconductor layer in the first substrate according to a third modification. As illustrated in FIG. 64, the third modification has a structure in which the FD conversion gain switching transistor FDG is disposed near the center (may be just at the center) of a rectangular region formed by the pixels 541A to 541D arranged in 2 rows×2 columns for each pixel sharing unit 539. The pixels 541A to 541D are isolated from each other by the pixel isolation portion 117, for example.

Nodes of the floating diffusion FD of each of the pixels 541A to 541D arranged in 2 rows×2 columns are connected to each other via wiring formed in the wiring layer 200T of the second substrate 200, similarly to the first modification (refer to FIG. 4).

Similarly to the first modification, for example, the parallel plate electrode 141 forming the subFD capacitance SFD is shared by the four pixels 541A to 541D constituting one pixel sharing unit 539.

For example, the parallel plate electrode 141 is disposed in a region deviated from the center of the rectangular region formed by the pixels 541A to 541D (for example, a region close to the boundary (which may include the boundary) of the adjacent pixel sharing unit 539).

The drain of the FD conversion gain switching transistor FDG and the parallel plate electrode 141 are connected to each other via the subFD contact FDGDC connected to the drain and via wiring 323 formed in the wiring layer 100T of the first substrate 100.

The wiring 323 is routed from the subFD contact FDGDC so as to detour above the pixels 541A to 541D, for example, and is connected to the parallel plate electrode 141.

9.8.4 Fourth Modification

Figure 65:
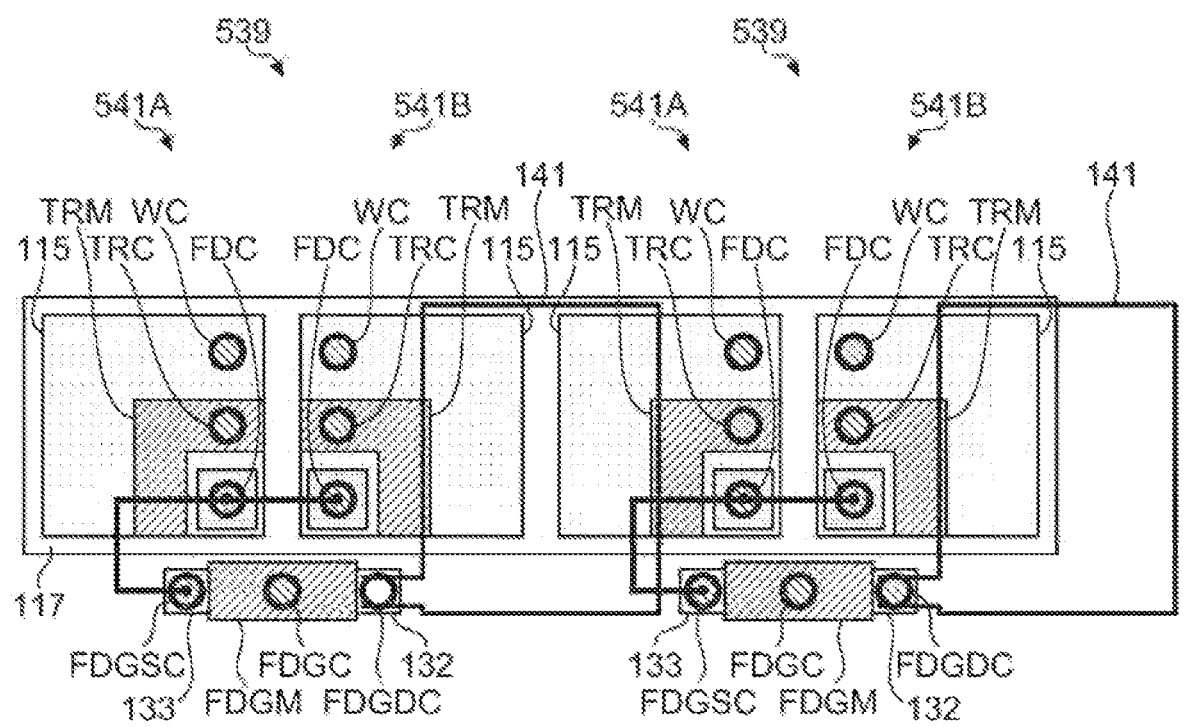
FIG. 65 is a schematic diagram illustrating a planar layout example of a main surface of a semiconductor layer in a first substrate according to a fourth modification of the eighth example of the second embodiment.

FIG. 65 is a schematic diagram illustrating a planar layout example of the main surface of the semiconductor layer in the first substrate according to a fourth modification. As illustrated in FIG. 65, the fourth modification has a structure in which the FD conversion gain switching transistor FDG is disposed in a region adjacent to the outer side of the rectangular region formed by the pixels 541A and 541B arranged in 1 row×2 columns for each pixel sharing unit 539 (for example, an adjacent region on the lower side in the drawing). The pixels 541A and 541B are isolated from each other by the pixel isolation portion 117, for example.

Nodes of the floating diffusion FD of each of the pixels 541A and 541B arranged in 1 row×2 columns are connected to each other via wiring formed in the wiring layer 200T of the second substrate 200, similarly to the above modifications.

Similarly to the pixel circuit 210, the parallel plate electrode 141 forming the subFD capacitance SFD is shared by the two pixels 541A and 541B constituting one pixel sharing unit 539. The parallel plate electrode 141 is disposed in a region where various contacts of the pixels 541A and 541B are not arranged in the wiring layer 100T of the first substrate 100, for example, arranged in a boundary portion of the adjacent pixel sharing unit 539.

9.8.5 Fifth Modification

Figure 66:
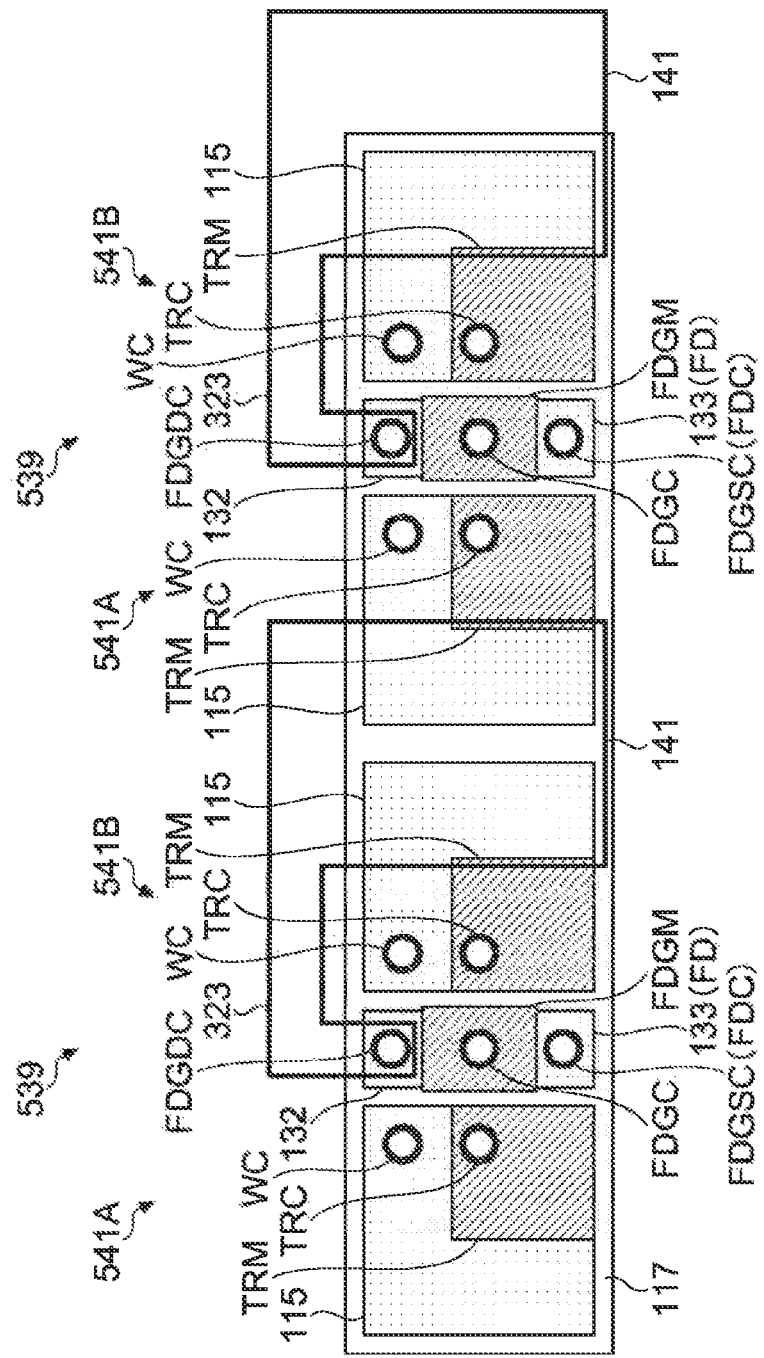
FIG. 66 is a schematic diagram illustrating a planar layout example of a main surface of a semiconductor layer in a first substrate according to a fifth modification of the eighth example of the second embodiment.

FIG. 66 is a schematic diagram illustrating a planar layout example of the main surface of the semiconductor layer in the first substrate according to a fifth modification. As illustrated in FIG. 66, the fifth modification has a structure in which the FD conversion gain switching transistor FDG is disposed at the center of a rectangular region formed by the pixels 541A and 541B arranged in 1 row×2 columns for each pixel sharing unit 539, that is, in a region sandwiched between the pixel 541A and the pixel 541B. The pixels 541A and 541B are isolated from each other by the pixel isolation portion 117, for example.

Nodes of the floating diffusion FD of each of the pixels 541A to 541D arranged in 1 row×2 columns are connected to each other via wiring formed in the wiring layer 200T of the second substrate 200, similarly to the above modifications.

Similarly to the pixel circuit 210, the parallel plate electrode 141 forming the subFD capacitance SFD is shared by the two pixels 541A and 541B constituting one pixel sharing unit 539. The parallel plate electrode 141 is disposed in a region where various contacts of the pixels 541A and 541B are not arranged in the wiring layer 100T of the first substrate 100, for example, arranged in a boundary portion of the adjacent pixel sharing unit 539.

Similarly to the third modification, the drain of the FD conversion gain switching transistor FDG and the parallel plate electrode 141 are connected to each other via the subFD contact FDGDC connected to the drain and via the wiring 323 formed in the wiring layer 100T of the first substrate 100.

The wiring 323 is routed from the subFD contact FDGDC so as to detour above the pixels 541A and 541B, for example, and is connected to the parallel plate electrode 141.

As described above, even in a case where one pixel circuit 210 is shared by a plurality of pixels 541, it is possible to appropriately arrange the capacitive elements for switching the FD capacitance C as described in the first example to the seventh example.

Since other configurations, operations, and effects may be similar to those in the above-described first example to the seventh example or the first embodiment, detailed description thereof will be omitted here.

9.9 Ninth Example

The first example to the eighth example above have described, by using examples, the circuit configuration, the layout structure, and the cross-sectional structure of each unit pixel 545 suitable for a system referred to as a rolling shutter system in which pixel signals are read out row by row sequentially from the plurality of unit pixels 545 arranged in the pixel array unit 540 in a matrix. In contrast, a ninth example will describe, by using examples, a circuit configuration, a layout structure, and a cross-sectional structure of each unit pixel suitable for a system referred to as a global shutter system in which pixel signals are simultaneously read out from all the unit pixels of the pixel array unit 540.

9.9.1 Circuit Configuration Example

Figure 67:
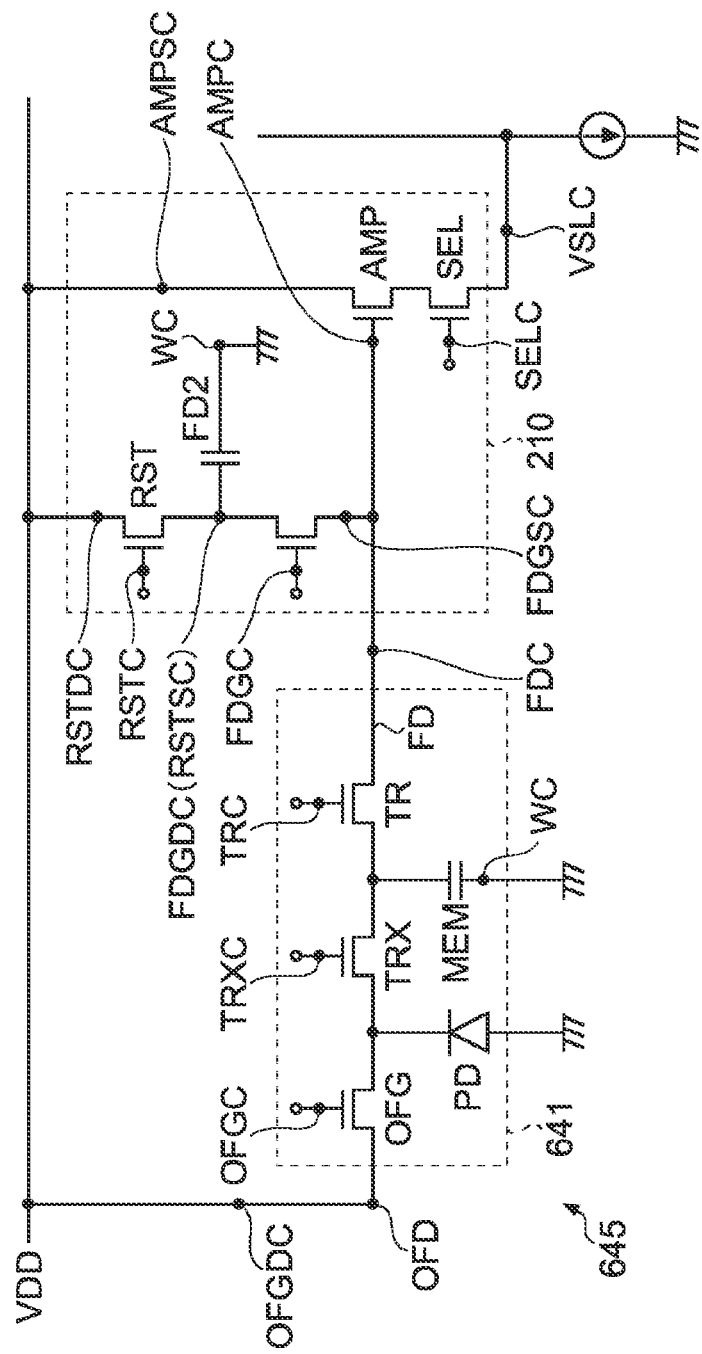
FIG. 67 is a circuit diagram illustrating a schematic configuration example of a unit pixel according to a ninth example of the second embodiment.

FIG. 67 is a circuit diagram illustrating a schematic configuration example of a unit pixel according to the ninth example. As illustrated in FIG. 67, a unit pixel 645 according to the ninth example has a configuration in which, for example, a pixel 541 is replaced with a pixel 641 in a configuration similar to the configuration described with reference to FIG. 38 in the first example.

While having a configuration similar to the case of the pixel 541, the pixel 641 has a configuration in which the source and drain of a gate transistor TRX are connected between the cathode of the photodiode PD and the transfer transistor TR. The wiring connecting the drain of the gate transistor TRX and the source of the transfer transistor TR is connected to memory MEM being a capacitive element. Therefore, the charge generated by photoelectric conversion in the photodiode PD is once held in the memory MEM via the gate transistor TRX and then transferred to the floating diffusion FD via the transfer transistor TR.

The cathode of the photodiode PD is also connected to the power supply line VDD via an overflow gate transistor OFG. The extra charge generated in the photodiode PD during the non-accumulation period is transferred to the overflow diffusion OFD via the overflow gate transistor OFG and then discharged to the power supply line VDD.

9.9.2 Example of Planar Layout of Each Layer

Figure 68:
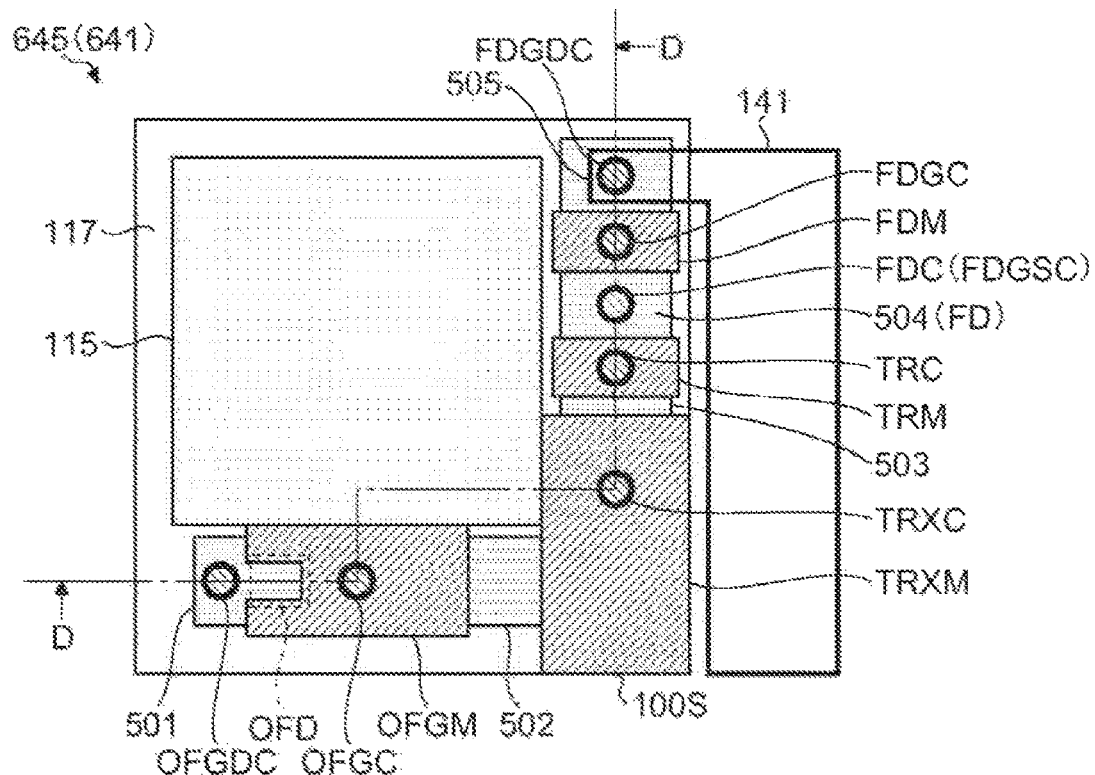
FIG. 68 is a schematic diagram illustrating a planar layout example of a semiconductor layer of a first substrate according to the ninth example of the second embodiment.
Figure 69:
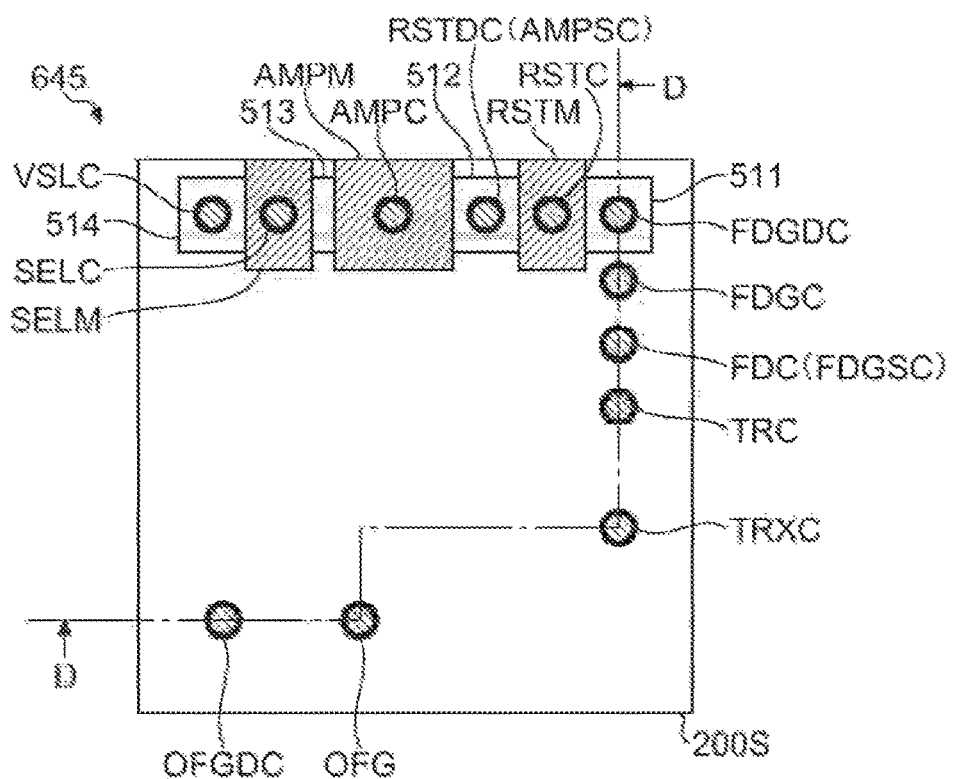
FIG. 69 is a schematic diagram illustrating a planar layout example of a semiconductor layer of a second substrate according to the ninth example of the second embodiment.
Figure 70:
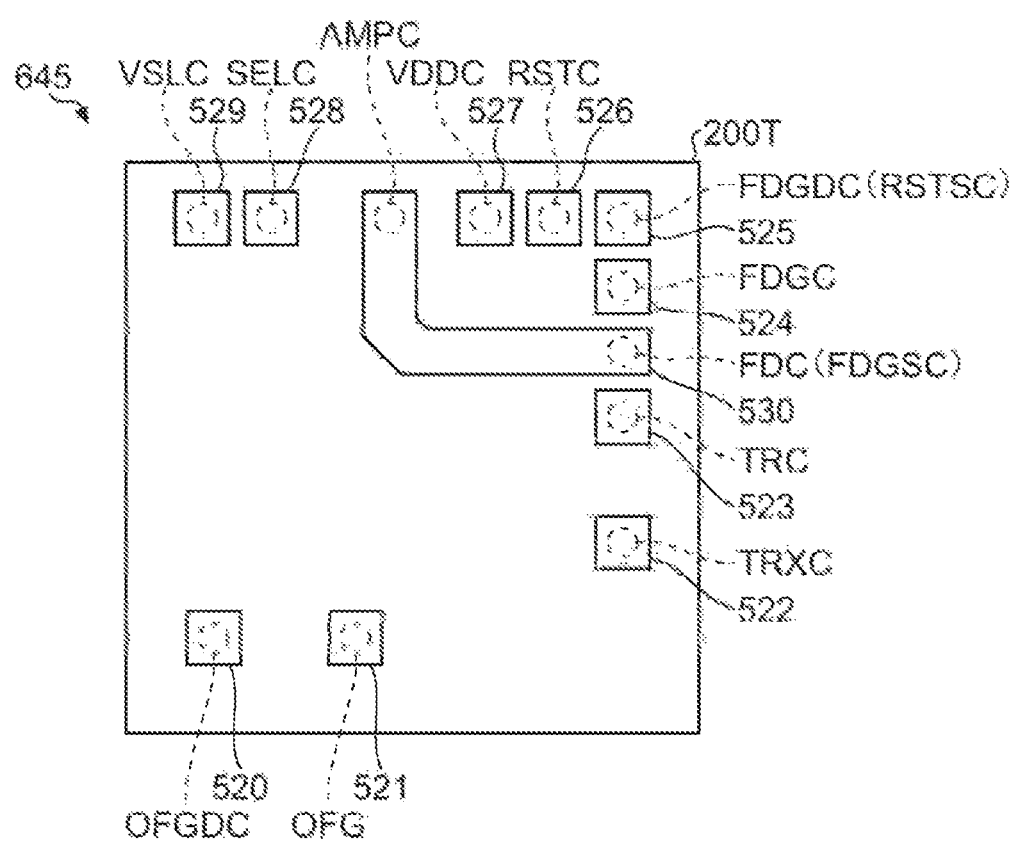
FIG. 70 is a schematic diagram illustrating a planar layout example of a wiring layer of the second substrate according to the ninth example of the second embodiment.
Figure 71:
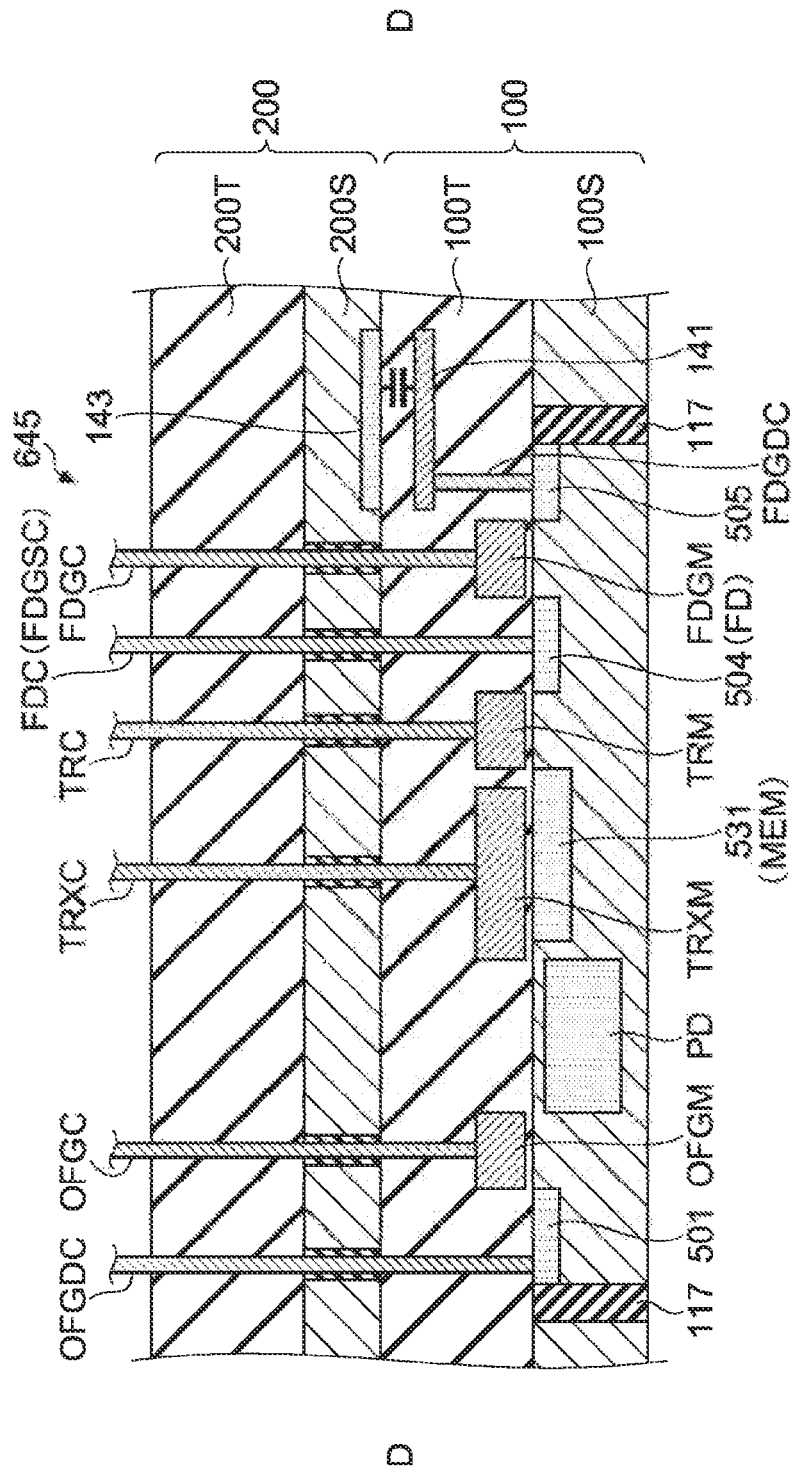
FIG. 71 is a cross-sectional view illustrating a structural example of a D-D plane in FIGS. 68 and 69.

FIG. 68 is a schematic diagram illustrating a planar layout example of the semiconductor layer of the first substrate according to the ninth example; FIG. 69 is a schematic diagram illustrating a planar layout example of the semiconductor layer of the second substrate according to the ninth example; and FIG. 70 is a schematic diagram illustrating a planar layout example of the wiring layer of the second substrate according to the ninth example. FIG. 71 is a cross-sectional view illustrating a structural example of a D-D plane in FIGS. 68 and 69.

As illustrated in FIG. 68, in the semiconductor layer 100S, the pixel region where each unit pixel 645 is provided is partitioned by the pixel isolation portion 117, similarly to the first example to the eighth example.

In each of pixel regions of the semiconductor layer 100S, the pixel 641 out of the unit pixel 645 is disposed. Furthermore, the FD conversion gain switching transistor FDG in the pixel circuit 210 is also disposed in the semiconductor layer 100S.

Specifically, at locations adjacent to the p well layer 115 in which the photodiode PD is formed, there are provided the gate electrode OFGM of the overflow gate transistor OFG, the gate electrode TRXM of the gate transistor TRX, the gate electrode TRM of the transfer transistor TR, and the gate electrode FDGM of the FD conversion gain switching transistor FDG.

Note that, in FIG. 68, diffusion regions 501 to 505 are regions that function as the source/drain of each of pixel transistors. Furthermore, in FIG. 68, the diffusion region 504 functioning as the drain of the transfer transistor TR and the source of the FD conversion gain switching transistor FDG also functions as the floating diffusion FD. Accordingly, in the configuration illustrated in FIG. 68, the FD contact FDC connected to the diffusion region 504 also functions as the FD transfer source contact FDGSC.

On the drain side of the gate electrode OFGM constituting the overflow gate OFG, there is provided a recess, and this recess constitutes the overflow diffusion OFD. In addition, an OFG contact OFGDC that penetrates the third substrate 300 so as to be connected to the row drive signal line 542 is connected to the diffusion region 501 functioning as the drain of the overflow gate OFG.

As illustrated in FIG. 69, in each of pixel regions of the semiconductor layer 200S, the reset transistor RST, the amplification transistor AMP, and the selection transistor SEL are arranged in a line. Note that, in FIG. 69, diffusion regions 611 to 614 are regions that function as the source/drain of each of pixel transistors. The diffusion region 612 also functions as a source of the reset transistor RST and a drain of the amplification transistor AMP.

As illustrated in FIG. 70, the wiring layer 200T is provided with pads 620 to 629 for connecting various contacts from the first substrate 100 to the third substrate 300.

In addition, the wiring layer 200T also includes wiring 630 for connecting the FD contact FDC also functioning as the subFD contact FDGDC to the amplification gate contact AMPC connected to the gate electrode AMPM of the amplification transistor AMP.

In such a configuration, the diffusion region 531 formed in the semiconductor layer 100S located below the gate electrode TRXM of the gate transistor TRX functions as the memory MEM. The charge generated in the photodiode PD is temporarily held in the diffusion region 531 and then transferred to the floating diffusion FD via the transfer transistor TR.

9.9.3 Effects

As described above, the structure of the subFD capacitance SFD illustrated in the first example to the eighth example can also be applied to a structure of the global shutter system.

With such a configuration, for example, it is possible to add the subFD capacitance SFD having a capacitance larger than the gate capacitance of the FD conversion gain switching transistor FDG while suppressing the influence on the area to be specifically used by the photodiode PD and the floating diffusion FD in the first substrate 100, the various transistors constituting the pixel circuit 210 in the second substrate 200 (hereinafter, referred to as a pixel transistor), and the like. This makes it possible to achieve a wide dynamic range and a high S/N ratio while suppressing the influence on the light receiving area of the photodiode PD, the characteristics of the pixel transistor, and the like. As a result, it is possible to generate image data with better image quality appropriate for the situation.

Although the ninth example is an exemplary case of having no pixel sharing structure as described above, the present disclosure is not limited thereto, and the above configuration can be applied to a case of including a pixel sharing structure.

Since other configurations, operations, and effects may be similar to those in the above-described embodiment, detailed description thereof will be omitted here.

10. Third Embodiment

Next, a third embodiment will be described in detail with reference to the drawings. Using some examples, the present embodiment will describe a case where the subFD capacitance SFD for switching the FD capacitance C is added in a configuration different from that of the above-described second embodiment.

Each of the following examples will describe a case where one pixel sharing unit 539 includes two pixel units of 2 rows×2 columns, that is, a case where each pixel sharing unit 539 includes a total of eight pixels 541.

Each of the following examples is based on the case where the pixel circuit 210 has the structure in which the FD conversion gain switching transistor FDG and the reset transistor RST are connected in parallel to the gate of the amplification transistor AMP, which has been described with reference to FIG. 59 in the seventh example of the second embodiment. However, the configuration is not limited thereto, and is also possible to similarly apply the present embodiment to the pixel circuit 210 having the structure in which the FD conversion gain switching transistor FDG and the reset transistor RST are connected in series to the gate of the amplification transistor AMP, which has been described in the first embodiment or other examples of the second embodiment.

Furthermore, the circuit configuration of the unit pixel according to each of the following examples is easily related from the configuration described with reference to FIGS. 59 and 4, for example, and thus a detailed description thereof will be omitted. Furthermore, in the following description, the configuration and operation similar to those of the first and second embodiments described above will be cited, thereby omitting redundant description.

10.1 First Example

Figure 72:
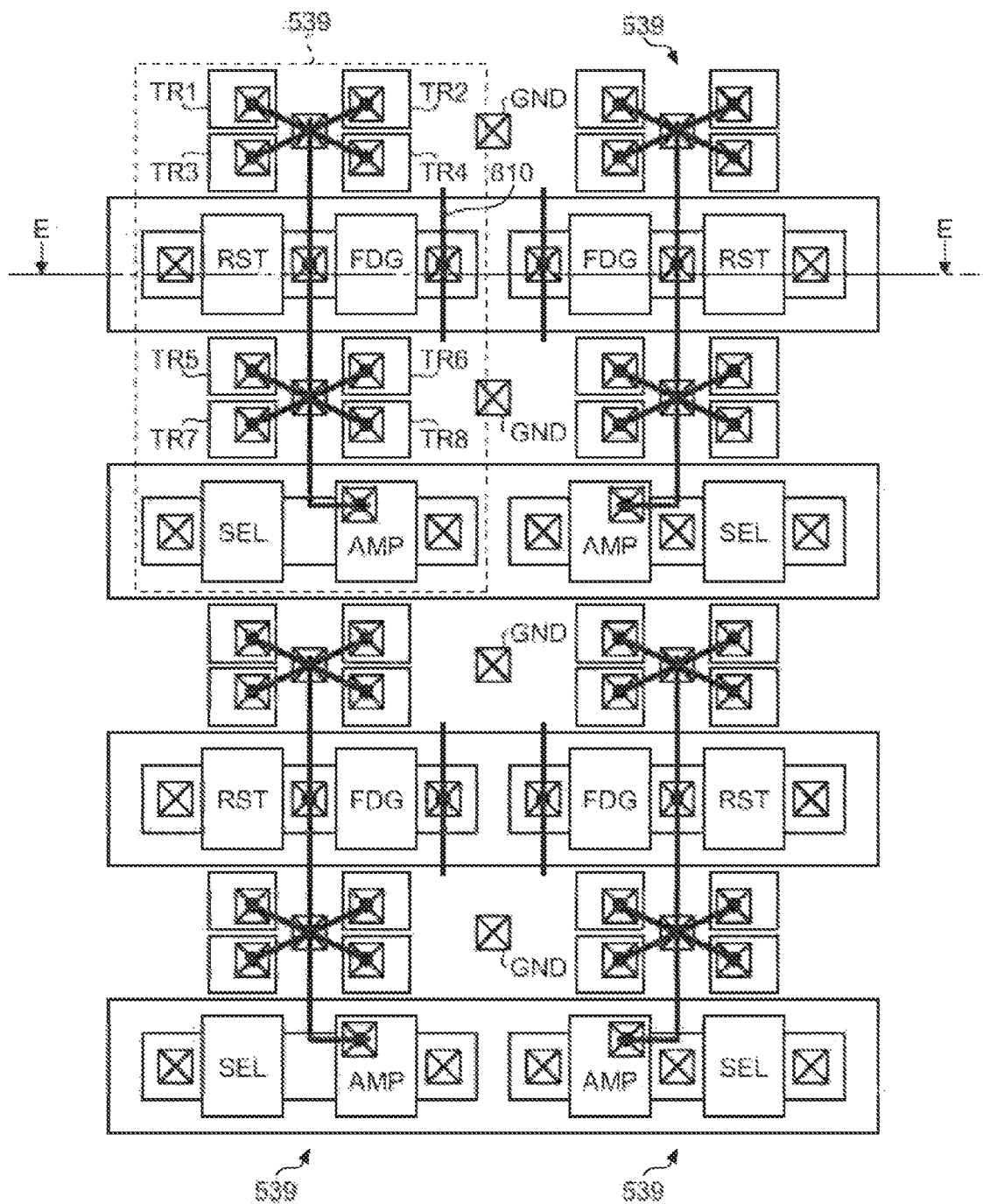
FIG. 72 is a schematic diagram illustrating a planar layout example of a main surface of a semiconductor layer in a second substrate according to a first example of a third embodiment.
Figure 73:
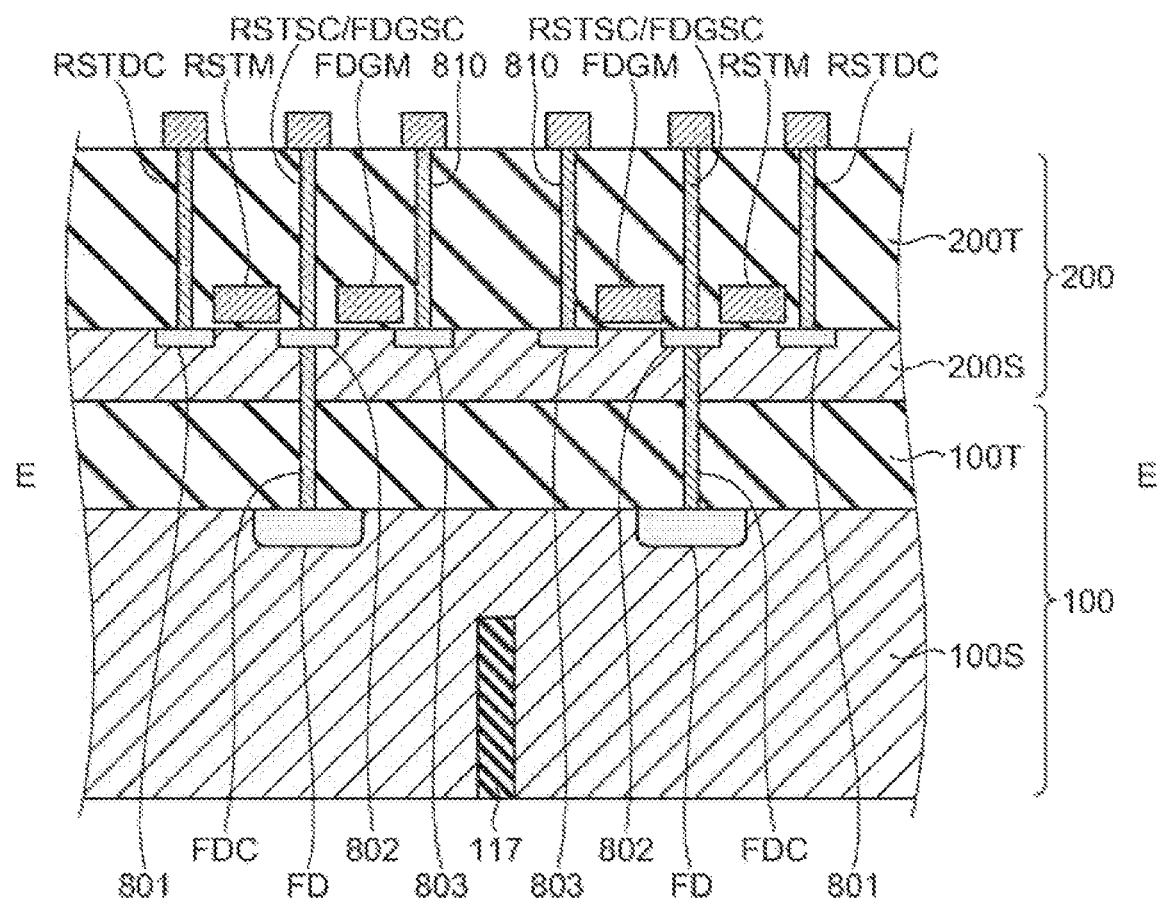
FIG. 73 is a cross-sectional view illustrating a structural example of an imaging device of an E-E plane in FIG. 72.

A first example is an exemplary case where wiring capacitance is used as a capacitive element forming the subFD capacitance SFD. FIG. 72 is a schematic diagram illustrating a planar layout example of the main surface of the semiconductor layer in the second substrate according to the first example. FIG. 73 is a cross-sectional view illustrating a structural example of the imaging device on an E-E plane in FIG. 72. In FIG. 73, a diffusion region 801 is the drain of the reset transistor RST, a diffusion region 802 is the source of the reset transistor RST and the FD conversion gain switching transistor FDG, and a diffusion region 803 is the drain of the FD conversion gain switching transistor FDG.

As illustrated in FIGS. 72 and 73, in the first example, subFD wiring 810 for forming the subFD capacitance SFD is provided in the wiring layer 200T of the second substrate 200. The subFD wiring 810 is connected to the diffusion region 803 being the drain of the FD conversion gain switching transistor FDG provided in the semiconductor layer 200S of the second substrate 200.

The subFD wiring 810 may be, for example, a flat plate-like member that spreads in the substrate thickness direction and the column direction of the second substrate 200. Furthermore, for example, the subFD wiring 810 can be formed of a metal material such as tungsten (W). However, the material is not limited thereto, and various conductive materials may be used.

With such a configuration, for example, it is possible to add the subFD capacitance SFD having a capacitance larger than the gate capacitance of the FD conversion gain switching transistor FDG while suppressing the influence on the area to be specifically used by the photodiode PD and the floating diffusion FD in the first substrate 100, the pixel transistors in the second substrate 200, and the like.

This makes it possible to achieve a wide dynamic range and a high S/N ratio while suppressing the influence on the light receiving area of the photodiode PD, the characteristics of the pixel transistor, and the like, enabling generation of image data with better image quality appropriate for the situation.

Since other configurations, operations, and effects may be similar to those in the above-described embodiment, detailed description thereof will be omitted here.

10.2 Second Example

Figure 74:
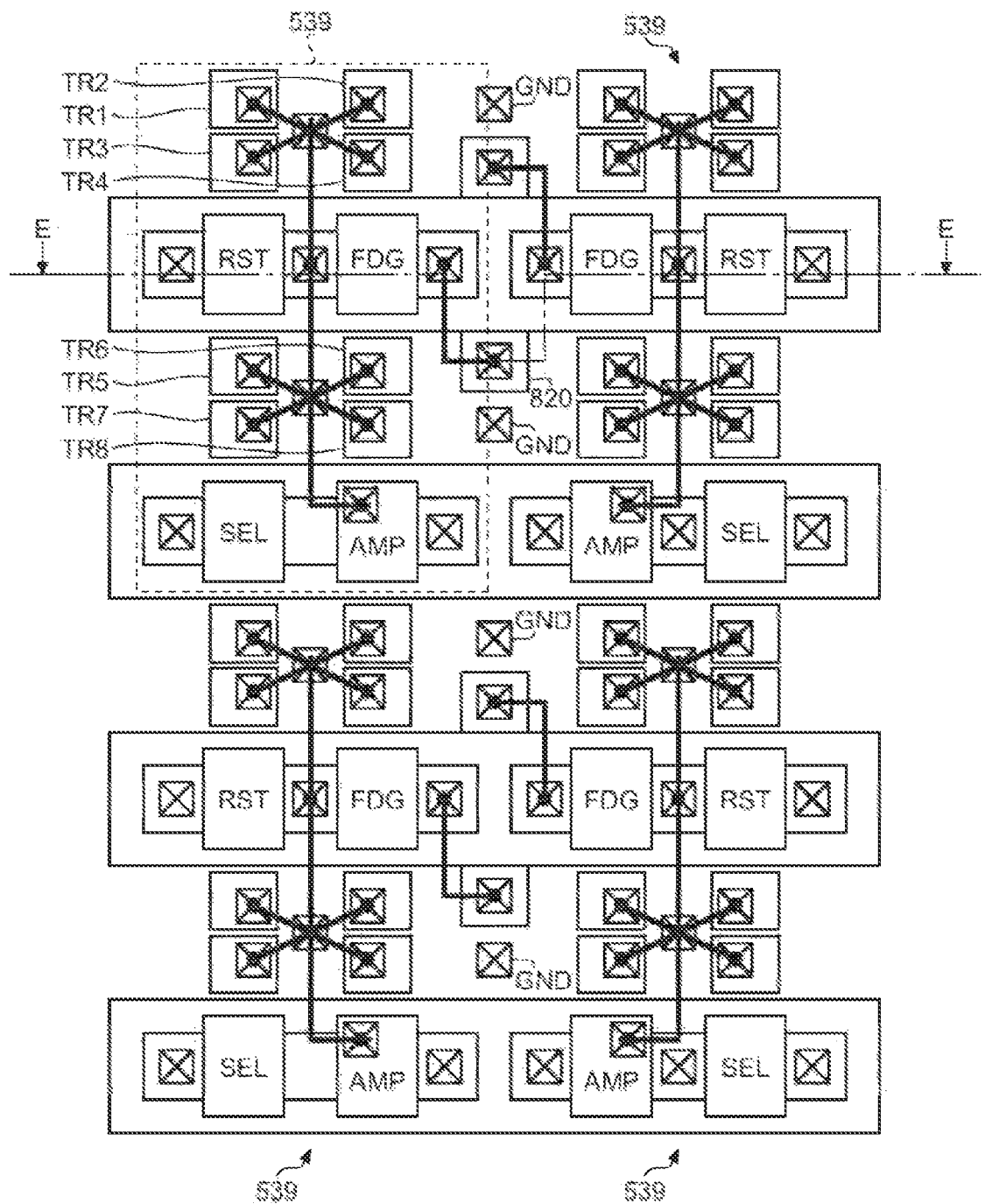
FIG. 74 is a schematic diagram illustrating a planar layout example of a main surface of a semiconductor layer in a second substrate according to a second example of the third embodiment.
Figure 75:
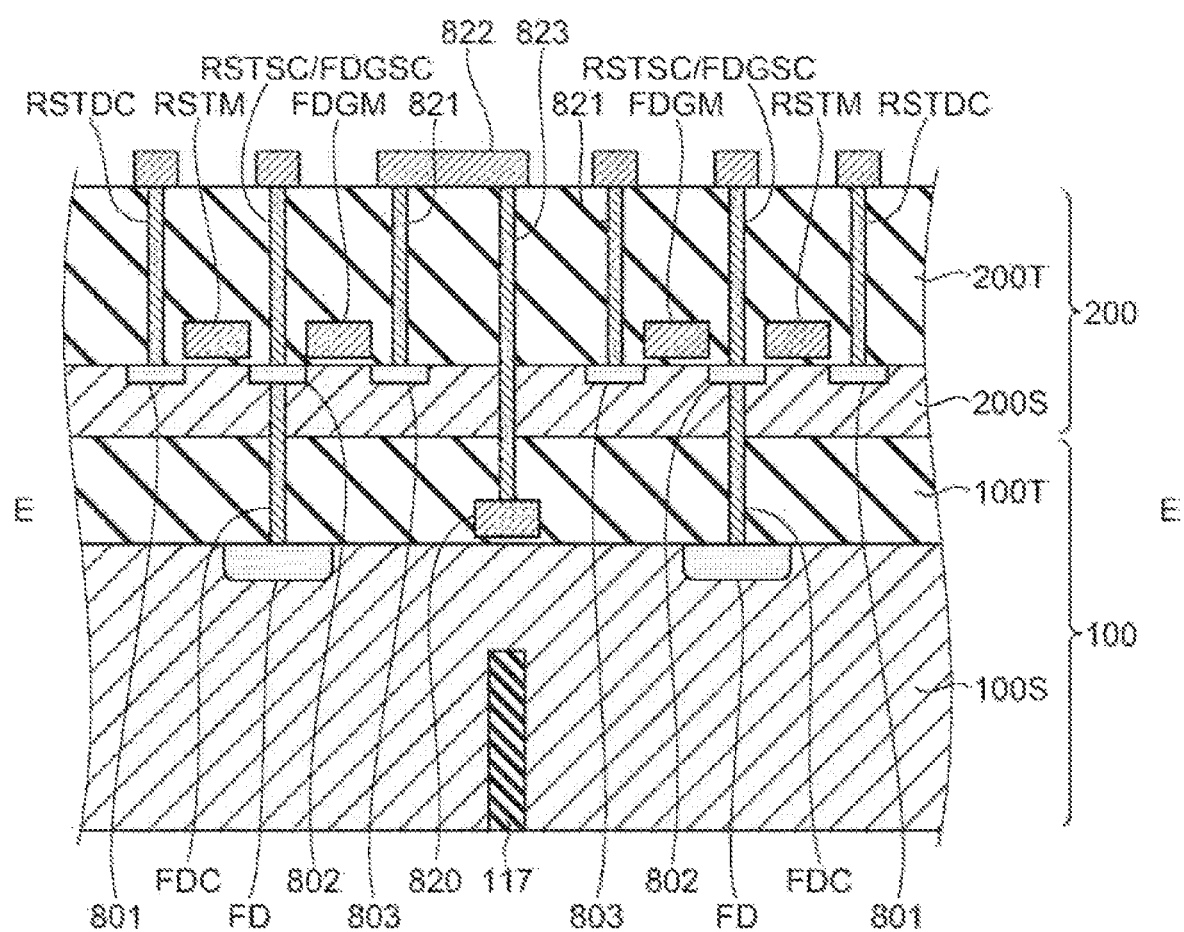
FIG. 75 is a cross-sectional view illustrating a structural example of an imaging device of an E-E plane in FIG. 74.

A second example is an exemplary case where gate capacitance is used as a capacitive element forming the subFD capacitance SFD. FIG. 74 is a schematic diagram illustrating a planar layout example of the main surface of the semiconductor layer in the second substrate according to the second example. FIG. 75 is a cross-sectional view illustrating a structural example of the imaging device on an E-E plane in FIG. 74.

As illustrated in FIGS. 74 and 75, in the second example, the diffusion region 803 being the drain of the FD conversion gain switching transistor FDG is connected to a gate electrode 820 disposed on the semiconductor layer 100S via a gate insulating film, through via-wiring 821 and wiring 822 formed in the wiring layer 200T and via-wiring 823 penetrating from the wiring layer 200T to the wiring layer 100T of the first substrate.

The gate electrode 820 functions as, for example, a capacitive element having the semiconductor layer 100S as the other electrode.

In this manner, with the configuration in which the drain of the FD conversion gain switching transistor FDG provided in the semiconductor layer 200S of the second substrate 200 is routed to the semiconductor layer 100S of the first substrate 100 and the gate capacitance is provided at the end of the routed drain, it is possible to add the subFD capacitance SFD having a capacitance larger than the gate capacitance of the FD conversion gain switching transistor FDG.

This makes it possible to achieve a wide dynamic range and a high S/N ratio while suppressing the influence on the light receiving area of the photodiode PD, the characteristics of the pixel transistor, and the like, enabling generation of image data with better image quality appropriate for the situation.

Incidentally, the gate electrode 820 is not an essential component, and may be omitted. Even in that case, the via-wiring 823 can function as a capacitive element using the semiconductor layer 100S as the other electrode. Since other configurations, operations, and effects may be similar to those in the above-described first example or the embodiments, detailed description thereof will be omitted here.

10.3 Third Example

Figure 76:
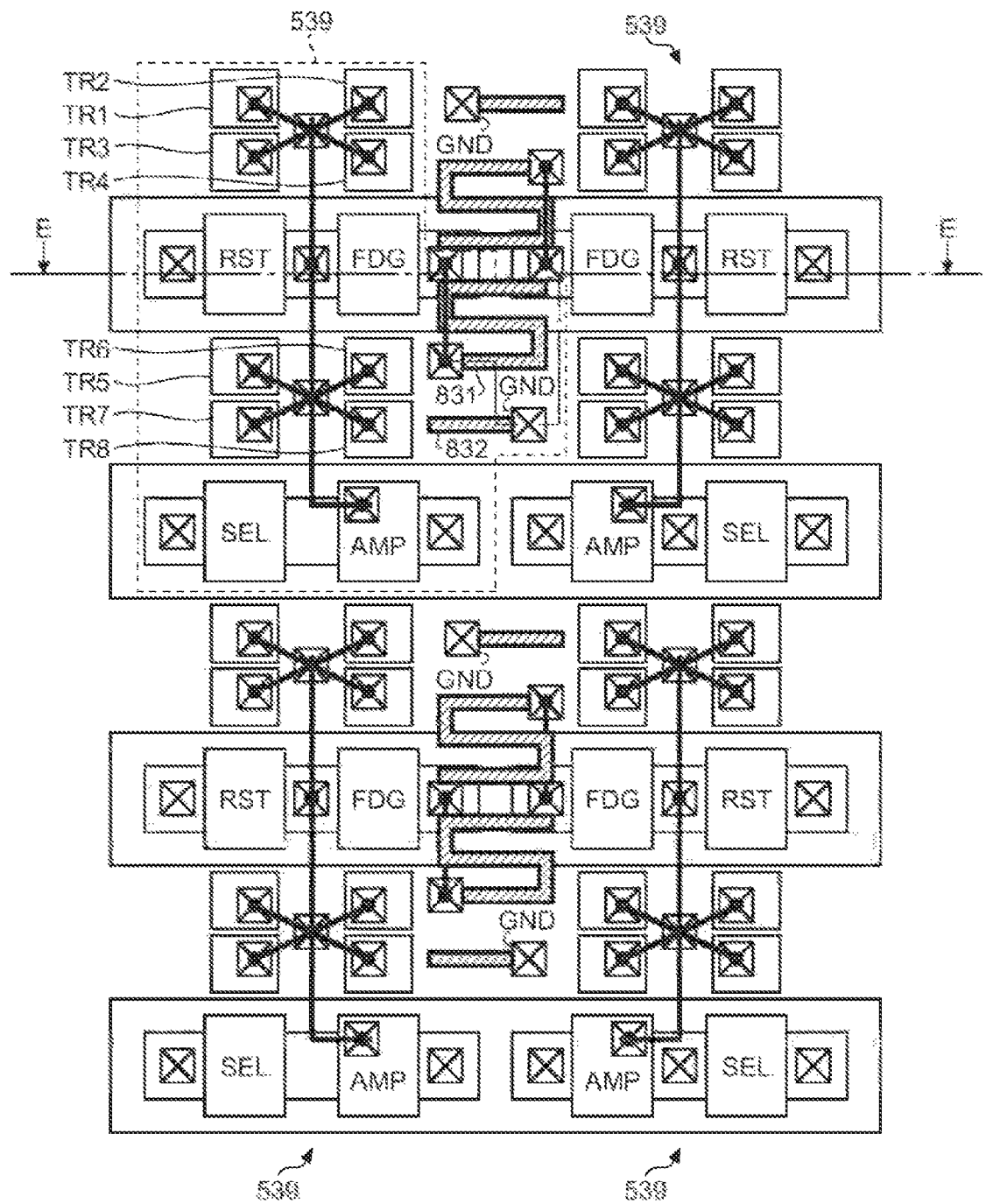
FIG. 76 is a schematic diagram illustrating a planar layout example of a main surface of a semiconductor layer in a second substrate according to a third example of the third embodiment.
Figure 77:
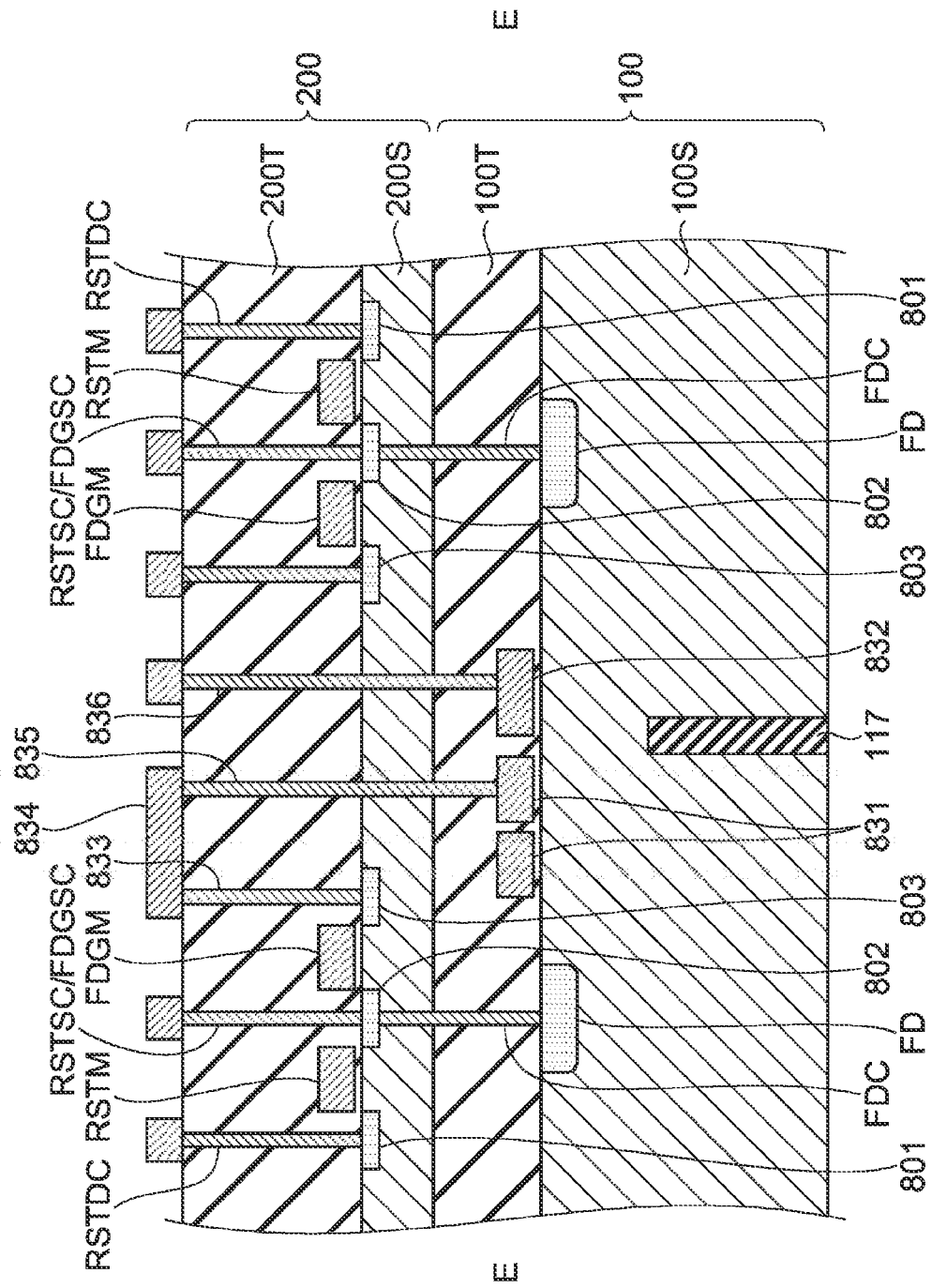
FIG. 77 is a cross-sectional view illustrating a structural example of an imaging device of an E-E plane in FIG. 76.

A third example is an exemplary case where wiring capacitance having configuration different from that of the first example is used as a capacitive element forming the subFD capacitance SFD. FIG. 76 is a schematic diagram illustrating a planar layout example of the main surface of the semiconductor layer in the second substrate according to the third example. FIG. 77 is a cross-sectional view illustrating a structural example of the imaging device on an E-E plane in FIG. 76.

Similarly to the second example, the third example uses a configuration, as illustrated in FIGS. 76 and 77, in which the diffusion region 803 being the drain of the FD conversion gain switching transistor FDG is connected to subFD wiring 831 disposed on the semiconductor layer 100S via an insulating film, through via-wiring 833 and wiring 834 formed in the wiring layer 200T and via-wiring 835 penetrating from the wiring layer 200T to the wiring layer 100T of the first substrate.

In this manner, it is possible to use, as the wiring capacitance, the capacitive element connected to the end of the drain of the FD conversion gain switching transistor FDG provided in the semiconductor layer 200S of the second substrate 200 having been routed to the semiconductor layer 100S of the first substrate 100. Similarly to the second example, this makes it possible to add the subFD capacitance SFD having a capacitance larger than the gate capacitance of the FD conversion gain switching transistor FDG, leading to achievement of a wide dynamic range and a high S/N ratio while suppressing the influence on the light receiving area of the photodiode PD, the characteristics of the pixel transistor, and the like As a result, it is possible to generate image data with better image quality appropriate for the situation.

In addition, in the third example, a ground line GND is connected to subFD wiring 832 arranged on the semiconductor layer 100S via an insulating film, through via-wiring 836 penetrating from the wiring layer 200T to the wiring layer 100T of the first substrate. In this manner, by bringing the grounded subFD wiring 832 close to the subFD wiring 831, the subFD capacitance SFD can be further increased.

Since other configurations, operations, and effects may be similar to those in the above-described first example, second example or the embodiments, detailed description thereof will be omitted here.

10.4 Fourth Example

Figure 78:
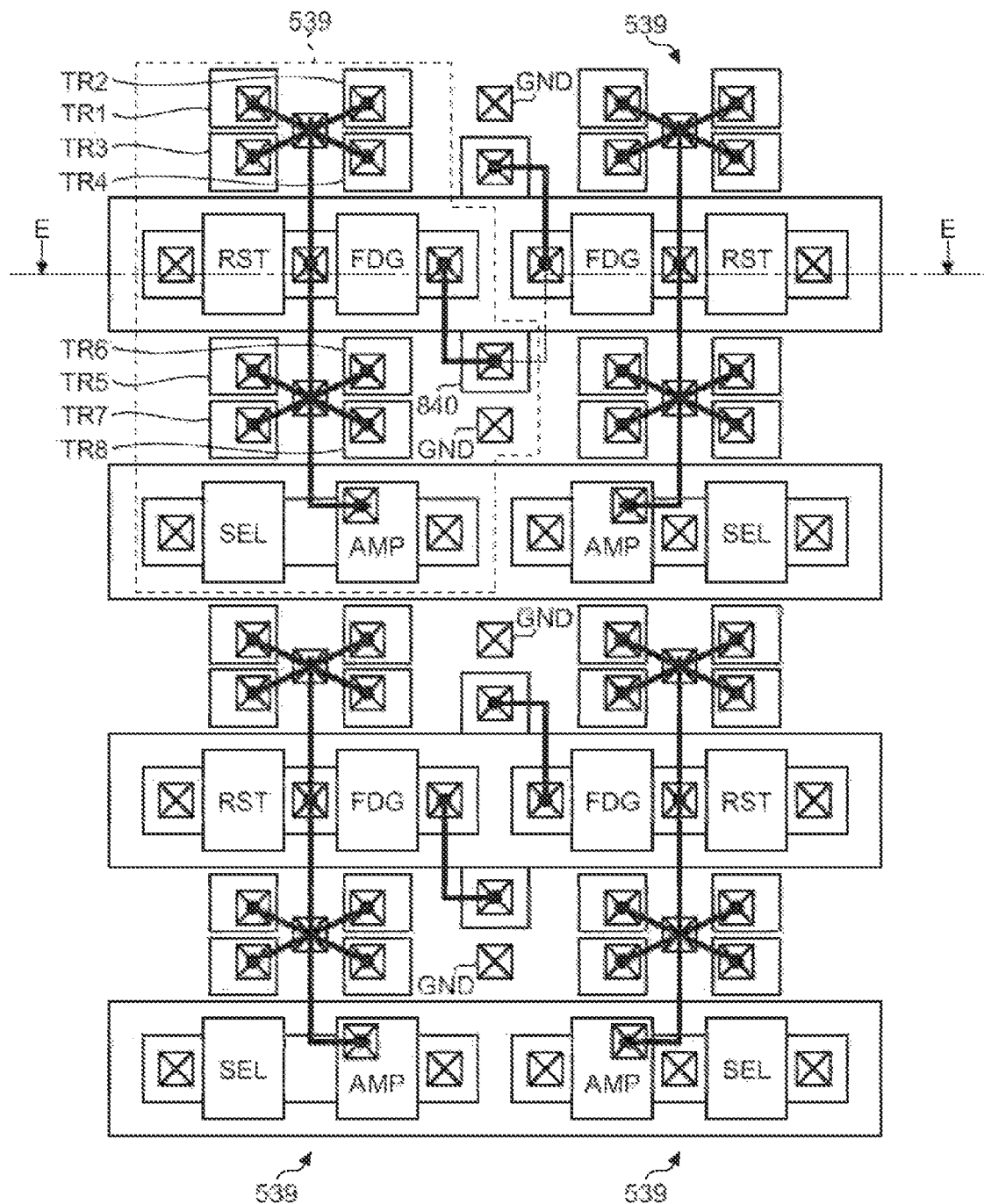
FIG. 78 is a schematic diagram illustrating a planar layout example of a main surface of a semiconductor layer in a second substrate according to a fourth example of the third embodiment.
Figure 79:
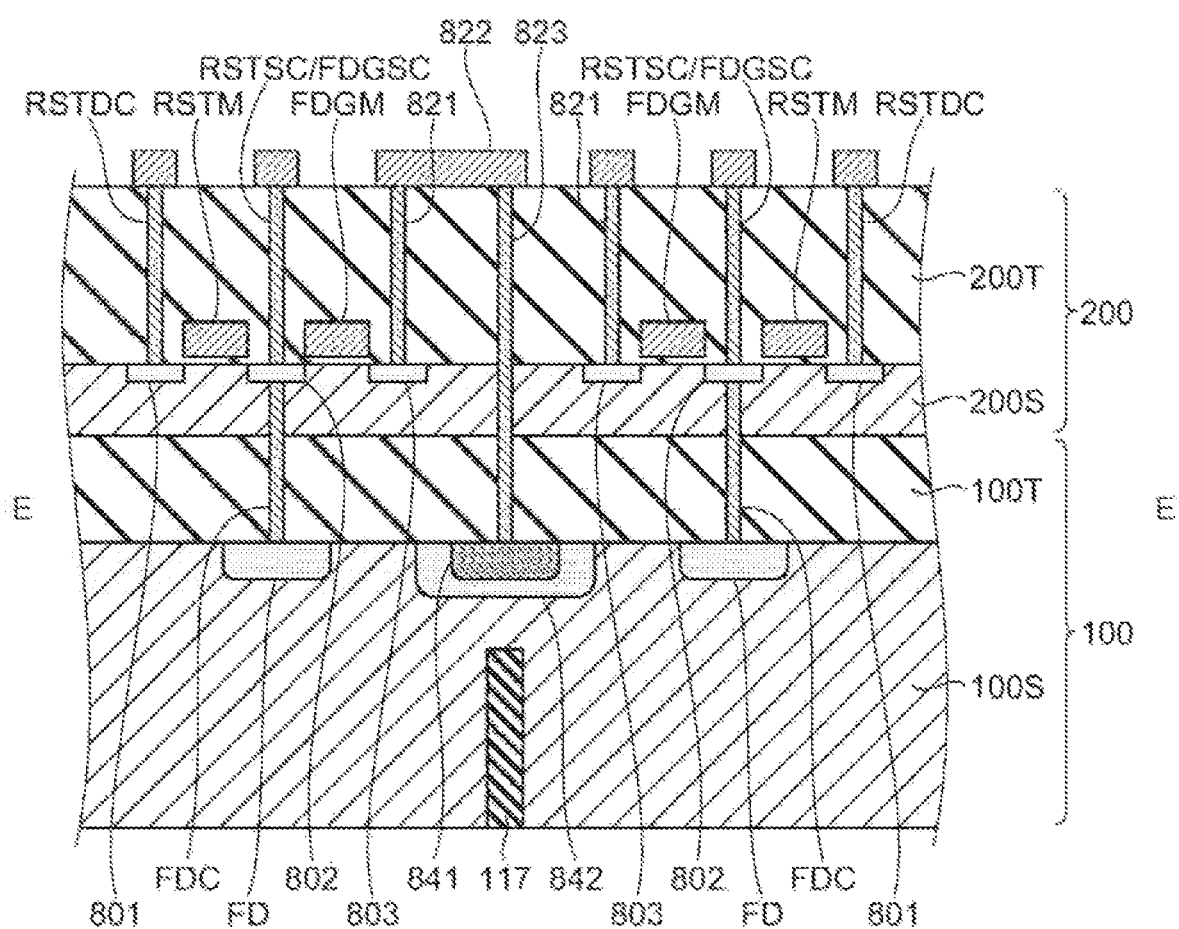
FIG. 79 is a cross-sectional view illustrating a structural example of an imaging device of an E-E plane in FIG. 78.

A fourth example is an exemplary case where diffusion capacitance is used as a capacitive element forming the subFD capacitance SFD. FIG. 78 is a schematic diagram illustrating a planar layout example of the main surface of the semiconductor layer in the second substrate according to the fourth example. FIG. 79 is a cross-sectional view illustrating a structural example of the imaging device on an E-E plane in FIG. 78.

As illustrated in FIGS. 78 and 79, the fourth example uses a configuration similar to the configuration described with reference to FIGS. 74 and 75 in the second example, in which the gate electrode 820 is replaced with an N+ type semiconductor region 841 and a P+ type semiconductor region 842, which form a diffusion capacitance That is, the fourth example uses, as the capacitive element used as the subFD capacitance SFD, the diffusion capacitance including: a first semiconductor region (for example, corresponding to the N+ type semiconductor region 841) having a first conductivity type; and a second semiconductor region (for example, corresponding to the P+ type semiconductor region 842) in contact with the first semiconductor region and having a second conductivity type opposite to the first conductivity type.

The N+ type semiconductor region 841 and the P+ type semiconductor region 842 may be diffusion regions formed in the semiconductor layer 100S, and are connected to the diffusion region 803 being the drain of the FD conversion gain switching transistor FDG, through the via-wiring 823, the wiring 822, and the via-wiring 821.

In this manner, it is possible to use, as the diffusion capacitance, the capacitive element connected to the end of the drain of the FD conversion gain switching transistor FDG provided in the semiconductor layer 200S of the second substrate 200 having been routed to the semiconductor layer 100S of the first substrate 100. Similarly to the second example and the third example, it is possible to add the subFD capacitance SFD having a capacitance larger than the gate capacitance of the FD conversion gain switching transistor FDG, leading to achievement of a wide dynamic range and a high S/N ratio while suppressing the influence on the light receiving area of the photodiode PD, the characteristics of the pixel transistor, and the like As a result, it is possible to generate image data with better image quality appropriate for the situation.

Since other configurations, operations, and effects may be similar to those in the above-described first example to the third example, or the embodiments, detailed description thereof will be omitted here.

10.5 Fifth Example

For example, in a case where there is a restriction on the readout operation that the pixels 541 adjacent in the row direction are not to be simultaneously read out, the configuration of the subFD capacitance SFD exemplified in the first example to the fourth example described above can be supplied between the pixel sharing units 539 adjacent in the row direction. Accordingly, a fifth example will describe a case where the subFD capacitance SFD is shared between the pixel sharing units 539 adjacent in the row direction based on the structure exemplified in the second example.

Figure 80:
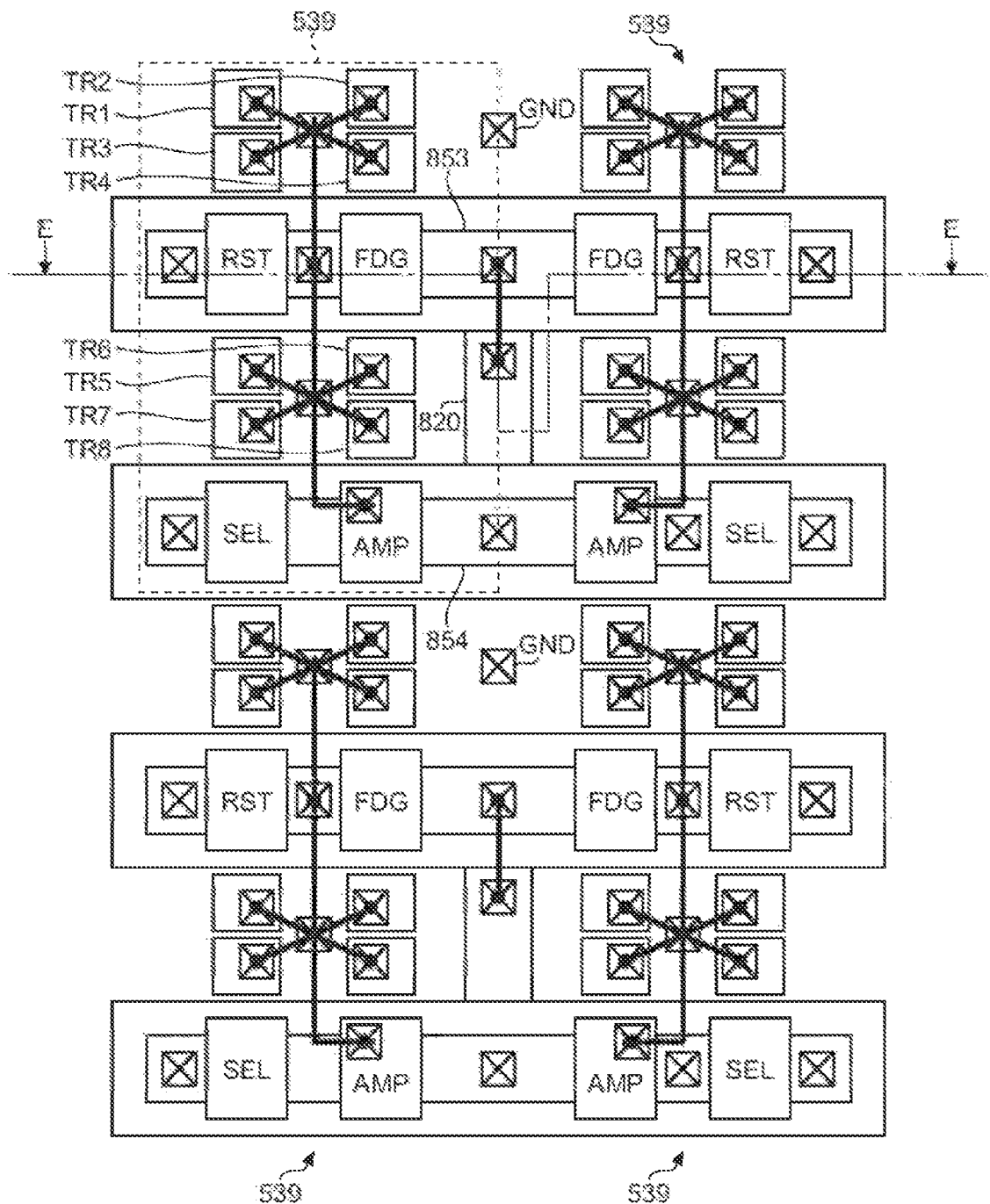
FIG. 80 is a schematic diagram illustrating a planar layout example of a main surface of a semiconductor layer in a second substrate according to a fifth example of the third embodiment.
Figure 81:
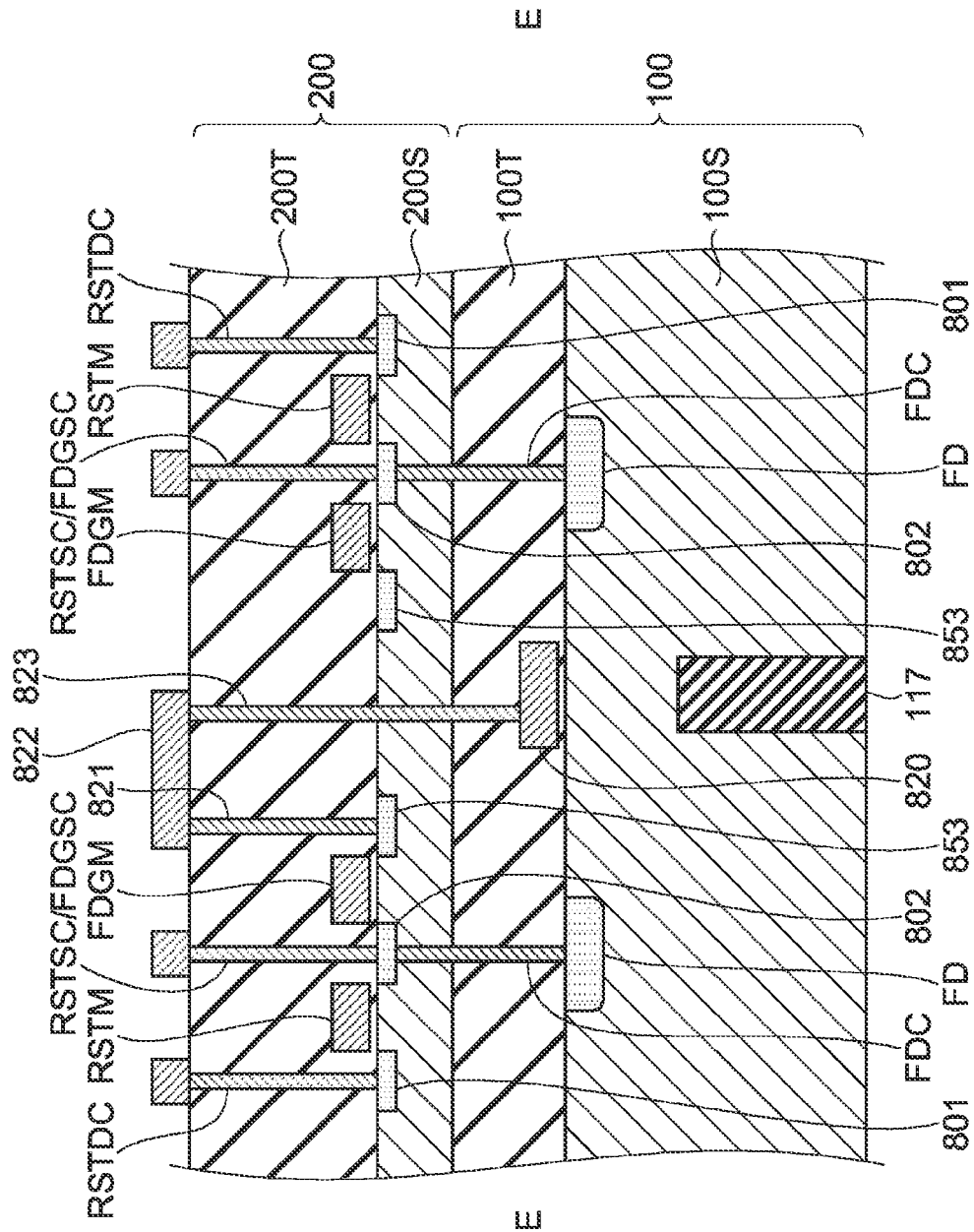
FIG. 81 is a cross-sectional view illustrating a structural example of an imaging device of an E-E plane in FIG. 80.

FIG. 80 is a schematic diagram illustrating a planar layout example of the main surface of the semiconductor layer in the second substrate according to the fifth example. FIG. 81 is a cross-sectional view illustrating a structural example of the imaging device on an E-E plane in FIG. 80.

As illustrated in FIGS. 80 and 81, the fifth example uses a configuration similar to the configuration described with reference to FIGS. 74 and 75 in the second example, in which one diffusion region 853 formed by continuously arranged drains of the FD conversion gain switching transistors FDG is provided between the adjacent pixel sharing units 539. In addition, the diffusion region 853 is connected to the gate electrode 820 (gate capacitance) on the semiconductor layer 100S through the via-wiring 821, the wiring 822, and the via-wiring 823.

In this manner, with a configuration in which the subFD capacitance SFD is shared between the adjacent pixel sharing units 539, it is possible to increase the area specifically used by one subFD capacitance SFD. This makes it possible to add a subFD capacitance SFD having a larger capacitance, leading to achievement of a wider dynamic range and a higher S/N ratio while suppressing the influence on the light receiving area of the photodiode PD, the characteristics of the pixel transistor, and the like. As a result, it is possible to generate image data with better image quality appropriate for the situation.

Note that, as illustrated in FIG. 80, in addition to the diffusion region 853 constituting the drain of the FD conversion gain switching transistor FDG, a diffusion region 854 constituting the drain of the amplification transistor AMP may be continuously formed between the adjacent pixel sharing units 539.

Since other configurations, operations, and effects may be similar to those in the above-described first example to the fourth example, or the embodiments, detailed description thereof will be omitted here.

10.6 Sixth Example

A fifth example will describe another structure for sharing the subFD capacitance SFD between the adjacent pixel sharing units 539 by using examples. Similarly to the fifth example, the sixth example will describe a case where the subFD capacitance SFD is shared between the pixel sharing units 539 adjacent in the row direction based on the structure exemplified in the second example.

Figure 82:
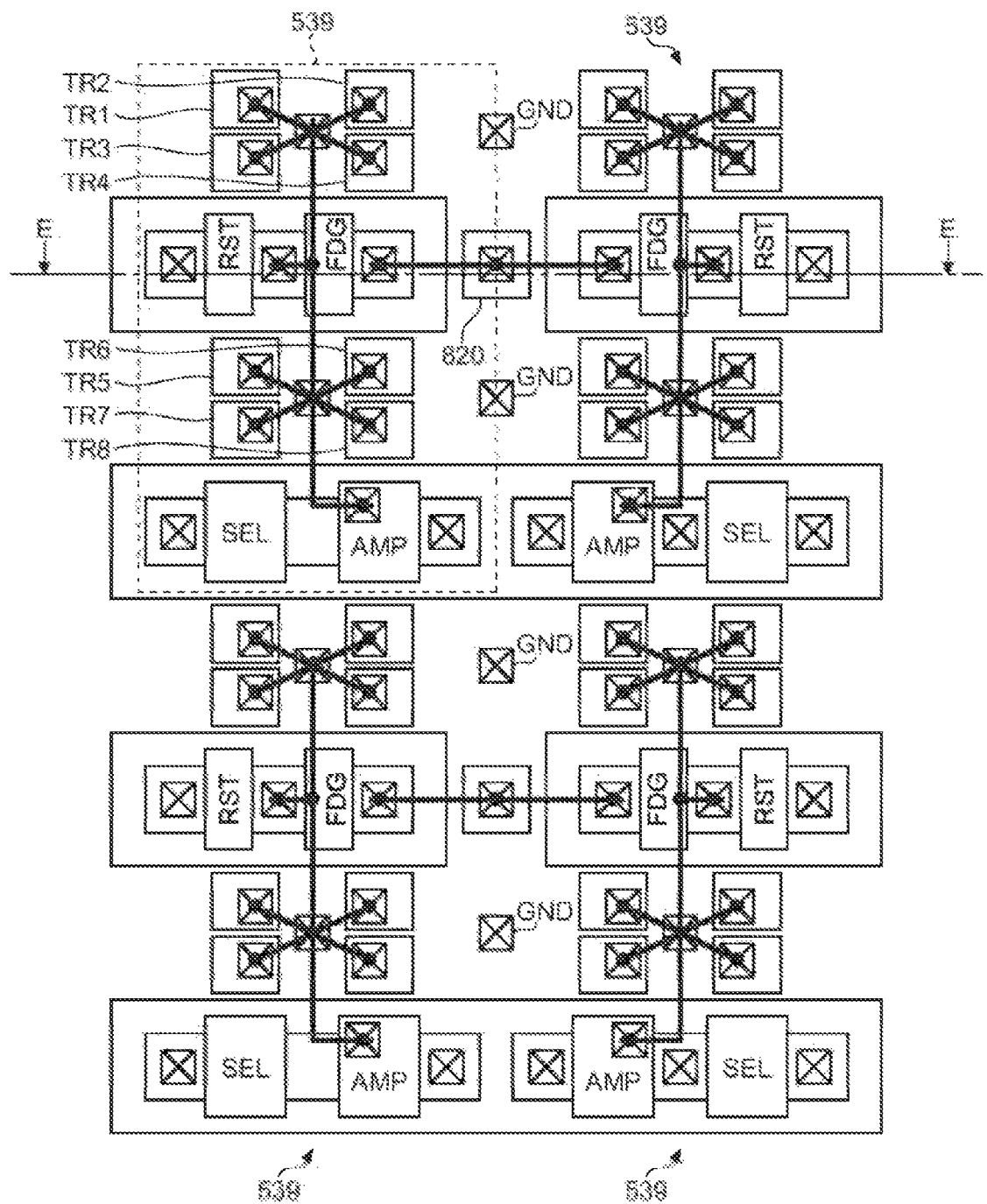
FIG. 82 is a schematic diagram illustrating a planar layout example of a main surface of a semiconductor layer in a second substrate according to a sixth example of the third embodiment.
Figure 83:
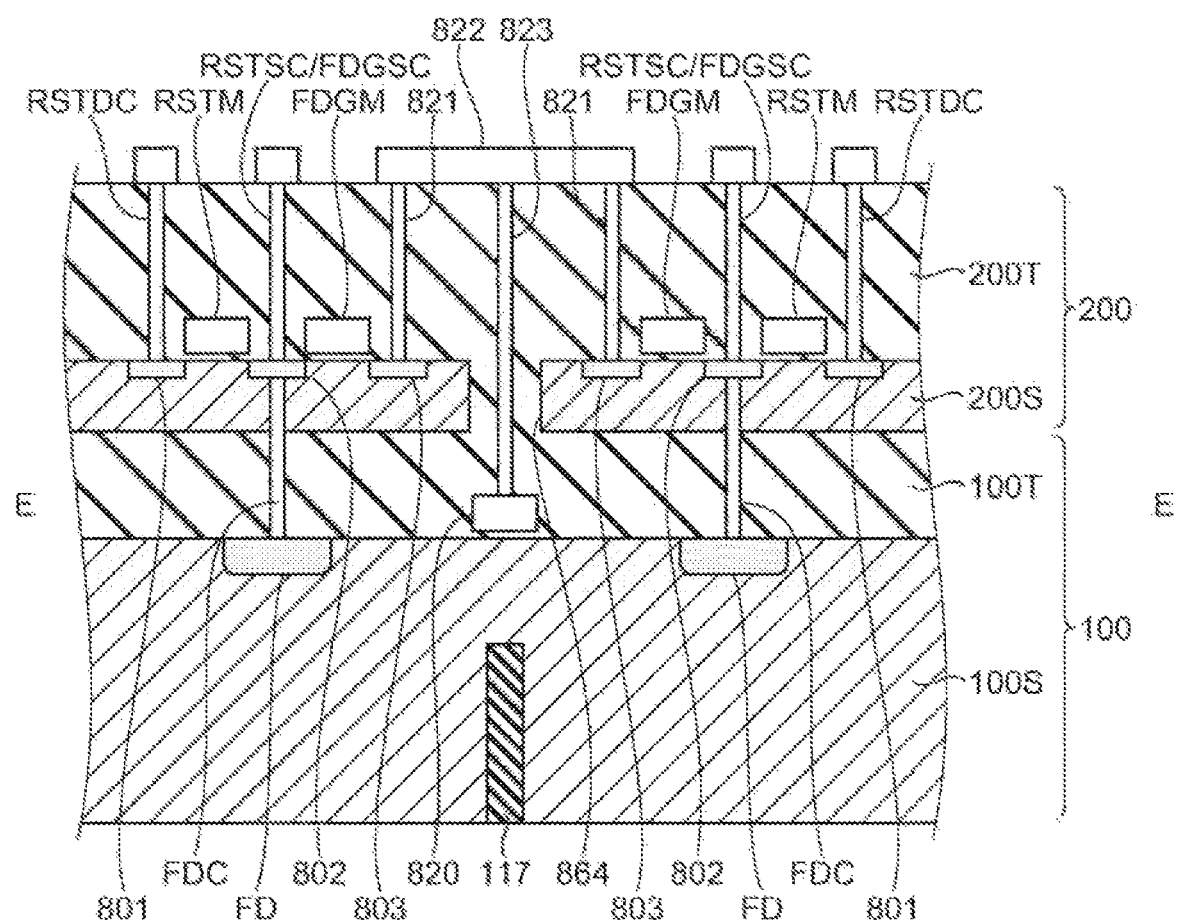
FIG. 83 is a cross-sectional view illustrating a structural example of an imaging device of an E-E plane in FIG. 82.

FIG. 82 is a schematic diagram illustrating a planar layout example of the main surface of the semiconductor layer in the second substrate according to the sixth example. FIG. 83 is a cross-sectional view illustrating a structural example of the imaging device on an E-E plane in FIG. 82.

As illustrated in FIGS. 82 and 83, the sixth example has a configuration in which a through hole 864 penetrating the semiconductor layer 200S is provided in a part between the adjacent pixel sharing units 539 sharing the subFD capacitance SFD. For example, the through hole 864 may be arranged between the drains of the FD conversion gain switching transistors FDG adjacent in the row direction. That is, in the sixth example, in the pixel sharing units 539 that share the subFD capacitance SFD, the sources of the switching transistors FDG adjacent to each other are divided by the through hole 864.

The drain of the FD conversion gain switching transistor FDG in each pixel sharing unit 539 is routed onto the semiconductor layer 100S of the first substrate 100 via the via-wiring 821, the wiring 822, and the via-wiring 823 passing through the through hole 864.

In this manner, with a configuration in which the through hole 864 is provided in the semiconductor layer 200S and the via-wiring 823 passes through the through hole 864, it is possible to shorten the length of the wiring through which the drain of the FD conversion gain switching transistor FDG is routed onto the semiconductor layer 100S.

Since other configurations, operations, and effects may be similar to those in the above-described first example to the fifth example, or the embodiments, detailed description thereof will be omitted here.

11. Modifications

Although some of the embodiments described above include an exemplary case, regarding the second substrate 200, in which the amplification transistor AMP, the reset transistor RST, and the selection transistor SEL capable of constituting the pixel circuit 210 are formed in the same semiconductor layer 200S, the configuration is not limited to this example. For example, it is allowable to form at least one transistor among the above transistors in the semiconductor layer 200S of the second substrate 200, and allowable to form the remaining transistors in a semiconductor layer of a new substrate (hereinafter, referred to as a fourth substrate) different from the semiconductor layer 100S of the first substrate 100 or the semiconductor layer 200S of the second substrate 200. Hereinafter, for clarity of description, the fourth substrate will be described as a fourth substrate 400, and the semiconductor layer thereof will be described as a semiconductor layer 400S.

The fourth substrate 400 may have a layer structure similar to that of the second substrate 200, for example. That is, the fourth substrate 400 may have a structure in which a wiring layer (hereinafter, the wiring layer will be described as a wiring layer 400T) is stacked on the semiconductor layer 400S.

The fourth substrate 400 is bonded to a surface of the second substrate 200 opposite to the first substrate 100, for example. When the second substrate 200 is bonded to the first substrate 100 in a face-down state (state where the element formation surface of the semiconductor layer 200S faces the first substrate 100), it is allowable to make electrical connection between various circuits included in the second substrate 200 and various circuits included in the fourth substrate 400 by using through-substrate wiring penetrating the semiconductor layer 200S of the second substrate 200. On the other hand, when the second substrate 200 is bonded to the first substrate 100 in a face-up state (state where the surface of the semiconductor layer 200S opposite to the element formation surface faces the first substrate 100), it is allowable to use a bonding method referred to as Cu—Cu bonding in which a copper pad formed on the upper surface of the wiring layer 200T of the second substrate 200 is bonded with a copper pad formed on the upper surface of the wiring layer 400T of the fourth substrate 400 for electrical connection between various circuits included in the second substrate 200 and various circuits included in the fourth substrate 400. Note that the electrical connection between the two is not limited to the above configuration, and may be implemented by various other configurations.

In the stacked structure in which the first substrate 100, the second substrate 200, and the fourth substrate 400 (in some cases, the third substrate 300 may be added to the top layer) are bonded to each other in this manner, it is also possible, as an example, to have a configuration in which the amplification transistor AMP is formed in the semiconductor layer 200S of the second substrate 200, and the reset transistor RST and/or the selection transistor SEL are formed in the semiconductor layer 400S of the fourth substrate 400.

Note that the number of the substrate (the fourth substrate 400 in the above example) added for the purpose of arranging the transistors capable of constituting the pixel circuit 210 is not limited to one. For example, another substrate may be further added, and at least one of the transistors capable of constituting the pixel circuit 210 may be arranged on the new substrate. Alternatively, the same number of substrates as the number of types of transistors capable of constituting the pixel circuit 210 may be provided instead of the second substrate 200, and the same type of transistors may be arranged on each substrate.

In this manner, by using a plurality of substrates on which the transistors capable of constituting the pixel circuit 210 are disposed, it is possible to reduce the area occupied by one pixel circuit 210 or to increase the size of the transistors or photodiode PD capable of constituting the pixel circuit 210 when viewed from the stacking direction of the substrates. This makes it possible to obtain effects such as a reduction in chip size and an increase in resolution. Furthermore, by increasing the occupied area of the amplification transistor AMP, for example, the noise reduction effect can be expected.

12. Application Examples

Figure 84:
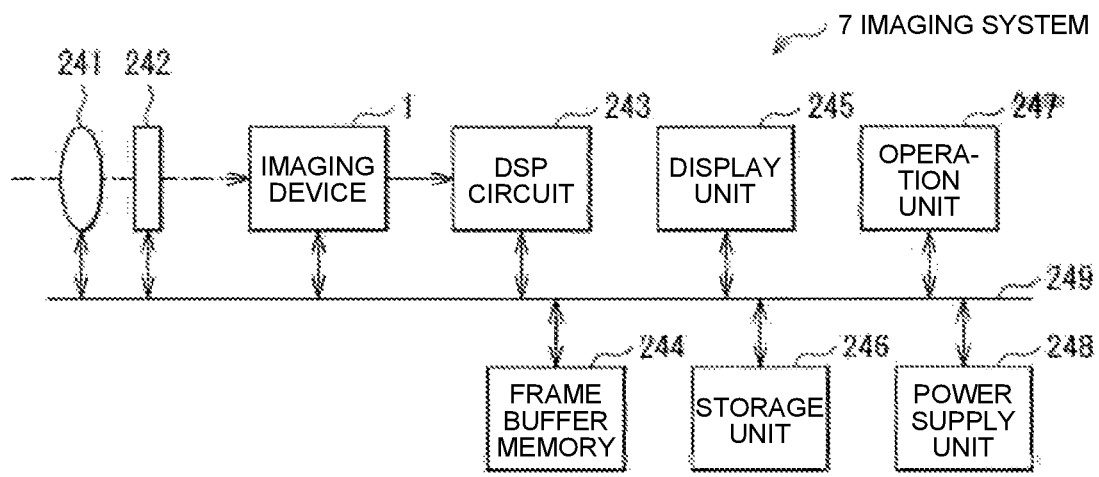
FIG. 84 is a diagram illustrating an example of a schematic configuration of an imaging system including the imaging device according to the embodiments and their modifications.

FIG. 84 is a diagram illustrating an example of a schematic configuration of an imaging system 7 including the imaging device 1 according to the embodiments and their modifications.

The imaging system 7 is, for example, an electronic device exemplified by an imaging device such as a digital still camera or a video camera, or a portable terminal device such as a smartphone or a tablet terminal. The imaging system 7 includes, for example, the imaging device 1 according to the above-described embodiments and their modifications, a DSP circuit 243, frame buffer memory 244, a display unit 245, a storage unit 246, an operation unit 247, and a power supply unit 248. In the imaging system 7, the imaging device 1 according to the above-described embodiments and their modifications, the DSP circuit 243, the frame buffer memory 244, the display unit 245, the storage unit 246, the operation unit 247, and the power supply unit 248 are connected to each other via a bus line 249.

The imaging device 1 according to the above-described embodiments and their modifications outputs image data according to incident light. The DSP circuit 243 is a signal processing circuit that processes a signal (image data) output from the imaging device 1 according to the above-described embodiments and their modifications. The frame buffer memory 244 temporarily holds the image data processed by the DSP circuit 243 in units of frames. The display unit 245 includes, for example, a panel-type display device such as a liquid crystal panel or an organic electro luminescence (EL) panel, and displays a moving image or a still image captured by the imaging device 1 according to the above-described embodiments and their modifications. The storage unit 246 records image data of a moving image or a still image captured by the imaging device 1 according to the above-described embodiments and their modifications in a recording medium such as semiconductor memory or a hard disk. The operation unit 247 issues operation commands for various functions of the imaging system 7 in accordance with an operation by the user. The power supply unit 248 appropriately supplies various types of power as operation power of the imaging device 1 according to the above-described embodiments and their modifications, the DSP circuit 243, the frame buffer memory 244, the display unit 245, the storage unit 246, and the operation unit 247 to these supply targets.

Next, an imaging procedure in the imaging system 7 will be described.

Figure 85:
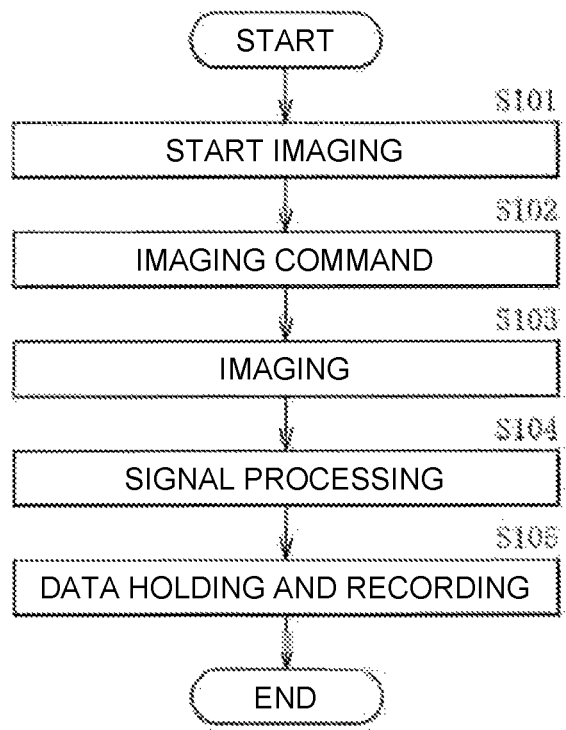
FIG. 85 is a diagram illustrating an example of an imaging procedure of the imaging system illustrated in FIG. 84.

FIG. 85 illustrates an example of a flowchart of an imaging operation in the imaging system 7. A user instructs start of imaging by operating the operation unit 247 (step S101). Subsequently, the operation unit 247 transmits an imaging command to the imaging device 1 (step S102). Having received the imaging command, the imaging device 1 (specifically, the control unit thereof) executes imaging by a predetermined imaging method (step S103).

The imaging device 1 outputs image data obtained by imaging to the DSP circuit 243. Here, the image data represents data for all the pixels of the pixel signal generated based on the charge temporarily held in the floating diffusion FD. The DSP circuit 243 performs predetermined signal processing (for example, noise reduction processing) based on the image data input from the imaging device 1 (step S104). The DSP circuit 243 causes the frame buffer memory 244 to hold the image data subjected to predetermined signal processing, and then, the frame buffer memory 244 causes the storage unit 246 to store the image data (step S105). In this manner, imaging in the imaging system 7 is performed.

In the present application example, the imaging device 1 according to the above-described embodiments and their modifications is applied to the imaging system 7. With this application, the imaging device 1 can be downsized or have high definition, making it possible to provide the small or high definition imaging system 7.

13. Examples of Application to Products

[First Example of Application to Products]

The technology according to the present disclosure (the present technology) is applicable to various products. The technology according to the present disclosure may be applied to devices mounted on any of moving objects such as automobiles, electric vehicles, hybrid electric vehicles, motorcycles, bicycles, personal mobility, airplanes, drones, ships, and robots.

Figure 86:
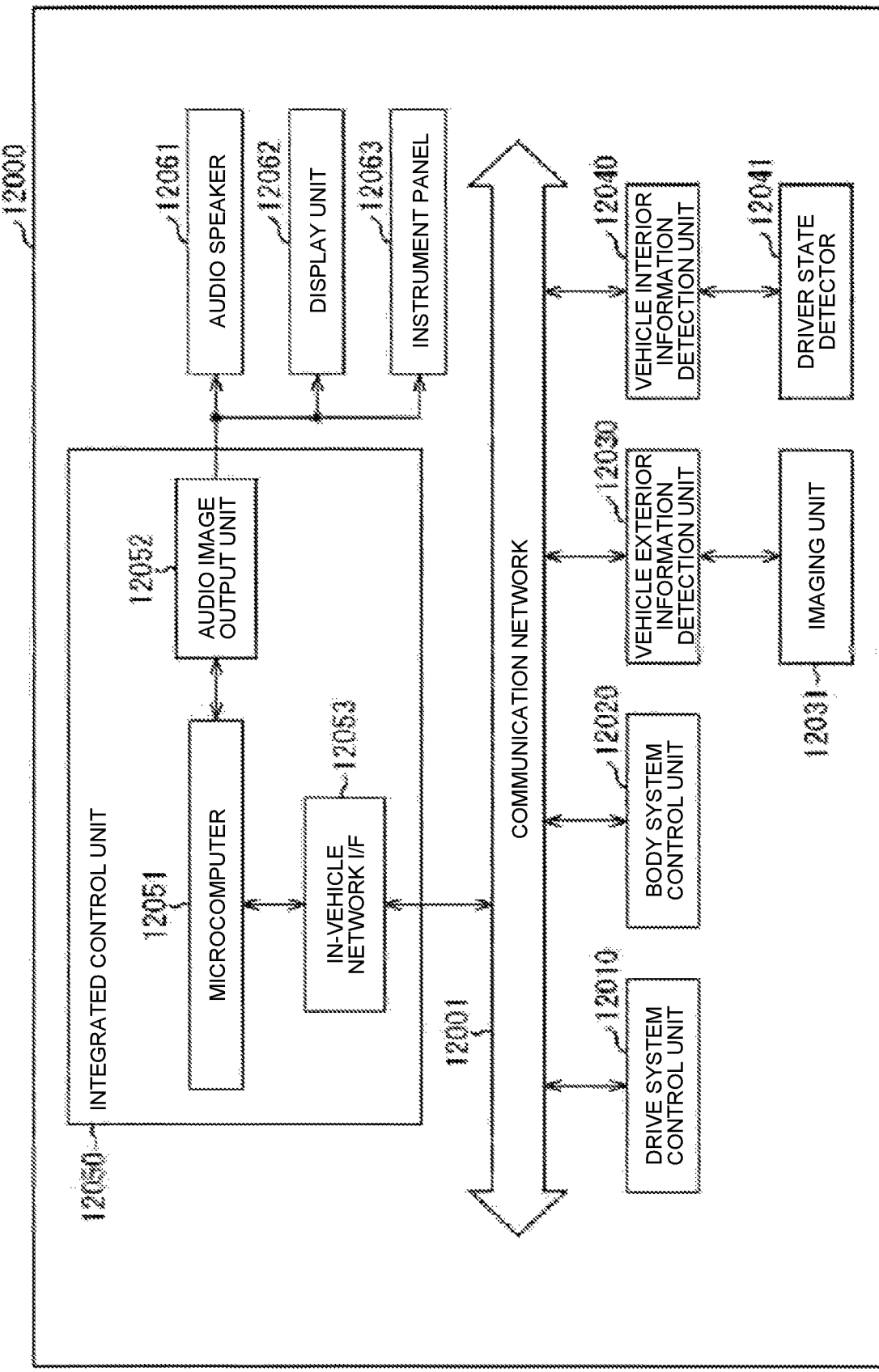
FIG. 86 is a block diagram illustrating an example of a schematic configuration of a vehicle control system.

FIG. 86 is a block diagram illustrating a schematic configuration example of a vehicle control system, which is an example of a moving body control system to which the technology according to the present disclosure is applicable.

A vehicle control system 12000 includes a plurality of electronic control units connected via a communication network 12001. In the example illustrated in FIG. 86, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of the device related to the drive system of the vehicle in accordance with various programs. For example, the drive system control unit 12010 functions as a control device of a driving force generation device that generates a driving force of a vehicle such as an internal combustion engine or a driving motor, a driving force transmission mechanism that transmits a driving force to the wheels, a steering mechanism that adjusts steering angle of the vehicle, a braking device that generates a braking force of the vehicle, or the like.

The body system control unit 12020 controls the operation of various devices mounted on the vehicle body in accordance with various programs. For example, the body system control unit 12020 functions as a control device for a keyless entry system, a smart key system, a power window device, or various lamps such as a head lamp, a back lamp, a brake lamp, a turn signal lamp, or a fog lamp. In this case, the body system control unit 12020 can receive input of radio waves transmitted from a portable device that substitutes for the key or signals from various switches. The body system control unit 12020 receives the input of these radio waves or signals and controls the door lock device, the power window device, the lamp, or the like, of the vehicle.

The vehicle exterior information detection unit 12030 detects information outside the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform an object detection process or a distance detection process of people, vehicles, obstacles, signs, or characters on the road surface based on the received image.

The imaging unit 12031 is an optical sensor that receives light and outputs an electric signal corresponding to the amount of received light. The imaging unit 12031 can output the electric signal as an image and also as distance measurement information. Furthermore, the light received by the imaging unit 12031 may be visible light or invisible light such as infrared rays.

The vehicle interior information detection unit 12040 detects vehicle interior information. The vehicle interior information detection unit 12040 is connected to a driver state detector 12041 that detects the state of the driver, for example. The driver state detector 12041 may include a camera that images the driver, for example. The vehicle interior information detection unit 12040 may calculate the degree of fatigue or degree of concentration of the driver or may determine whether the driver is dozing off based on the detection information input from the driver state detector 12041.

The microcomputer 12051 can calculate a control target value of the driving force generation device, the steering mechanism, or the braking device based on vehicle external/internal information obtained by the vehicle exterior information detection unit 12030 or the vehicle interior information detection unit 12040, and can output a control command to the drive system control unit 12010. For example, the microcomputer 12051 can perform cooperative control for the purpose of achieving a function of an advanced driver assistance system (ADAS) including collision avoidance or impact mitigation of vehicles, follow-up running based on an inter-vehicle distance, cruise control, vehicle collision warning, vehicle lane departure warning, or the like.

Furthermore, it is allowable such that the microcomputer 12051 controls the driving force generation device, the steering mechanism, the braking device, or the like, based on the information regarding the surroundings of the vehicle obtained by the vehicle exterior information detection unit 12030 or the vehicle interior information detection unit 12040, thereby performing cooperative control for the purpose of autonomous driving or the like, in which the vehicle performs autonomous traveling without depending on the operation of the driver.

Furthermore, the microcomputer 12051 can output a control command to the body system control unit 12020 based on the vehicle exterior information acquired by the vehicle exterior information detection unit 12030. For example, the microcomputer 12051 can control the head lamp in accordance with the position of the preceding vehicle or the oncoming vehicle sensed by the vehicle exterior information detection unit 12030, and thereby can perform cooperative control aiming at antiglare such as switching the high beam to low beam.

The audio image output unit 12052 transmits an output signal in the form of at least one of audio or image to an output device capable of visually or audibly notifying the occupant of the vehicle or the outside of the vehicle of information. In the example of FIG. 57, an audio speaker 12061, a display unit 12062, and an instrument panel 12063 are illustrated as exemplary output devices. The display unit 12062 may include, for example, at least one of an onboard display and a head-up display.

Figure 87:
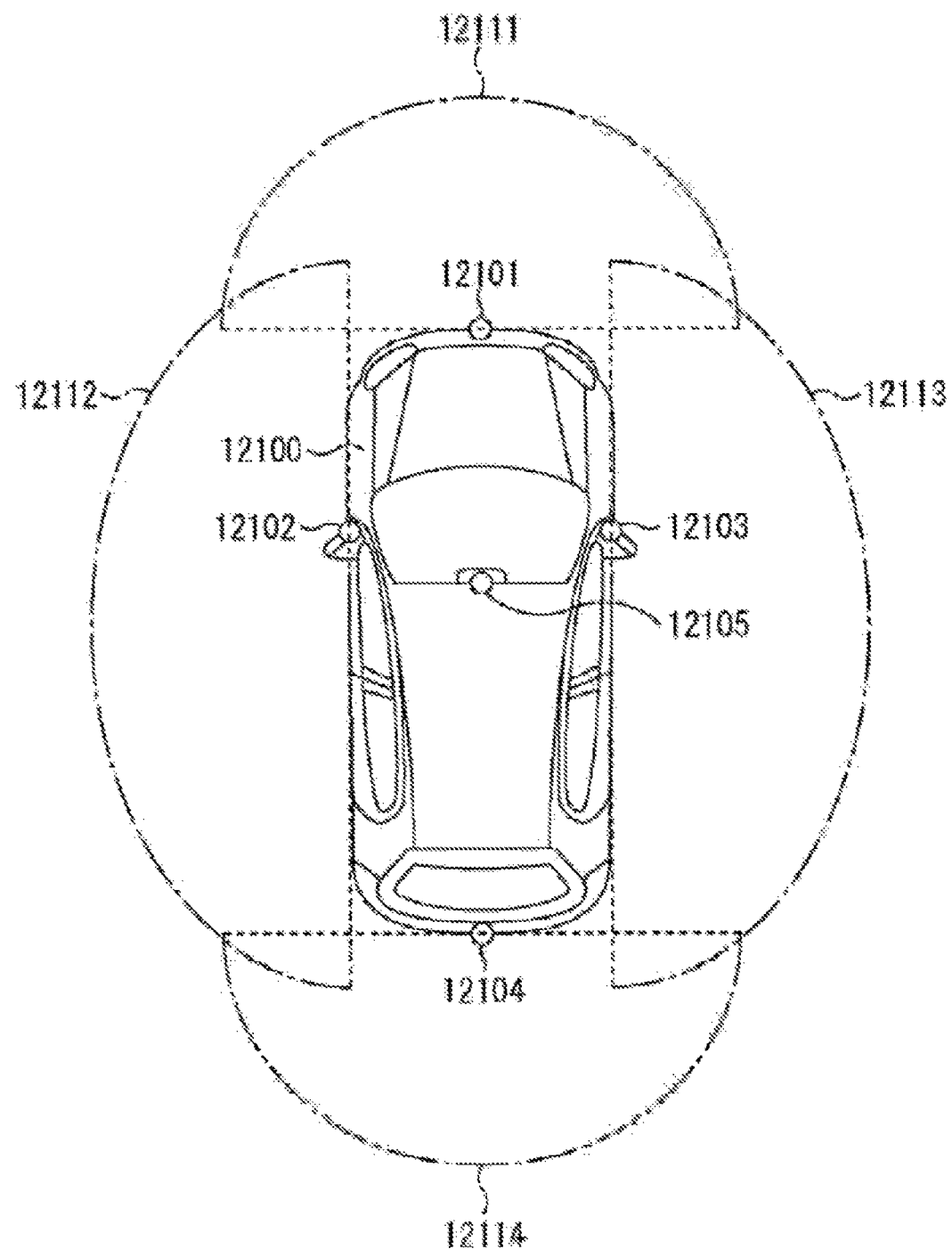
FIG. 87 is a diagram illustrating an example of installation positions of a vehicle exterior information detector and an imaging unit.

FIG. 87 is a diagram illustrating an example of an installation position of the imaging unit 12031.

In FIG. 87, a vehicle 12100 has imaging units 12101, 12102, 12103, 12104, and 12105 as the imaging units 12031.

For example, the imaging units 12101, 12102, 12103, 12104, and 12105 are installed at positions on the vehicle 12100, including a front nose, a side mirror, a rear bumper, a back door, an upper portion of the windshield in a vehicle interior, or the like. The imaging unit 12101 provided on the front nose and the imaging unit 12105 provided on the upper portion of the windshield in the vehicle interior mainly acquire an image in front of the vehicle 12100. The imaging units 12102 and 12103 provided in the side mirrors mainly acquire images of the side of the vehicle 12100. The imaging unit 12104 provided on the rear bumper or the back door mainly acquires an image behind the vehicle 12100. The images in front acquired by the imaging units 12101 and 12105 are mainly used for detecting a preceding vehicle or a pedestrian, an obstacle, a traffic light, a traffic sign, a lane, or the like.

Note that FIG. 87 illustrates an example of the imaging range of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, by superimposing pieces of image data captured by the imaging units 12101 to 12104, it is possible to obtain a bird's-eye view image of the vehicle 12100 as viewed from above.

At least one of the imaging units 12101 to 12104 may have a function of acquiring distance information. For example, at least one of the imaging units 12101 to 12104 may be a stereo camera including a plurality of imaging elements, or an imaging element having pixels for phase difference detection.

For example, the microcomputer 12051 can calculate a distance to each of three-dimensional objects in the imaging ranges 12111 to 12114 and a temporal change (relative speed with respect to the vehicle 12100) of the distance based on the distance information obtained from the imaging units 12101 to 12104, and thereby can extract a three-dimensional object traveling at a predetermined speed (for example, 0 km/h or more) in substantially the same direction as the vehicle 12100 being the closest three-dimensional object on the traveling path of the vehicle 12100, as a preceding vehicle. Furthermore, the microcomputer 12051 can set an inter-vehicle distance to be ensured in front of the preceding vehicle in advance, and can perform automatic brake control (including follow-up stop control), automatic acceleration control (including follow-up start control), or the like. In this manner, it is possible to perform cooperative control for the purpose of autonomous driving or the like, in which the vehicle autonomously travels without depending on the operation of the driver.

For example, based on the distance information obtained from the imaging units 12101 to 12104, the microcomputer 12051 can extract three-dimensional object data regarding the three-dimensional object with classification into three-dimensional objects, such as a two-wheeled vehicle, a regular vehicle, a large vehicle, a pedestrian, and other three-dimensional objects such as a utility pole, and can use the data for automatic avoidance of obstacles. For example, the microcomputer 12051 distinguishes obstacles around the vehicle 12100 into obstacles having high visibility to the driver of the vehicle 12100 and obstacles having low visibility to the driver. Subsequently, the microcomputer 12051 determines a collision risk indicating the risk of collision with each of obstacles. When the collision risk is a set value or more and there is a possibility of collision, the microcomputer 12051 can output an alarm to the driver via the audio speaker 12061 and the display unit 12062, and can perform forced deceleration and avoidance steering via the drive system control unit 12010, thereby achieving driving assistance for collision avoidance.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is performed, for example, by a procedure of extracting feature points in a captured image of the imaging units 12101 to 12104 as an infrared camera, and by a procedure of performing pattern matching processing on a series of feature points indicating the contour of the object to discriminate whether or not it is a pedestrian. When the microcomputer 12051 determines that a pedestrian is present in the captured images of the imaging units 12101 to 12104 and recognizes a pedestrian, the audio image output unit 12052 controls the display unit 12062 to perform superimposing display of a rectangular contour line for emphasis to the recognized pedestrian. Furthermore, the audio image output unit 12052 may control the display unit 12062 to display an icon indicating a pedestrian or the like at a desired position.

Hereinabove, an example of the moving body control system to which the technology according to the present disclosure is applicable has been described. The technology according to the present disclosure can be suitably applied to the imaging unit 12031 among the configurations described above. Specifically, the imaging device 1 according to the above-described embodiments and their modifications can be applied to the imaging unit 12031. By applying the technology according to the present disclosure to the imaging unit 12031, it is possible to obtain a high-definition photographic image with little noise, leading to achievement of high-accuracy control using the photographic image in the moving body control system.

[Second Example of Application to Products]

Figure 88:
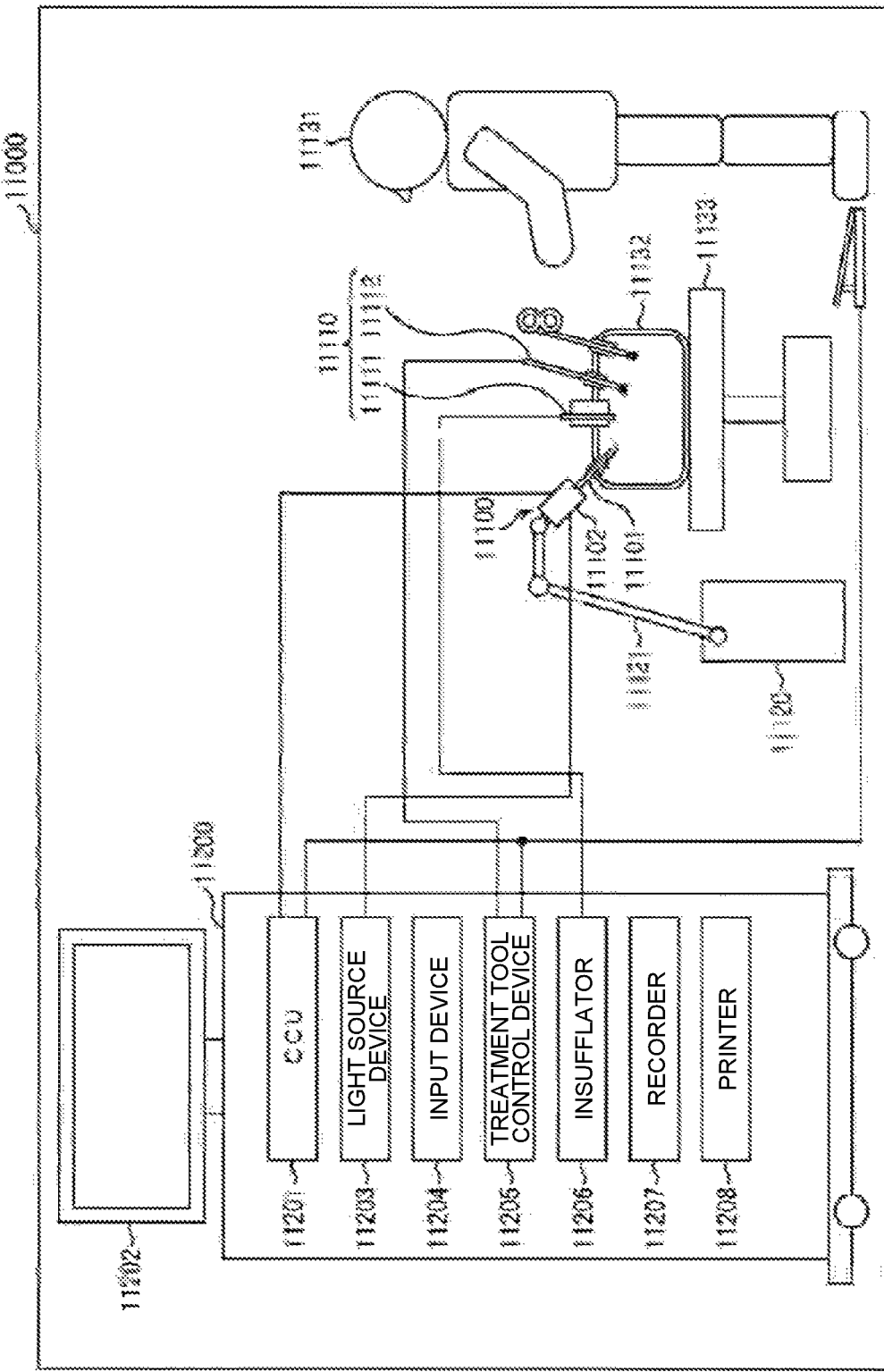
FIG. 88 is a diagram illustrating an example of a schematic configuration of an endoscopic surgery system.

FIG. 88 is a diagram illustrating an example of a schematic configuration of an endoscopic surgery system to which the technology (the present technology) according to the present disclosure is applicable.

FIG. 88 illustrates a scene in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 equipped with various devices for endoscopic surgery.

The endoscope 11100 includes: a lens barrel 11101 in which a region of a predetermined length from a distal end is to be inserted into the body cavity of the patient 11132; and a camera head 11102 connected to a proximal end of the lens barrel 11101. The example in the figure illustrates the endoscope 11100 as a rigid endoscope having the lens barrel 11101 of a rigid type. However, the endoscope 11100 can be a flexible endoscope having a flexible lens barrel.

The distal end of the lens barrel 11101 has an opening to which an objective lens is fitted. The endoscope 11100 is connected to a light source device 11203. The light generated by the light source device 11203 is guided to the distal end of the lens barrel by a light guide extending inside the lens barrel 11101, and the guided light will be emitted toward an observation target in the body cavity of the patient 11132 through the objective lens. The endoscope 11100 may be a forward viewing endoscope, a forward-oblique viewing endoscope, or a side-viewing endoscope.

An optical system and an imaging element are provided inside the camera head 11102. Reflected light (observation light) from the observation target is focused on the imaging element by the optical system. The observation light is photoelectrically converted by the imaging element so as to generate an electric signal corresponding to the observation light, that is, an image signal corresponding to the observation image. The image signal is transmitted as RAW data to a camera control unit (CCU) 11201.

The CCU 11201 is formed with a central processing unit (CPU), a graphics processing unit (GPU), or the like, and integrally controls operations of the endoscope 11100 and a display device 11202. Furthermore, the CCU 11201 receives an image signal from the camera head 11102, and performs various types of image processing on the image signal for displaying an image based on the image signal, such as developing processing (demosaicing).

Under the control of the CCU 11201, the display device 11202 displays an image based on the image signal that has undergone image processing by the CCU 11201.

The light source device 11203 includes a light source such as a light emitting diode (LED), for example, and supplies the irradiation light for imaging the surgical site or the like to the endoscope 11100.

An input device 11204 is an input interface to the endoscopic surgery system 11000. The user can input various types of information and input instructions to the endoscopic surgery system 11000 via the input device 11204. For example, the user inputs an instruction and the like to change the imaging conditions (type of irradiation light, magnification, focal length, and the like) by the endoscope 11100.

A treatment tool control device 11205 controls the drive of the energy treatment tool 11112 for ablation or dissection of tissue, sealing of blood vessels, or the like. In order to inflate the body cavity of the patient 11132 to ensure a view field for the endoscope 11100 and to ensure a working space of the surgeon, an insufflator 11206 pumps gas into the body cavity through the insufflation tube 11111. A recorder 11207 is a device capable of recording various types of information associated with the surgery. A printer 11208 is a device capable of printing various types of information associated with surgery in various forms such as text, images, and graphs.

The light source device 11203 that supplies the endoscope 11100 with irradiation light when imaging a surgical site can be constituted with, for example, an LED, a laser light source, or a white light source with a combination of these. In a case where the white light source is constituted with the combination of the RGB laser light sources, it is possible to control the output intensity and the output timing of individual colors (individual wavelengths) with high accuracy. Accordingly, it is possible to perform white balance adjustment of the captured image on the light source device 11203. Furthermore, in this case, by emitting the laser light from each of the RGB laser light sources to an observation target on the time-division basis and by controlling the drive of the imaging element of the camera head 11102 in synchronization with the light emission timing, it is also possible to capture the image corresponding to each of RGB colors on the time division basis. According to this method, a color image can be obtained without providing a color filter on the imaging element.

Furthermore, the drive of the light source device 11203 may be controlled so as to change the intensity of the output light at predetermined time intervals. With the control of the drive of the imaging element of the camera head 11102 in synchronization with the timing of the change of the intensity of the light so as to obtain images on the time division basis and combine the images, it is possible to generate an image with high dynamic range without so called blackout shadows or blown out highlights (overexposure).

Furthermore, the light source device 11203 may be configured to be able to supply light in a predetermined wavelength band corresponding to special light observation. The special light observation is used to perform narrowband light observation (narrow band imaging). The narrowband light observation uses the wavelength dependency of the light absorption in the body tissue and emits light in a narrower band compared with the irradiation light (that is, white light) at normal observation, thereby imaging a predetermined tissue such as a blood vessel of the mucosal surface layer with high contrast. Alternatively, the special light observation may include fluorescence observation to obtain an image by fluorescence generated by emission of excitation light. Fluorescence observation can be performed to observe fluorescence emitted from a body tissue to which excitation light is applied (autofluorescence observation), can be performed with topical administration of reagent such as indocyanine green (ICG) to the body tissue, and together with this, excitation light corresponding to the fluorescence wavelength of the reagent is emitted to the body tissue to obtain a fluorescent image, or the like. The light source device 11203 can be configured to be able to supply narrow band light and/or excitation light corresponding to such special light observation.

Figure 89:
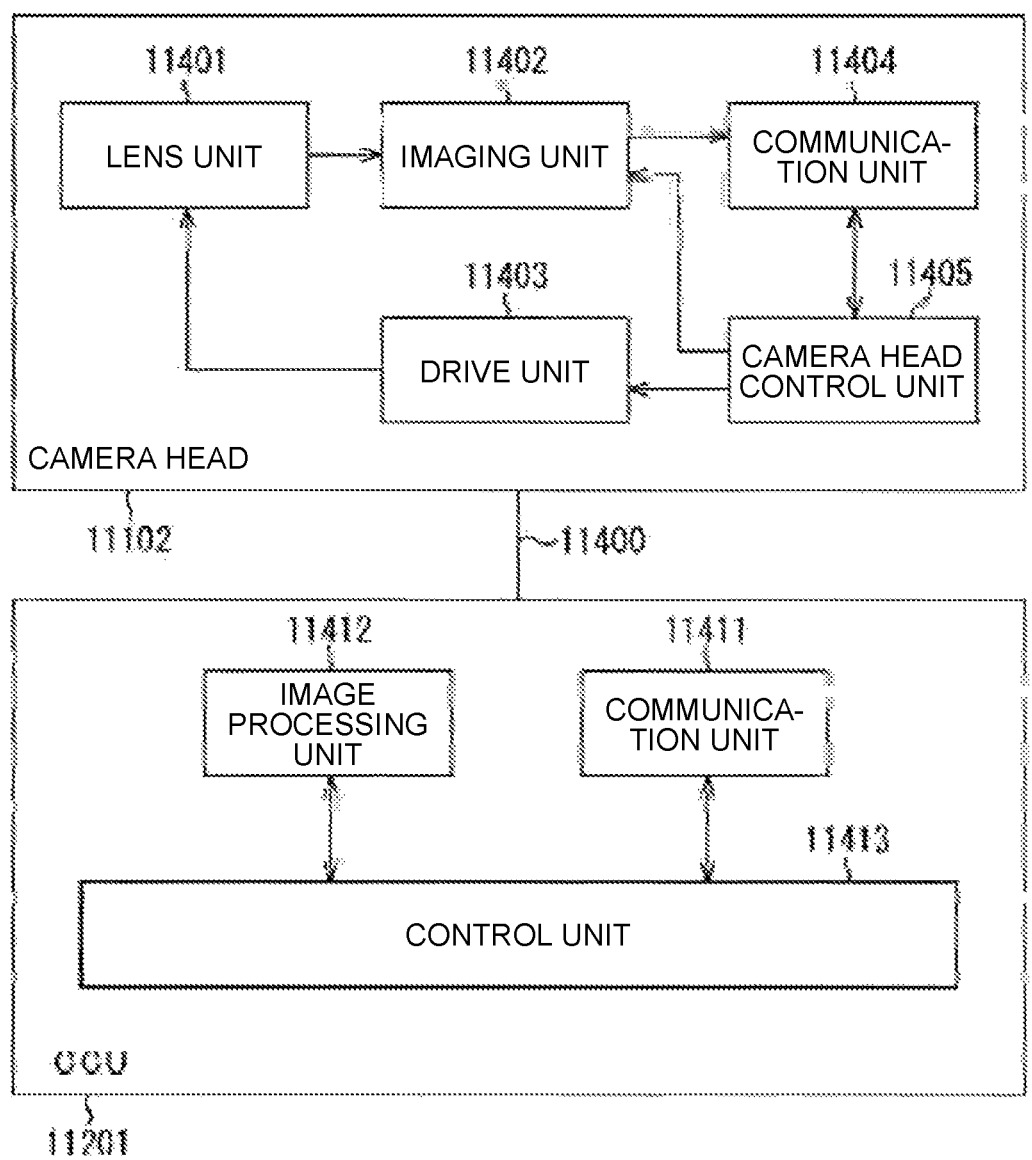
FIG. 89 is a block diagram illustrating an example of a functional configuration of a camera head and a CCU.

FIG. 89 is a block diagram illustrating an example of the functional configuration of the camera head 11102 and the CCU 11201 illustrated in FIG. 88.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided at a connection portion with the lens barrel 11101. The observation light captured from the distal end of the lens barrel 11101 is guided to the camera head 11102 so as to be incident on the lens unit 11401. The lens unit 11401 is formed by a combination of a plurality of lenses including a zoom lens and a focus lens.

The imaging unit 11402 is constituted with an imaging element. The number of imaging elements forming the imaging unit 11402 may be one (single-plate type) or in plurality (multi-plate type). When the imaging unit 11402 is a multi-plate type, for example, each of imaging elements may generate an image signal corresponding to one color of RGB, and a color image may be obtained by combining these individual color image signals. Alternatively, the imaging unit 11402 may include a pair of imaging elements for acquiring image signals individually for the right eye and the left eye corresponding to three-dimensional (3D) display. The 3D display enables the surgeon 11131 to grasp the depth of the living tissue more accurately in the surgical site. When the imaging unit 11402 is a multi-plate type, a plurality of the lens units 11401 may be provided corresponding to the imaging elements.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. With this operation, the magnification and focal point of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201 and supplies the control signal to the camera head control unit 11405. The control signal includes information associated with imaging conditions, such as information designating a frame rate of a captured image, information designating an exposure value at the time of imaging, and/or information designating the magnification and focal point of the captured image.

Note that the imaging conditions such as the frame rate, the exposure value, the magnification, and the focal point may be appropriately designated by the user, or may be automatically set by the control unit 11413 of the CCU 11201 based on the acquired image signal. In the latter case, an auto exposure (AE) function, an auto focus (AF) function, and an auto white balance (AWB) function are to be installed in the endoscope 11100.

The camera head control unit 11405 controls the drive of the camera head 11102 based on the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electric communication, optical communication, or the like.

The image processing unit 11412 performs various types of image processing on the image signal which is the RAW data transmitted from the camera head 11102.

The control unit 11413 performs various controls related to the imaging of the surgical site or the like by the endoscope 11100 and related to the display of the captured image obtained by the imaging of the surgical site or the like. For example, the control unit 11413 generates a control signal for controlling the drive of the camera head 11102.

Furthermore, the control unit 11413 controls the display device 11202 to display the captured image including an image of a surgical site or the like based on the image signal that has undergone image processing by the image processing unit 11412. At this time, the control unit 11413 may recognize various objects in the captured image by using various image recognition techniques. For example, the control unit 11413 detects the shape, color, or the like of an edge of an object included in the captured image, making it possible to recognize a surgical tool such as forceps, a specific living body site, bleeding, a mist at the time of using the energy treatment tool 11112, or the like. When displaying the captured image on the display device 11202, the control unit 11413 may superimpose and display various types of surgical operation support information on the image of the surgical site by using the recognition result. By displaying the surgical operation support information in a superimposed manner so as to be presented to the surgeon 11131, it is possible to reduce the burden on the surgeon 11131 and enable the surgeon 11131 to proceed with the operation with higher reliability.

The transmission cable 11400 that connects the camera head 11102 and the CCU 11201 is an electric signal cable that supports electric signal communication, an optical fiber that supports optical communication, or a composite cable thereof.

Here, while an illustrated example in which wired communication is performed using the transmission cable 11400, the communication between the camera head 11102 and the CCU 11201 may be performed wirelessly.

An example of the endoscopic surgery system to which the technology according to the present disclosure can be applied has been described above. The technology according to the present disclosure can be appropriately applied to the imaging unit 11402 provided in the camera head 11102 of the endoscope 11100 among the configurations described above. Application of the technology according to the present disclosure to the imaging unit 11402, can achieve downsizing and high definition of the imaging unit 11402, making it possible to provide the endoscope 11100 having achieved downsizing or high definition.

Although the present disclosure has been described with reference to the embodiments, their modifications, application examples, and examples of application to products, the present disclosure is not limited to the embodiments and the like, and various modifications can be made. Note that the effects described in the present specification are merely examples. The effects of the present disclosure are not limited to the effects described herein. The present disclosure may have effects other than those described herein.

Furthermore, the technical scope of the present disclosure is not limited to the above-described embodiments, and various modifications can be made without departing from the scope and spirit of the present disclosure. Moreover, it is allowable to combine the components across different embodiments and their modifications as appropriate. Still further, the effects described in individual embodiments of the present specification are merely examples, and thus, there may be other effects, not limited to the exemplified effects.

Note that the present technology can also have the following configurations.

(1)
A solid-state imaging device comprising:
a first substrate including a plurality of photoelectric converters arranged in a matrix;
a second substrate that is bonded to a first surface of the first substrate and includes a pixel circuit that generates a pixel signal based on a charge generated in each of the photoelectric converters; and
a third substrate bonded to a third surface of the second substrate opposite to a second surface to which the first substrate is bonded, the third substrate including a peripheral circuit that executes predetermined processing on the pixel signal generated by the pixel circuit,
wherein the pixel circuit includes:
a charge accumulation unit that accumulates a charge generated in the photoelectric converter;
an amplification transistor that generates the pixel signal having a voltage value corresponding to a charge amount regarding the charge accumulated in the charge accumulation unit; and
a switching transistor that switches capacitance of the charge accumulation unit.

(2)
The solid-state imaging device according to (1),
wherein the pixel circuit further includes a capacitive element, and
the switching transistor switches the capacitance of the charge accumulation unit by switching connection between the capacitive element and a gate of the amplification transistor.

(3)
The solid-state imaging device according to (2),
wherein the capacitive element is an element that functions as wiring.

(4)
The solid-state imaging device according to (2),
wherein the capacitive element is a metal oxide semiconductor (MOS) capacitor.

(5)
The solid-state imaging device according to (2),
wherein the capacitive element is a parallel plate capacitor.

(6)
The solid-state imaging device according to (5),
wherein one electrode constituting the parallel plate capacitor is a part of the second substrate.

(7)
The solid-state imaging device according to (2),
wherein the capacitive element is a gate capacitance.

(8)
The solid-state imaging device according to (2),
wherein the capacitive element is a diffusion capacitance including: a first semiconductor region having a first conductivity type; and a second semiconductor region being in contact with the first semiconductor region and having a second conductivity type opposite to the first conductivity type.

(9)
The solid-state imaging device according to any one of (2) to (8),
wherein the capacitive element includes:
a first capacitive element connected to a drain of the switching transistor; and
a second capacitive element connected to a semiconductor layer of the first substrate.

(10)
The solid-state imaging device according to (9),
wherein a part of the second capacitive element extends to a boundary portion of the plurality of photoelectric converters arranged in the matrix.

(11)
The solid-state imaging device according to any one of (2) to (10),
wherein the switching transistor is disposed on the second substrate.

(12)
The solid-state imaging device according to any one of (2) to (10), in which the switching transistor is disposed on the first substrate.

(13)
The solid-state imaging device according to any one of (2) to (12),
wherein the pixel circuit further includes a reset transistor that releases the charge accumulated in the charge accumulation unit, and
the reset transistor and the switching transistor are connected in parallel to the gate of the amplification transistor.

(14)
The solid-state imaging device according to any one of (2) to (12),
in which the pixel circuit further includes a reset transistor that releases the charge accumulated in the charge accumulation unit, and
the reset transistor and the switching transistor are directly connected to a gate of the amplification transistor.

(15)
The solid-state imaging device according to any one of (2) to (14), comprising a plurality of the pixel circuits,
wherein a group of two or more photoelectric converters close to each other, out of the plurality of photoelectric converters, is defined as one unit, each of the units sharing the one pixel circuit, and
the capacitive element is disposed at a boundary portion between the units adjacent to each other.

(16)
The solid-state imaging device according to (15),
wherein the capacitive element is shared between the units adjacent to each other.

(17)
The solid-state imaging device according to (16),
wherein the capacitive element is shared by a first unit and a second unit among a plurality of the units, and
the switching transistor included in a first pixel circuit shared by the two or more photoelectric converters included in the first unit and the switching transistor included in a second pixel circuit shared by the two or more photoelectric converters included in the second unit share mutual sources of the transistors.

(18)
The solid-state imaging device according to (16),
in which the capacitive element is shared by a first unit and a second unit among a plurality of the units,
a first switching transistor included in a first pixel circuit shared by the two or more photoelectric converters included in the first unit and a second switching transistor included in a second pixel circuit shared by the two or more photoelectric converters included in the second unit are disposed adjacent to each other in a semiconductor layer of the second substrate, and
the semiconductor layer is divided between the first switching transistor and the second switching transistor.

(19)
The solid-state imaging device according to any one of (2) to (18), further comprising:
an overflow gate transistor that releases a charge generated in each of the photoelectric converters;
memory that temporarily accumulates a charge generated in each of the photoelectric converters; and
a transfer transistor that controls transfer of the charge accumulated in the memory to the charge accumulation unit.

(20)
The solid-state imaging device according to any one of (2) to (19),
wherein the first substrate includes a first semiconductor layer and a first wiring layer stacked on the first semiconductor layer,
the second substrate includes a second semiconductor layer and a second wiring layer stacked on the second semiconductor layer, and
the capacitive element is disposed in the second wiring layer.

(21)
The solid-state imaging device according to any one of (2) to (19),
wherein the first substrate includes a first semiconductor layer and a first wiring layer stacked on the first semiconductor layer,
the second substrate includes a second semiconductor layer and a second wiring layer stacked on the second semiconductor layer, and
the capacitive element is disposed in the first wiring layer.

(22)
The solid-state imaging device according to any one of (1) to (21),
wherein at least one of bonding between the first substrate and the second substrate or bonding between the second substrate and the third substrate is substrate bonding that uses bonding between mutual copper pads.

(23)
An electronic device comprising:
a solid-state imaging device; and
a signal processing circuit that processes a signal output from the solid-state imaging device,
wherein the solid-state imaging device includes:
a first substrate including a plurality of photoelectric converters arranged in a matrix;
a second substrate that is bonded to a first surface of the first substrate and includes a pixel circuit that generates a pixel signal based on a charge generated in each of the photoelectric converters; and
a third substrate bonded to a third surface of the second substrate opposite to a second surface to which the first substrate is bonded, the third substrate including a peripheral circuit that executes predetermined processing on the pixel signal generated by the pixel circuit, and
the pixel circuit includes:
a charge accumulation unit that accumulates a charge generated in the photoelectric converter;
an amplification transistor that generates the pixel signal having a voltage value corresponding to a charge amount regarding the charge accumulated in the charge accumulation unit; and
a switching transistor that switches capacitance of the charge accumulation unit.

REFERENCE SIGNS LIST

1 IMAGING DEVICE
7 IMAGING SYSTEM
100 FIRST SUBSTRATE
100S, 200S SEMICONDUCTOR LAYER
100T, 200T WIRING LAYER
111 INSULATING FILM
112 FIXED CHARGE FILM
113 FIRST PINNING REGION
114 n TYPE SEMICONDUCTOR REGION
115 p WELL LAYER
116 SECOND PINNING REGION
117 PIXEL ISOLATION PORTION
117A LIGHT SHIELDING FILM
117B INSULATING FILM
118, 218 VSS CONTACT REGION
119, 123, 222 INTERLAYER INSULATING FILM
120, 121 PAD PORTION
120E, 121E, TGV THROUGH-SUBSTRATE ELECTRODE
122, 221 PASSIVATION FILM

124 BONDING FILM
141, 142, 151 PARALLEL PLATE ELECTRODE
132, 133, 143, 152, 231 to 236, 241, 501 to 505, 531, 611 to 614, 801 to 803, 853 DIFFUSION REGION
200 SECOND SUBSTRATE
201, 202, 203, 204, 301, 302, 303, 304 CONTACT PORTION
210 PIXEL CIRCUIT
212 INSULATING REGION
213 ELEMENT ISOLATION REGION
218V CONNECTION PORTION
220 ELEMENT ISOLATION REGION
230 ELEMENT FORMATION REGION
300 THIRD SUBSTRATE
311 to 313, 315, 317 to 319, 620 to 629 PAD
314, 810, 831, 832 subFD WIRING
316, 321, 322, 630, 822, 834 WIRING, WIRING LINE
401 LIGHT RECEIVING LENS
539 PIXEL SHARING UNIT
541, 541A to 541D, 641 PIXEL
543 VERTICAL SIGNAL LINE
545, 645 UNIT PIXEL
820 GATE ELECTRODE
821, 823, 833, 835, 836 VIA-WIRING
841 N+ TYPE SEMICONDUCTOR REGION
842 P+ TYPE SEMICONDUCTOR REGION
864 THROUGH HOLE
AMP AMPLIFICATION TRANSISTOR
FD FLOATING DIFFUSION
FDG FD CONVERSION GAIN SWITCHING TRANSISTOR
MEM MEMORY
MOSM GATE ELECTRODE
OFG OVERFLOW GATE TRANSISTOR
PD PHOTODIODE
RST RESET TRANSISTOR
SEL SELECTION TRANSISTOR
SFD subFD CAPACITANCE
TG TRANSFER GATE
TR TRANSFER TRANSISTOR
TRX GATE TRANSISTOR

The invention claimed is:

1. A solid-state imaging device, comprising:
a first substrate including a plurality of photoelectric converters in a matrix, wherein the first substrate further includes a first semiconductor layer;
a second substrate that is bonded to a first surface of the first substrate, wherein
the second substrate includes a pixel circuit configured to generate a pixel signal based on a charge generated in each photoelectric converter of the plurality of photoelectric converters; and
a third substrate bonded to a first surface of the second substrate, wherein
the first surface of the second substrate is opposite to a second surface of the second substrate to which the first substrate is bonded,
the third substrate includes a peripheral circuit configured to execute a determined process on the pixel signal generated by the pixel circuit, and
the pixel circuit includes:
a charge accumulation unit configured to accumulate the charge generated in a respective photoelectric converter of the plurality of photoelectric converters;
an amplification transistor configured to generate the pixel signal having a voltage value corresponding to a charge amount regarding the charge accumulated in the charge accumulation unit;
a capacitive element that includes:
a first capacitive element; and
a second capacitive element connected to the first semiconductor layer of the first substrate; and
a switching transistor configured to switch connection between the capacitive element and a gate of the amplification transistor to switch capacitance of the charge accumulation unit, wherein the first capacitive element is connected to a drain of the switching transistor.

2. The solid-state imaging device according to claim 1, wherein the capacitive element includes an element that functions as wiring.

3. The solid-state imaging device according to claim 1, wherein the capacitive element includes a metal oxide semiconductor (MOS) capacitor.

4. The solid-state imaging device according to claim 1, wherein the capacitive element includes a parallel plate capacitor.

5. The solid-state imaging device according to claim 4, wherein
the parallel plate capacitor includes one electrode, and
the one electrode is a part of the second substrate.

6. The solid-state imaging device according to claim 1, wherein the capacitive element includes a gate capacitance.

7. The solid-state imaging device according to claim 1, wherein the capacitive element includes a diffusion capacitance including:
a first semiconductor region having a first conductivity type; and
a second semiconductor region in contact with the first semiconductor region, wherein the second semiconductor region has a second conductivity type opposite to the first conductivity type.

8. The solid-state imaging device according to claim 1, wherein a part of the second capacitive element extends to a boundary portion of the plurality of photoelectric converters in the matrix.

9. The solid-state imaging device according to claim 1, wherein the switching transistor is on the second substrate.

10. The solid-state imaging device according to claim 1, wherein
the pixel circuit further includes a reset transistor configured to release the charge accumulated in the charge accumulation unit, and
the reset transistor and the switching transistor are connected in parallel to the gate of the amplification transistor.

11. The solid-state imaging device according to claim 1, further comprising a plurality of pixel circuits including the pixel circuit, wherein
groups of at least two adjacent photoelectric converters of the plurality of photoelectric converters correspond to a plurality of units,
each unit of the plurality of units shares the pixel circuit, and
the capacitive element is at a boundary portion between adjacent units of the plurality of units.

12. The solid-state imaging device according to claim 11, wherein the capacitive element is shared between the adjacent units.

13. The solid-state imaging device according to claim 12, wherein
the capacitive element is shared by a first unit and a second unit among the plurality of units, the plurality of pixel circuits includes a first pixel circuit and a second pixel circuit, and the switching transistor included in the first pixel circuit shared by the at least two adjacent photoelectric converters included in the first unit and the switching transistor included in the second pixel circuit shared by the at least two adjacent photoelectric converters included in the second unit share a mutual source of the switching transistor.

14. The solid-state imaging device according to claim 1, further comprising:

an overflow gate transistor a configured to release the charge generated in each photoelectric converter of the plurality of photoelectric converters;

a memory configured to temporarily accumulate the charge generated in each photoelectric converter of the plurality of photoelectric converters; and a transfer transistor configured to control transfer of the charge accumulated in the memory to the charge accumulation unit.

15. The solid-state imaging device according to claim 1, wherein the first substrate includes a first wiring layer on the first semiconductor layer, the second substrate includes a second semiconductor layer and a second wiring layer on the second semiconductor layer, and the capacitive element is in the second wiring layer.

16. The solid-state imaging device according to claim 1, wherein the first substrate includes a first wiring layer on the first semiconductor layer, the second substrate includes a second semiconductor layer and a second wiring layer on the second semiconductor layer, and the capacitive element is in the first wiring layer.

17. The solid-state imaging device according to claim 1, wherein at least one of a bonding between the first substrate and the second substrate or a bonding between the second substrate and the third substrate includes substrate bonding that uses bonding between mutual copper pads.

18. An electronic device, comprising:

a solid-state imaging device; and a signal processing circuit configured to process a signal output from the solid-state imaging device, wherein the solid-state imaging device includes:

a first substrate including a plurality of photoelectric converters in a matrix, wherein the first substrate further includes a semiconductor layer;

a second substrate that is bonded to a first surface of the first substrate, wherein the second substrate includes a pixel circuit configured to generate a pixel signal based on a charge generated in each photoelectric converter of the plurality of photoelectric converters; and a third substrate bonded to a first surface of the second substrate, wherein the first surface of the second substrate is opposite to a second surface of the second substrate to which the first substrate is bonded, the third substrate includes a peripheral circuit configured to execute a determined process on the pixel signal generated by the pixel circuit, and the pixel circuit includes:

a charge accumulation unit configured to accumulate the charge generated in a respective photoelectric converter of the plurality of photoelectric converters;

an amplification transistor configured to generate the pixel signal having a voltage value corresponding to a charge amount regarding the charge accumulated in the charge accumulation unit;

a capacitive element that includes:
a first capacitive element; and
a second capacitive element connected to the semiconductor layer of the first substrate; and a switching transistor configured to switch connection between the capacitive element and a gate of the amplification transistor to switch capacitance of the charge accumulation unit, wherein the first capacitive element is connected to a drain of the switching transistor.

19. A solid-state imaging device, comprising:

a first substrate including a plurality of photoelectric converters in a matrix, wherein groups of at least two adjacent photoelectric converters of the plurality of photoelectric converters correspond to a plurality of units;

a second substrate that is bonded to a first surface of the first substrate, wherein the second substrate includes a plurality of pixel circuits, the plurality of pixel circuits includes at least one pixel circuit configured to generate a pixel signal based on a charge generated in each photoelectric converter of the plurality of photoelectric converters, and each unit of the plurality of units shares the at least one pixel circuit; and a third substrate bonded to a first surface of the second substrate, wherein the first surface of the second substrate is opposite to a second surface of the second substrate to which the first substrate is bonded, the third substrate includes a peripheral circuit configured to execute a determined process on the pixel signal generated by the at least one pixel circuit, and the at least one pixel circuit includes:

a charge accumulation unit configured to accumulate the charge generated in a respective photoelectric converter of the plurality of photoelectric converters;

an amplification transistor configured to generate the pixel signal having a voltage value corresponding to a charge amount regarding the charge accumulated in the charge accumulation unit;

a capacitive element, wherein
the capacitive element is at a boundary portion between adjacent units of the plurality of units, and
the capacitive element is shared between the adjacent units of the plurality of units; and a switching transistor configured to switch connection between the capacitive element and a gate of the amplification transistor to switch capacitance of the charge accumulation unit.

* * * * *